US009024521B2

(12) United States Patent
Yoshinaga et al.

(10) Patent No.: US 9,024,521 B2

(45) Date of Patent: May 5, 2015

(54) ORGANIC EL DISPLAY DEVICE AND METHOD OF MANUFACTURING THE SAME

(75) Inventors: Tadahiko Yoshinaga, Kanagawa (JP); Toshiki Matsumoto, Kanagawa (JP); Tomoyuki Higo, Tokyo (JP)

(73) Assignee: Sony Corporation (JP)

( * ) Notice: Subject to any disclaimer, the term of this patent is extended or adjusted under 35 U.S.C. 154(b) by 14 days.

(21) Appl. No.: 13/399,132

(22) Filed: Feb. 17, 2012

(65) Prior Publication Data

US 2012/0223633 A1 Sep. 6, 2012

(30) Foreign Application Priority Data

Mar. 4, 2011 (JP) ................................ 2011-048353

(51) Int. Cl.

| | |
|---|---|
| ***H01J 1/62*** | (2006.01) |
| ***H01J 63/04*** | (2006.01) |
| ***H01L 51/50*** | (2006.01) |
| ***H01L 27/32*** | (2006.01) |
| ***H01L 51/56*** | (2006.01) |

(52) U.S. Cl.

CPC ............ *H01L 51/50* (2013.01); *H01L 27/3211* (2013.01); *H01L 51/5056* (2013.01); *H01L 51/56* (2013.01); *H01L 51/5016* (2013.01); *H01L 51/504* (2013.01)

(58) Field of Classification Search

None

See application file for complete search history.

(56) References Cited

U.S. PATENT DOCUMENTS 7,095,172 B2 * 8/2006 Sakamoto et al. ............ 313/506

7,776,457 B2 * 8/2010 Lee et al. ...................... 428/690

FOREIGN PATENT DOCUMENTS

JP 2006-140434 6/2006

OTHER PUBLICATIONS

Kwang Ohk et al.; Progress in Solution Processible Phosphorescent Organic Light Emitting Diodes (PHOLEDs); IMID/IDMC/ASIA Display 2010 Digest; 159.

* cited by examiner

*Primary Examiner* — Natalie Walford

(74) *Attorney, Agent, or Firm* — Sheridan Ross P.C.

(57) ABSTRACT

Disclosed herein is an organic EL display device, including: a lower electrode provided every first organic EL element for a blue color and every second organic EL element for another color on a substrate; a hole injection/transport layer provided every first and second organic EL elements; a second organic light emitting layer for another color provided on said hole injection/transport layer for said second organic EL element; a connection layer made of a low-molecular material and provided over an entire surface of said hole injection/transport layer for said second organic light emitting layer and said first organic EL element; a first organic light emitting layer for a blue color provided over an entire surface of said connection layer; and an electron injection/transport layer and an upper electrode provided over an entire surface of said organic light emitting layer in order.

14 Claims, 12 Drawing Sheets

ORGANIC EL DISPLAY DEVICE AND METHOD OF MANUFACTURING THE SAME

BACKGROUND

The present disclosure relates to an organic Electro Luminescence (EL) display device which emits a light by utilizing an organic EL phenomenon, and a method of manufacturing the same.

A display element having an advanced performance has been required with accelerating development of an information and communication industry. In particular, an organic EL element which attracts attention as a next-generation display device has an advantage that not only a view angle is wide in terms of a spontaneous luminescence type display device and contrast is excellent, but also a response time is fast.

Materials used in a light emitting layer and the like composing the organic EL element are classified into a low-molecular material and a high-molecular material. In general, it is known that the low-molecular material shows a high luminous efficiency and a long life rather than the high-molecular material. In particular, the performance of blue light emission is perceived to be high in the low-molecular material.

In addition, in the case of the low-molecular material, an organic film of the same is generally deposited by utilizing a dry method (evaporation method) such as a vacuum evaporation method. On the other hand, in the case of the high-molecular material, an organic film made of the same is deposited by utilizing either a wet method (application method) such as a spin coating method, an ink-jet method or a nozzle coating method, or a printing method such as a flexo printing method or an offset printing.

The vacuum evaporation method has an advantage that it is unnecessary to dissolve a formation material for an organic thin film into a solvent, and a process for removing the solvent after completion of the deposition is unnecessary. However, the vacuum evaporation has a disadvantage that since it is difficult to carry out the deposition appropriately using a metal mask, and especially, equipment and manufacturing cost in manufacturing of a large panel is high, the application of the vacuum evaporation to a large screen substrate is difficult and the vacuum evaporation has trouble with mass production as well. Then, the application method with which the large area promotion of the display screen is selectively easy attracts attention.

In recent years, a method of depositing a soluble low-molecular material by utilizing the wet method has been searched for. Also, in this case, materials used in the light-emitting layer which show the high luminous efficiency and life characteristics in red and green light emitting layers have been reported. This technique, for example, is described in a non-patent literary document of IMID/IDMC/ASIA DISPLAY 2010 DIGEST 159. However, in the blue light emitting layer deposited by utilizing the wet method, the emission luminance and the life characteristics have been poor irrespective of the low-molecular material and the high-molecular material. In particular, the patterning by the wet method has been perceived to be difficult.

In order to cope with this situation, there is developed a display device in which layers in and after a blue light emitting layer are formed on upper portions of a red light emitting layer and a green light emitting layer obtained through patterning made by either utilizing the application method described above or a transferring method using light radiation such as laser by utilizing a vacuum evaporation method. The adopting of such a structure results in that it is unnecessary to carry out the patterning for the blue light emitting layer, and thus the possibility for scaling-up becomes high.

On the other hand, an additional improvement point in the organic EL element includes a luminous efficiency. Recently, an organic EL element using a phosphorescence material as a luminescence material has been reported. The phosphorescence material has an internal quantum efficiency of 75% or more, theoretically, a value near 100%. Thus, it is expected that the use of the phosphorescence material results in obtaining of the organic EL element having a high efficiently and low power consumption. For example, Japanese Patent Laid-Open No. 2006-140434 discloses a display device in which a blue light emitting layer is formed as a common layer on an upper portion of a light emitting layer including a phosphorescence luminescent material and provided every element.

SUMMARY

However, the organic EL element disclosed in Japanese Patent Laid-Open No. 2006-140434 described above involves a problem that the luminous efficiency of the light emitting layer including the phosphorescence luminescent material is actually reduced, and moreover, the chromaticity is changed due to the current density dependency.

The present disclosure has been made in order to solve the problems described above, and it is therefore desirable to provide an organic EL display device which is capable of enhancing a luminous efficiency without changing a chromaticity, and a method of manufacturing the same.

In order to attain the desire described above, according to an embodiment of the present disclosure, there is provided an organic EL display device including: a lower electrode provided every first organic EL element for a blue color and every second organic EL element for another color on a substrate; a hole injection/transport layer provided every first organic EL element and second organic EL element on the lower electrode, and having at least one of properties of hole injection and hole transport; a second organic light emitting layer for another color provided on the hole injection/transport layer for said second organic EL element; a connection layer made of a low-molecular material and provided over an entire surface of said hole injection/transport layer for the second organic light emitting layer and said first organic EL element; a first organic light emitting layer for a blue color provided over an entire surface of said connection layer; and an electron injection/transport layer having at least one of the properties of electron injection and the electron transport and an upper electrode provided over an entire surface of the first organic light emitting layer in order.

In the organic EL display device according to the embodiment of the present disclosure, the providing of the connection layer made of the low-molecular material between the first organic light emitting layer for the blue color and the second organic light emitting layer for another color results in that the energy in each of the organic light emitting layers is held.

According to another embodiment of the present disclosure, there is provided a method of manufacturing an organic EL display device including: providing a lower electrode every first organic EL element for a blue color and every second organic EL element for another color on a substrate; forming a hole injection/transport layer having at least one of properties of hole injection and hole transport every first organic EL element and second organic EL element on the lower electrode by utilizing an application method; forming a second organic light emitting layer for another color on the hole injection/transport layer for the second organic EL element by utilizing an application method; forming a connection layer made of a low-molecular material over an entire surface of the hole injection/transport layer for the second organic light emitting layer and the first organic EL element by utilizing an evaporation method; forming a first organic light emitting layer for a blue color over an entire surface of the connection layer by utilizing an evaporation method; and forming an electron injection/transport layer having at least one of properties of electron injection and electron transport, and an upper electrode in order over an entire surface of the first organic light emitting layer of the blue color.

As set forth hereinabove, according to the present disclosure, since the connection layer made of the low-molecular material is provided between the first organic light emitting layer for the blue color and the second organic light emitting layer for another color, the energy in each of the organic light emitting layers is held. As a result, the luminous efficiency is enhanced, and the change in the chromaticity due to the current density dependency is suppressed, thereby enhancing the color purity.

DETAILED DESCRIPTION OF THE PREFERRED EMBODIMENTS

Embodiments of the present disclosure will be described in detail hereinafter with reference to the accompanying drawings.

It is noted that the description will be given below in accordance with the following order:

1. First Embodiment;

(an organic EL display device including a second light emitting layer made of a phosphorescence luminescent low-molecular material and formed by utilizing a printing method)

Entire Structure

Manufacturing Method

2. Change of First Embodiment;

(an organic EL display device including a second light emitting layer formed by utilizing a method other than the printing method)

3. Second Embodiment;

(an organic EL display device including a second light emitting layer made of phosphorescence luminescent low-molecular material and high-molecular material)

4. Third Embodiment; and (an organic EL display device including a second light emitting layer made of a phosphorescence luminescent low-molecular material)

5. Examples of Application.

1. First Embodiment

Figure 1:
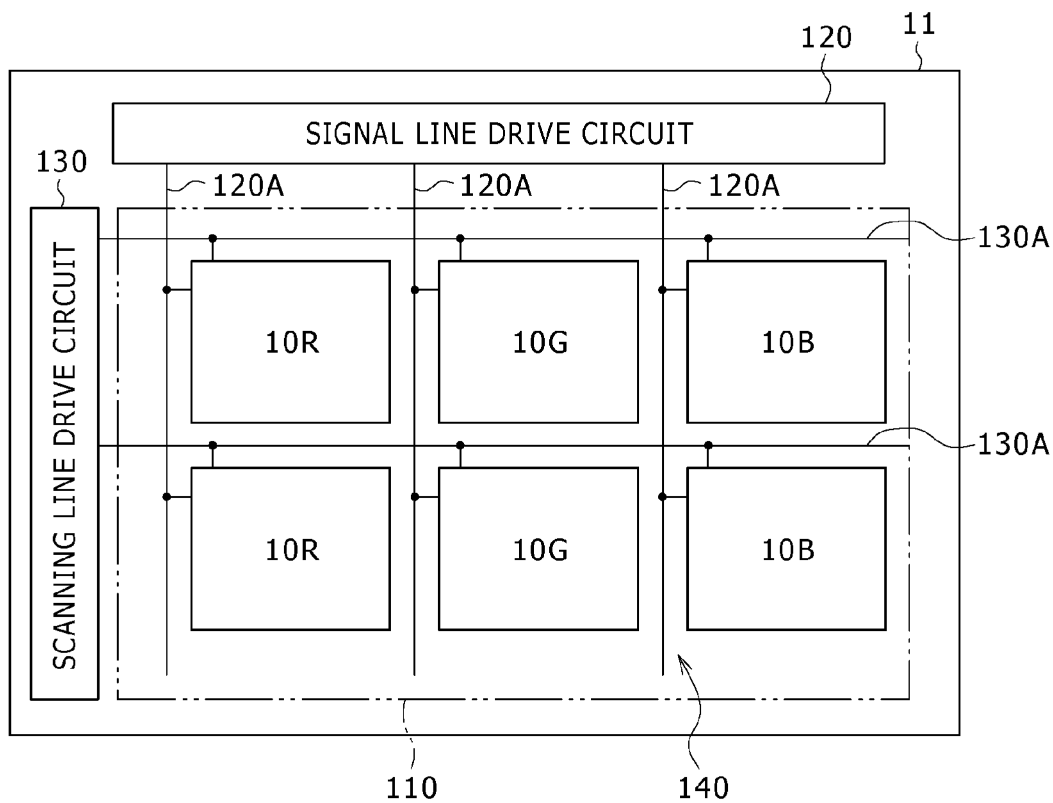
FIG. 1 is a block diagram showing a configuration of an organic EL display device according to a first embodiment of the present disclosure.

FIG. 1 is a block diagram showing a configuration of an organic EL display device 1 according to a first embodiment of the present disclosure. The organic EL display device 1 is used in an organic EL television set or the like. For example, in the organic EL display device 1, plural red organic EL elements 10R, plural green organic EL elements 10G, and plural blue organic EL elements 10B which will be all described later are disposed in a matrix in a display area 110 on a substrate 11. A signal line drive circuit 120 and a scanning line drive circuit 130 as drivers for image display are provided in the circumference of the display area 110.

Figure 2:
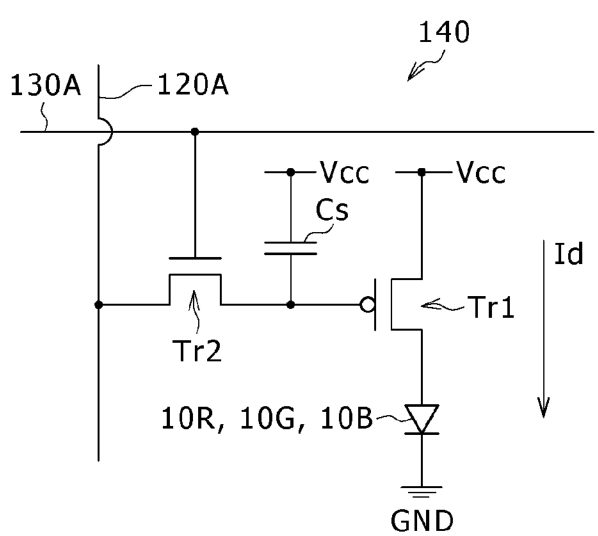
FIG. 2 is a circuit diagram showing a configuration of a part of a pixel drive circuit shown in FIG. 1.

A pixel drive circuit 140 is provided within the display area 110. FIG. 2 is a circuit diagram showing a configuration of a part of the pixel drive circuit 140. The pixel drive circuit 140 is an active type drive circuit formed in a lower layer of a lower electrode 14 which will be described later. That is to say, the pixel drive circuit 140 includes a drive transistor Tr1 and a write transistor Tr2, a capacitor (hold capacitor) Cs disposed between the drive transistor Tr1 and the write transistor Tr2, and a red organic EL element 10R (or a green organic EL element 10G, or a blue organic EL element 10B) which is connected in series with the drive transistor Tr1 between the first power source line (Vcc) and a second power source line (GND). Each of the drive transistor Tr1 and the write transistor Tr2 is composed of a general Thin Film Transistor (TFT). A structure of each of the drive transistor Tr1 and the write transistor Tr2, for example, either may be an inversely-staggered structure (a so-called bottom-gate type) or may be staggered structure (top-gate type), and thus is especially by no means limited.

In the pixel drive circuit 140, plural signal lines 120A are disposed in a column direction, and plural scanning lines 130A are disposed in a row direction. An intersection point between each signal line 120A and each scanning line 130A corresponds to any one (sub-pixel) of the red EL elements 10R, the green EL elements 10G, and the blue electroluminescence elements 10B. The signal lines 120A are connected to the signal line drive circuit 120. Thus, image signals are supplied from the signal line drive circuit 120 to source electrodes of the write transistors Tr2 through the signal lines 120A, respectively. The scanning lines 130A are connected to the scanning line drive circuit 130. Thus, scanning signals are successively supplied from the scanning line drive circuit 130 to gate electrodes of the write transistors Tr2 through the scanning lines 130A, respectively.

In addition, the red organic EL elements 10R each generating a red color light, the green organic EL elements 10G each generating a green color light, and a blue organic EL elements 10B each generating the blue color light are disposed in order in a matrix as a whole in the display area 110. It is noted that a combination of the red organic EL element 10R, the green organic EL element 10G, and the blue organic EL element 10B adjacent to one another composes one pixel.

Figure 3:
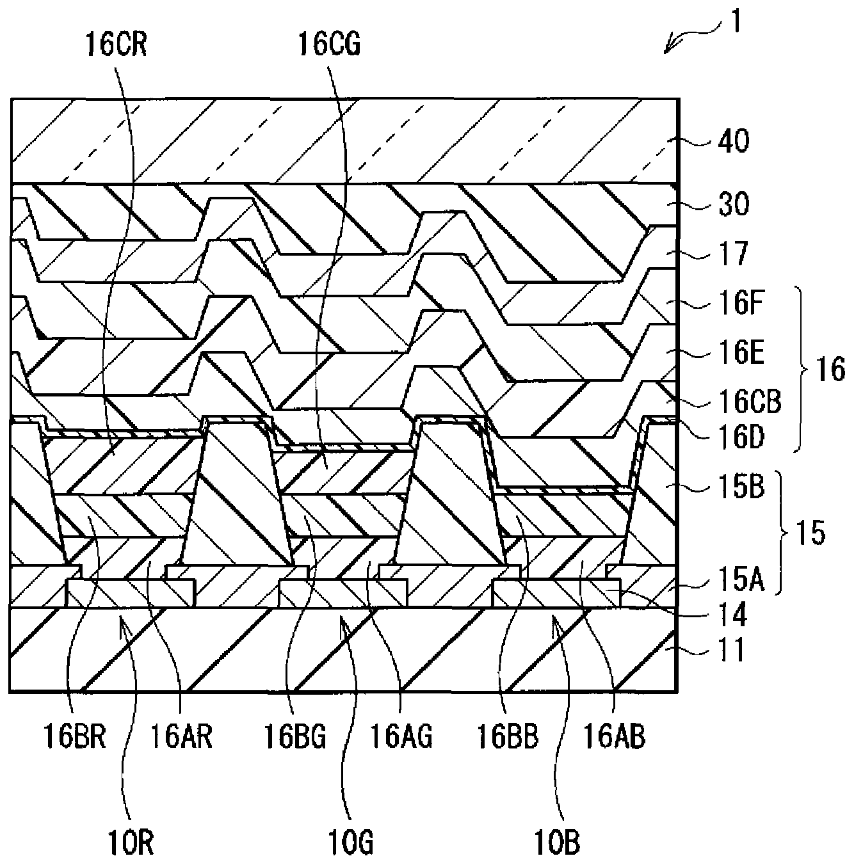
FIG. 3 is a cross sectional view showing a structure of a display area shown in FIG. 1.

FIG. 3 shows a cross-sectional structure of a part of the display area 110 shown in FIG. 1. Each of the red organic EL element 10R, the green organic EL element 10G, and the blue organic EL element 10B has a structure in which a lower electrode 14 serving as an anode, a partition wall 15, an organic layer 16 including a light emitting layer 16C (a red light emitting layer 16CR, a green light emitting layer 16CG, and a blue light emitting layer 16CB) which will be described later, and an upper electrode 17 serving as a cathode are laminated in this order from the substrate 11 side through the drive transistor Tr1, and a planarizing insulating film (not shown) of the pixel drive circuit 140 described above.

The red organic EL elements 10R, the green organic EL elements 10G, and the blue organic EL element 10B are all covered with a protective layer 30, and are all sealed by sticking a sealing substrate 40 made of a glass or the like over the entire surface of the protective layer 30 through an adhesive layer (not shown) made of a thermosetting resin, an ultraviolet curable resin or the like.

The substrate 11 is a supporting body in which the red organic EL elements 10R, the green organic EL elements 10G, and the blue organic EL elements 10B are arranged and formed on one principal surface side thereof, and may be a known substrate. For example, quartz, a glass, a metallic foil, a film or sheet made of a resin, or the like is used as the substrate 11. In particular, the quartz or the glass is preferable. In the case where the substrate 11 is made of the resin, the material thereof includes a methacrylic resin class typified by polymethyl methacrylate (PMMA), a polyester class such as polyethylene terephthalate (PET), polyethylene naphthalate (PEN) or polybutylene naphthalate (PBN), a polycarbonate resin or the like. However, it is necessary to make a lamination structure or a surface treatment for suppressing water permeability and gas permeability.

The lower electrode 14 is provided every red organic EL element 10R, green organic EL element 10G, and blue organic EL element 10B on the substrate 11. A thickness in a lamination direction (hereinafter simply referred to as "a thickness") of the lower electrode 14, for example, is 10 nm to 1,000 nm. A material of the lower electrode 14 includes a simple substance of a metallic element such as chromium (Cr), gold (Au), platinum (Pt), nickel (Ni), copper (Cu), tungsten (W) or silver (Ag) or an alloy thereof. In addition, the lower electrode 14 may have a lamination structure including a metallic film made of a simple substance any of these metallic elements or an alloy thereof, and a transparent conductive film made of an indium tin oxide (ITO), an indium zinc oxide (InZnO), an alloy of a zinc oxide (ZnO) and aluminum (Al) or the like. It is noted that when the lower electrode 14 is used as an anode, the lower electrode 14 is preferably made of a material having a high hole injection property. However, even in a material in which presence of an oxide thin film on a surface, and a hole injection barrier due to a small work function become a problem as with the aluminum (Al) alloy, the suitable hole injection layer 16A is provided, thereby being able to be used as the lower electrode 14.

The partition wall 15 is provided in order to ensure the insulating property between the lower electrode 14 and the upper electrode 17, and to make the light emission area into a desired shape. In addition, the partition wall 15 has a function as a partition wall as well when the application is carried out by utilizing an ink-jet method, a nozzle coating method or the like in a manufacturing process which will be described later. The partition wall 15, for example, has an upper partition wall 15B made of a photosensitive resin such as positive photosensitive polybenzoxazole or positive photosensitive polyimide on a lower partition wall 15A made of an inorganic insulating material such as $SiO_2$. An opening is provided in the partition wall 15 so as to correspond to the light emission area. It is noted that although the organic layer 16 and the upper electrode 17 may be formed not only over the opening, but also on the partition wall 15, the light emission is generated only in the opening of the partition wall 15.

The organic layer 16 of the red organic EL element 10R, for example, has a structure in which a hole injection layer 16AR, a hole transport layer 16BR, a red light emitting layer 16CR, a connection layer 16D, a blue light emitting layer 16CB, an electron transport layer 16E, and an electron injection layer 16F are laminated in this order from the lower electrode 14 side. The organic layer 16 of the green organic EL element 10G, for example, has a structure in which a hole injection layer 16AG, a hole transport layer 16BG, a green light emitting layer 16CG, the connection layer 16D, the blue light emitting layer 16CB, the electron transport layer 16E, and the electron injection layer 16F are laminated in this order from the lower electrode 14 side. The organic layer 16 of the blue organic EL element 10B, for example, has a structure in which a hole injection layer 16AB, a hole transport layer 16BB, the connection layer 16D, the blue light emitting layer 16CB, the electron transport layer 16E, and the electron injection layer 16F are laminated in this order from the lower electrode 14 side. Of them, the connection layer 16D, the blue light emitting layer 16CB, the electron transport layer 16E, and the electron injection layer 16F are provided as a common layer of the red organic EL element 10R, the green organic EL element 10G, and the blue organic EL element 10B.

The hole injection layers 16AR, 16AG, and 16AB are buffer layers for increasing the efficiencies of the injection of the holes into the light emitting layers 16CR, 16CG, and 16CB, and preventing the leakage. Also, the hole injection layers 16AR, 16AG, and 16AB are provided every red organic EL element 10R, green organic EL element 10G, and blue organic EL element 10B on the lower electrode 14.

A thickness of each of the hole injection layers 10AR, 10AG, and 16AB, for example, is preferably in the range of 5 to 100 nm, and more preferably in the range of 8 to 50 nm. Materials composing the hole injection layers 16AR, 16AG, and 16AB may be suitably selected in relation to the materials of the electrodes and the adjacent layers. Thus, the materials composing the hole injection layers 16AR, 16AG, and 16AB include polyaniline, polythiophene, polypyrrole, polyphenylenevinylene, polythienylenevinylene, polyquinoline, polyquinoxaline, a derivative thereof, a conductive high-molecular material such as a polymer containing therein an aromatic amine structure in a main chain or a side chain, metal phthalocyanine (such as copper phthalocyanine), carbon, and the like.

When the material used in each of the hole injection layers 16AR, 16AG, and 16AB is a high-molecular material, all it takes is that a weight-average molecular weight (Mw) of the high-molecular material is in the range of 5,000 to 300,000, and especially, preferably in the range of about 10,000 to about 200,000. In addition, although about 2,000 to about 10,000 oligomers may be used, when Mw is smaller than 5,000, there is the possibility that the hole injection layer is dissolved when the layers in and after the hole transport layer are formed. In addition, when Mw exceeds 300,000, there is the possibility that the material is gelatinized, and the film deposition becomes difficult.

A typical conductive high-molecular material used as the material composing each of the hole injection layers 16AR, 16AG, and 16AB, for example, includes polydioxythiophene such as polyaniline, oligoaniline, and poly(3,4-ethylenedioxythiophene) (PEDOT). In addition thereto, the typical conductive high-molecular material includes a polymer offered commercially as Nafion (registered trademark) manufactured by H.C. Stark Ltd., or a polymer offered commercially in the form of a dissolution form as Liquion (registered trademark), and ELsource (registered trademark) manufactured by NISSAN CHEMICAL INDUSTRIES, LTD., Berazol (registered trademark) as a conductive polymer manufactured by Soken Chemical & Engineering Co., Ltd., and the like.

The hole transport layers 16BR, 16BG, and 16BB of the red organic EL element 10R, the green organic EL element 10G, and the blue organic EL element 10B are provided in order to increase the efficiencies of the transport of the holes to the red light emitting layer 16CR, the green light emitting layer 16CG, and the blue light emitting layer 16CB, respectively. The hole transport layers 16BR, 16BG, and 16BB are provided every red organic EL element 10R, green organic EL element 10G, and blue organic EL element 10B on the hole injection layers 16AR, 16AG, and 16AB.

Although depending on the entire structure of the element, a thickness of each of the hole transport layers 16BR, 16BG, and 16BB, for example, is preferably in the range of 10 to 200 nm, and more preferably in the range of 15 to 150 nm. A light emitting material which can be dissolved into an organic solvent, for example, polyvinylcarbazole, polyfluorene, polyaniline, polysilane or a derivative thereof, a polysiloxane derivative having aromatic amine in a side chain or a main chain, polythiophene, and a derivative thereof, polypyrrole, and the like can be used as the high-molecular materials composing the hole transport layers 16BR, 16BG, and 16BB.

More preferably, a high-molecular material can be given which is excellent in adhesiveness to the hole injection layers 16AR, 16AG, and 16AB, and the light emitting layers 16CR, 16CG, and 16CB of R, G, and B which the hole transport layers 16BR, 16BG, and 16BB contact on a lower side and an upper side, respectively, which has the property of being able to be dissolved into the organic solvent, and which is expressed by the general formula (1):

(1)

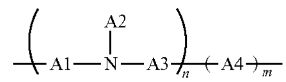

in which A1 to A4 are groups in each of which 1 to 10 aromatic hydrocarbon groups or 1 to 10 derivative thereof are coupled independently of one another, or 1 to 15 heterocyclic groups or 1 to 15 derivatives thereof are coupled to one another, m and n are each an integral number of 0 to 10,000, and (n+m) is an integral number of 10 to 20,000.

In addition, the order of arrangement of an n part and an m part is arbitrary and, for example, may be any of a random polymer, an alternate copolymer, a cyclic copolymer, and a block copolymer. Moreover, each of n and m is preferably an integral number of 5 to 5,000, and more preferably an integral number of 10 to 3,000. Also, (n+m) is preferably an integral number of 10 to 10,000, and more preferably an integral number of 20 to 6,000.

In addition, an concrete example of the aromatic hydrocarbon group represented by A1 to A4 in the compound expressed by the general formula (1), for example, includes benzene, fluorene, naphthalene, anthracene or a derivative thereof, or a phenylenevinylene derivative, a styryl derivative, and the like. Also, a concrete example of the heterocyclic group, for example, includes thiophene, pyridine, pyrrol, carbazole or a derivative thereof.

In addition, when A1 to A4 in the compound expressed by the general formula (1) have a substituent, the substituent, for example, is a normal-chain or branched alkyl group or alkenyl group having a carbon number of 1 to 12. Specifically, the substituent is preferably a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, an allyl group or the like.

Although as a concrete example of the compound shown in the general formula (1), for example, compounds expressed by the following structural formulas (1-1) to (1-3): poly[(9,9-dioctyl fluorenyl-2,7-diyl)-co-(4,4'-(N-(4-sec-butyl phenyl))diphenylamine)] (TFB, the structural formula (1-1)); poly[(9,9-dioctyl fluoreny-2,7-diyl)-alt-co-(N,N'-bis{4-butylphenyl}-benzidine N,N'-{1,4-diphenylene})] (the structural formula (1-2)); and poly[(9,9-dioctyl fluorenyl-2,7-diyl)] (PFO, the structural formula (1-3)) are preferable, the present disclosure is by no means limited thereto.

(1-1)

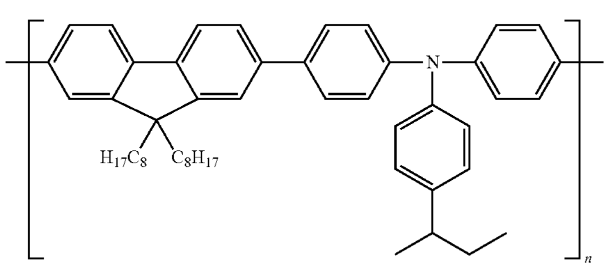

-continued (1-2)

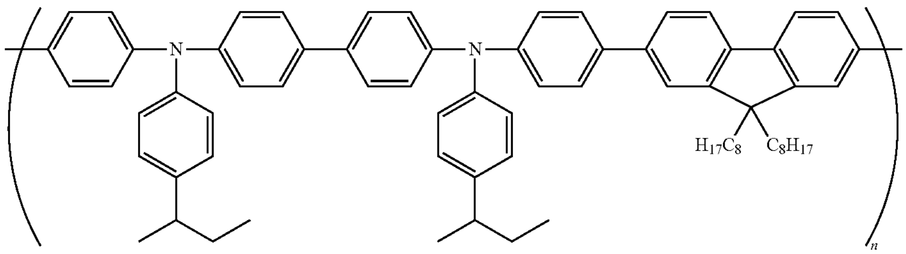

(1-3)

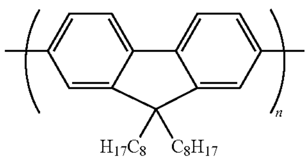

It is noted that in the first embodiment, up to the hole injection layers 16AR, 16AG, and 16AB, the hole transport layers 16BR, 16BG, and 16BB, and the red light emitting layer 16CR, and the green light emitting layer 16CG are formed by utilizing the application method. For this reason, compounds which are cross-linked and insolubilized into the solvent through the heat treatment or the like after completion of the formation of the layers described above need to be used as the hole injection layers 16AR, 16AG, and 16AB, and the hole transport layers 16BR, 16BG, and 16BB.

In each of the red light emitting layer 16CR and the green light emitting layer 16CG, the electron and the hole are recombined with each other by application of the electric field, thereby emitting the light. Although depending on the entire structure of the element, preferably, a thickness of each of the red light emitting layer 16CR and the green light emitting layer 16CG, for example, is in the range of 10 to 200 nm, and more preferably in the range of 15 to 150 nm. The red light emitting layer 16CR and the green light emitting layer 16CG are made of low-molecular materials which emit phosphorescences, respectively. The fluorescence material which has been used in the past directly returns from an excited state, that is, a singlet state to a ground state, thereby emitting a light. Since the singlet state is unstable because of a high energy thereof, a life is short. On the other hand, the phosphorescence luminescent material returns from the singlet state to the ground state through a slightly stable intermediate state, that is, a triplet state. Since the triplet state is a state to which the state transits from the singlet state, a life of the phosphorescence is longer than that of the fluorescence.

It is noted that here, the low-molecular material means one which is other than a compound composed of molecules of a polymer or a condensed body having a high molecular weight, and generated by repeating the same reaction or a similar reaction in a chain reaction by a low-molecular compound, and also means one whose molecular weight is substantially single. In addition, a new chemical coupling between molecules due to heating is not generated in the low-molecular material described above and thus the low-molecular material described above exists in the form of a mono-molecule. A weight-average molecular weight (Mw) of such a low-molecular material is preferably equal to or smaller than 10,000.

Specifically, a material composing each of the red light emitting layer 16CR and the green light emitting layer 16CG includes phosphorescence host materials expressed by the general formulas (2) and (3) below and each containing therein a phosphorescence dopant:

(2)

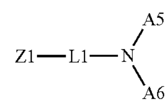

in which Z is either a nitrogen-containing hydrocarbon group or a derivative thereof, L1 is a group into which 1 to 4 bivalent aromatic cyclic groups are coupled, specifically, a group into which 1 to 4 bivalent aromatic rings are linked or a derivative thereof, and A5 and A6 are aromatic hydrocarbon groups or aromatic heterocyclic ring groups, or derivatives thereof, but A5 and A6 may be coupled to each other to form a ring structure, and (3)

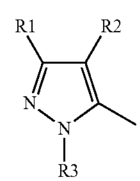

in which R1 to R3 are independently hydrogen atoms, aromatic hydrocarbon groups into each of which 1 to 3 aromatic rings are condensed or derivatives thereof, aromatic hydrocarbon groups into each of which 1 to 3 aromatic rings each having a hydrocarbon group having a carbon number of 1 to 6 are condensed or derivatives thereof, or aromatic hydrocarbon groups into each of which 1 to 3 aromatic rings each having an aromatic hydrocarbon group having a carbon number of 6 to 12 or derivatives thereof.

A concrete example of the compound expressed by the general formula (2) includes compounds expressed by the following structural formulas (2-1) to (2-96). It is noted that although the compounds having a carbazole group and an indole group, for example, are given as the nitrogen-containing hydrocarbon groups coupled to L1 here, the present disclosure is by no means limited thereto. For example, an imidazole group may be used.

(2-1)
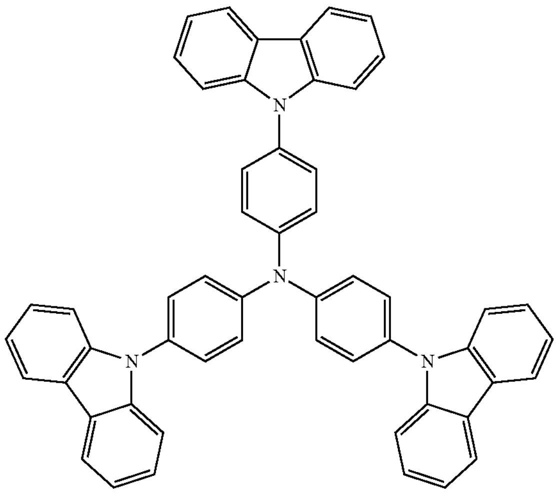
(2-2)
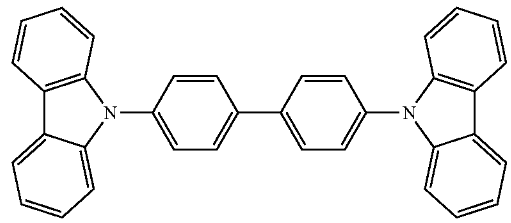
(2-3)
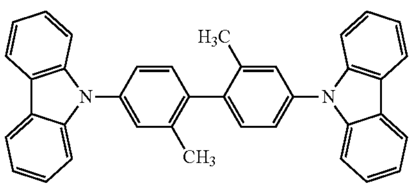
(2-4)
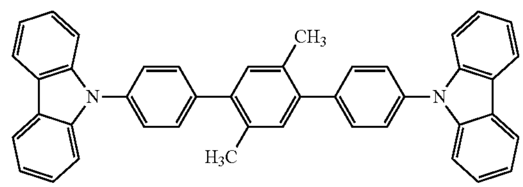
(2-5)
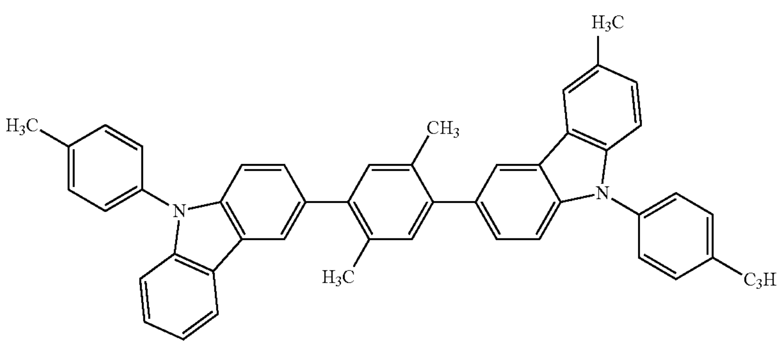
(2-6)
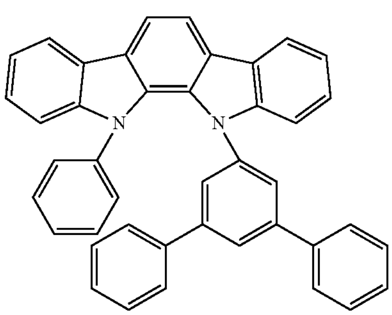
(2-7)
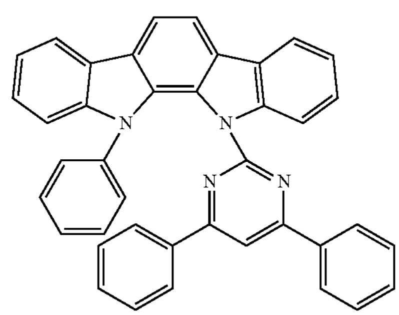

-continued
(2-8)
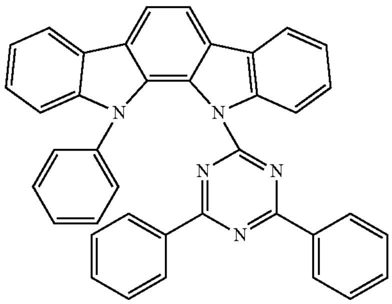
(2-9)
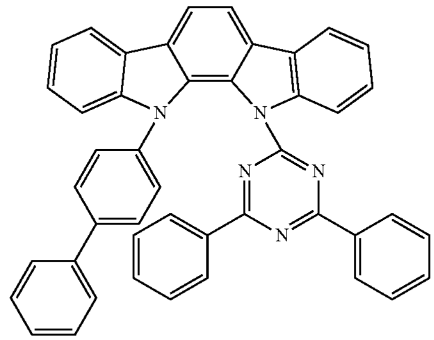
(2-10)
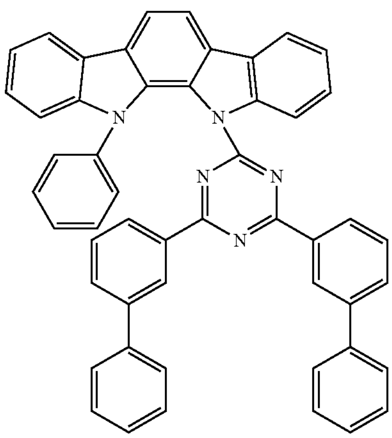
(2-11)
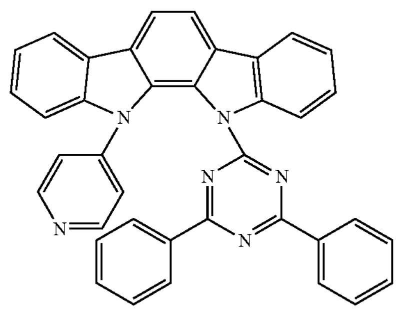
(2-12)
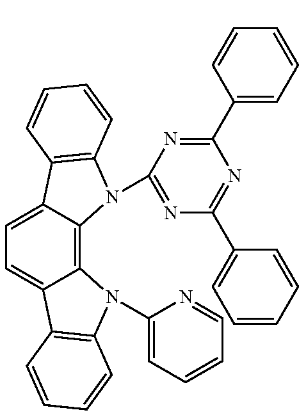
(2-13)
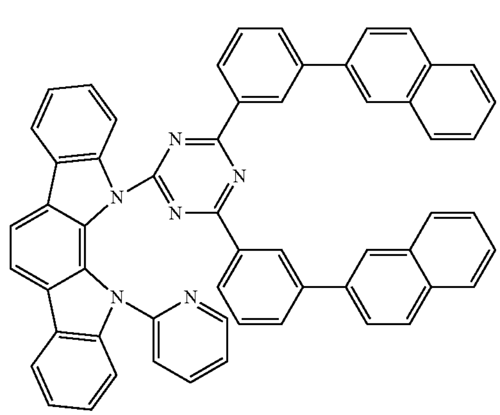

-continued
(2-14)
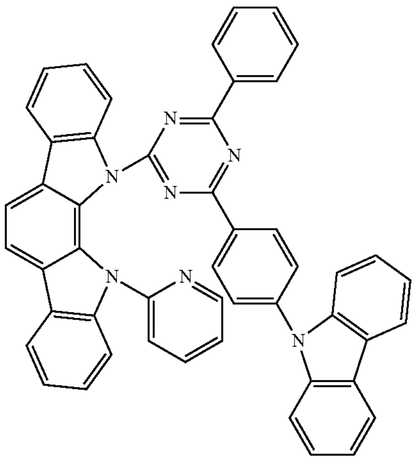
(2-15)
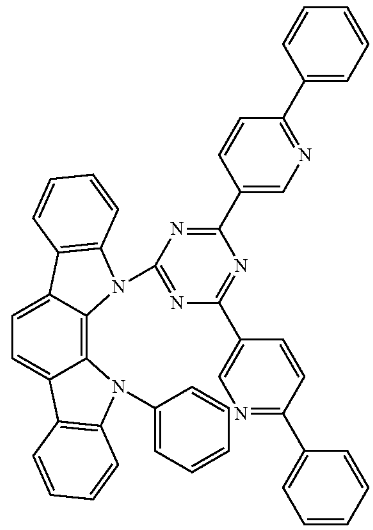
(2-16)
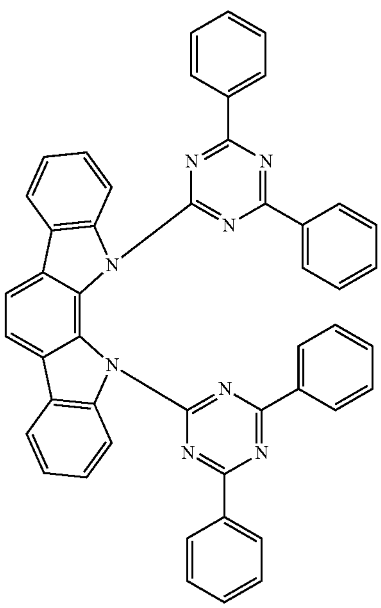
(2-17)
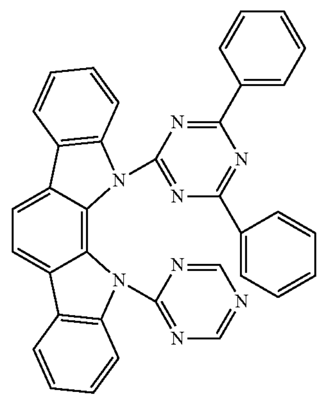
(2-18)
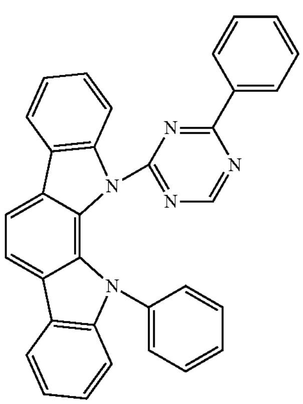
(2-19)
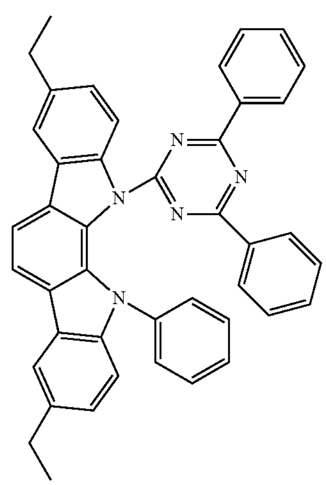

-continued
(2-20)
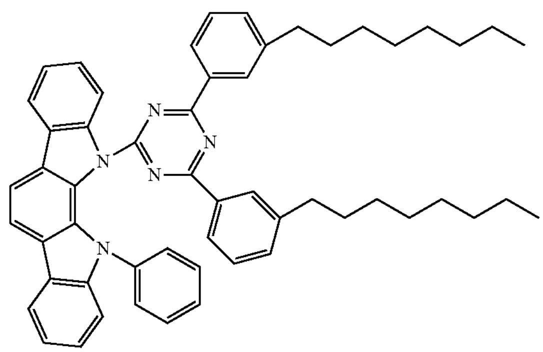
(2-21)
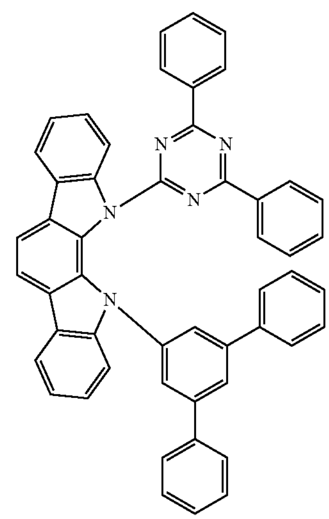
(2-22)
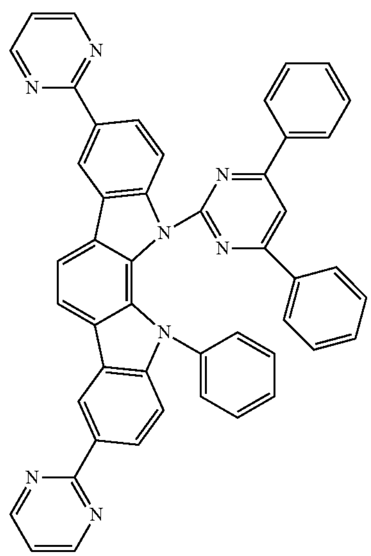
(2-23)
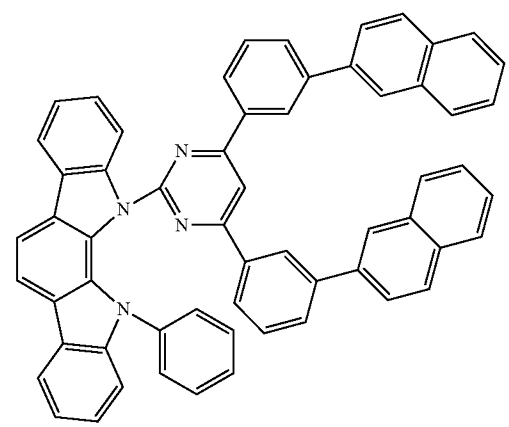
(2-24)
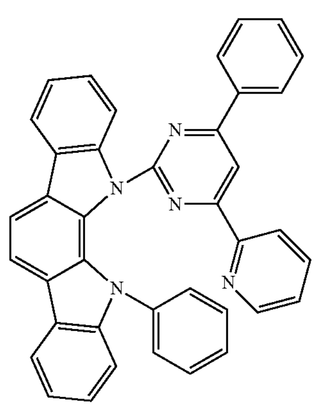
(2-25)
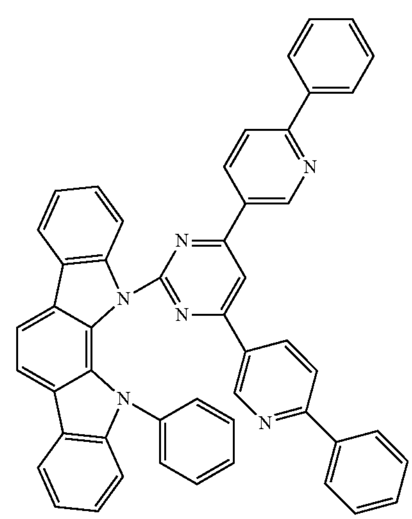

-continued
(2-26)
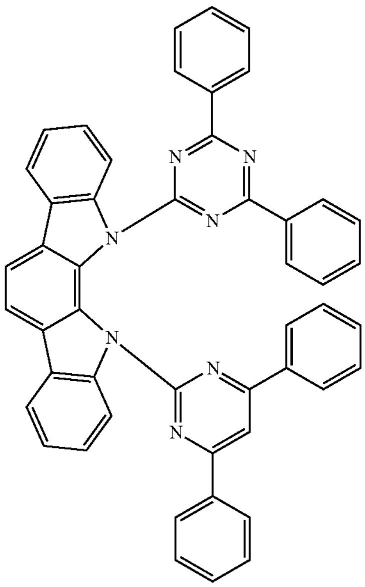
(2-27)
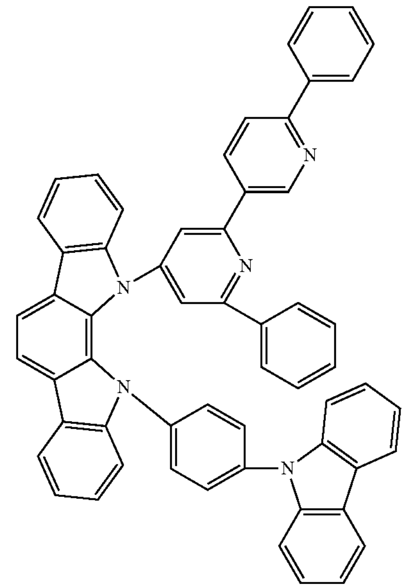
(2-28)
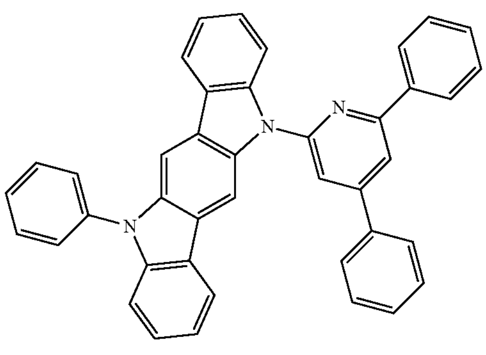
(2-29)
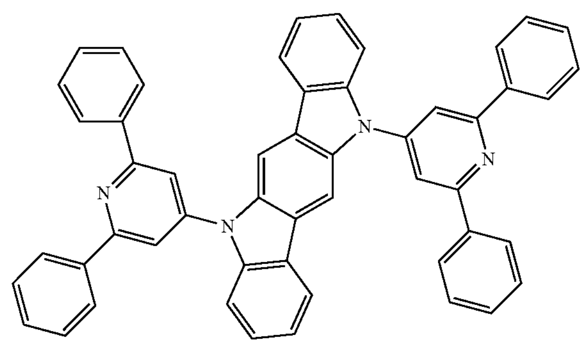
(2-30)
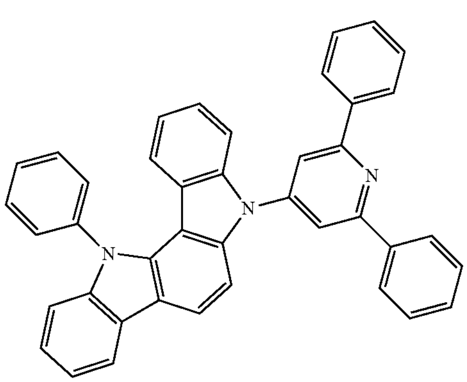
(2-31)
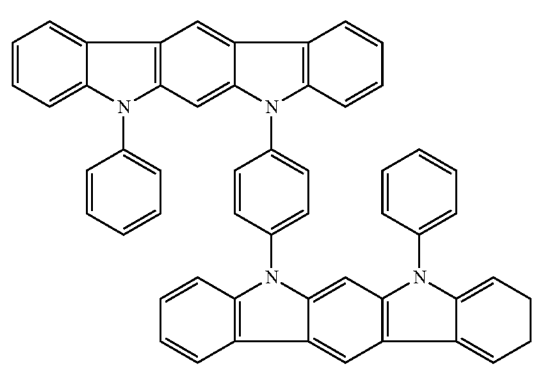

-continued
(2-31)
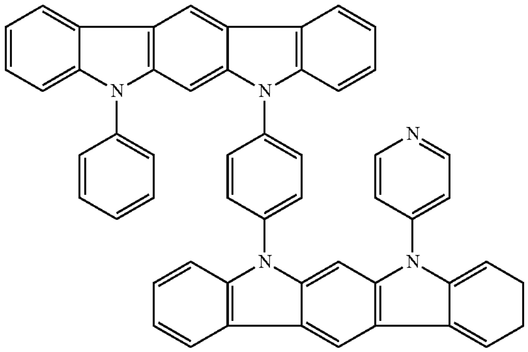
(2-32)
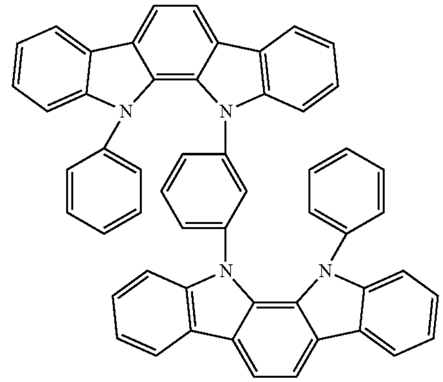
(2-33)
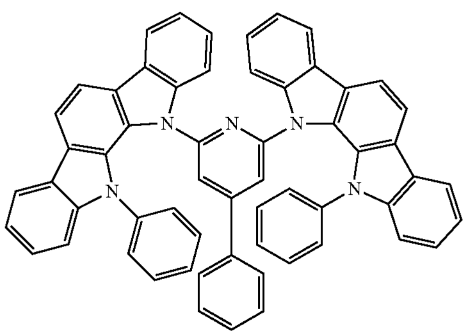
(2-34)
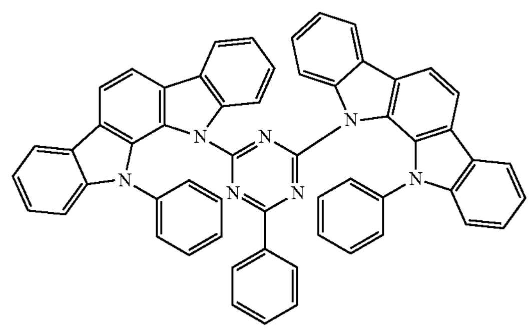
(2-35)
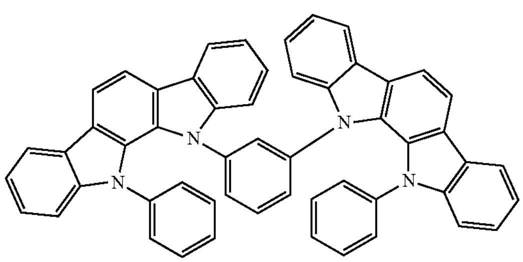
(2-36)
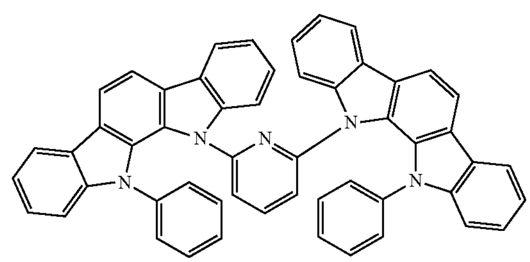
(2-37)
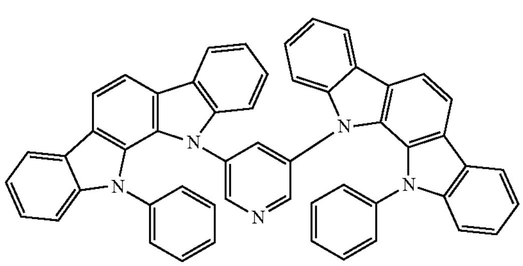
(2-38)
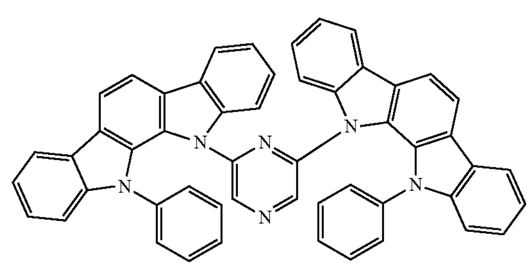
(2-40)
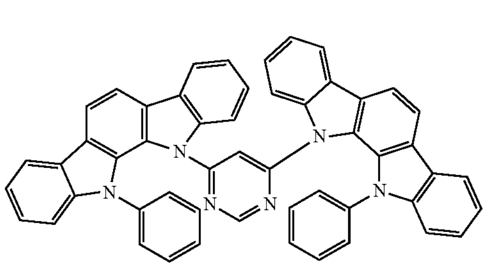
(2-41)
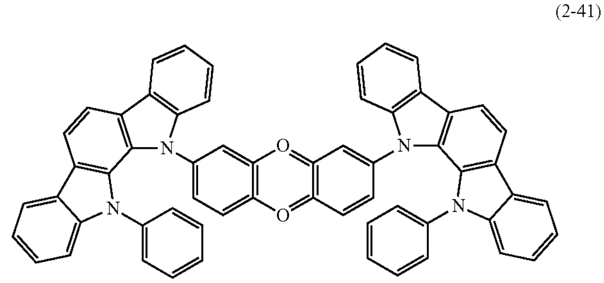

-continued
(2-42)
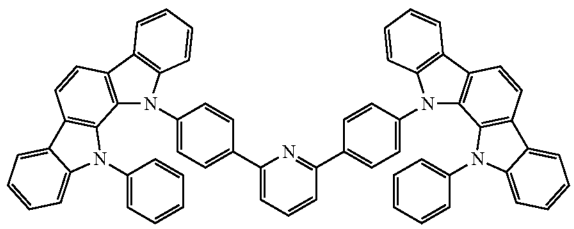
(2-43)
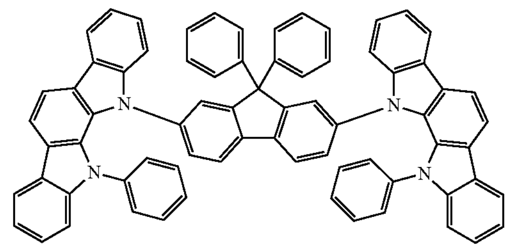
(2-44)
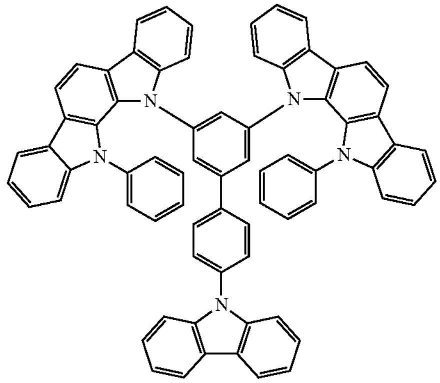
(2-45)
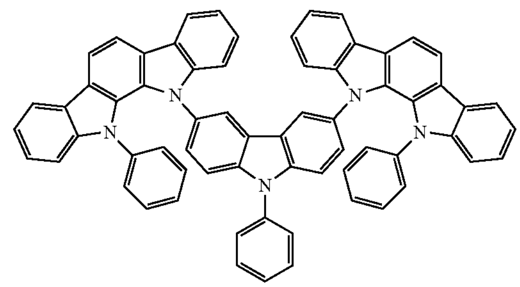
(2-46)
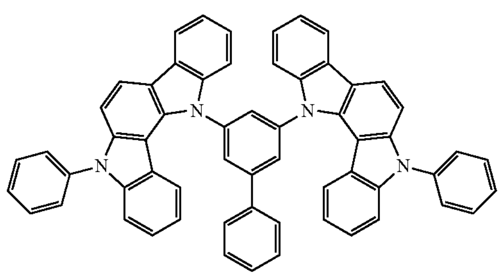
(2-47)
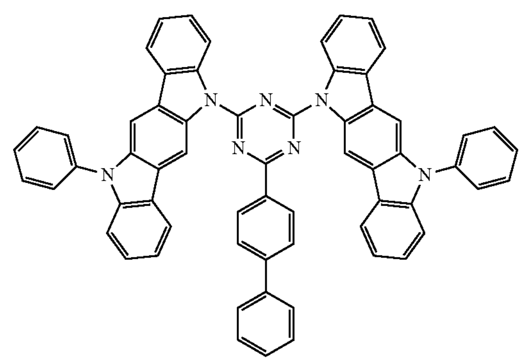
(2-48)
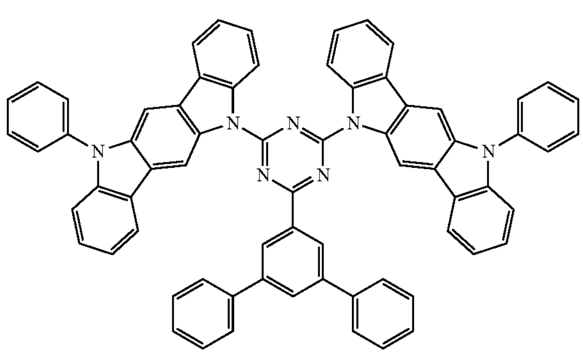
(2-49)
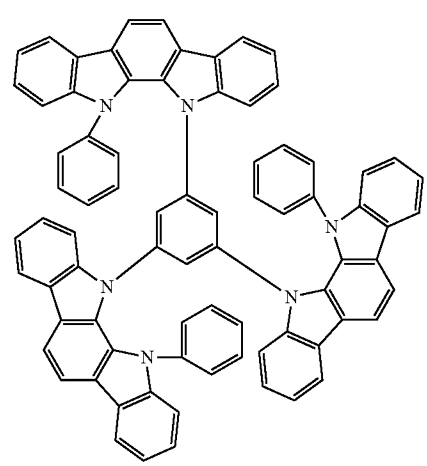

-continued
(2-50)
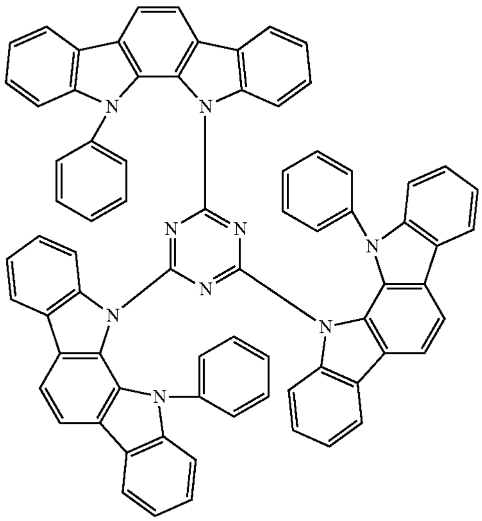
(2-51)
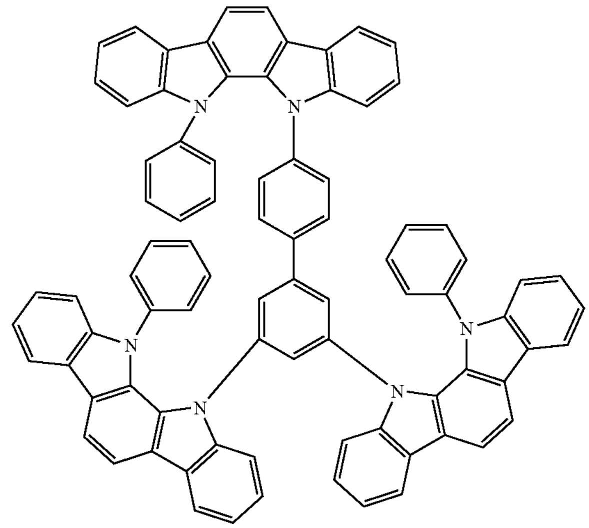
(2-52)
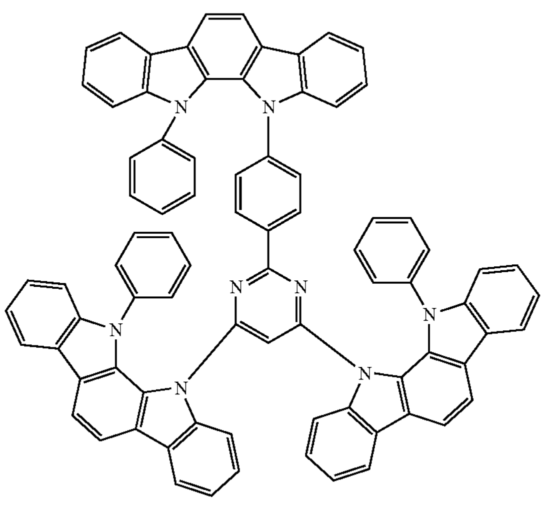
(2-53)
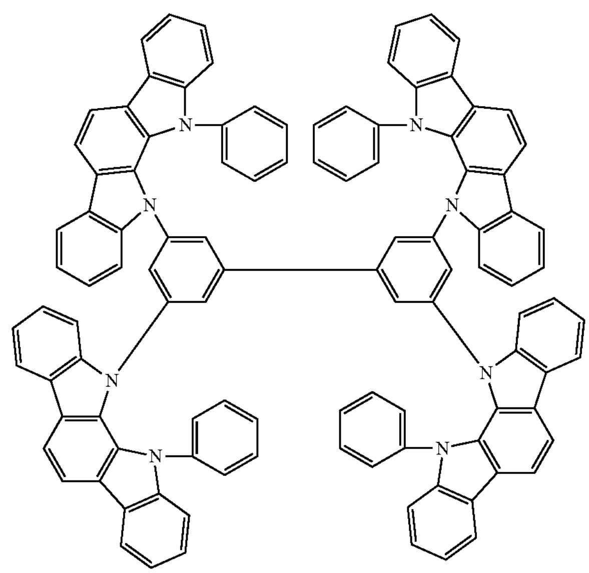

-continued
(2-54)
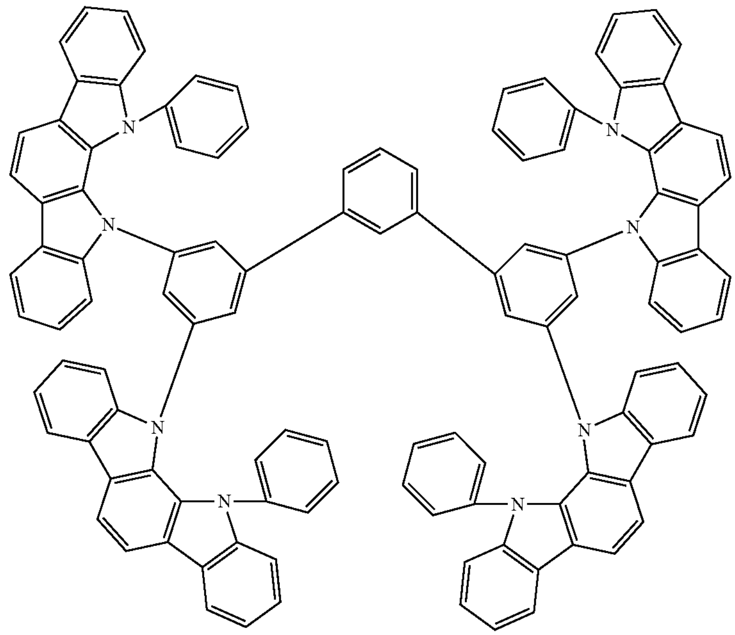
(2-55)
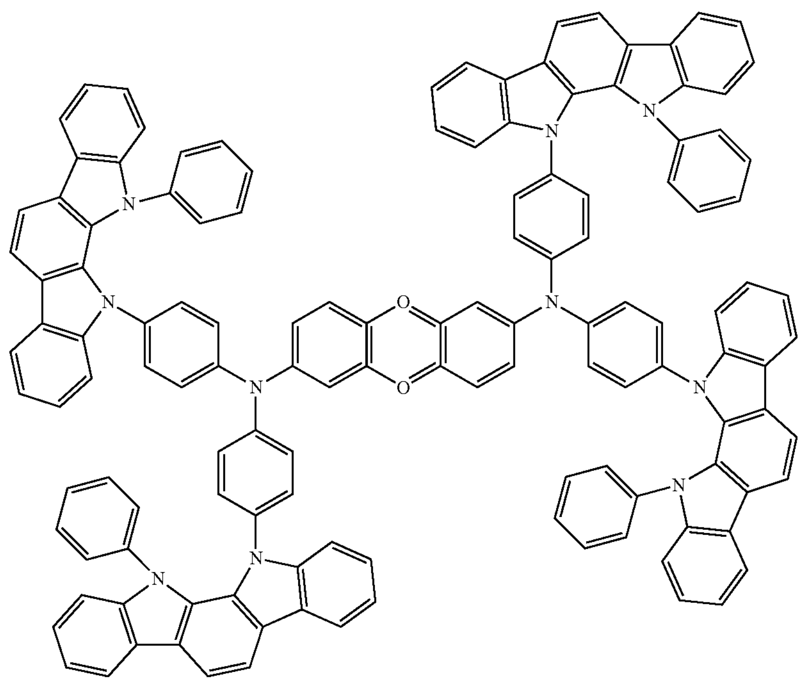

-continued
(2-56)
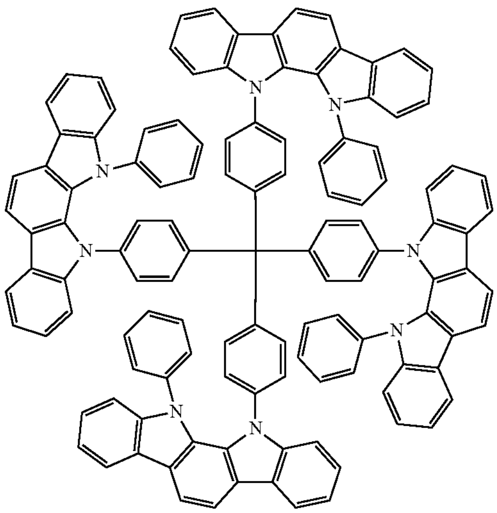
(2-57)
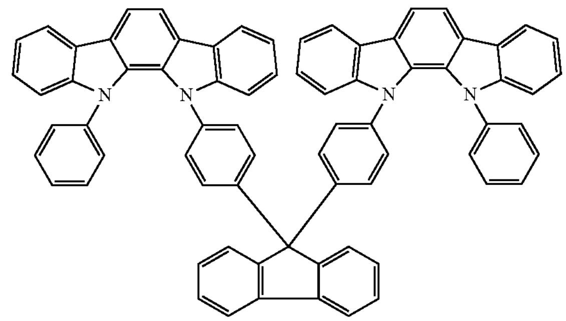
(2-58)
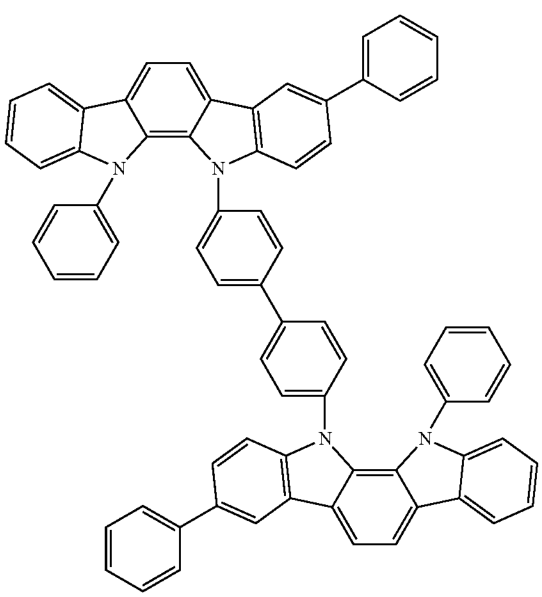
(2-59)
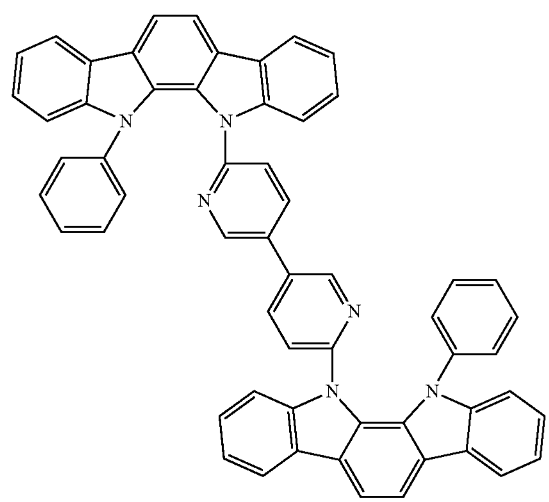
(2-60)
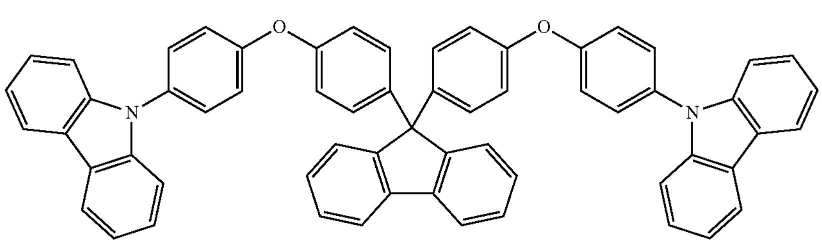
(2-61)
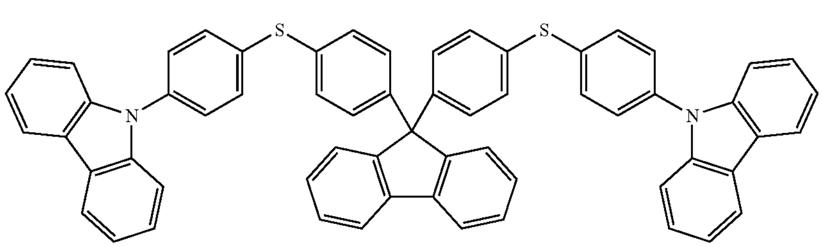

-continued
(2-62)
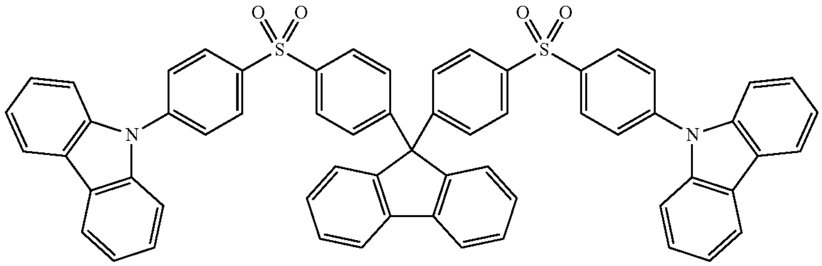
(2-63)
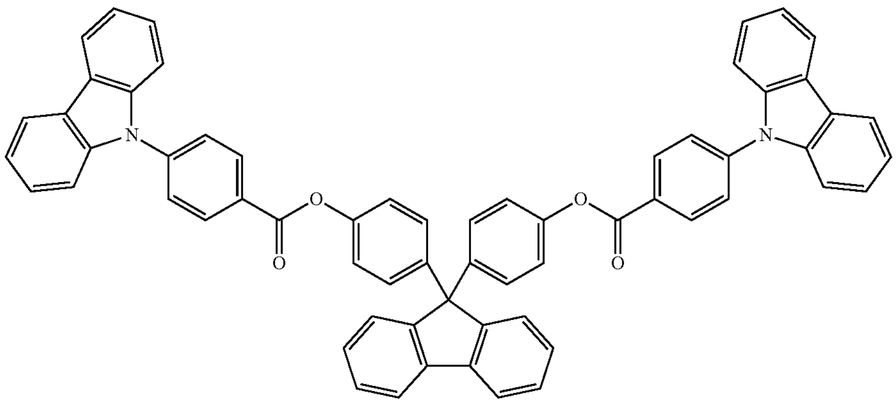
(2-64)
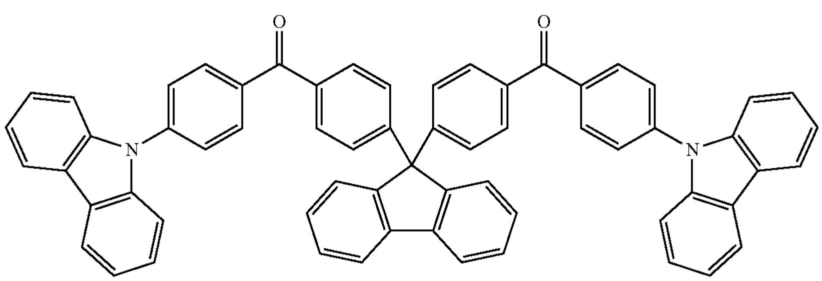
(2-65)
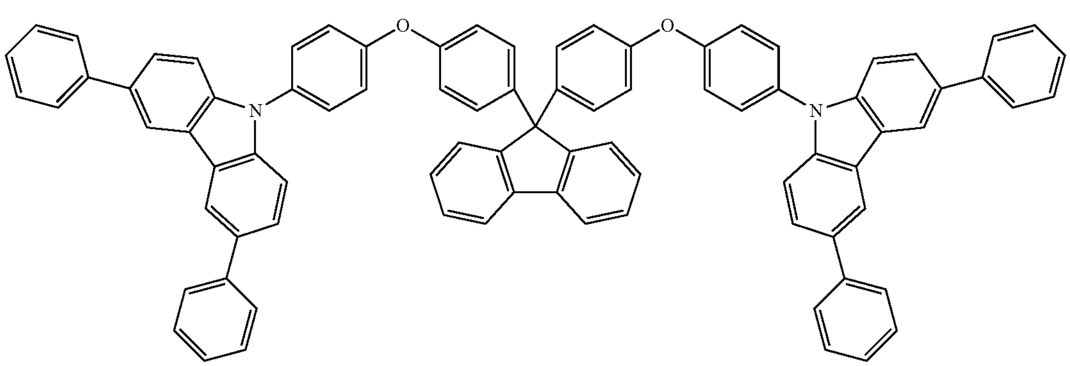

-continued
(2-66)
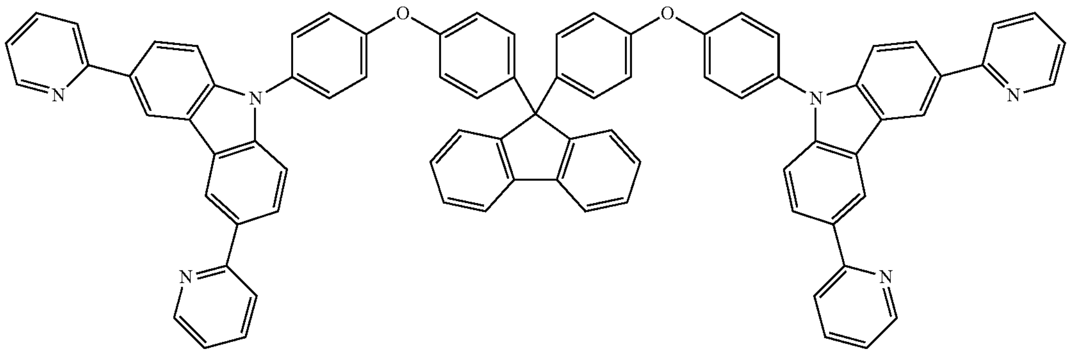
(2-67)
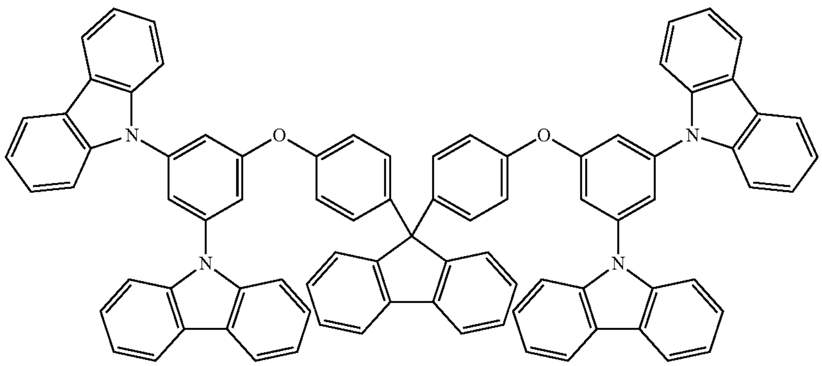
(2-68)
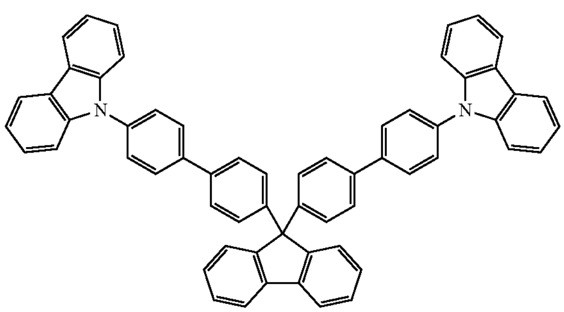
(2-69)
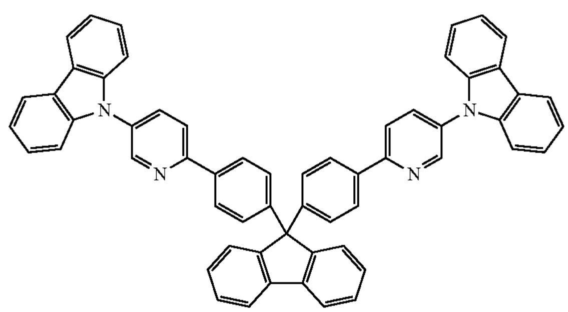
(2-70)
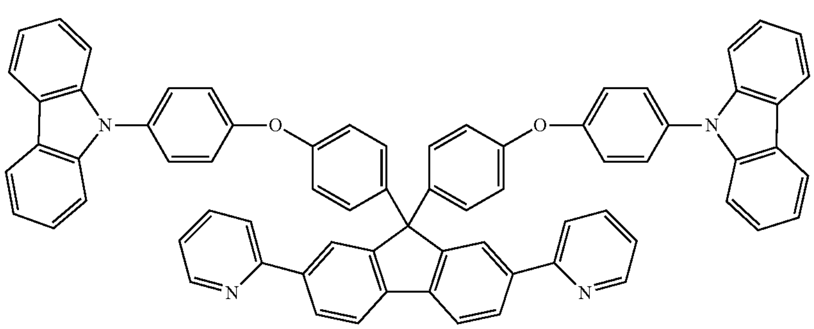

-continued
(2-71)
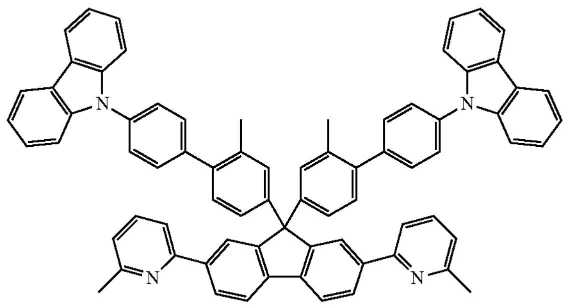
(2-72)
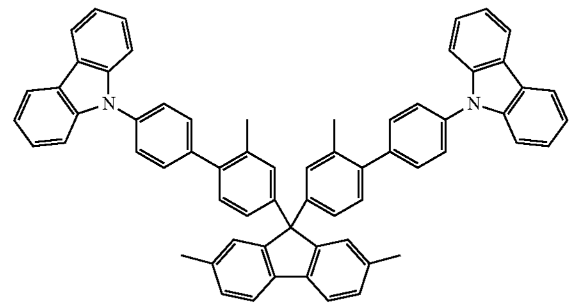
(2-73)
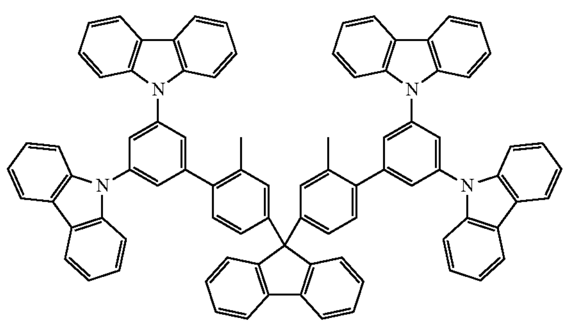
(2-74)
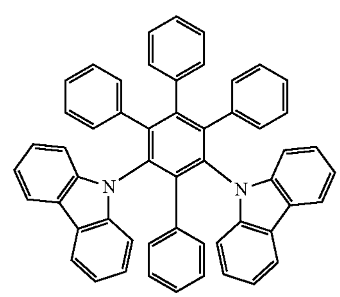
(2-75)
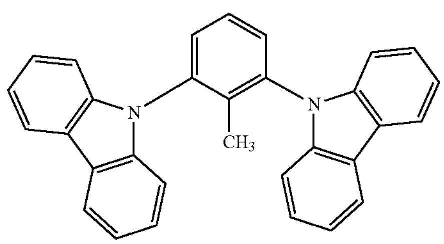
(2-76)
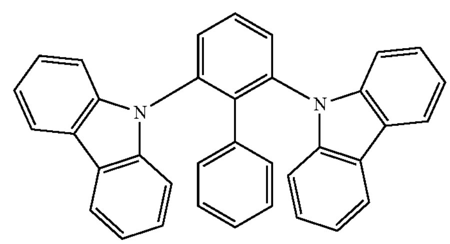
(2-77)
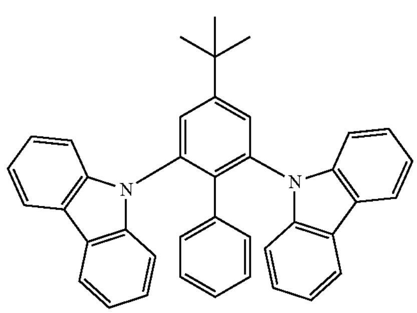
(2-78)
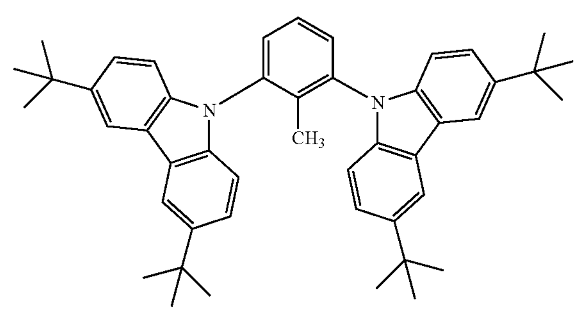
(2-79)
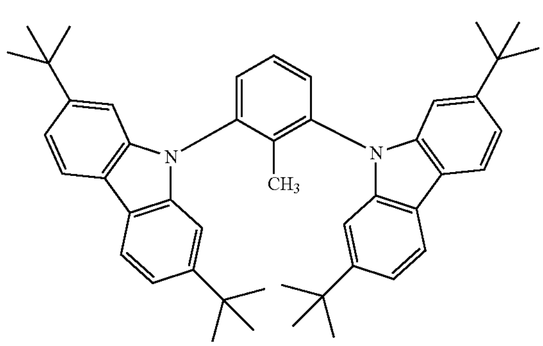
(2-80)
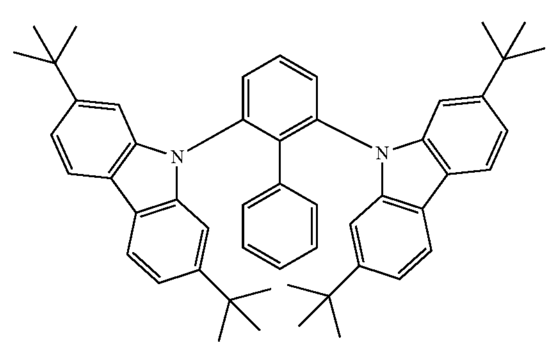

-continued
(2-81)
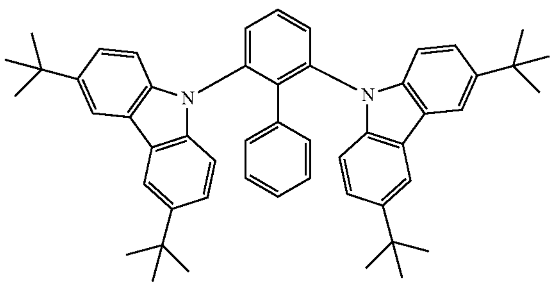
(2-82)
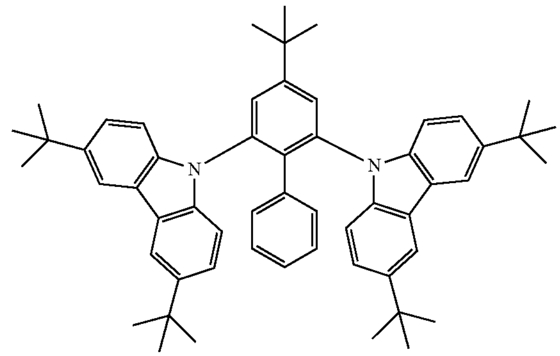
(2-83)
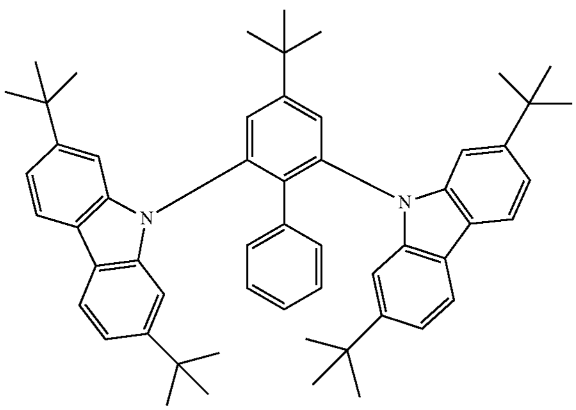
(2-84)
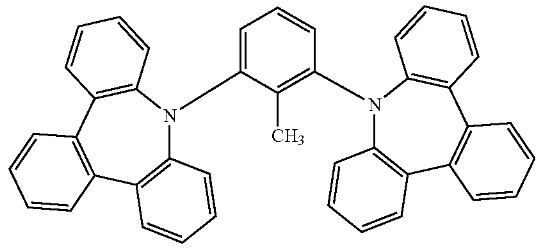
(2-85)
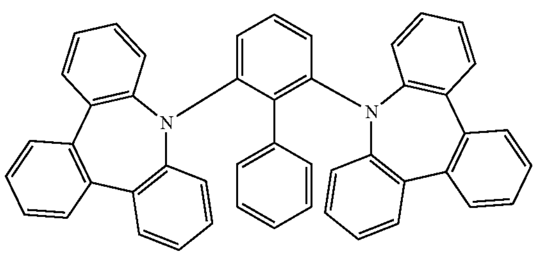
(2-86)
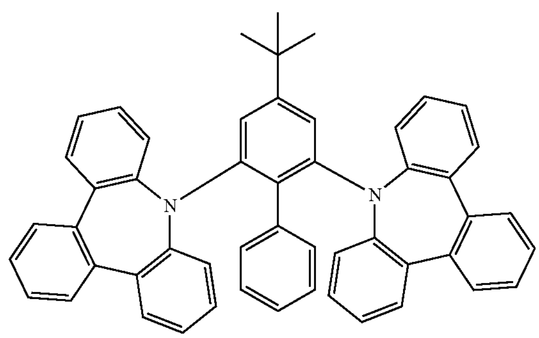
(2-87)
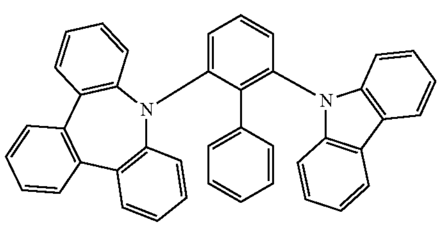
(2-88)
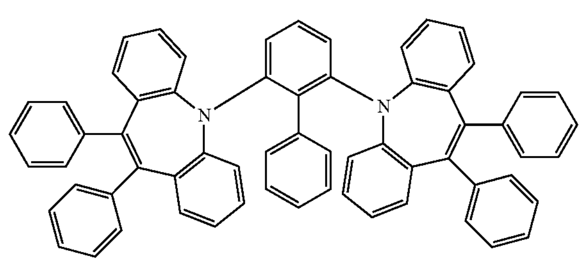

-continued
(2-89)
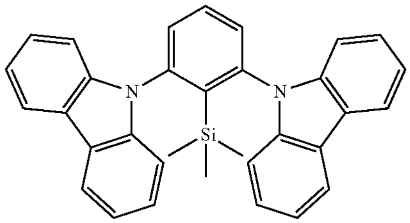
(2-90)
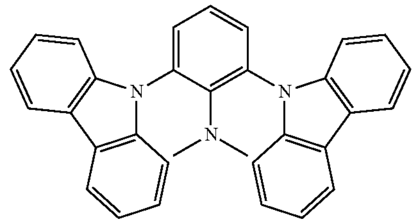
(2-91)
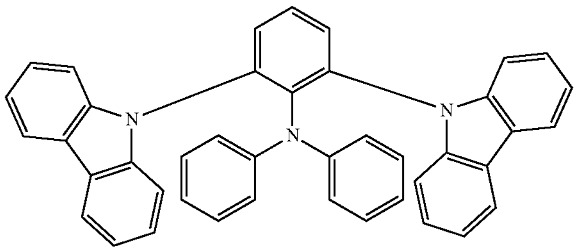
(2-92)
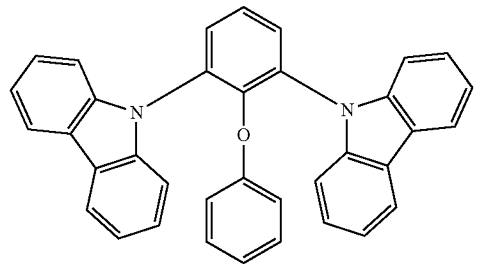
(2-93)
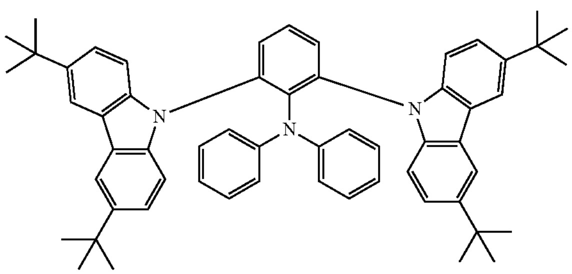
(2-94)
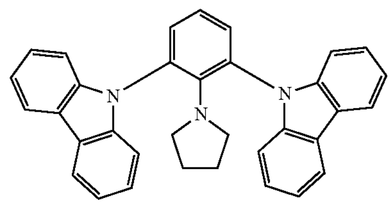
(2-95)
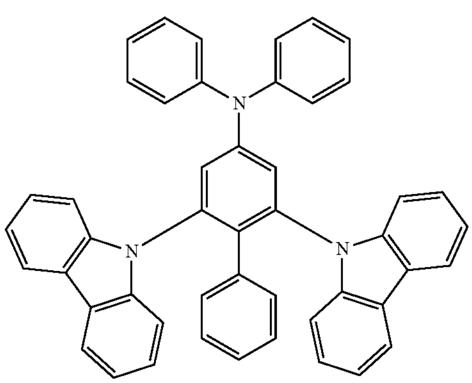
(2-96)
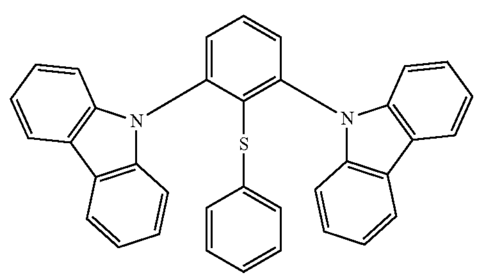
A concrete example of the compound expressed by the general formula (3) includes compounds expressed by the following structural formulas (3-1) to (3-11), and the like:

(3-1)
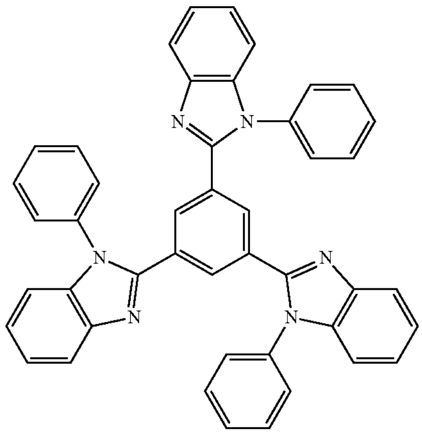
(3-2)
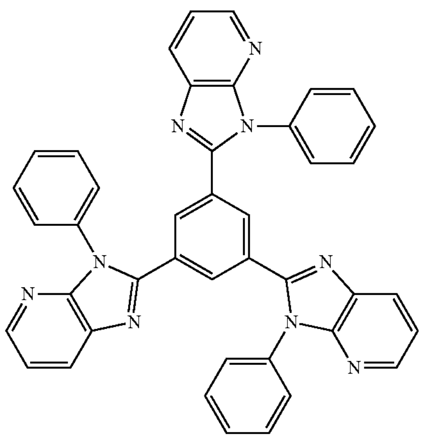
(3-3)
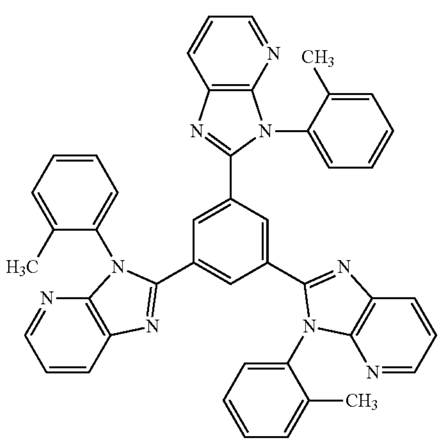
-continued
(3-4)
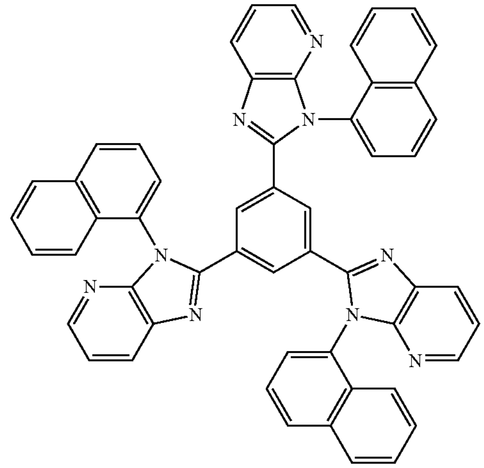
(3-5)
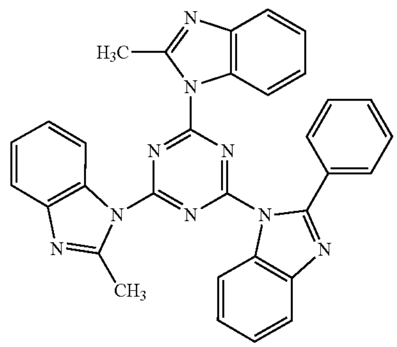
(3-6)
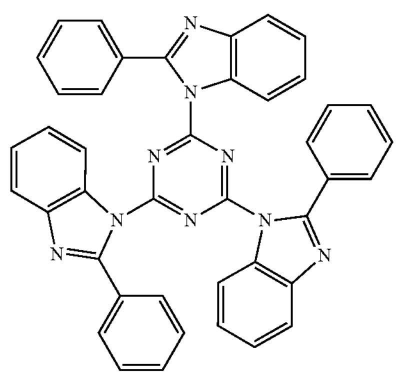
(3-7)
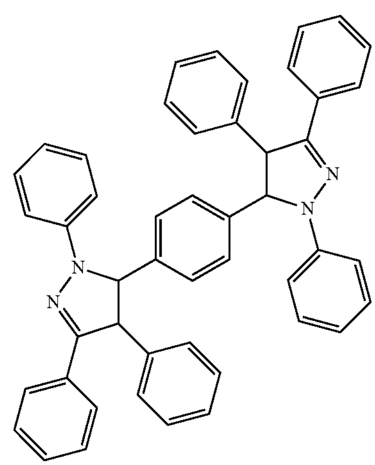

-continued (3-8)

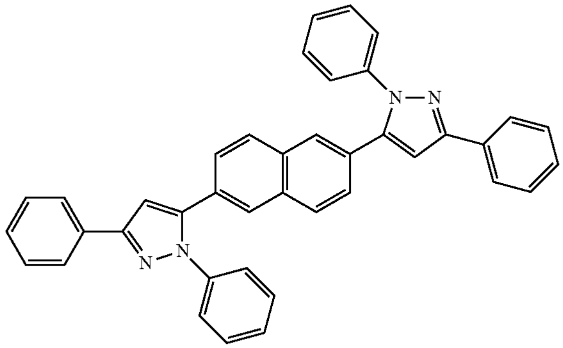

(3-9)

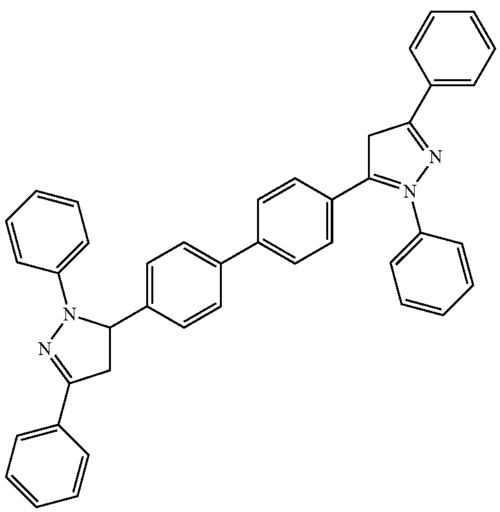

(3-10)

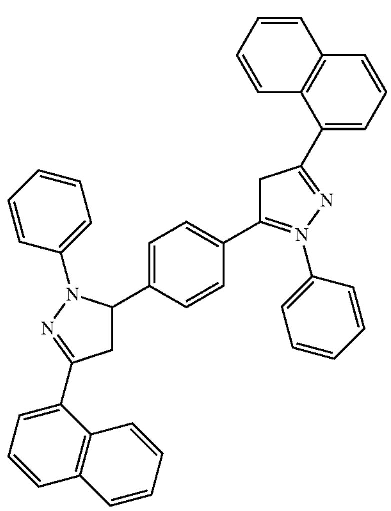

-continued (3-11)

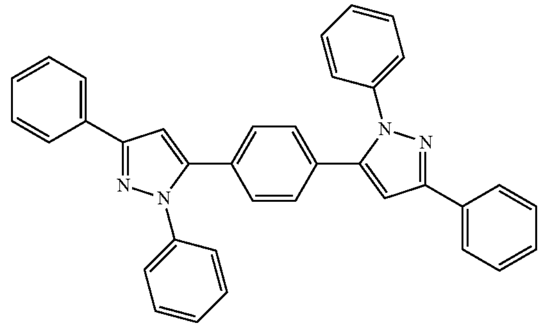

A dopant with which the phosphorescence host material is doped includes a phosphorescence metallic complex compound, specifically, an ortho metalated complex or a porphyrin metallic complex. Metals selected from 7 to 11 groups in a periodic table, for example, ruthenium (Ru), rhodium (Rh), palladium (Pd), silver (Ag), rhenium (Re), osmium (Os), iridium (Ir), platinum (Pt), and gold (Au) are preferably used as central metals. It is noted that one to two or more kinds of dopants described above may be used. In addition, dopants which are different in central metal from one another may be combined with one another.

Although the ortho metalated complex, for example, includes compounds expressed by the structural formulas (4-1) to (4-12), respectively, the present disclosure is by no means limited thereto.

(4-1)

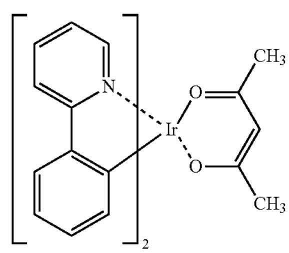

(4-2)

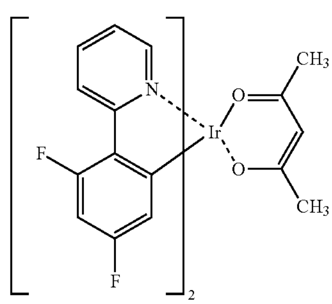

-continued
(4-3)
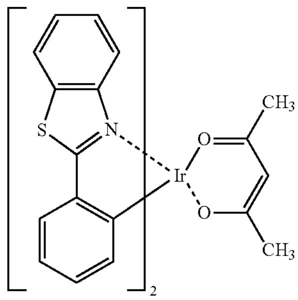
(4-4)
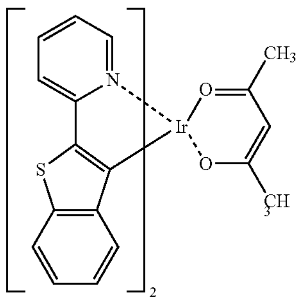
(4-5)
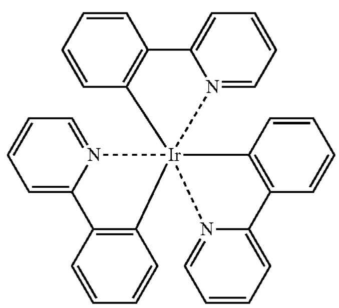
(4-6)
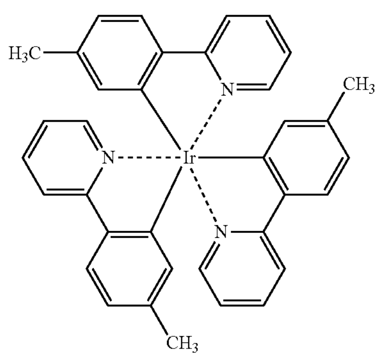
(4-7)
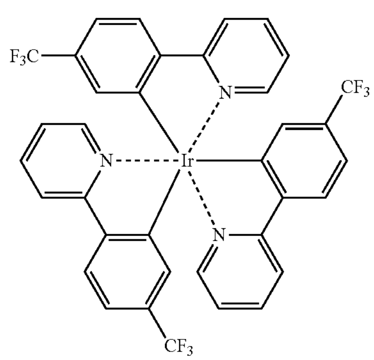
-continued
(4-8)
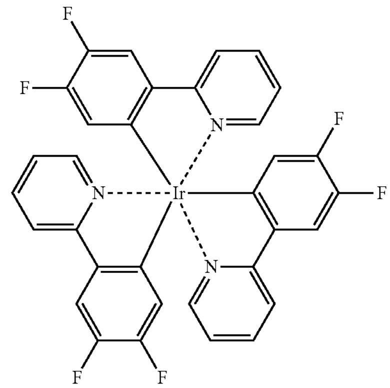
(4-9)
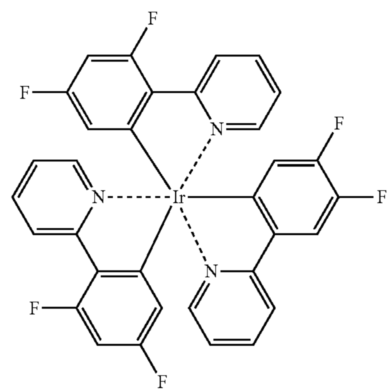
(4-10)
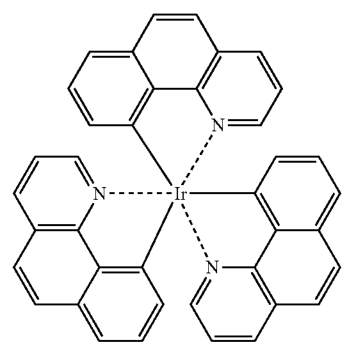
(4-11)
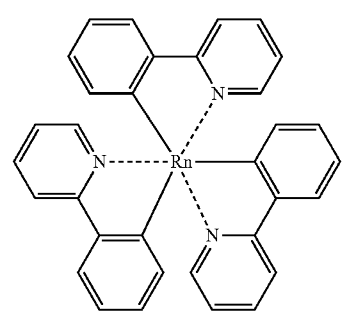

-continued
(4-12)
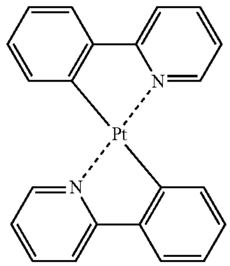
Although the porphyrin metallic complex, for example, includes compounds expressed by the structural formulas (5-1) to (5-7), respectively, the present disclosure is by no means limited thereto.
(5-1)
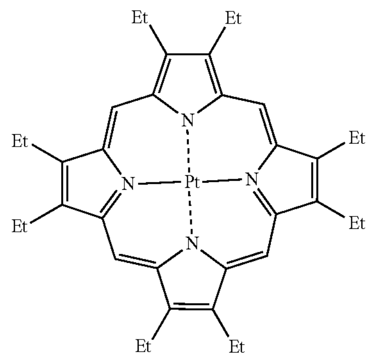
(5-2)
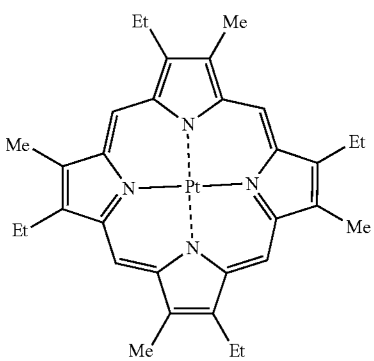
(5-3)
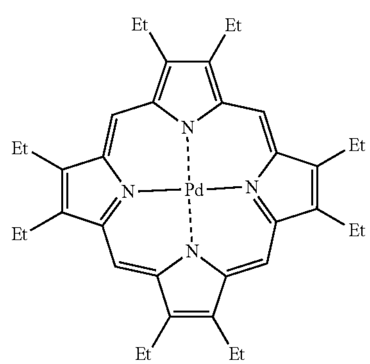
-continued
(5-4)
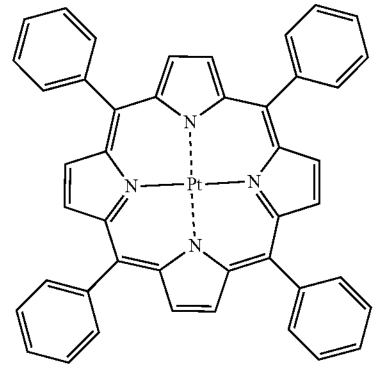
(5-5)
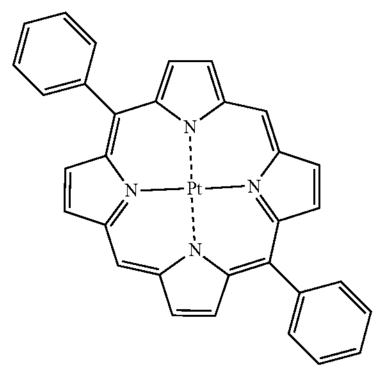
(5-6)
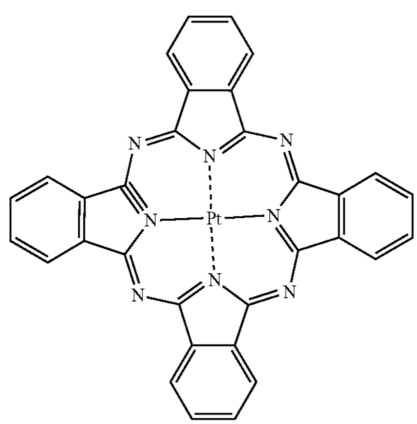

-continued (5-7)

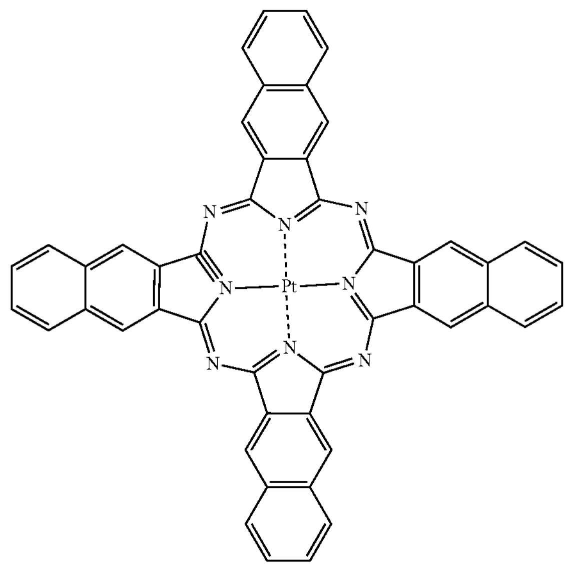

The connection layer 16D is provided in order to confine the triplet excitons formed within both of the red light emitting layer 16CR and green light emitting layer 16CG described above in both of the red light emitting layer 16CR and the green light emitting layer 16CG, and to increase the efficiency of injection of the holes into the blue light emitting layer 16CB. The connection layer 16D is provided as the common layer over the entire surfaces of the red light emitting layer 16CR, the green light emitting layer 16CG, and the hole transport layer 16BB for the blue organic EL element 10B. Although depending on the entire structure of the element, a thickness of the common hole transport layer 16D, for example, is preferably in the range of 1 to 30 nm, and more preferably in the range of 1 to 15 nm.

Figure 4:
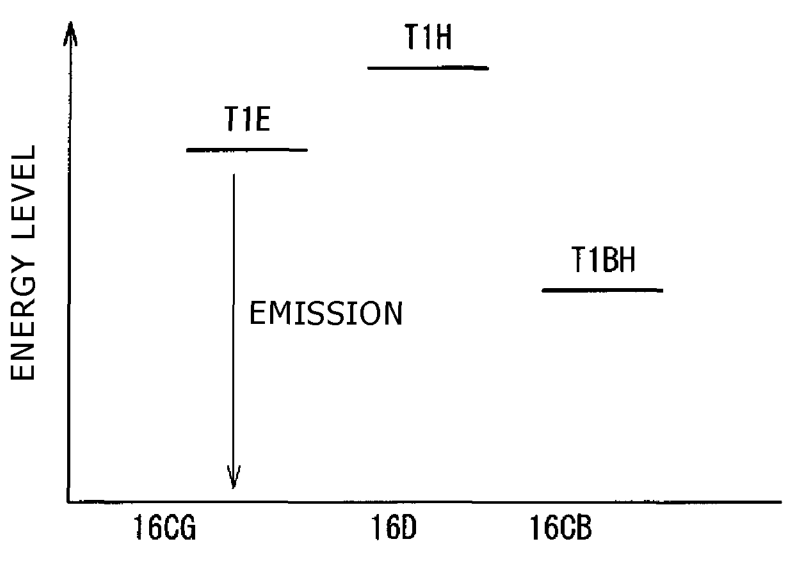
FIG. 4 is a graphical representation showing a relationship in triplet energy gap among layers of the present disclosure.

The following conditions are given for the material composing the common layer 16D. Firstly, an excited triplet energy of the material composing the connection layer 16D is sufficiently higher than that of each of the red light emitting layer 16CR and the green light emitting layer 16CG. Specifically, as shown in FIG. 4, the triplet excited state (T1H) of the connection layer 16D is preferably 0.1 eV or more higher than the triplet excited state of the red light emitting layer 16CR and the triplet exited state (T1E) of the green light emitting layer 16CG (only the green light emitting layer 16CG is shown in FIG. 4). As a result, the triplet excitations generated in both of the red light emitting layer 16CR and the green light emitting layer 16CG are prevented from diffusing into the blue light emitting layer 16CB, so that the phosphorescence emission is obtained at a high efficiency. It is noted that each of the red light emitting layer 16CR and the green light emitting layer 16CG is made of a mixture of a host material (host matrix) and a guest material (phosphorescence emitter). The triplet excited state of each of the red light emitting layer 16CR and the green light emitting layer 16CG stated here means a triplet excited state of the material having a light emitting section of the materials described above. Secondly, the connection layer 16D has a high hole transport performance in order to increase the efficiency of the injection of the holes into the blue light emitting layer 16CB, and prevents a large hole injection barrier from being generated between the hole transport layer 16BB for the blue organic EL element 10B, and the connection layer 16D. Specifically, an energy difference between the ground state (S0H) of the connection layer 16D and the ground state (S0I) of the hole transport layer 16BB is set to 0.4 eV or less, thereby making it possible to maintain the efficiency of the injection of the holes into the blue light emitting layer 16CB.

In addition, a low-molecular material, especially, a monomer is preferably used as a material for the connection layer 16D because the connection layer 16D is formed by utilizing an evaporation method. The reason for this is because it is feared that the polymerized molecules like either an oligomer or a high-molecular material are resolved during the evaporation. It is noted that the low-molecular material of the connection layer 16D may also be formed by mixing two or more kinds of materials which are different in molecular weight from one another with one another, or laminating the two or more kinds of materials which are different in molecular from one another weight one upon another.

The low-molecular material used in the connection layer 16D, for example, includes the phosphorescent host materials expressed by the structural formulas (2-1) to (2-96), and the structural formulas (3-1) to (3-11). In addition, it is also possible to use any of the phosphorescence host materials other than the phosphorescence host materials described above. However, although in general, many phosphorescence host materials are high in energy level (T1 level), it is preferable to exclude any of the materials each having the high electron transport property. However, even in the case of the material having the high electron transport performance, such a material can be used by being mixed with the material having the high hole transport property, or by laminating suitable layers one upon another.

In addition thereto, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugate system monomer or oligomer such as a vinylcarbazole system compound, a thiophene system compound or an aniline system compound, for example, can be used as the low-molecular material other than the phosphorescence host material used in the connection layer 16D.

In addition, although a concrete material includes porphyrin, metal tetraphenylporphyrin, metal naphthalocyanine, N,N,N',N'-tetrakis(p-tolyl)$_p$-phenylenediamine, N,N,N',N'-tetraphenyl-4,4'-diaminobiphenyl, N-phenylcarbazole, 4-di-p-tolylaminostilben, and the like, the present disclosure is by no means limited thereto.

More preferably, low-molecular materials expressed by the following general formulas (6) and (7) are given:

(6)

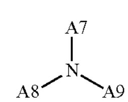

in which A7 to A9 are aromatic hydrocarbon groups, heterocyclic groups or derivatives thereof, and

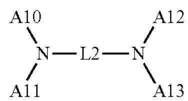

(7)

in which L2 is a group in which 2 to 6 bivalent aromatic cycle groups are coupled to on another, specifically, a bivalent group into which 2 to 6 bivalent aromatic rings are linked, or a derivative thereof, and A10 to A13 are aromatic hydrocarbon groups or heterocyclic groups, or groups into each of which 1 to 10 derivatives thereof are coupled.

A concrete example of the compound expressed by the general formula (6) includes the following structural formulas (6-1) to (6-48) and the like:

(6-1)

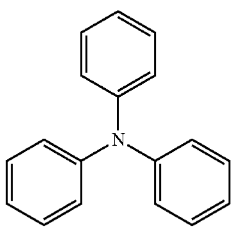

(6-2)

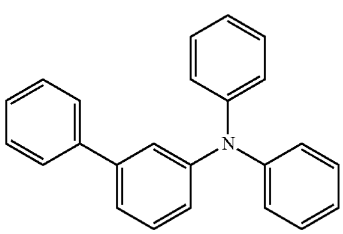

(6-3)

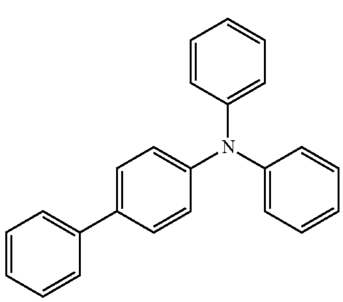

(6-4)

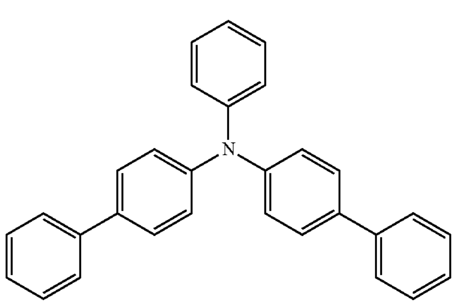

-continued (6-5)

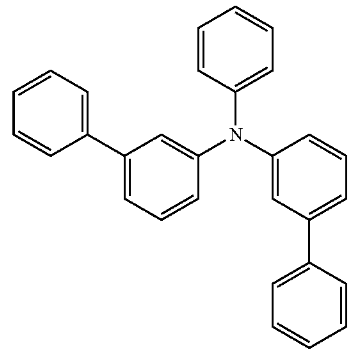

(6-6)

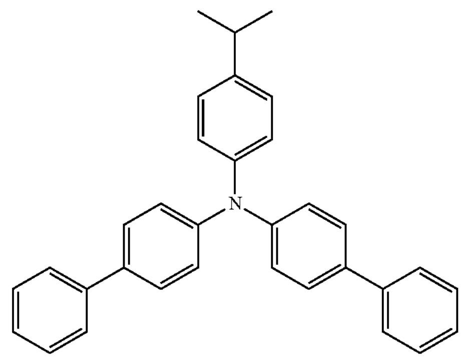

(6-7)

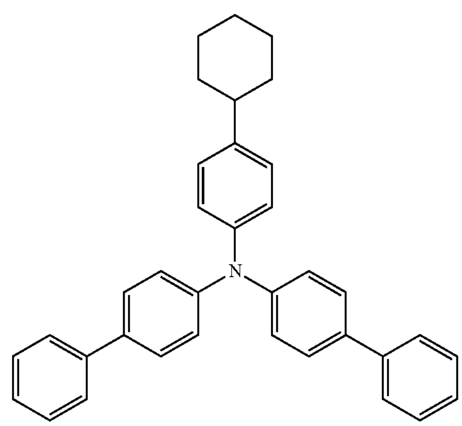

(6-8)

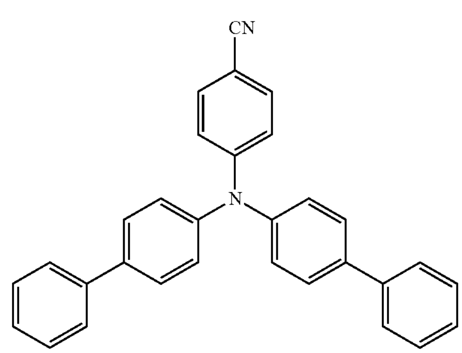

-continued
(6-9)
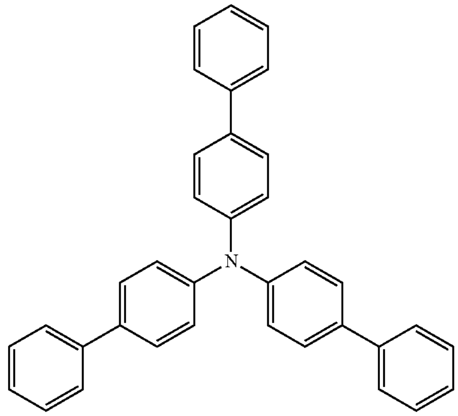
(6-10)
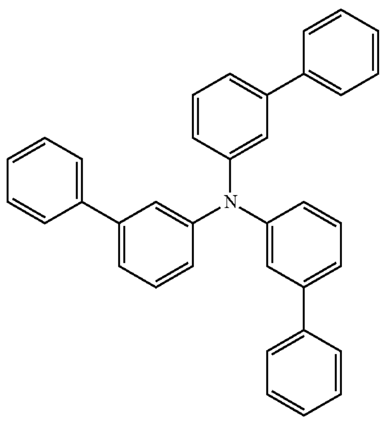
(6-11)
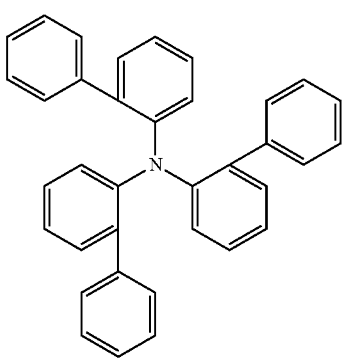
(6-12)
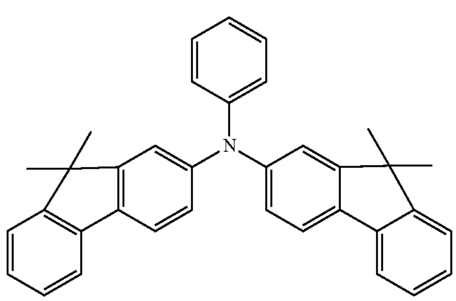
-continued
(6-13)
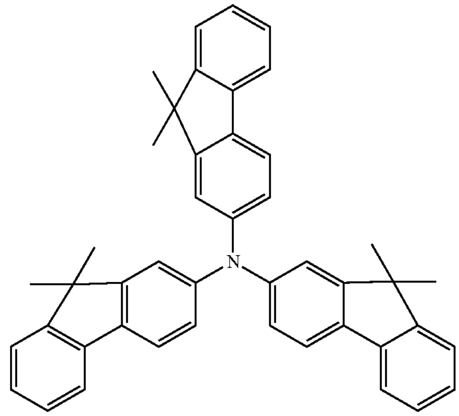
(6-14)
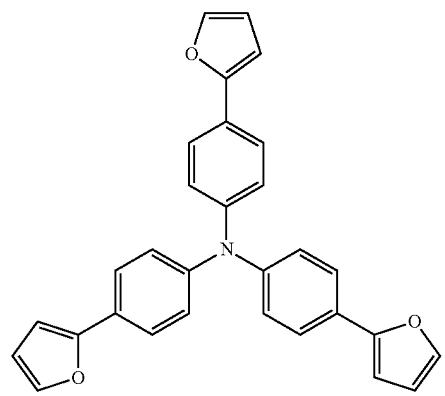
(6-15)
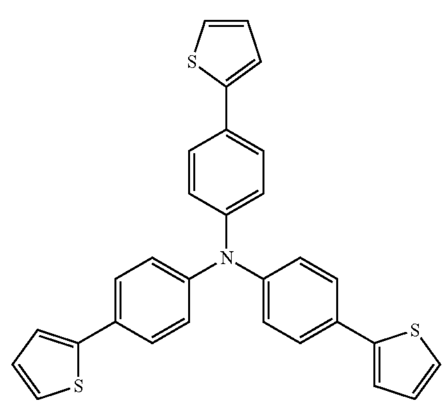

-continued
(6-16)
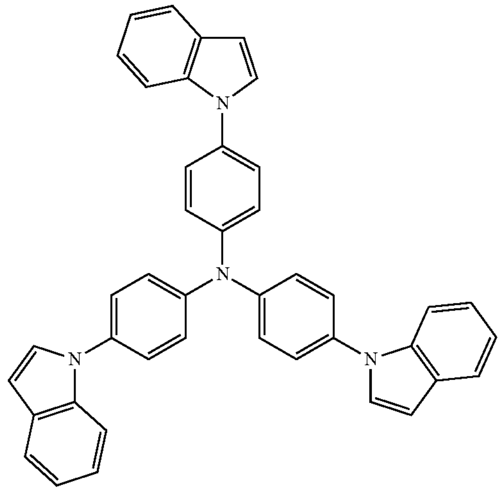
(6-17)
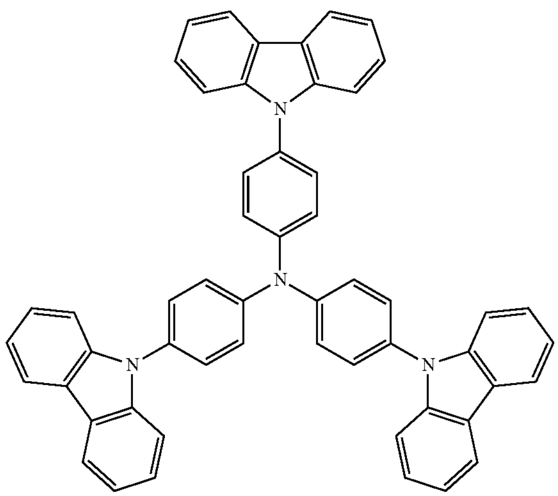
(6-18)
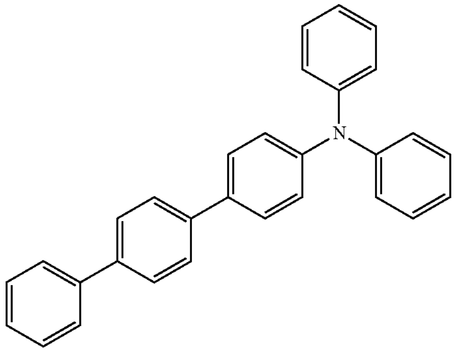
-continued
(6-19)
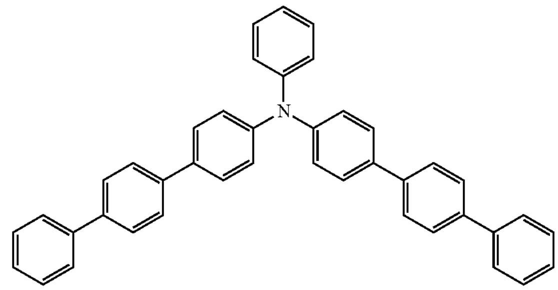
(6-20)
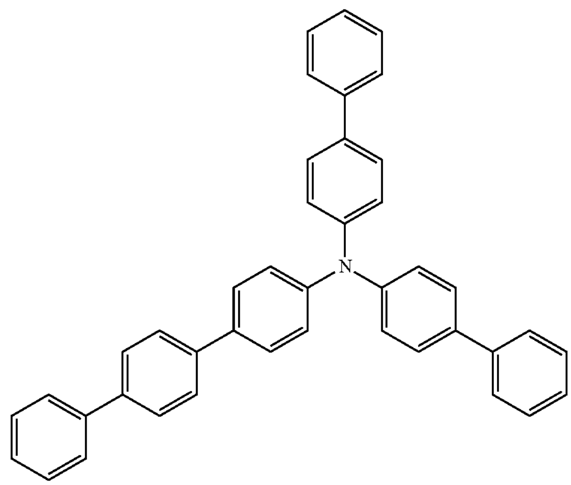
(6-21)
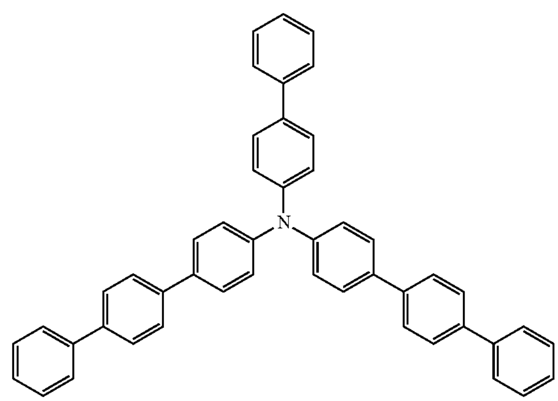

-continued
(6-22)
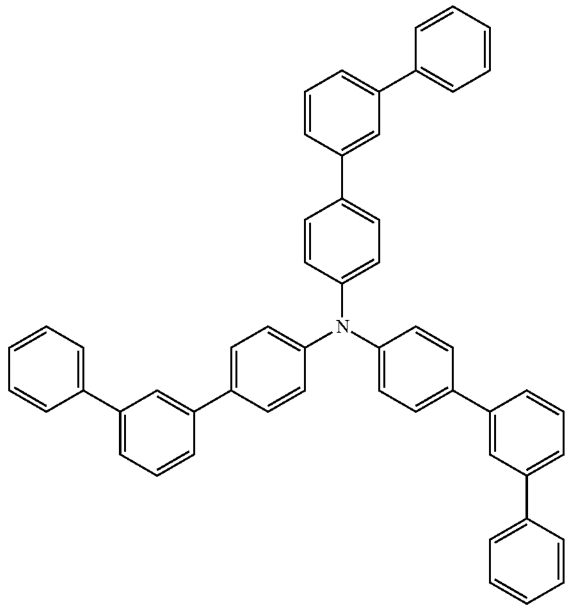
(6-23)
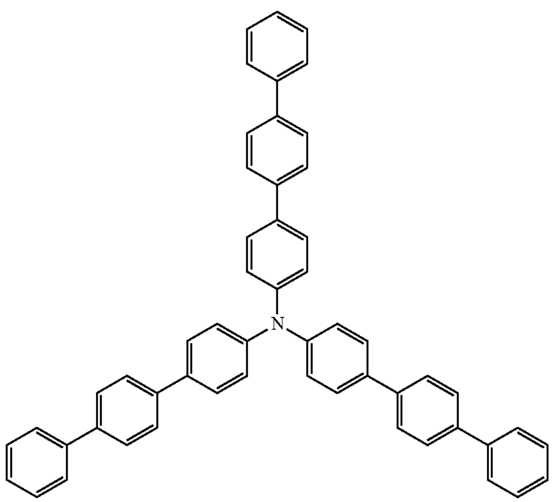
(6-24)
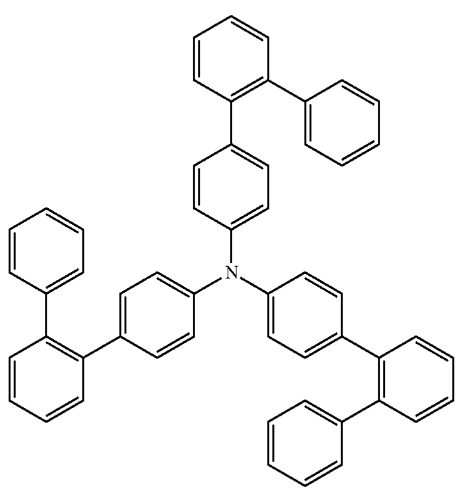
-continued
(6-25)
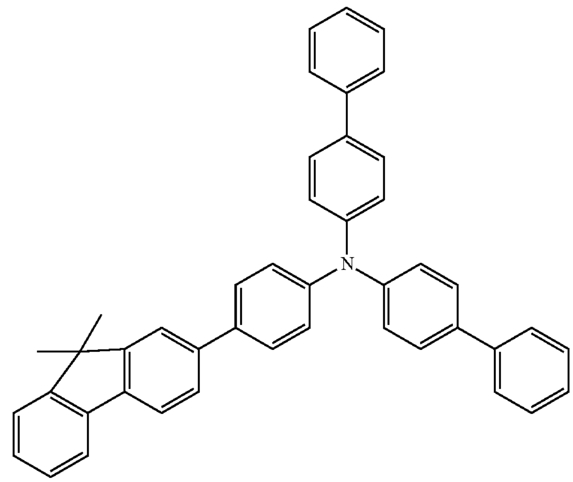
(6-26)
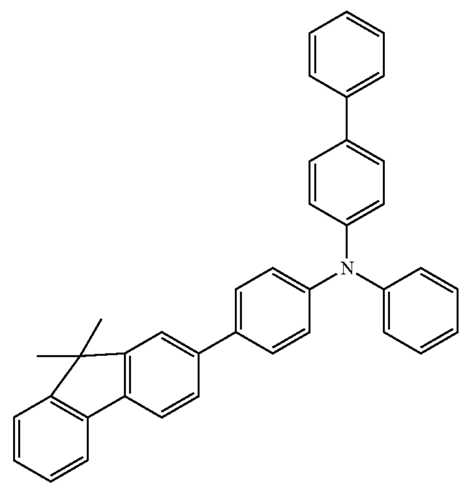
(6-27)
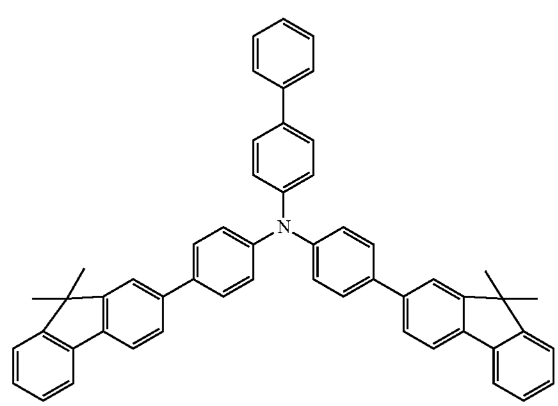

-continued
(6-28)
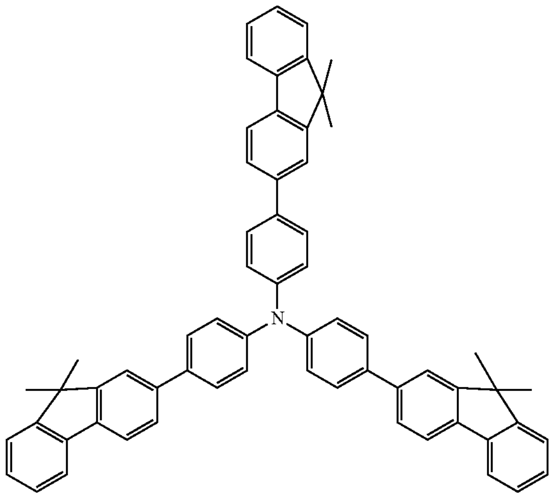
(6-29)
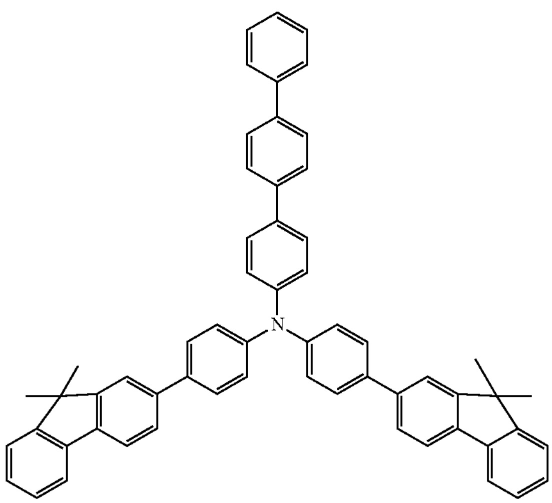
(6-30)
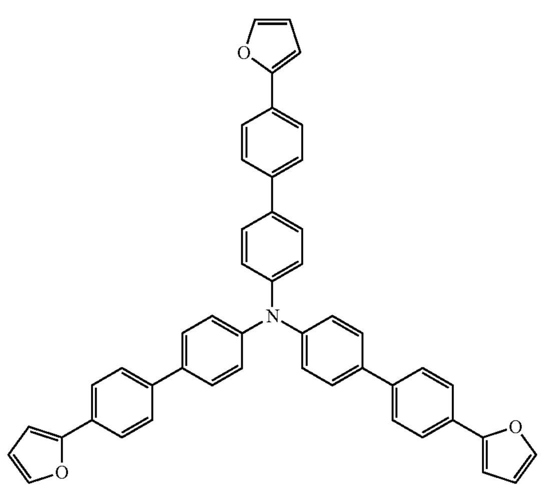
-continued
(6-31)
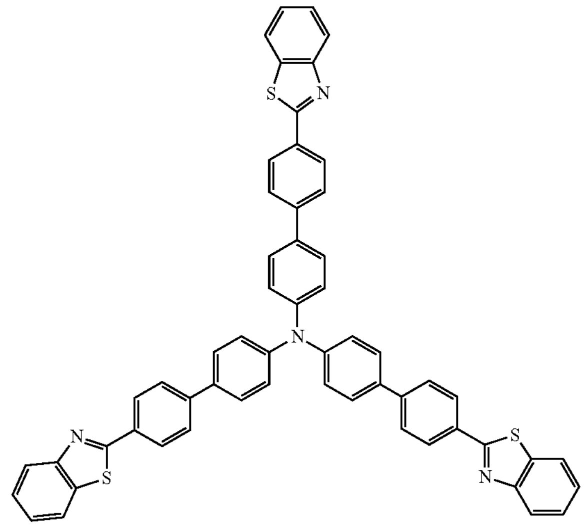
(6-32)
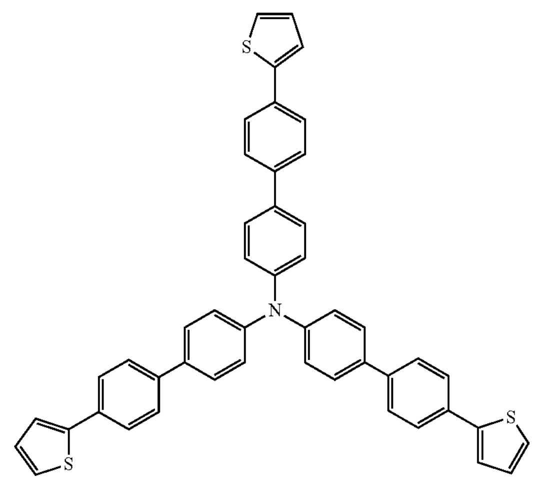
(6-33)
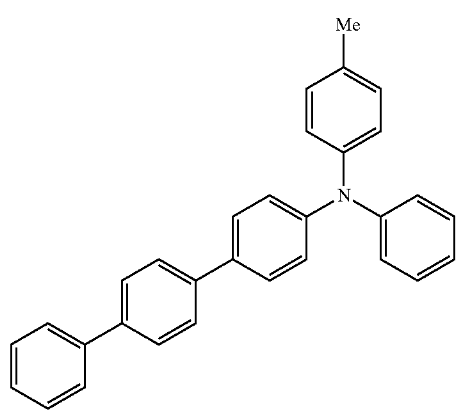

(6-34)
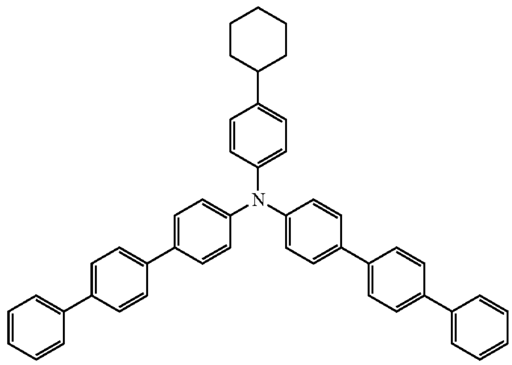
(6-35)
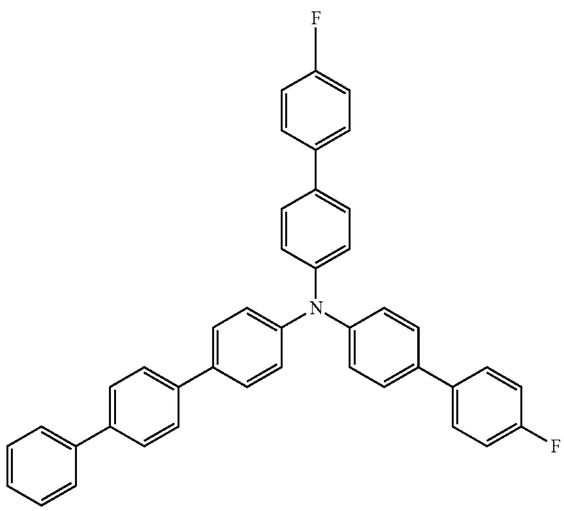
(6-36)
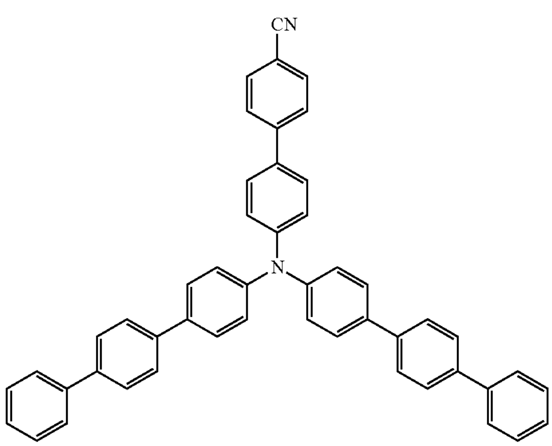
(6-37)
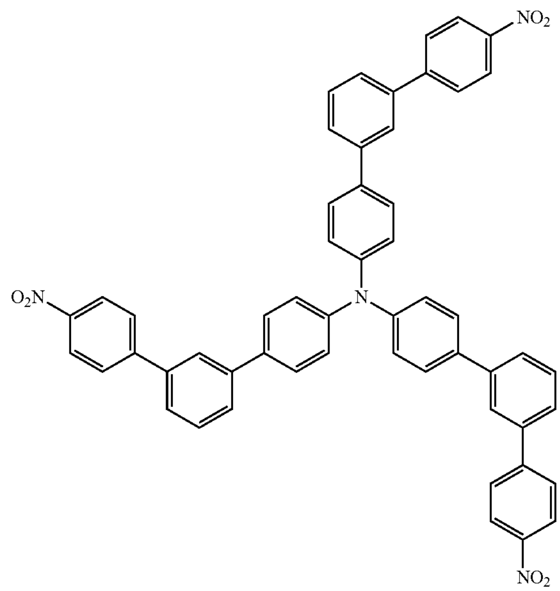
(6-38)
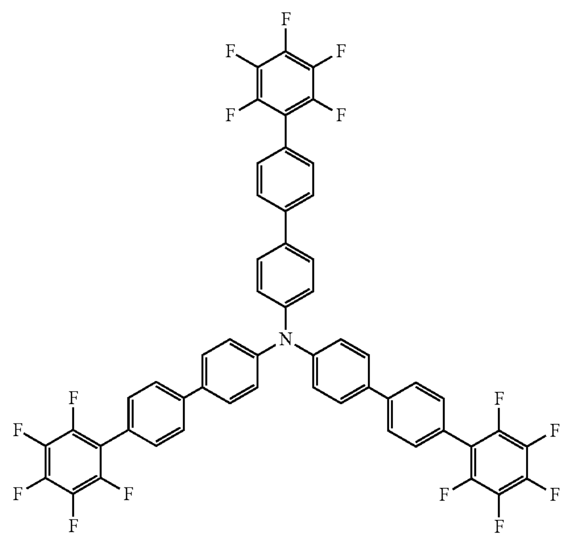
(6-39)
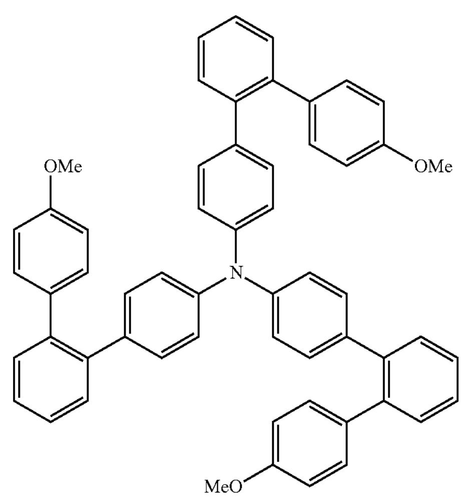

-continued
(6-40)
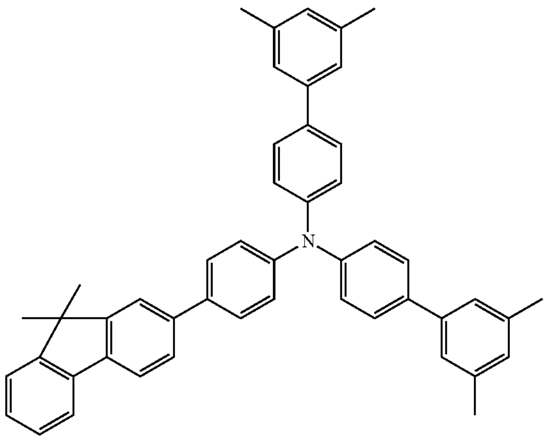
(6-41)
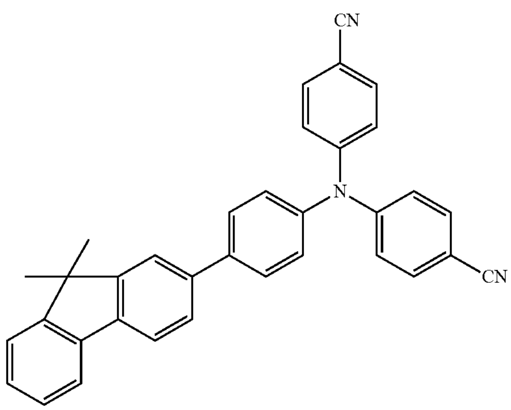
(6-42)
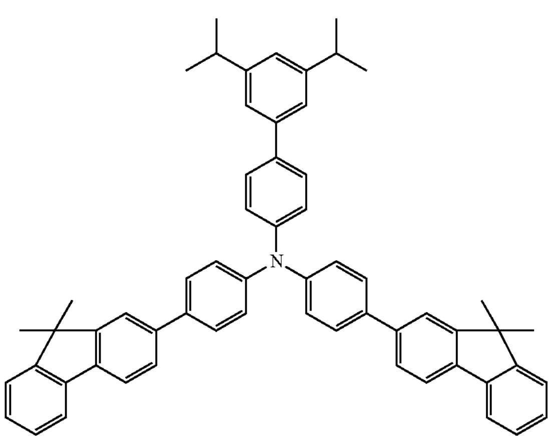
-continued
(6-43)
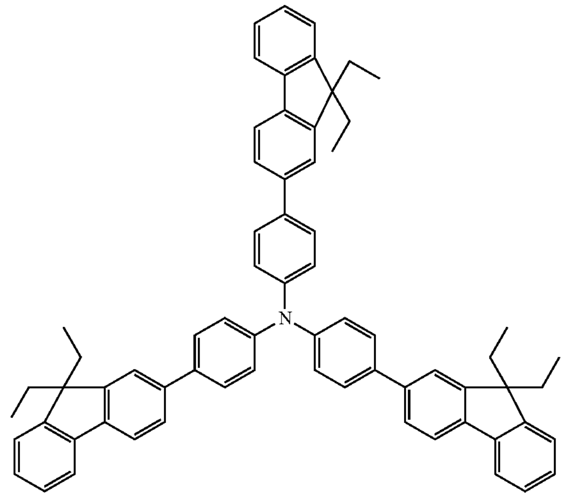
(6-44)
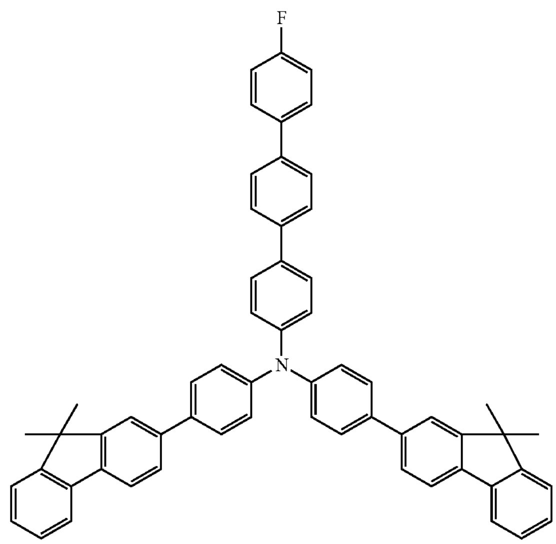
(6-45)
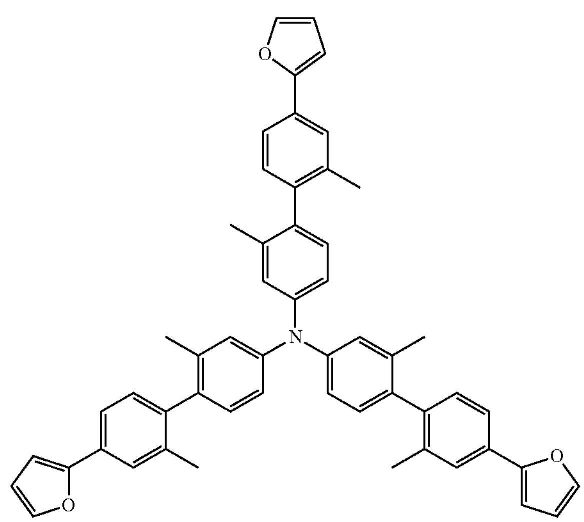

-continued (6-46)

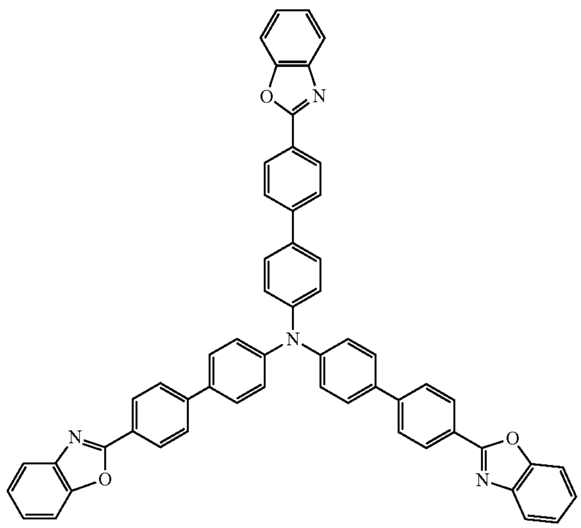

(6-47)

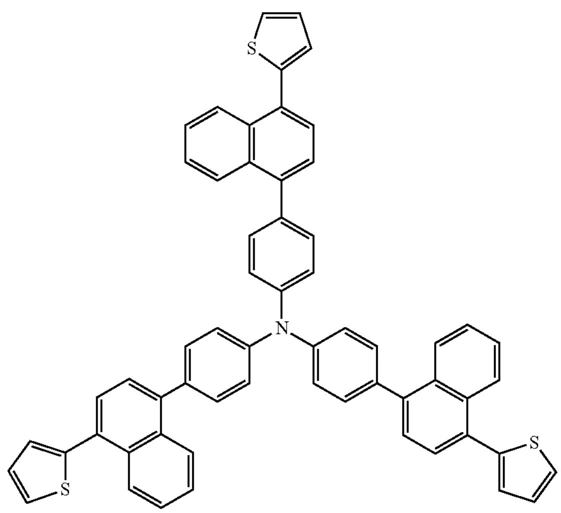

-continued (6-48)

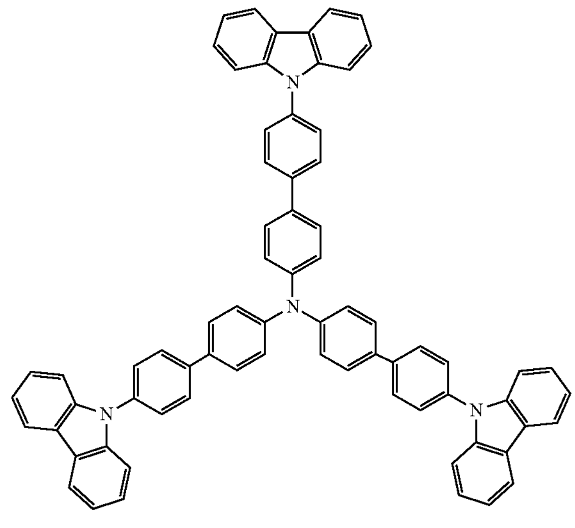

In addition, of the compounds expressed by the general formula (6), it is preferable to use amine compounds containing therein an aryl group having a dibenzofuran structure, and an aryl group having a carbazole structure. Each of these amine compounds is large in singlet excited level and in triplet excited level, and thus can effectively block the electrons of the blue light emitting layer 16CB. For this reason, since the luminous efficiency is increased and the injection of the electrons into the hole transport layer 16BB is suppressed, the life property is enhanced. In addition, the triplet excitons of the red light emitting layer 16CR and the green light emitting layer 16CG can be confined in high triplet excited levels, thereby increasing the luminous efficiency.

A concrete example of the amine compound containing therein the aryl group having the dibenzofuran structure, and the aryl group having the carbazole structure includes compounds, for example, expressed by the following structural formulas (6-49) to (6-323), and the like:

(6-49)

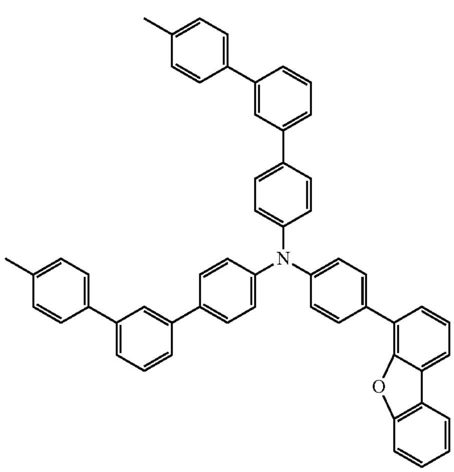

(6-50)

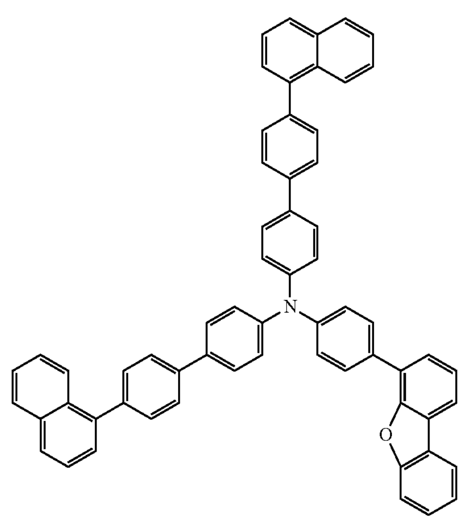

-continued
(6-51)
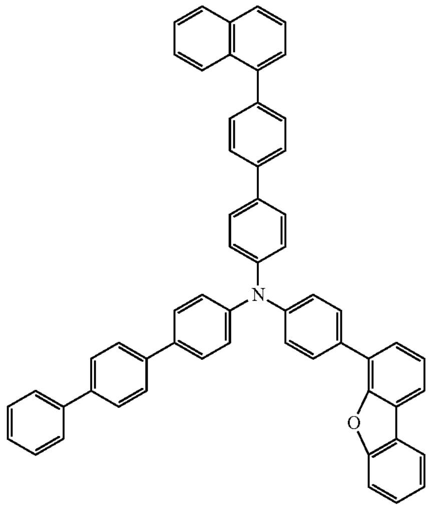
(6-52)
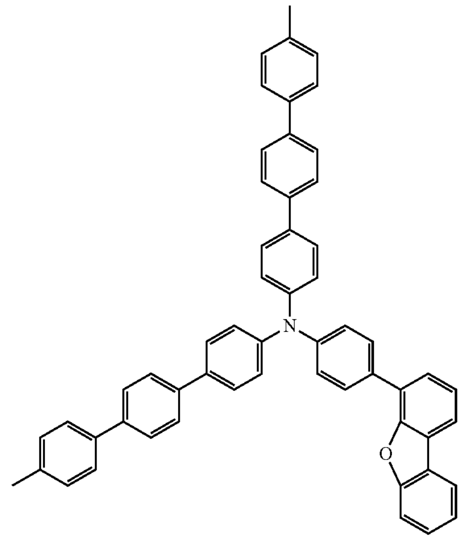
(6-53)
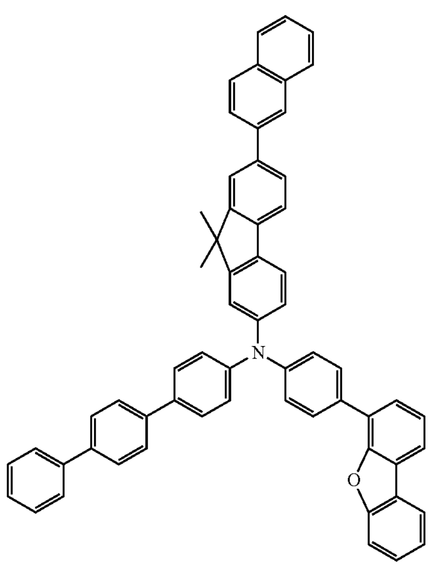
(6-54)
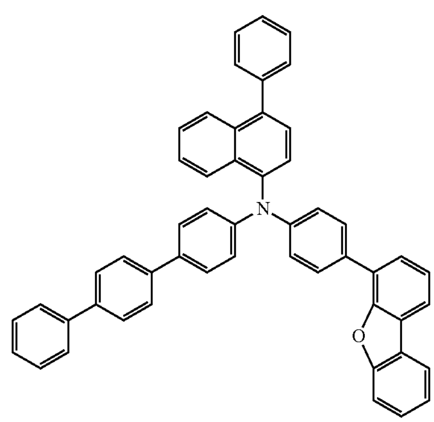

-continued
(6-55)
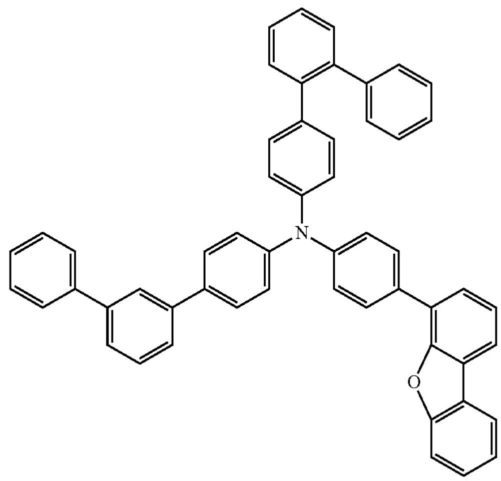
(6-56)
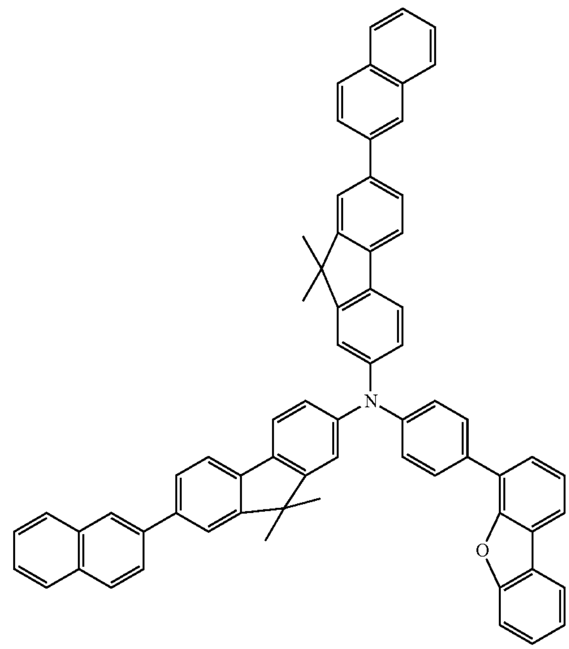
(6-57)
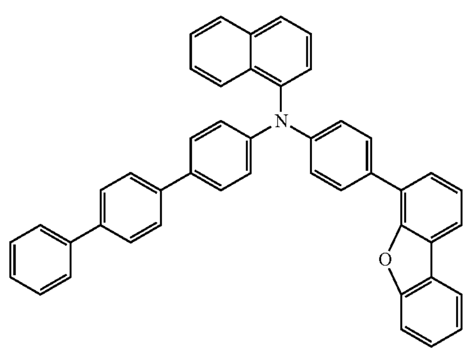
(6-58)
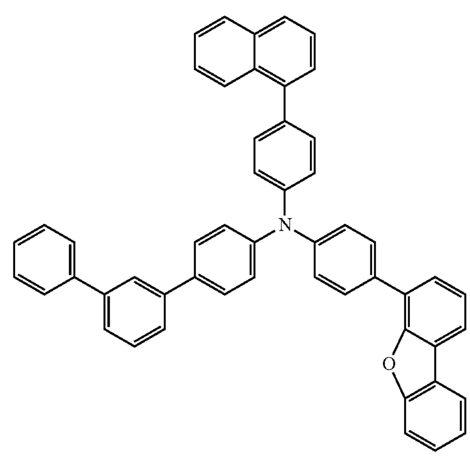

-continued
(6-59)
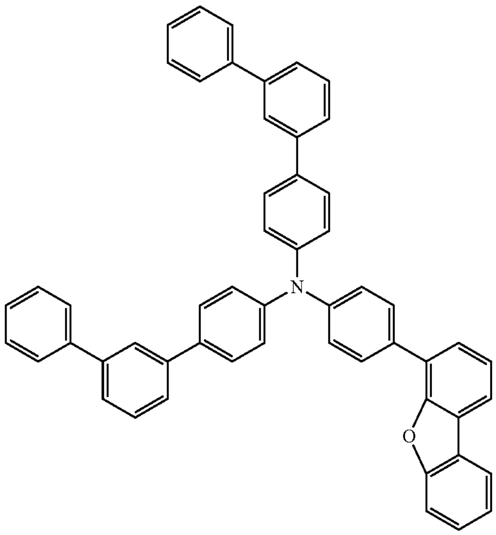
(6-60)
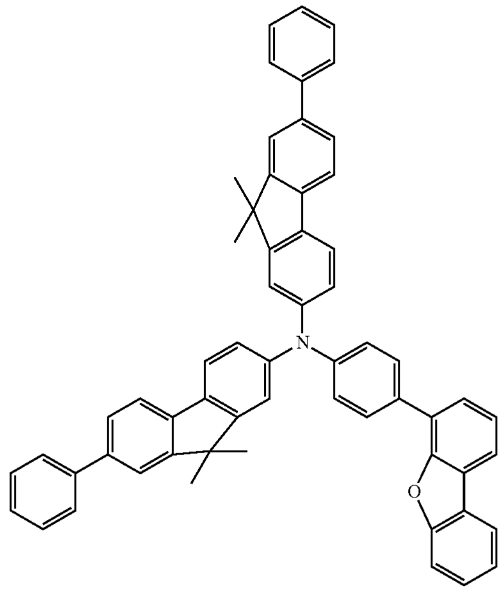
(6-61)
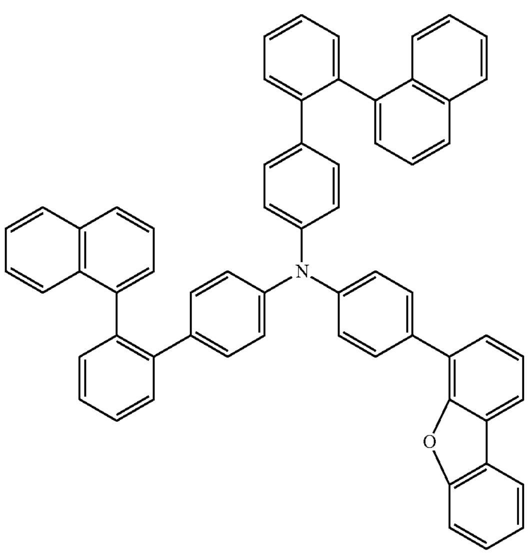
(6-62)
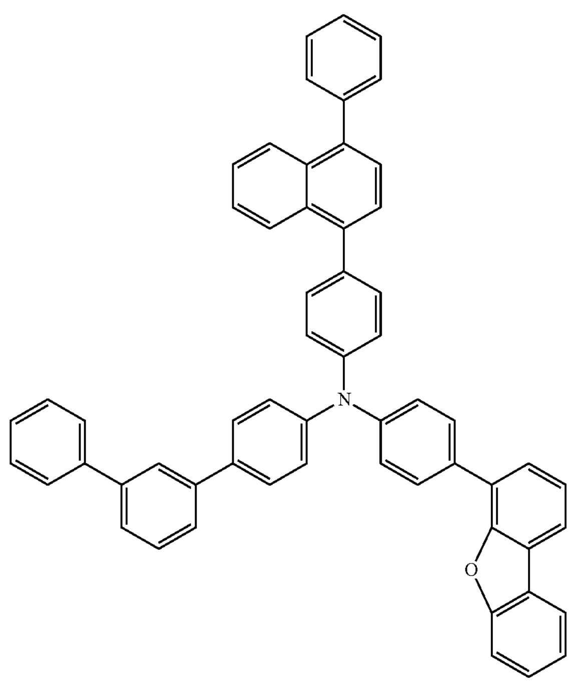

-continued
(6-63)
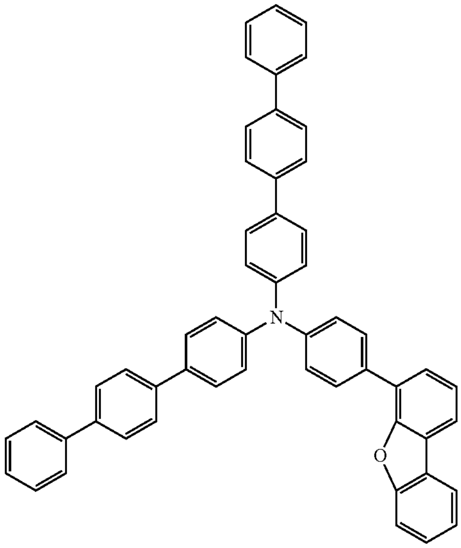
(6-64)
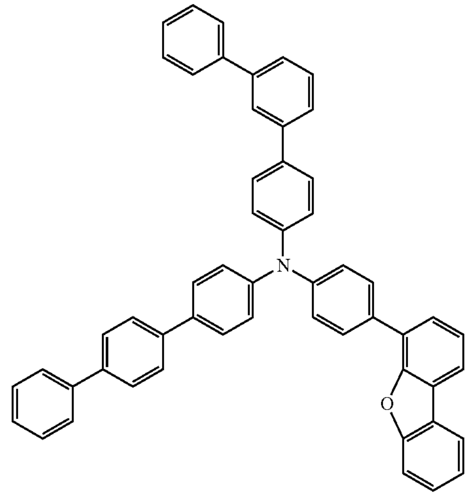
(6-65)
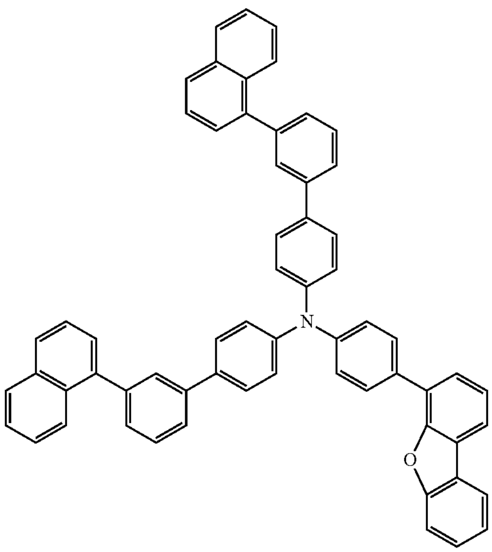
(6-66)
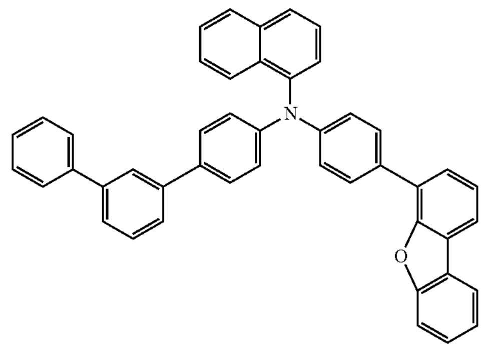
(6-67)
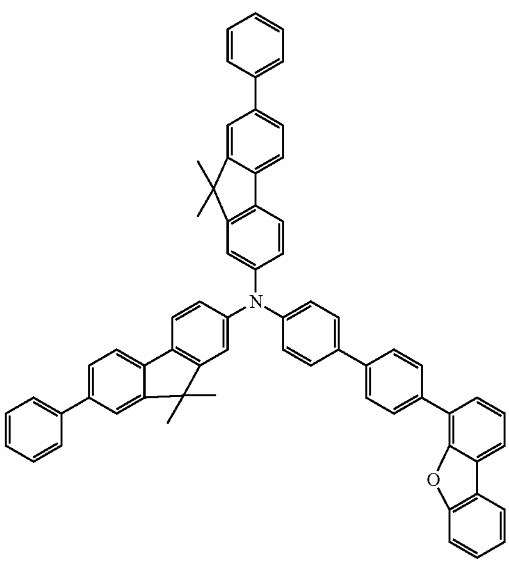
(6-68)
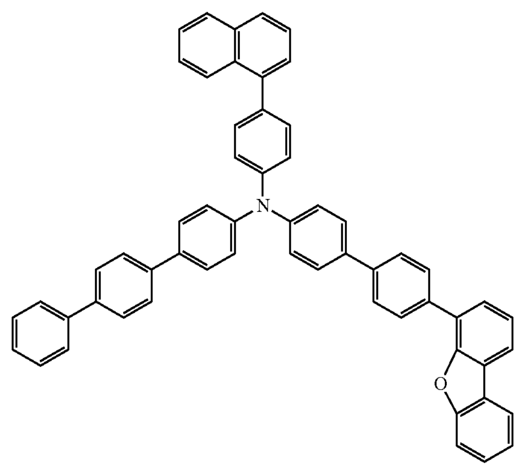

-continued
(6-69)
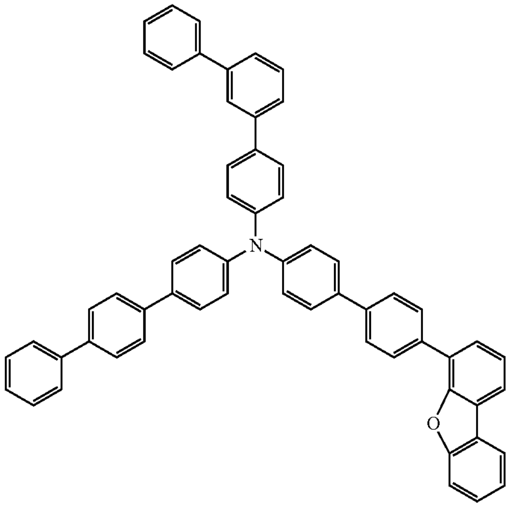
(6-70)
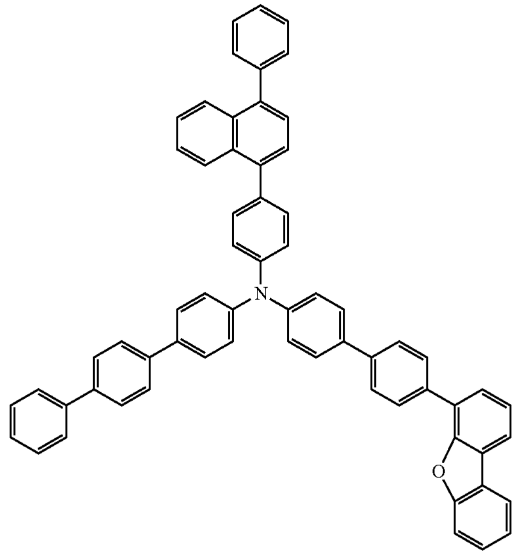
(6-71)
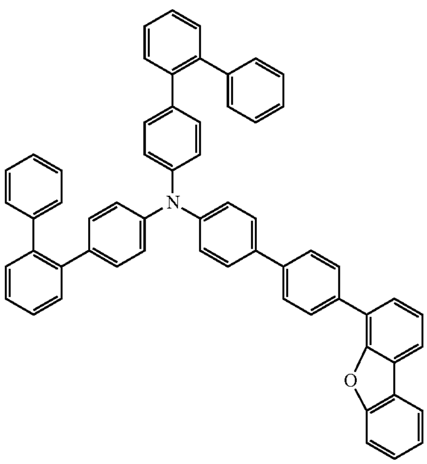
(6-72)
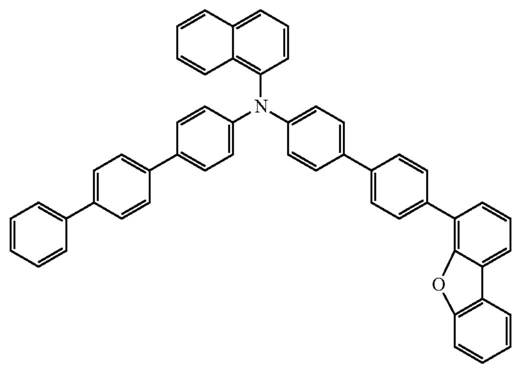
(6-73)
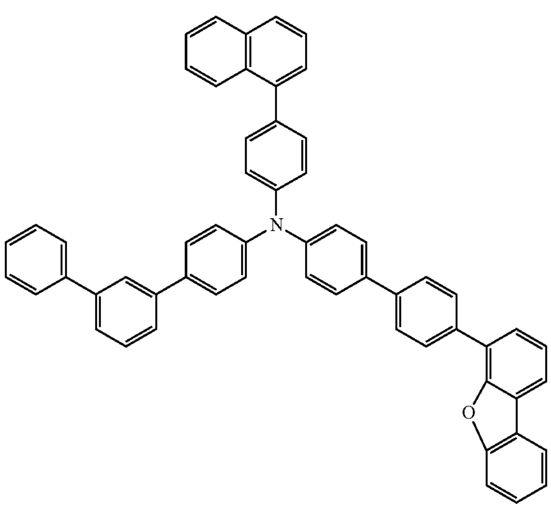
(6-74)
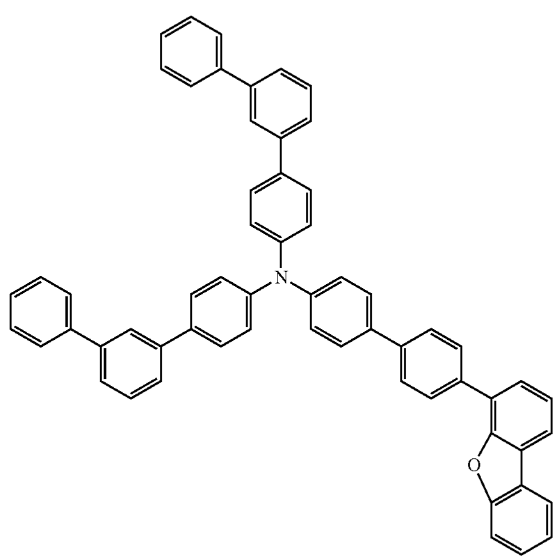

-continued
(6-75)
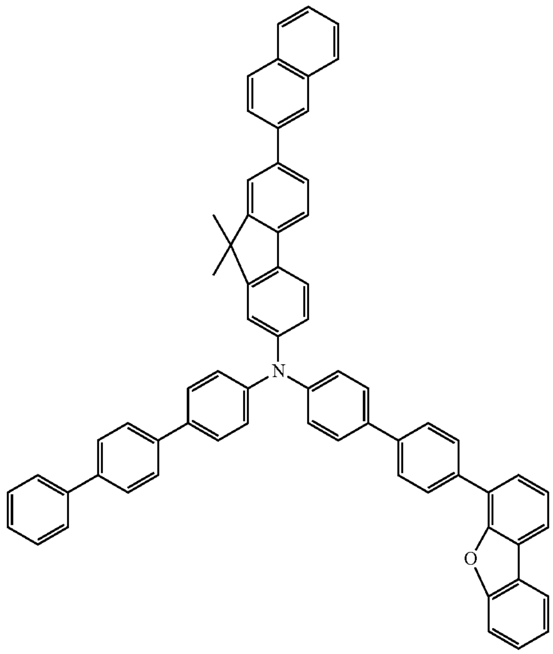
(6-76)
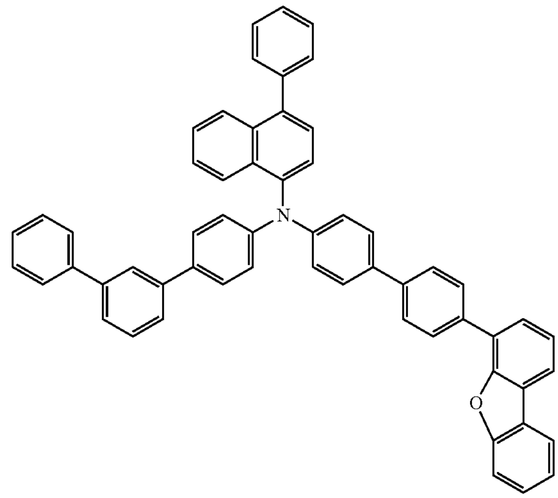
(6-77)
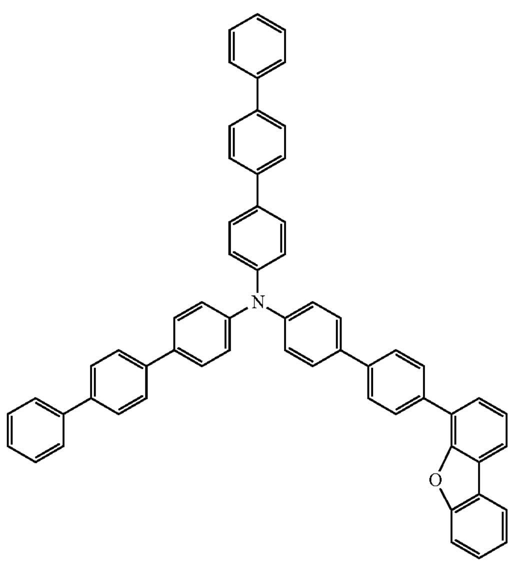
(6-78)
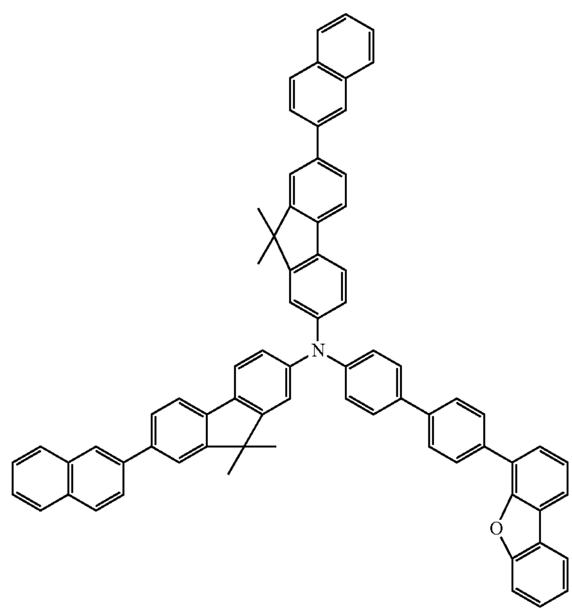

-continued
(6-79)
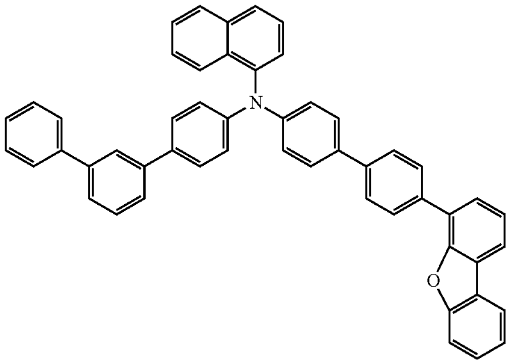
(6-80)
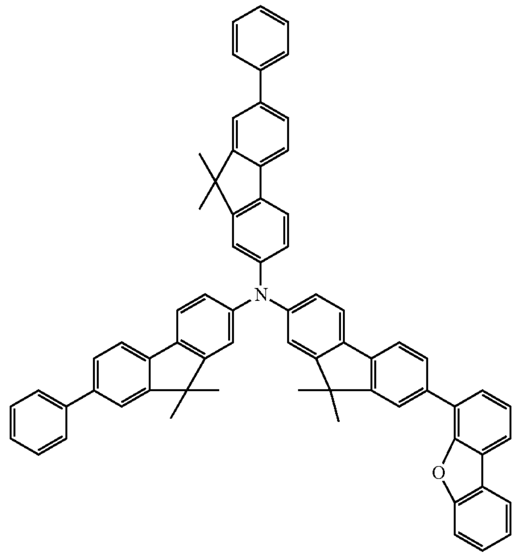
(6-81)
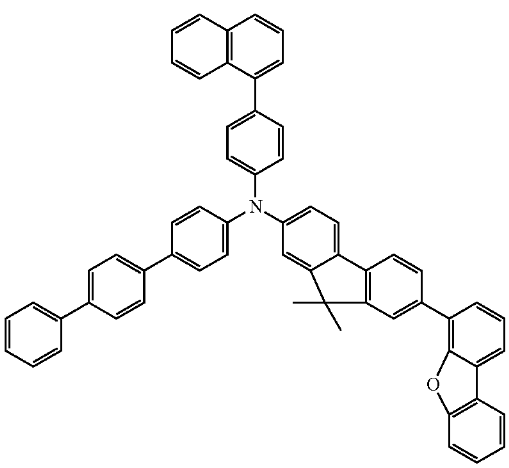
(6-82)
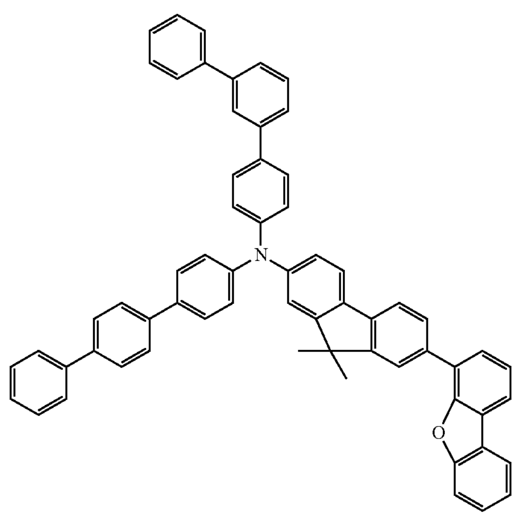

-continued
(6-83)
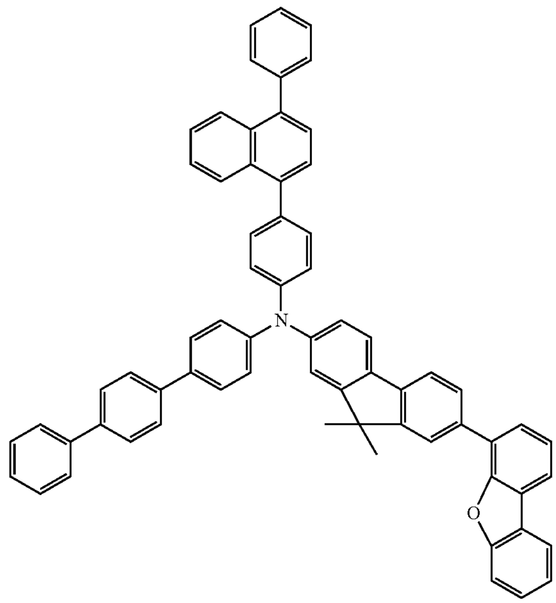
(6-84)
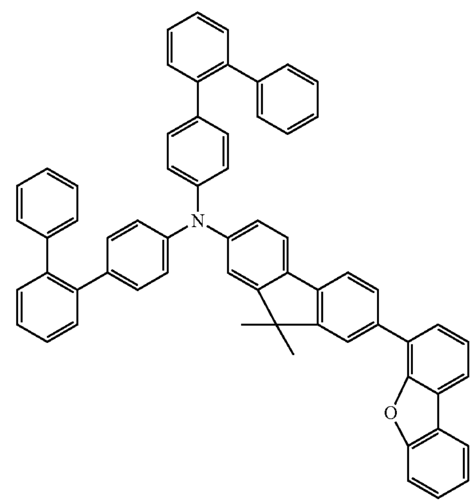
(6-85)
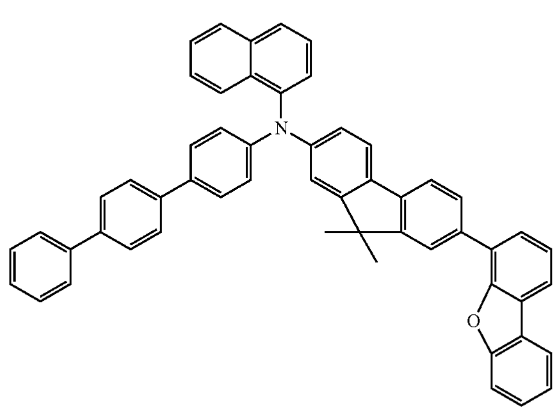
(6-86)
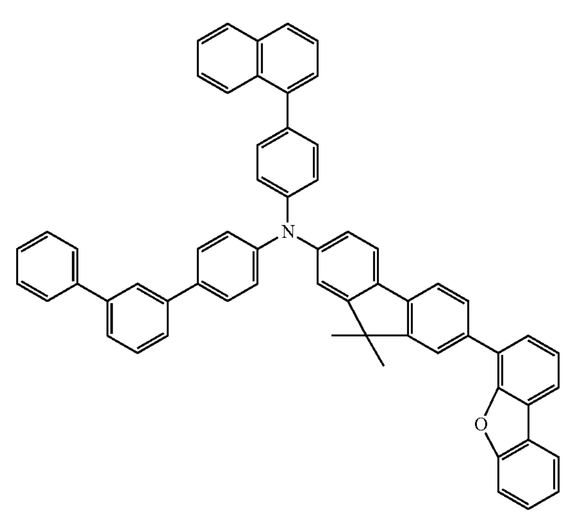

-continued
(6-87)
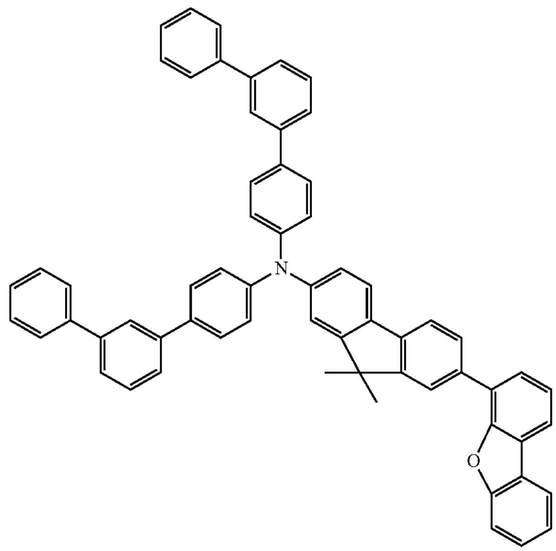
(6-88)
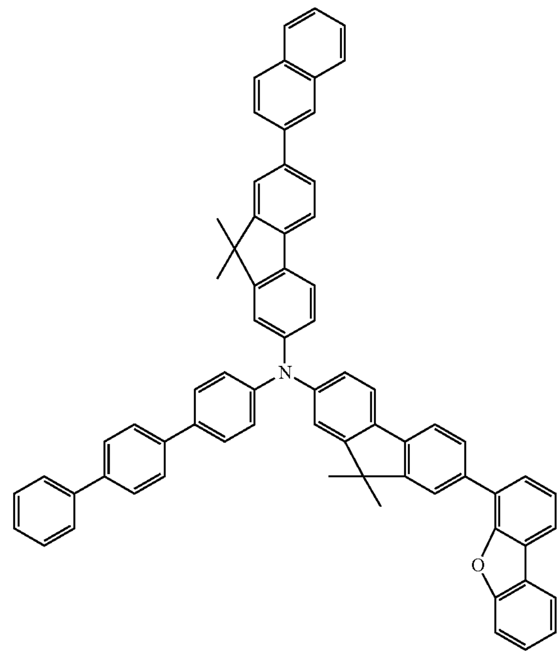
(6-89)
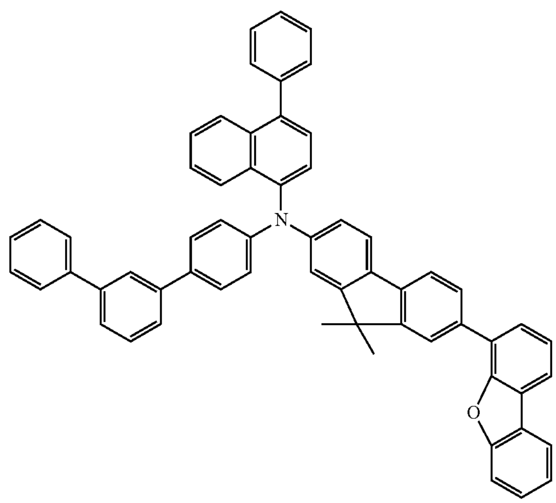
(6-90)
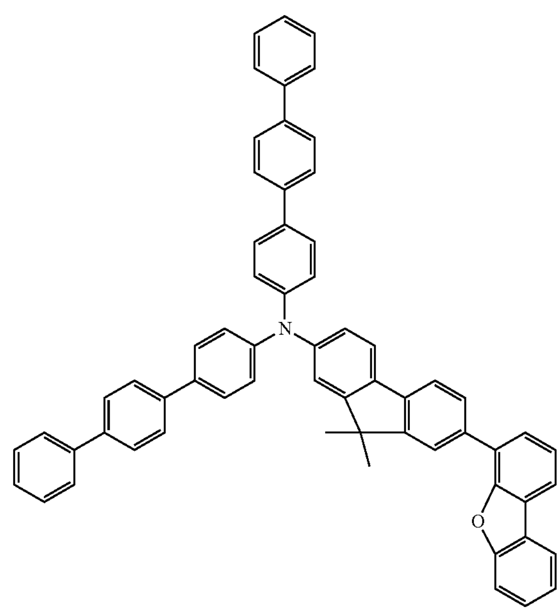

-continued
(6-91)
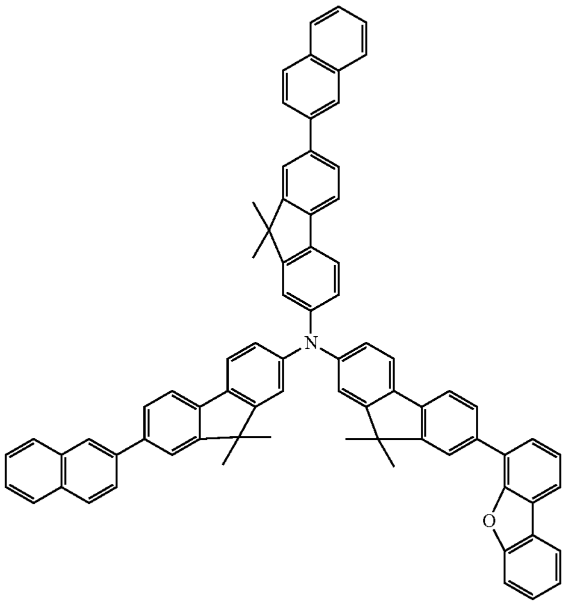
(6-92)
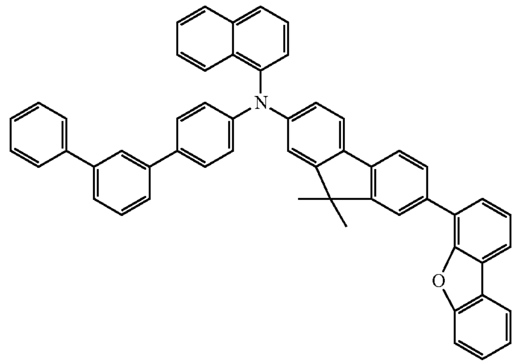
(6-93)
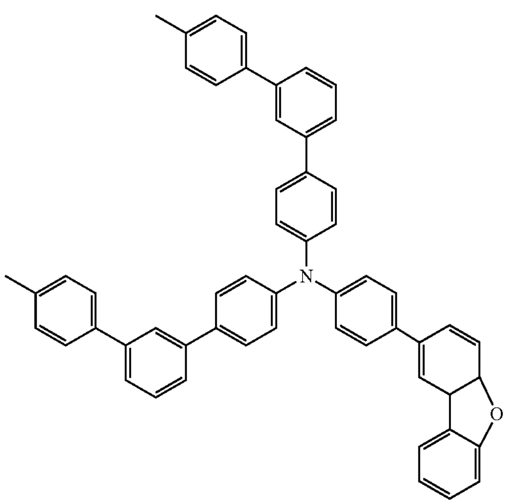
(6-94)
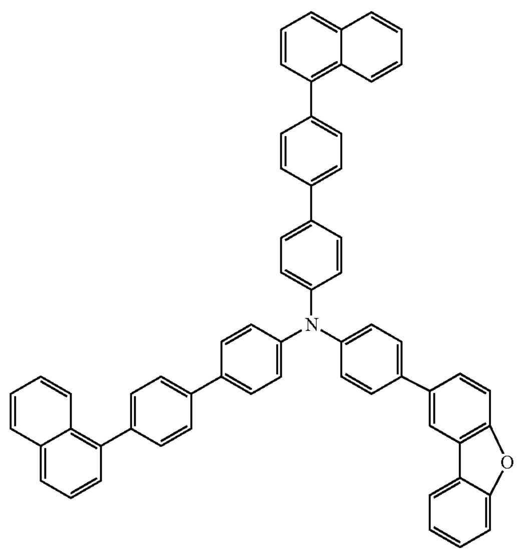

-continued
(6-95)
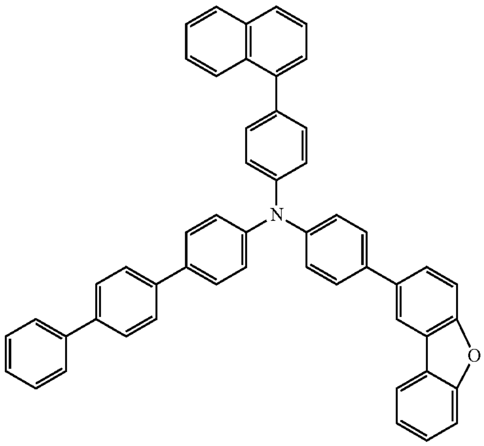
(6-96)
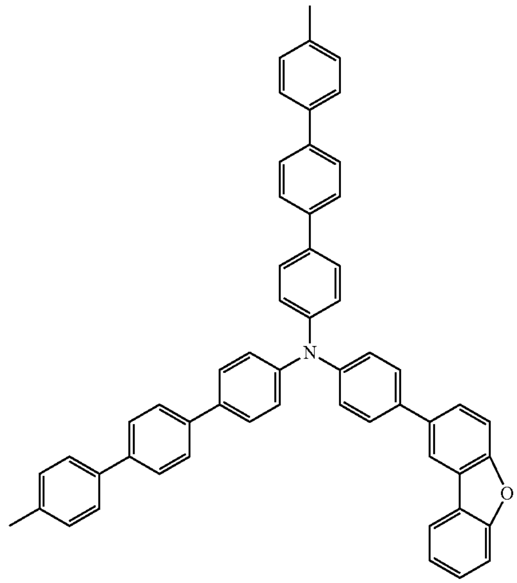
(6-97)
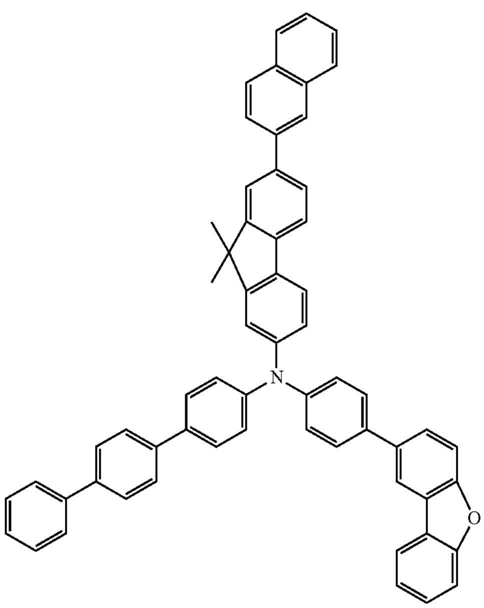
(6-98)
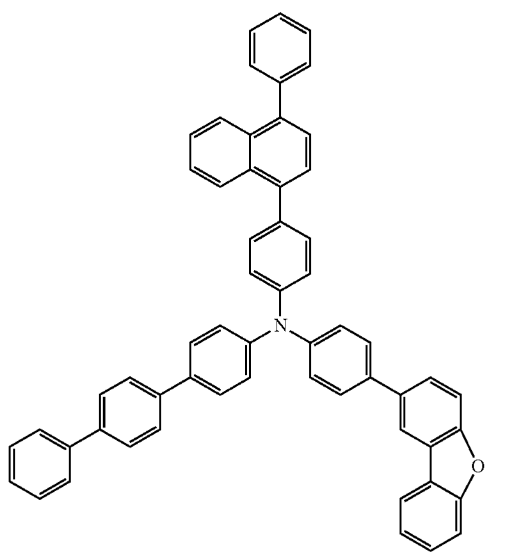

-continued
(6-99)
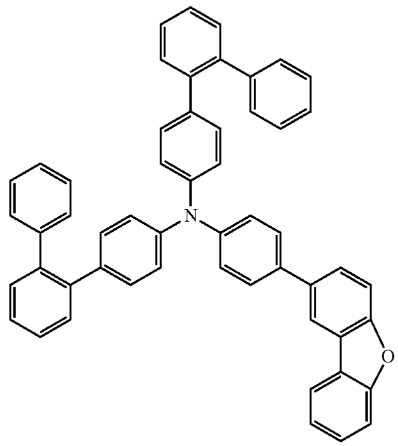
(6-100)
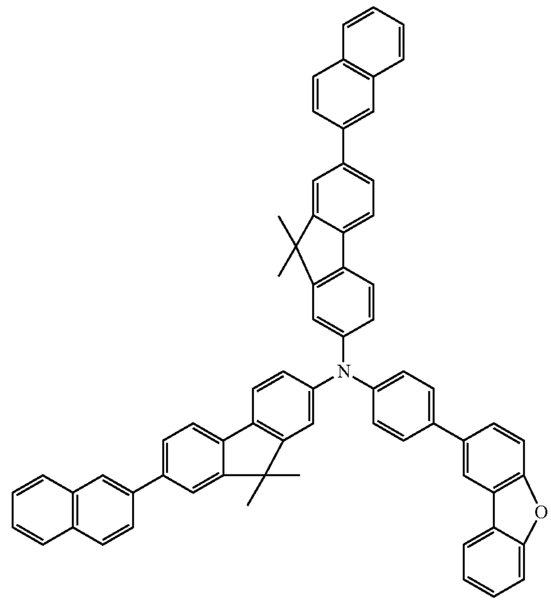
(6-101)
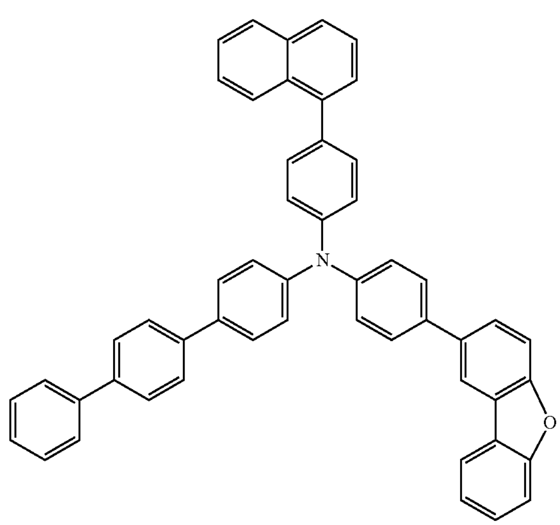
(6-102)
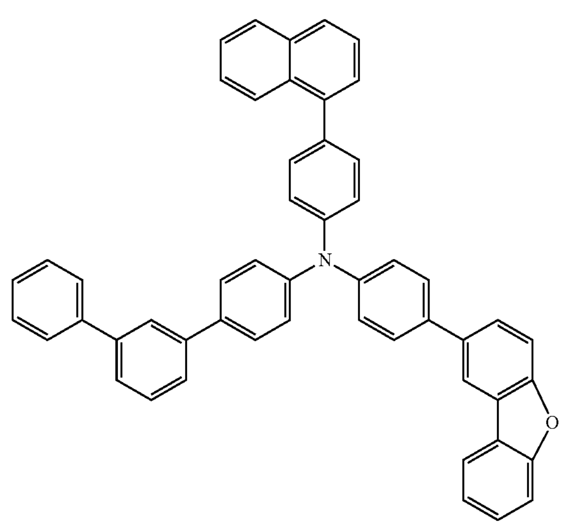

-continued
(6-103)
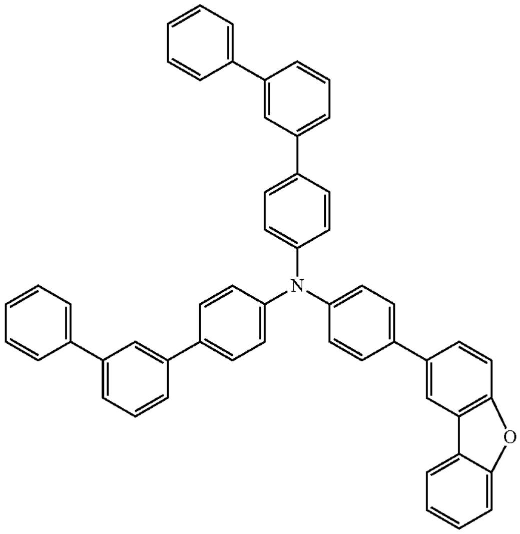
(6-104)
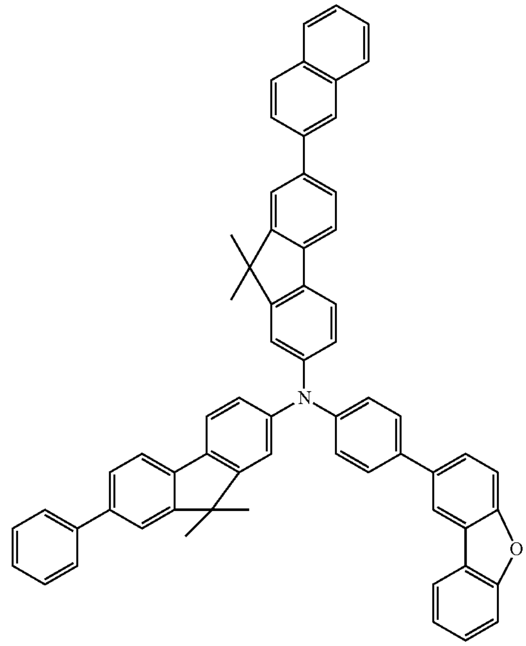
(6-105)
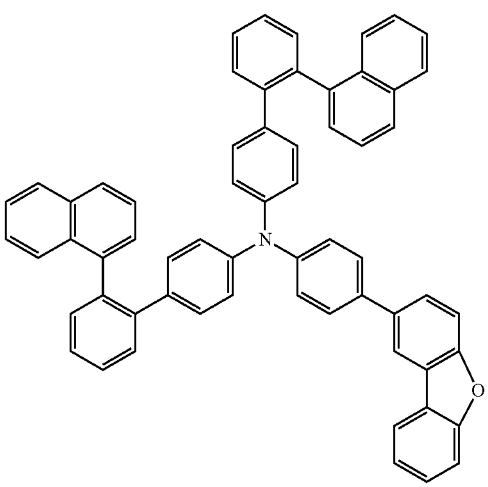
(6-106)
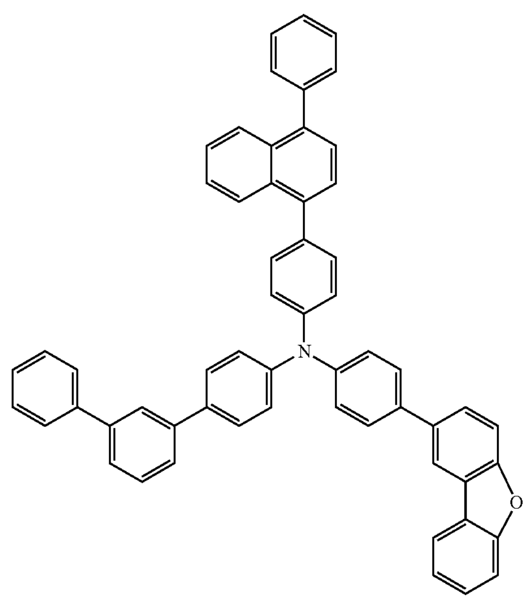

-continued
(6-107)
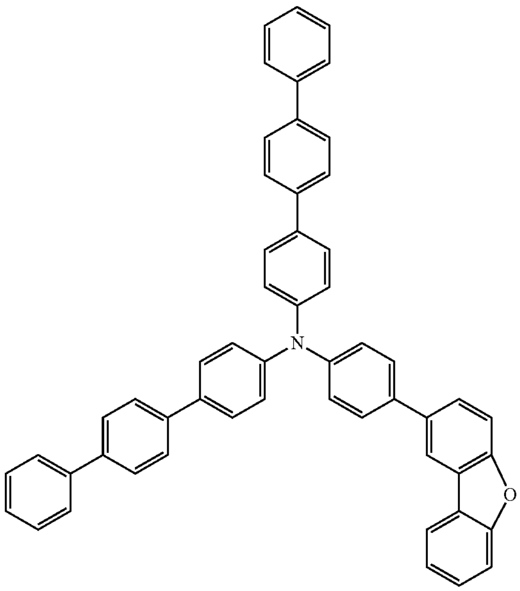
(6-108)
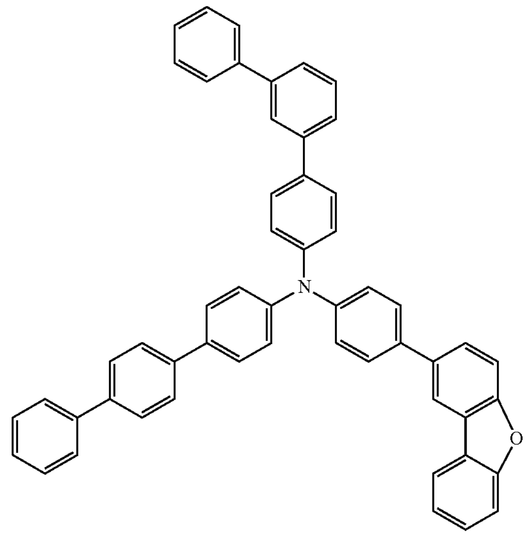
(6-109)
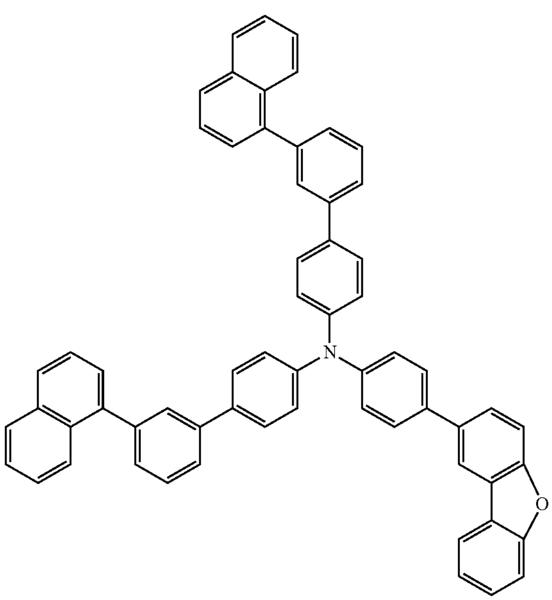
(6-110)
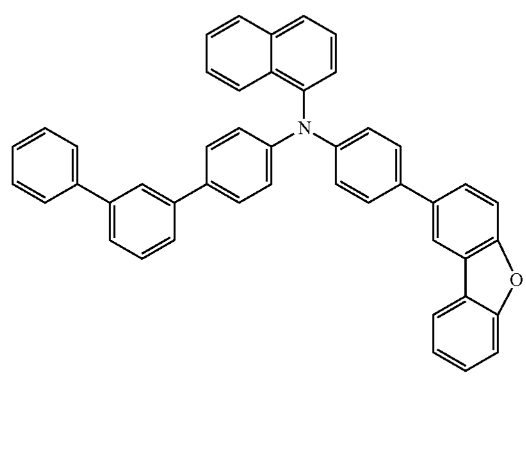

-continued
(6-111)
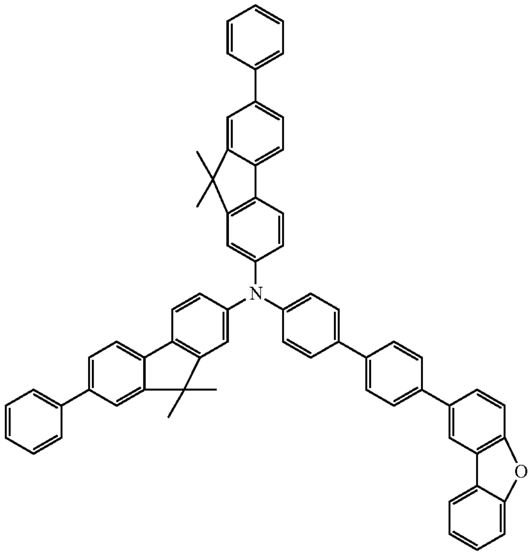
(6-112)
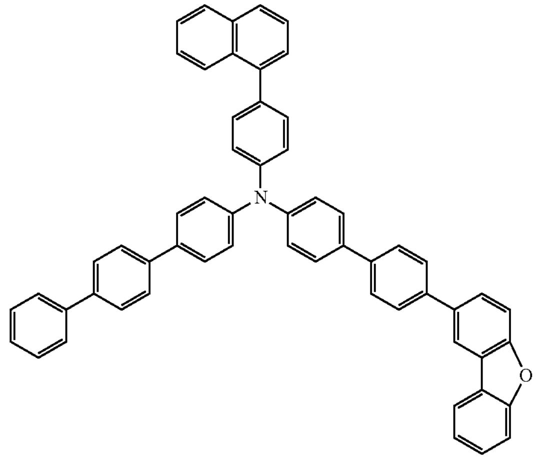
(6-113)
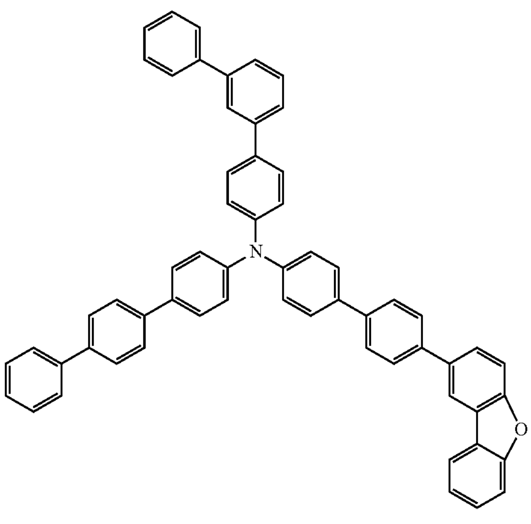
(6-114)
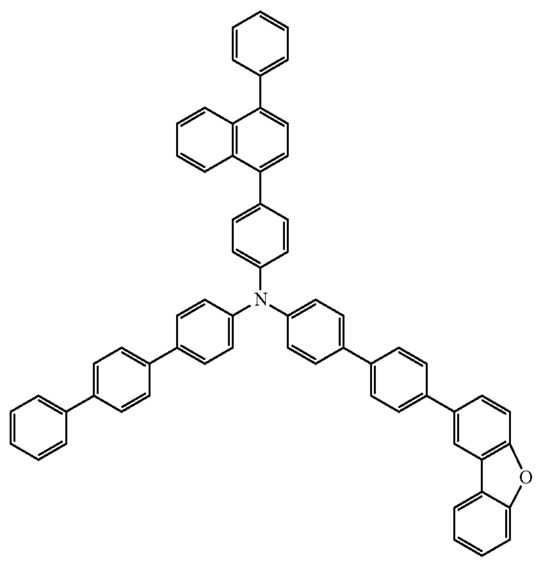
(6-115)
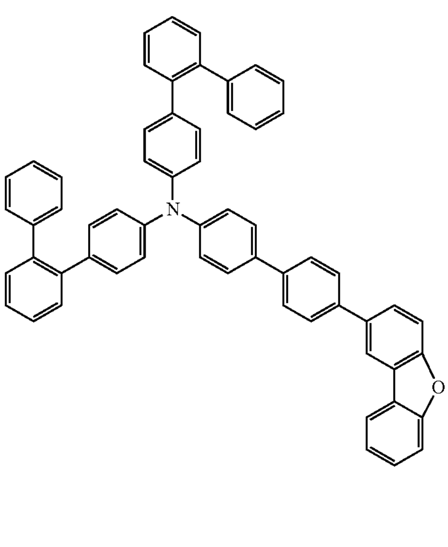
(6-116)
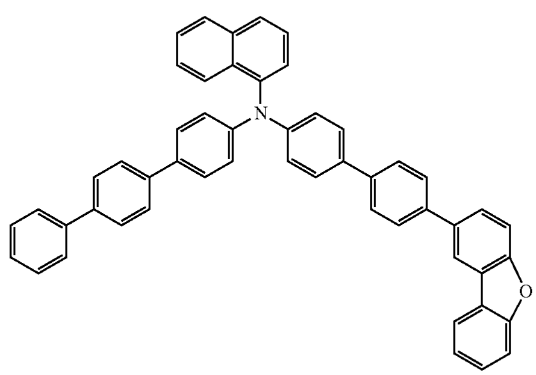

-continued
(6-117)
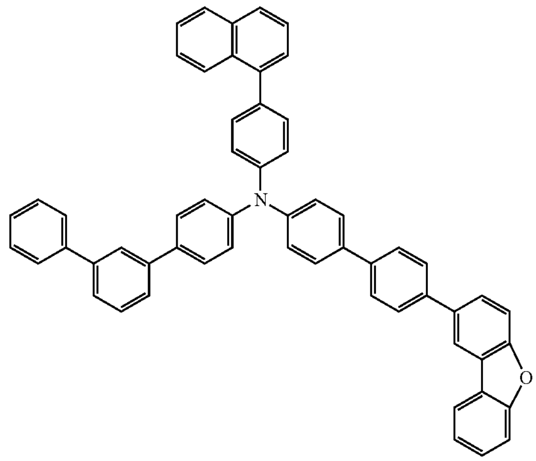
(6-118)
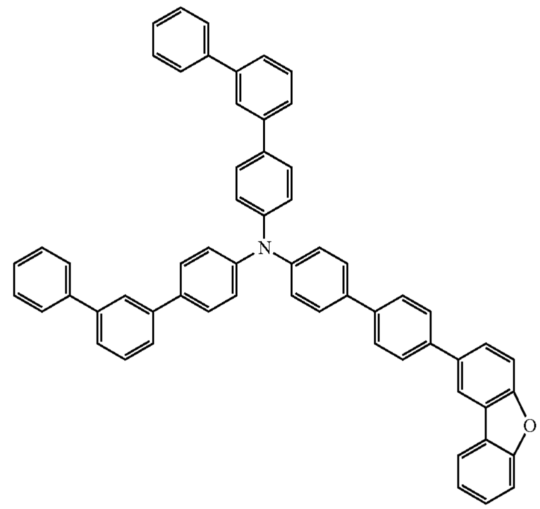
(6-119)
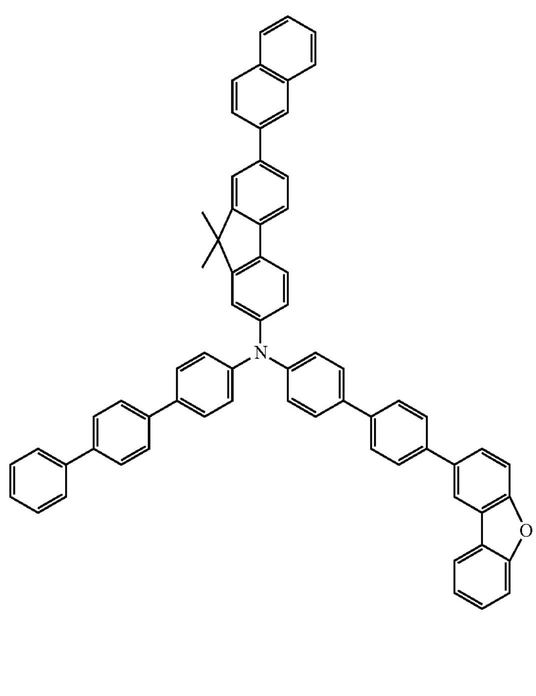
(6-120)
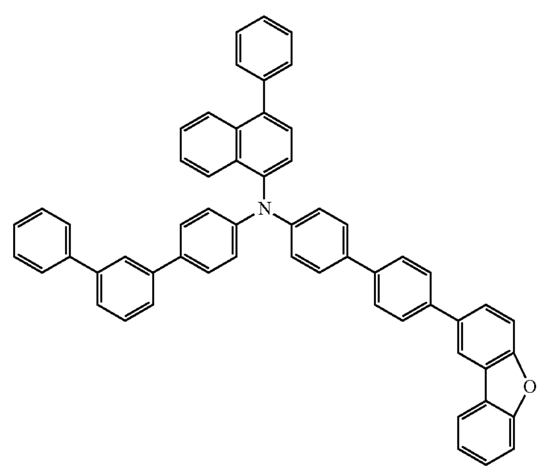

-continued
(6-121)
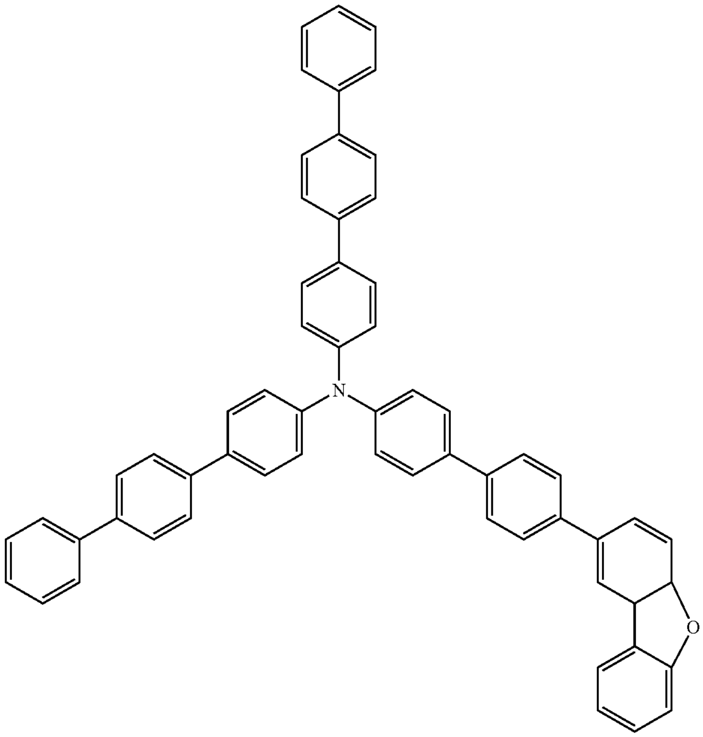
(6-122)
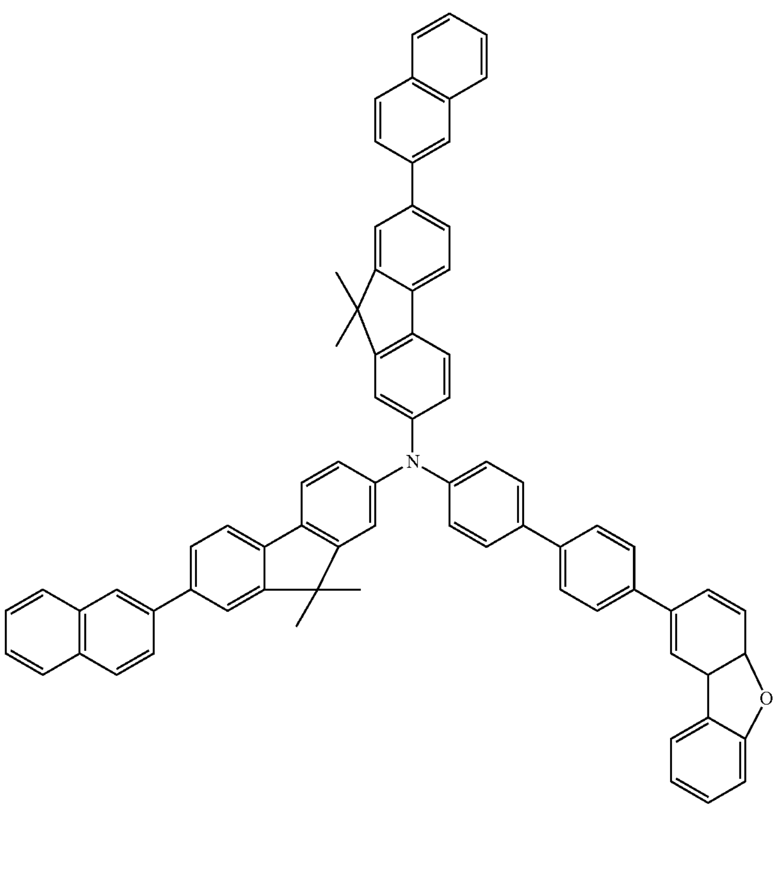

-continued
(6-123)
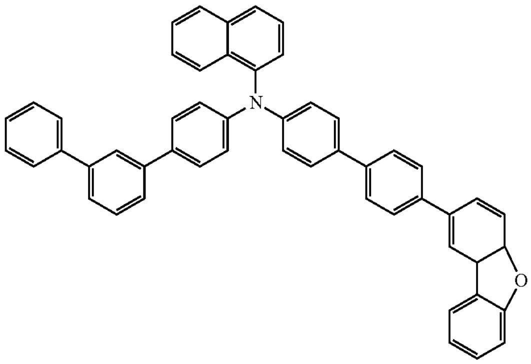
(6-124)
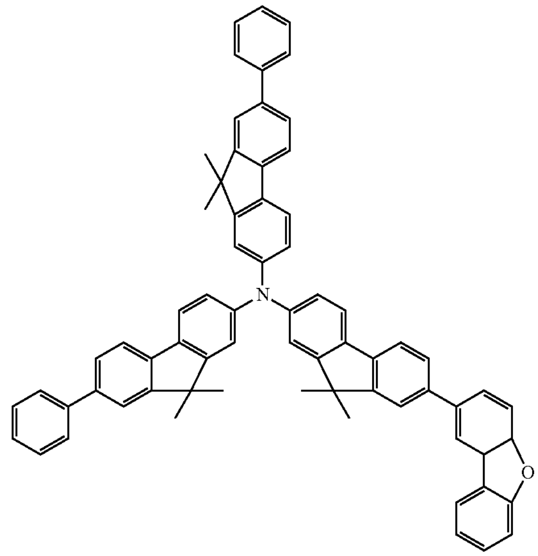
(6-125)
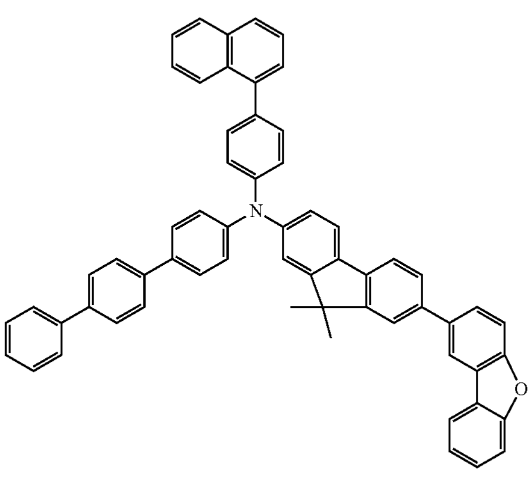
(6-126)
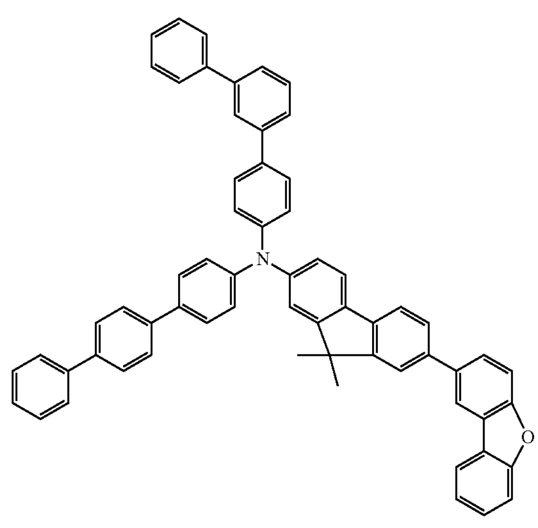

-continued
(6-127)
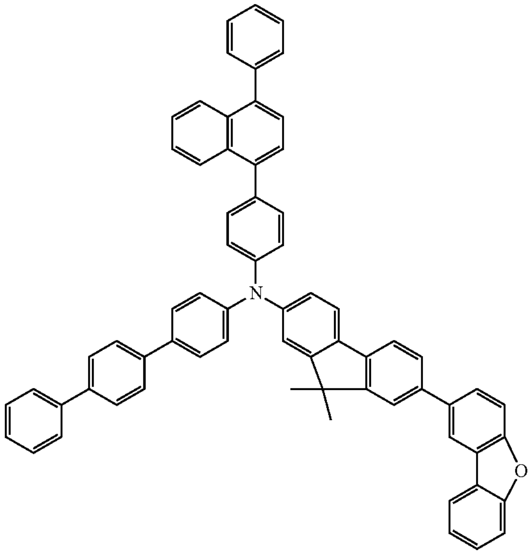
(6-128)
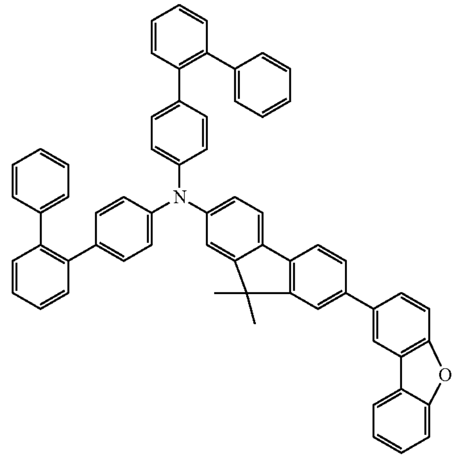
(6-129)
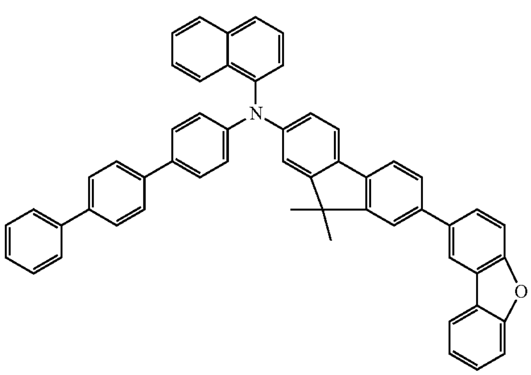
(6-130)
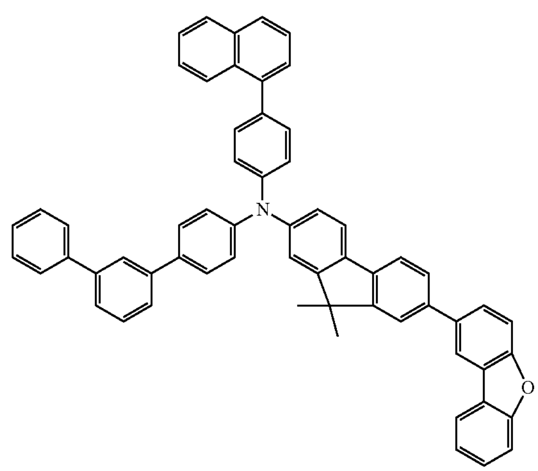

-continued
(6-131)
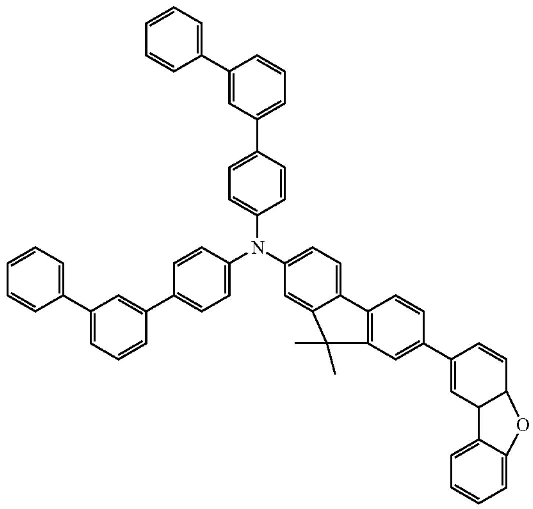
(6-132)
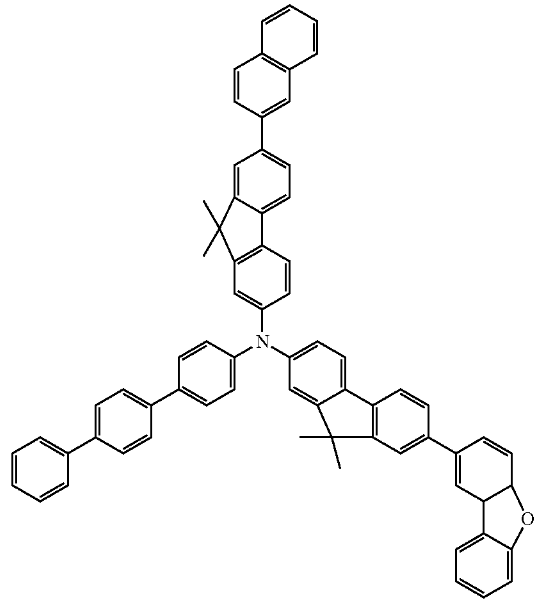
(6-133)
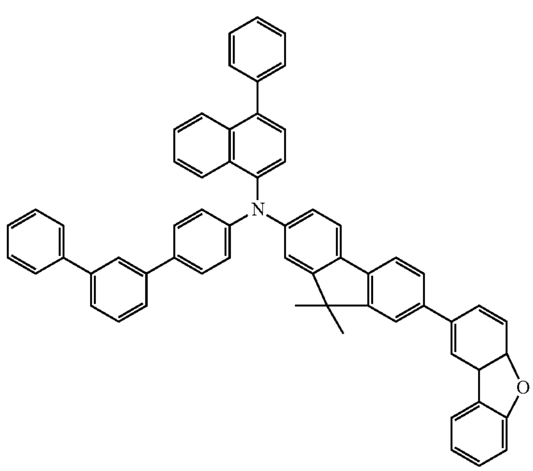
(6-134)
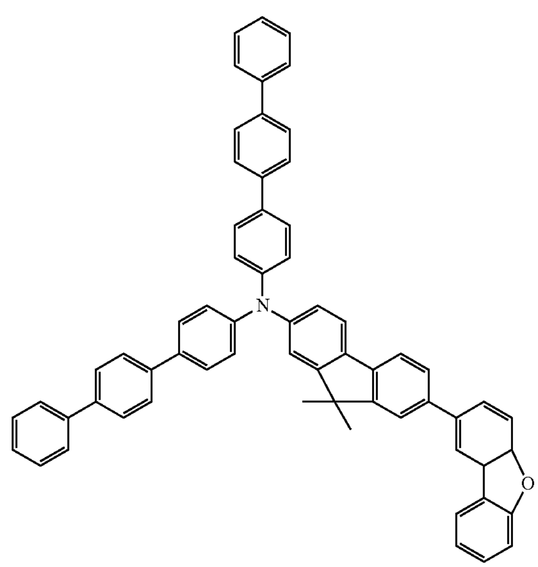

-continued
(6-135)
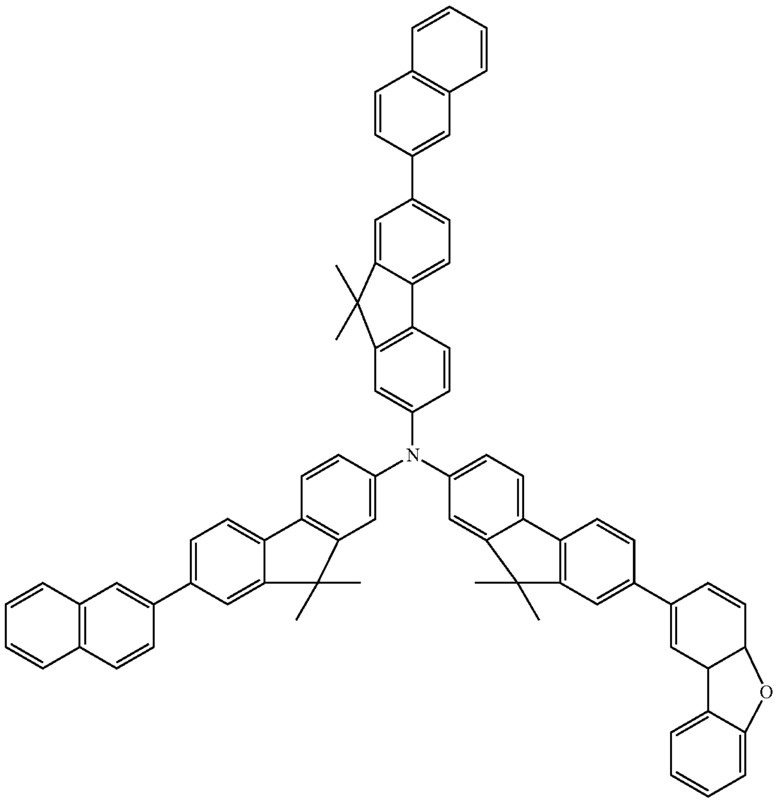
(6-136)
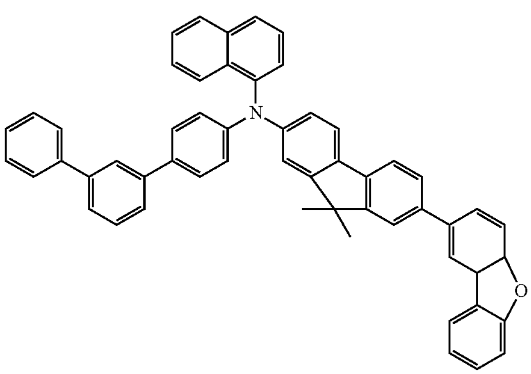
(6-137)
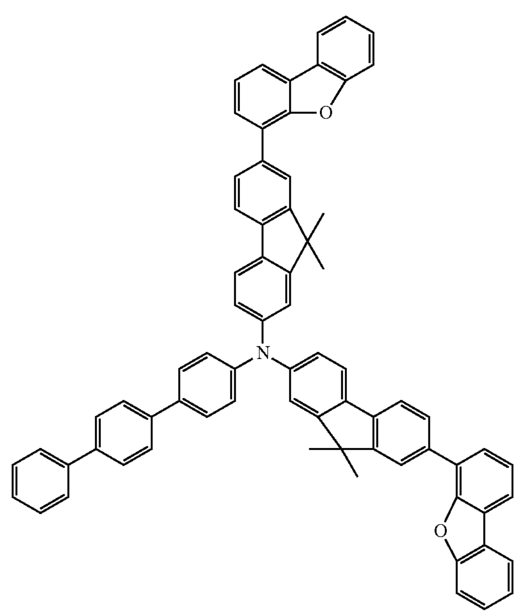

-continued
(6-138)
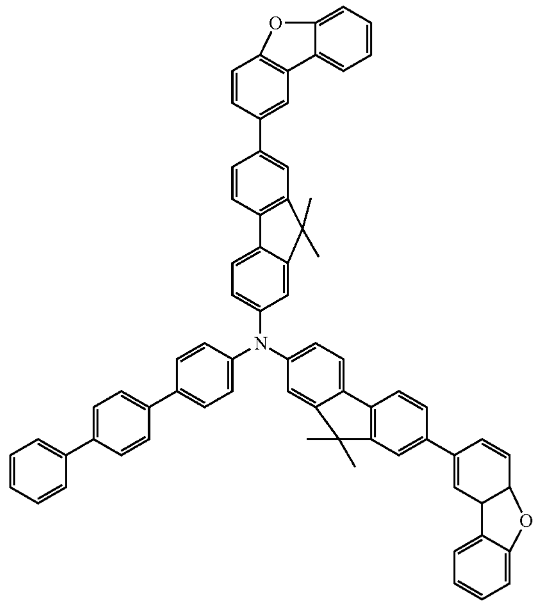
(6-139)
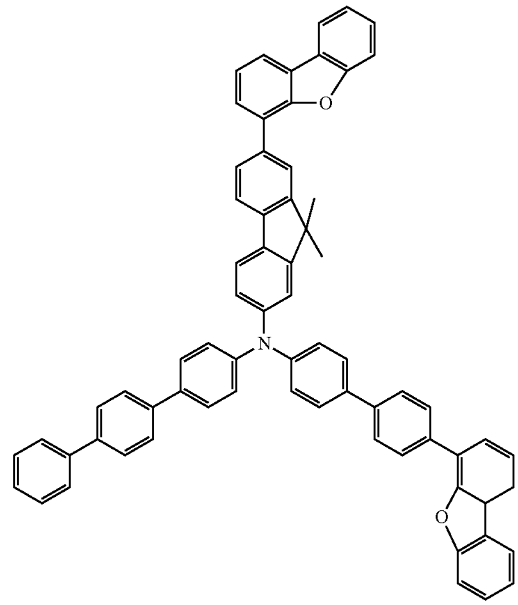
(6-140)
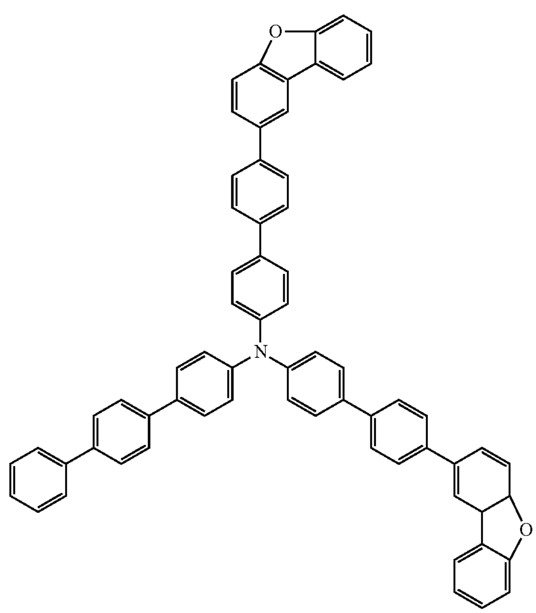
(6-141)
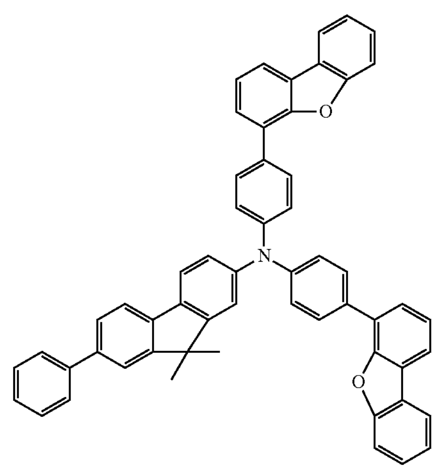

-continued
(6-142)
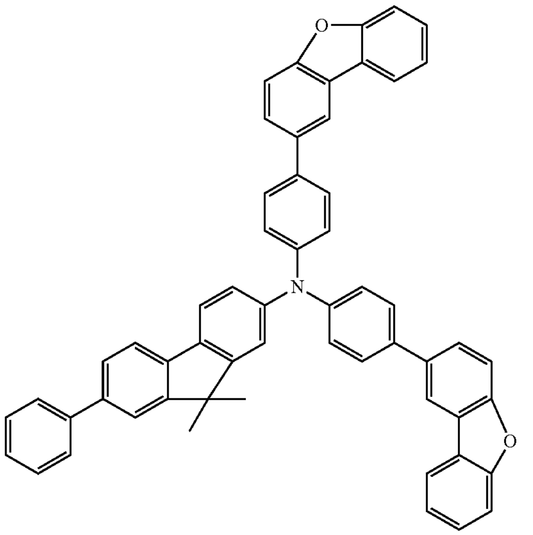
(6-143)
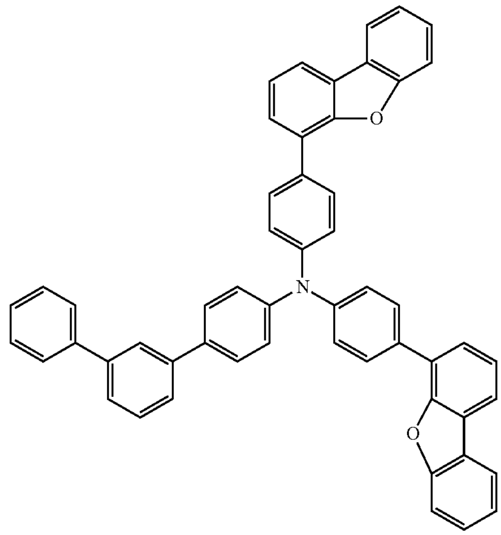
(6-145)
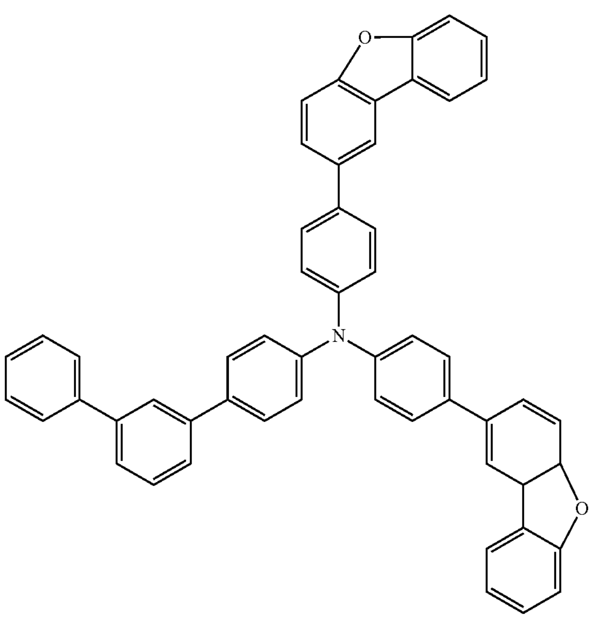
(6-146)
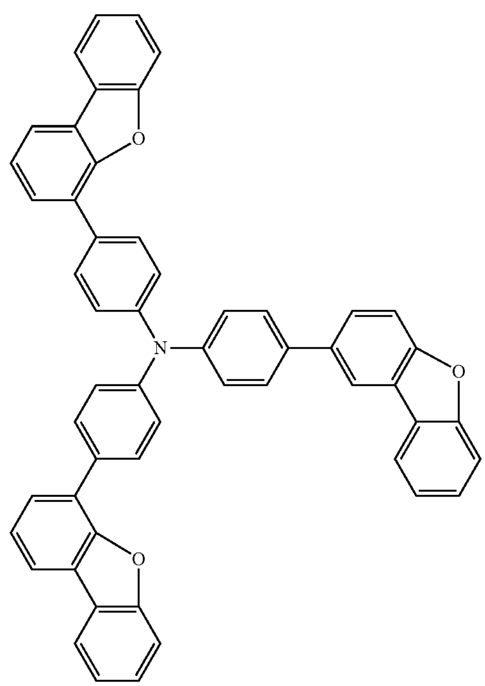

-continued
(6-147)
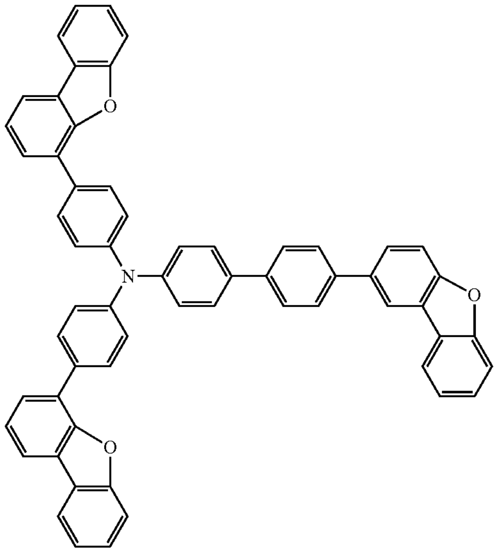
(6-148)
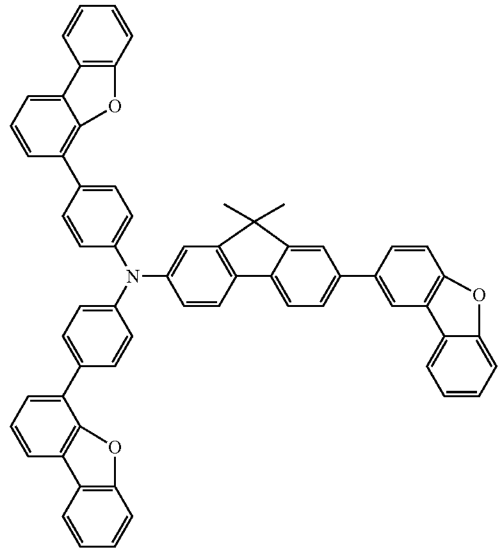
(6-149)
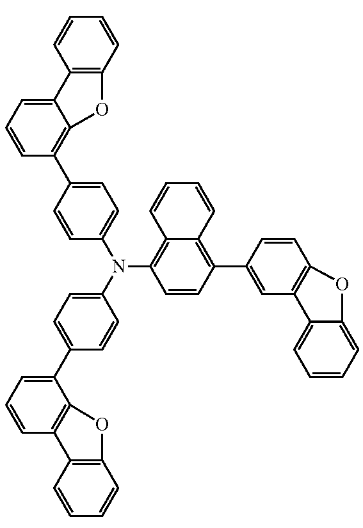
(6-150)
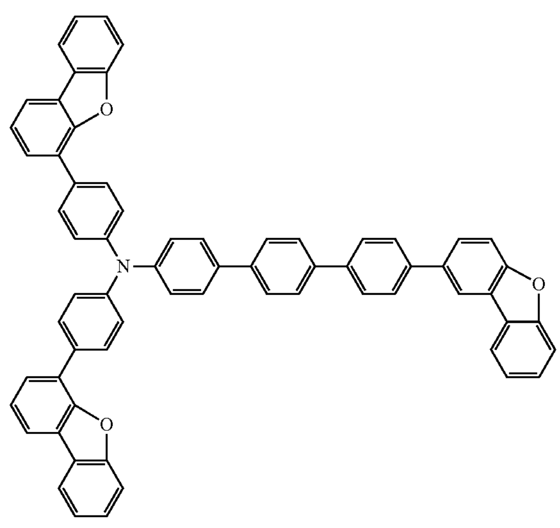

-continued
(6-151)
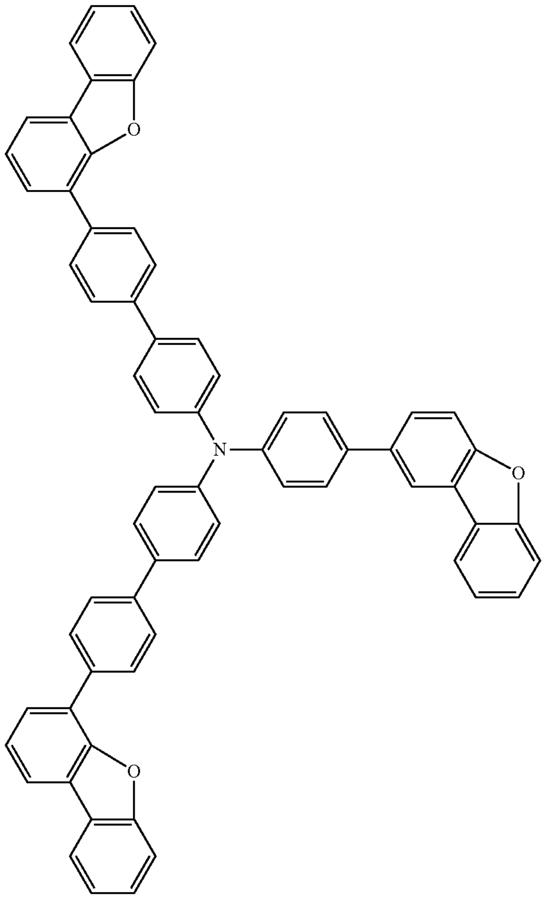
(6-152)
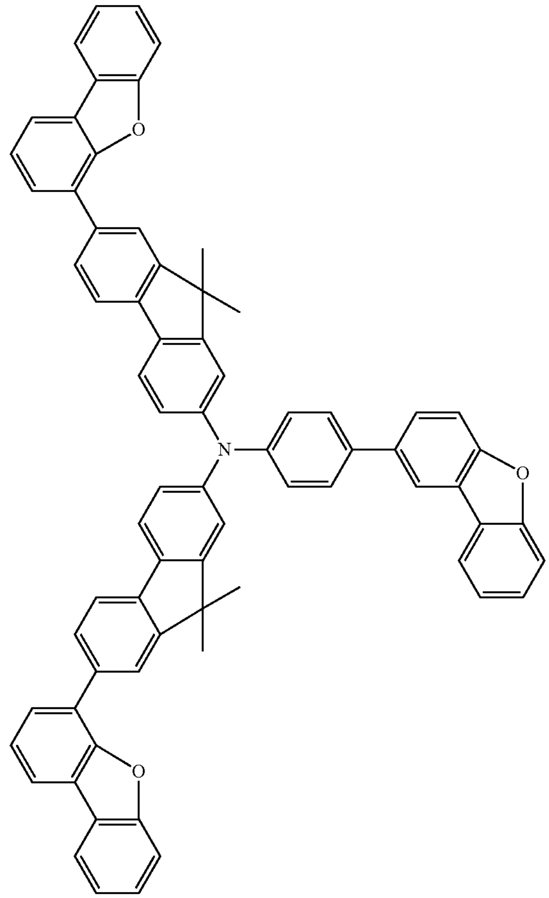
(6-153)
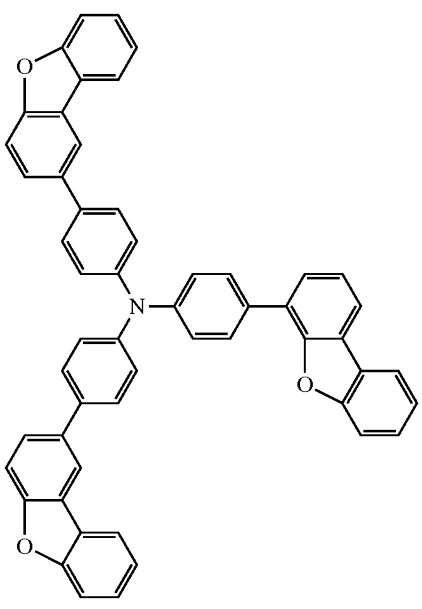
(6-154)
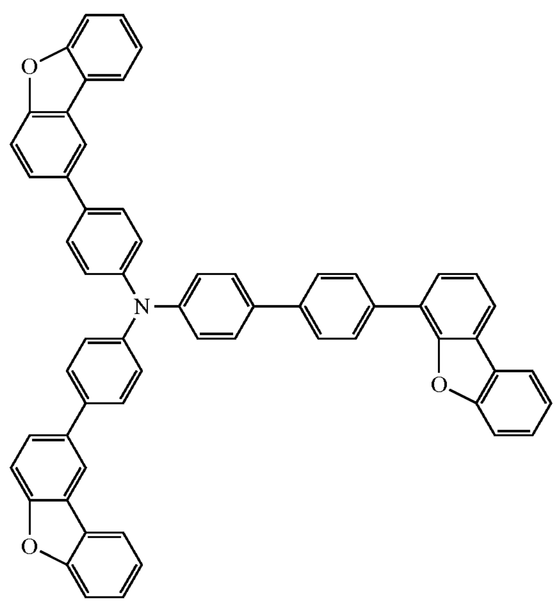

-continued
(6-155)
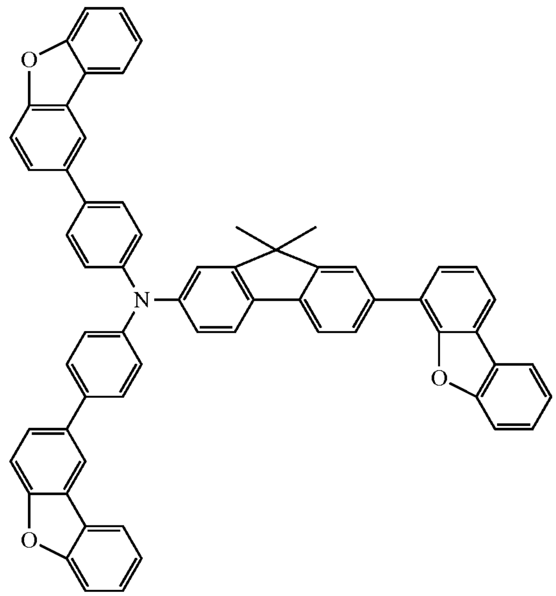
(6-156)
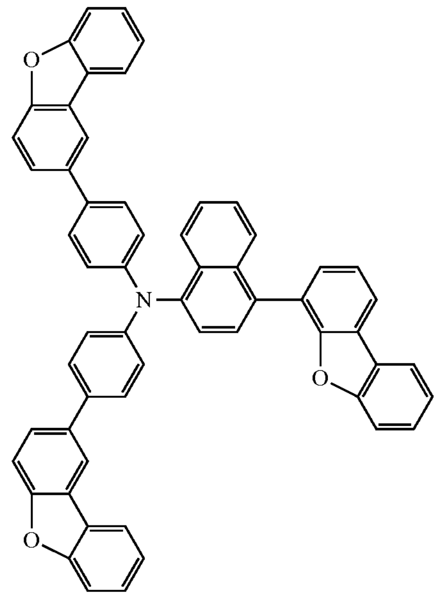
(6-157)
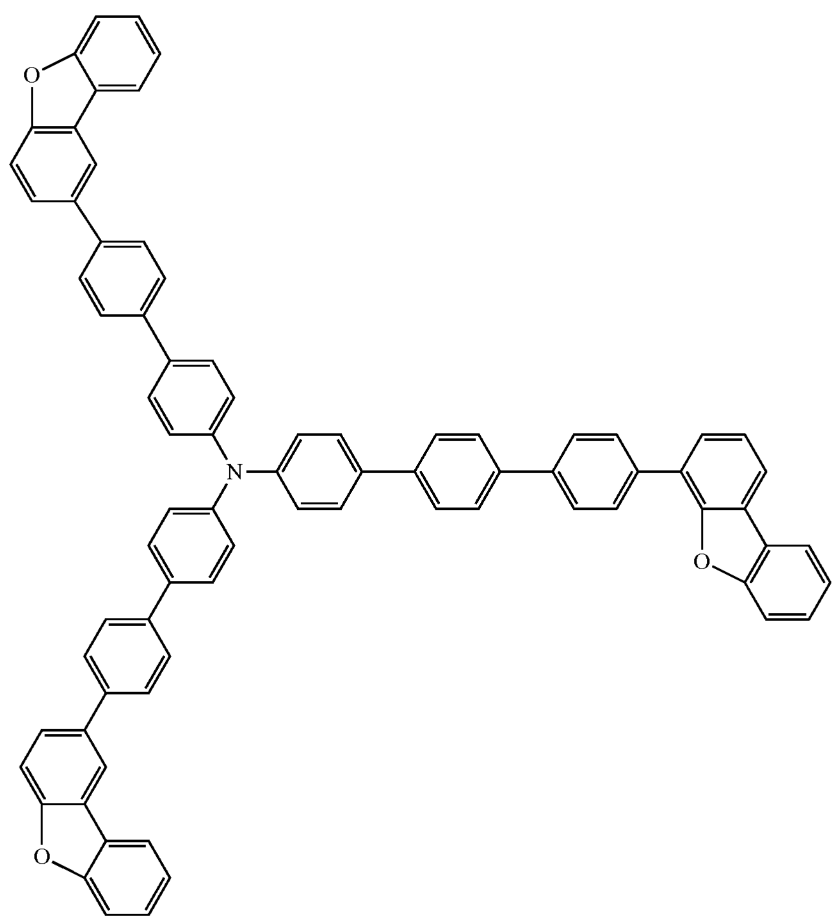

-continued
(6-158)
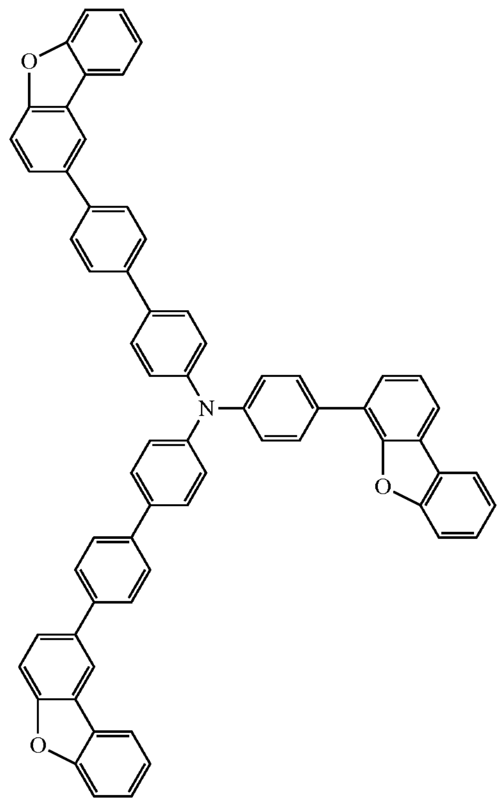
(6-159)
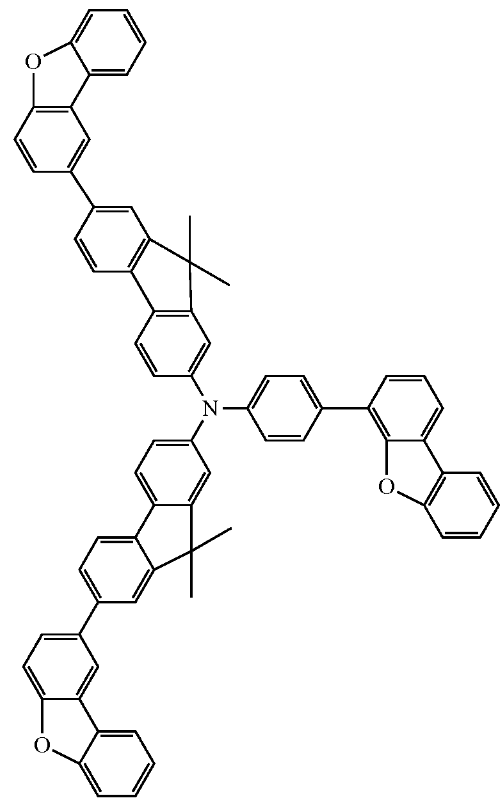
(6-160)
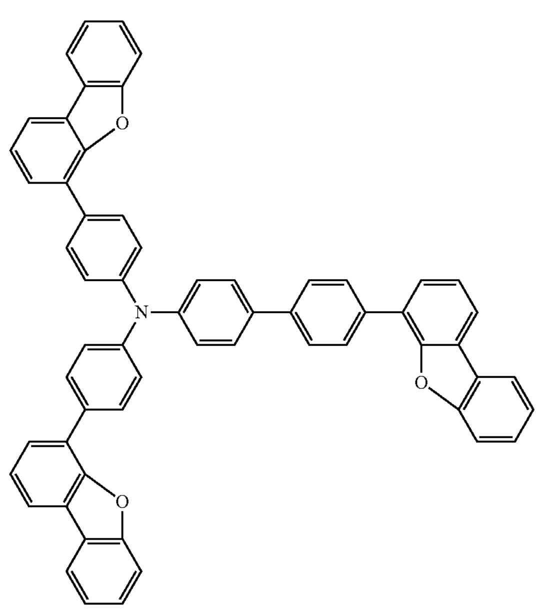
(6-161)
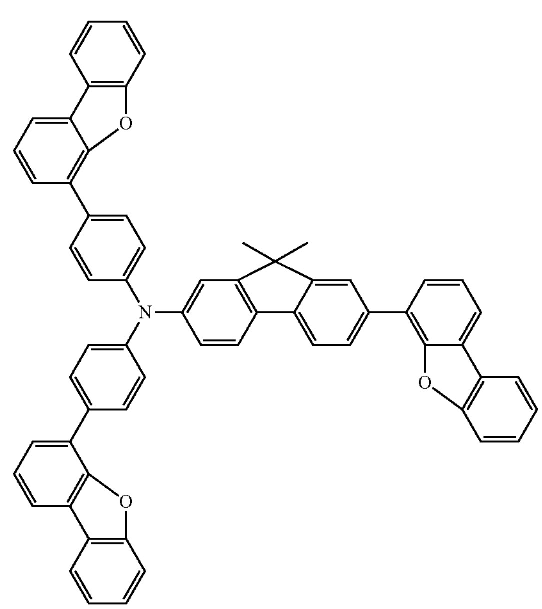

-continued
(6-162)
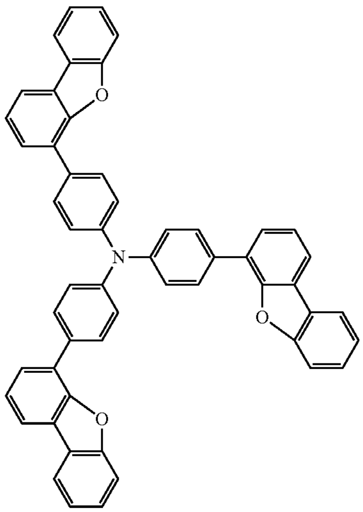
(6-163)
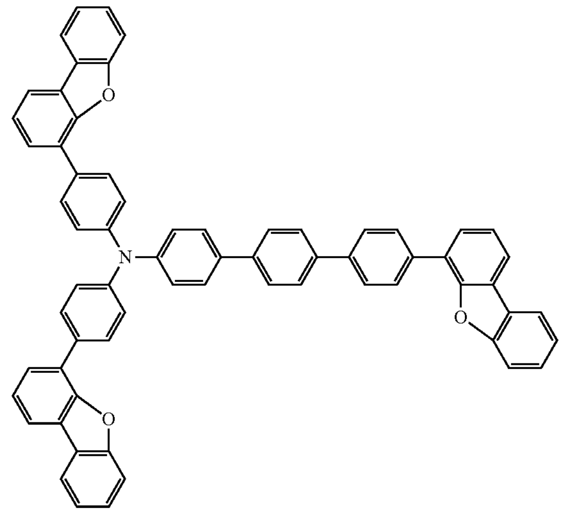
(6-164)
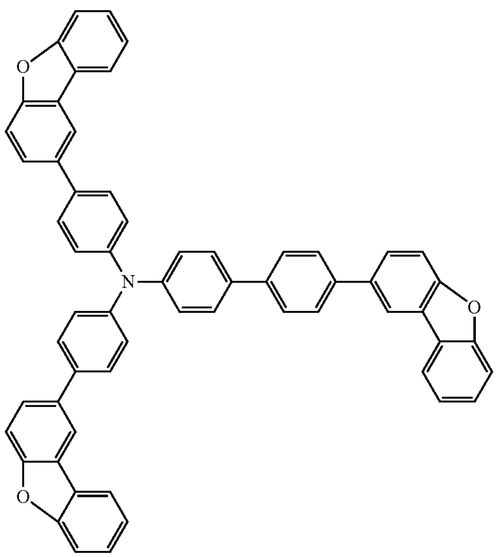
(6-165)
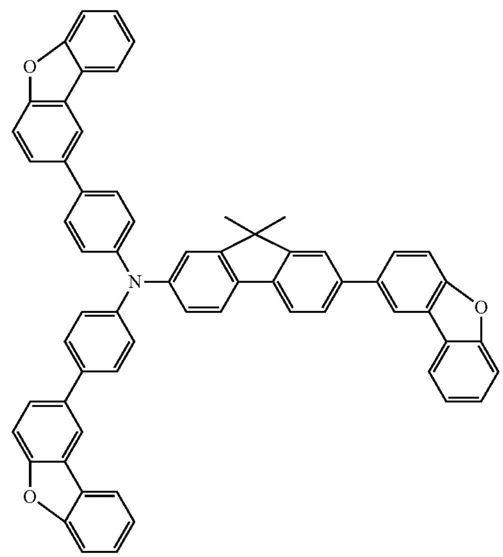
(6-166)
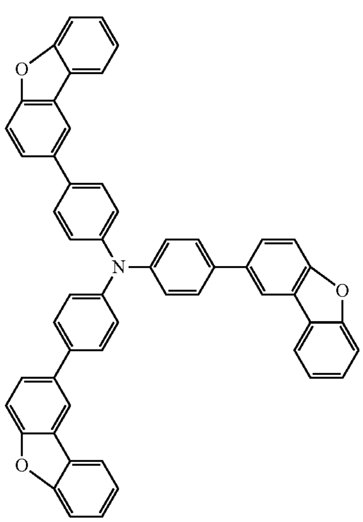
(6-167)
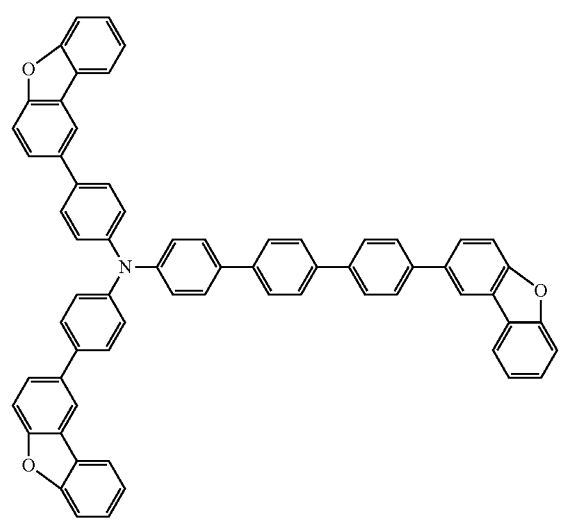

-continued
(6-168)
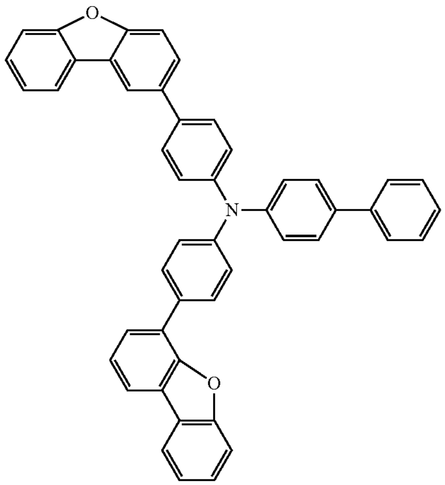
(6-169)
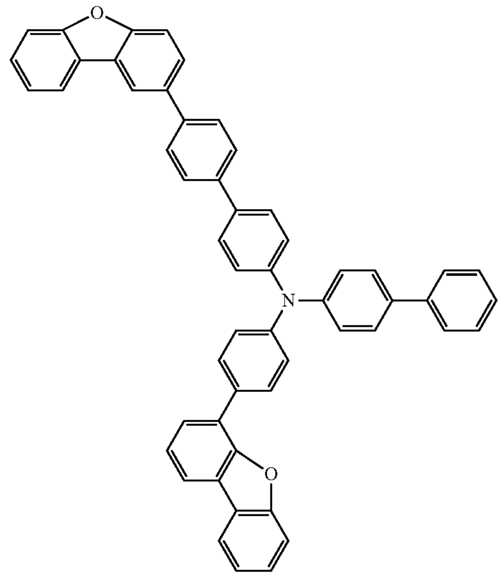
(6-170)
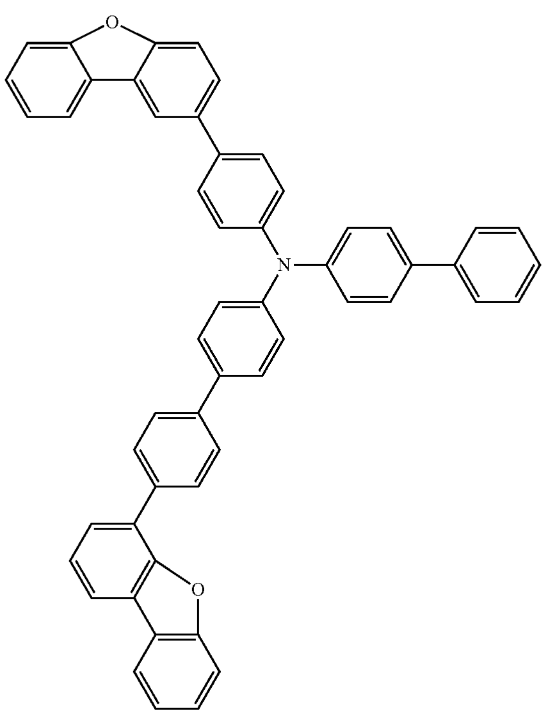
(6-171)
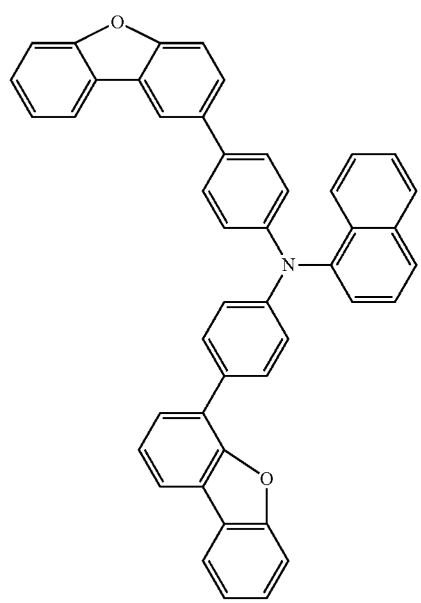

-continued
(6-172)
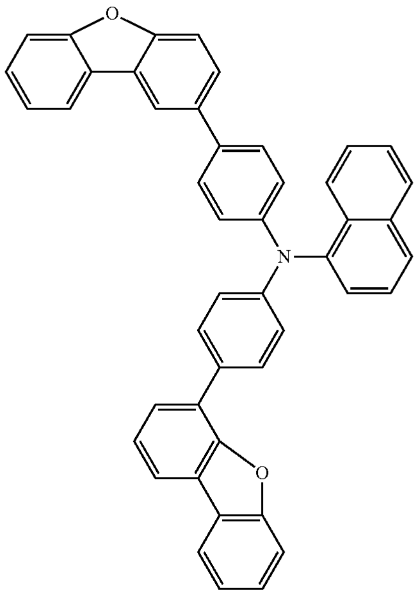
(6-173)
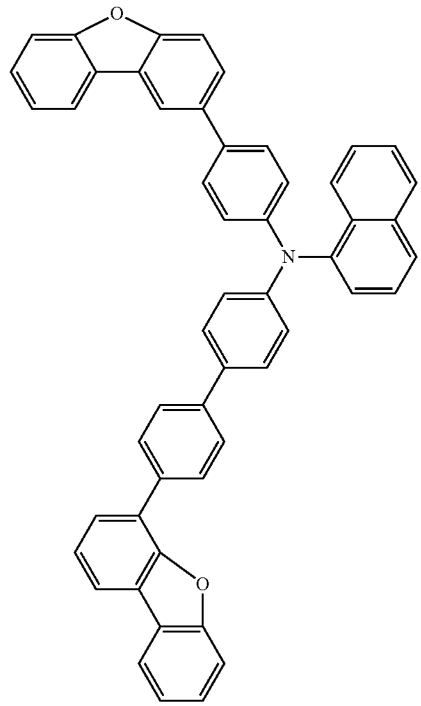
(6-174)
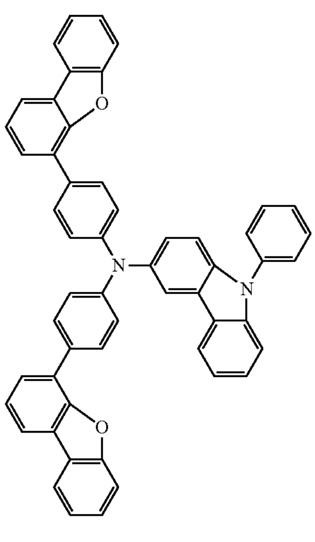
(6-175)
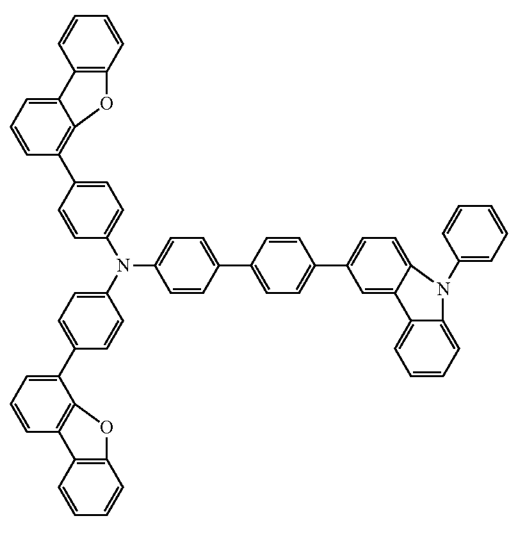

-continued
(6-176)
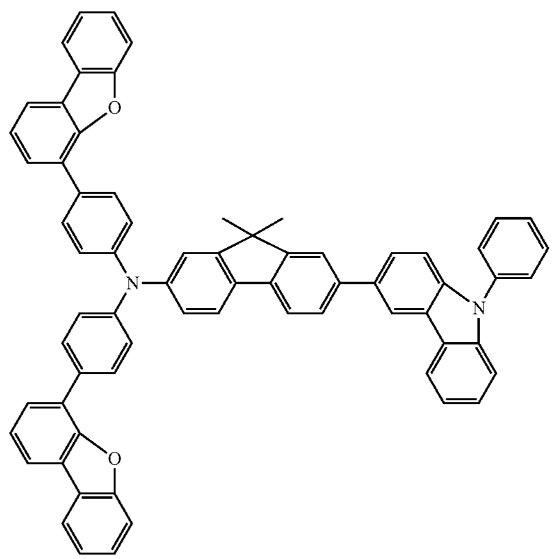
(6-177)
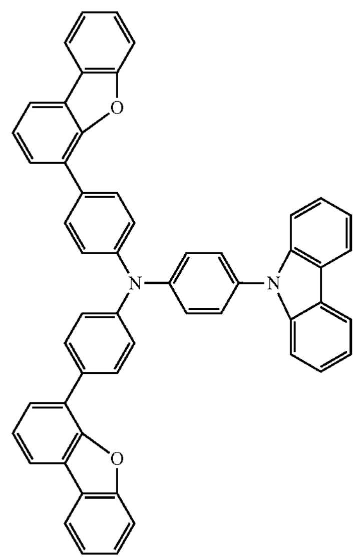
(6-178)
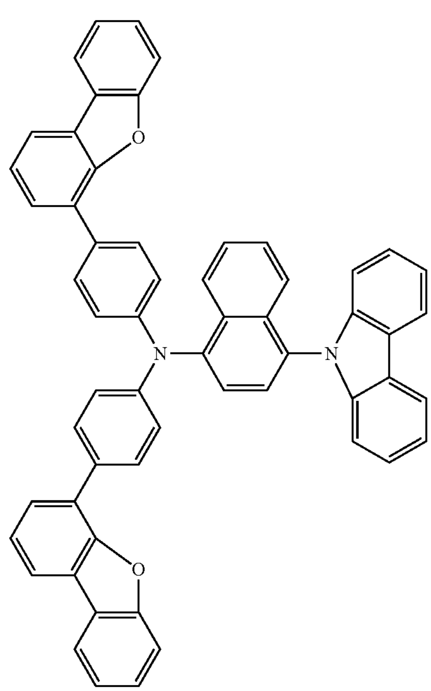
(6-179)
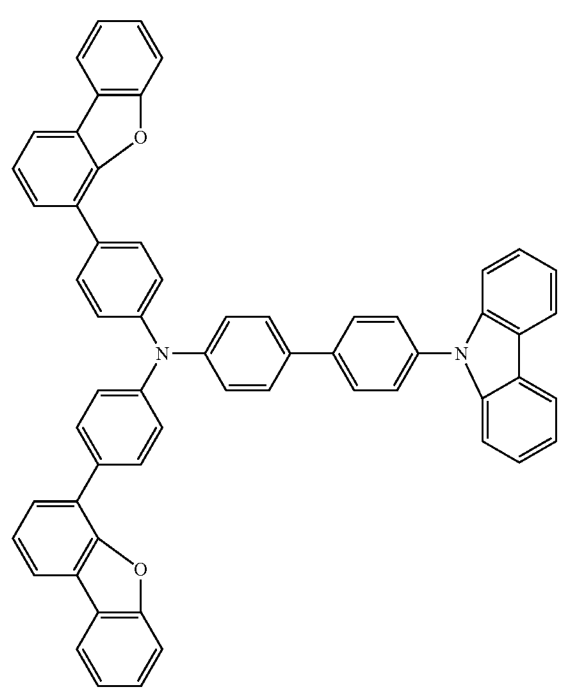

-continued
(6-180)
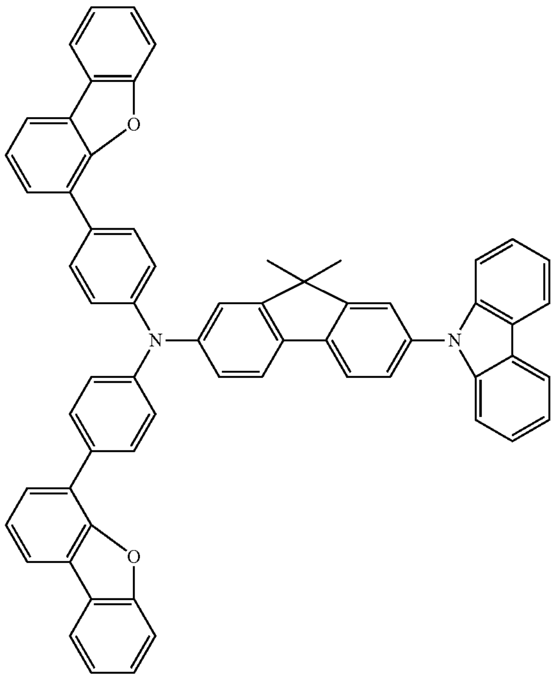
(6-181)
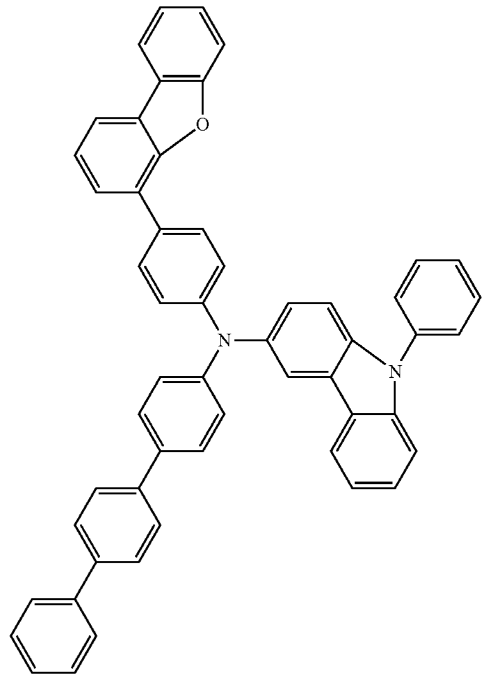
(6-182)
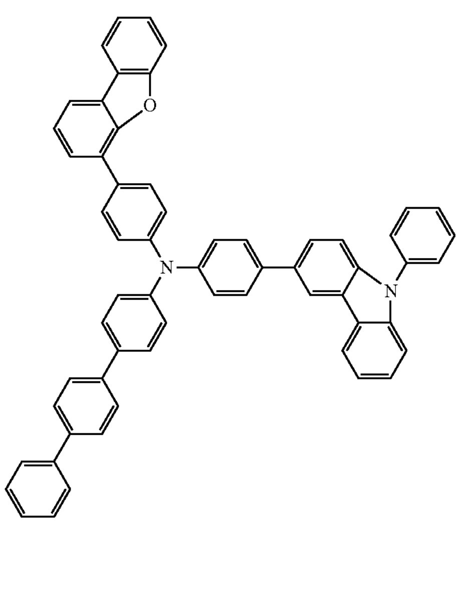
(6-183)
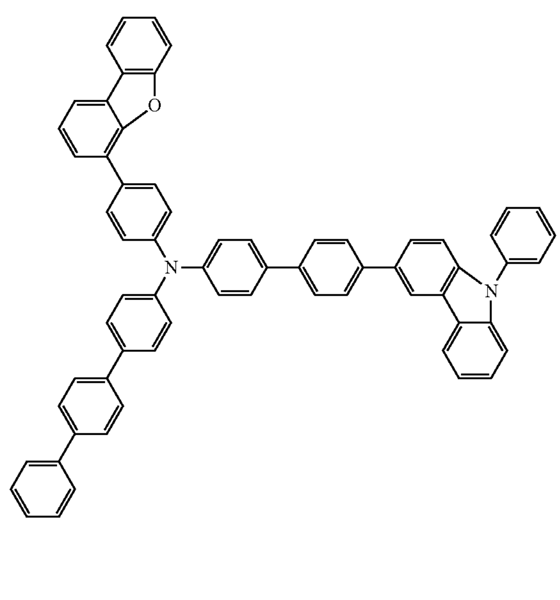

-continued
(6-184)
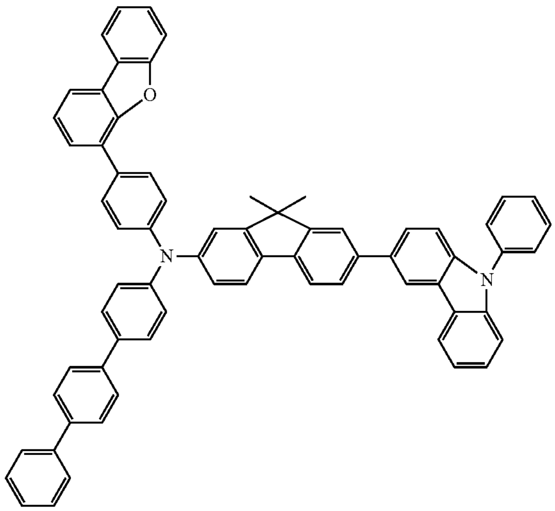
(6-185)
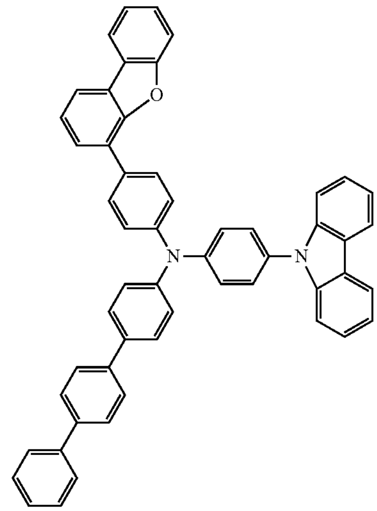
(6-186)
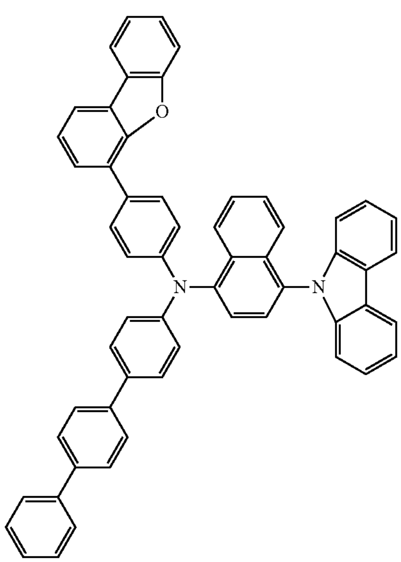
(6-187)
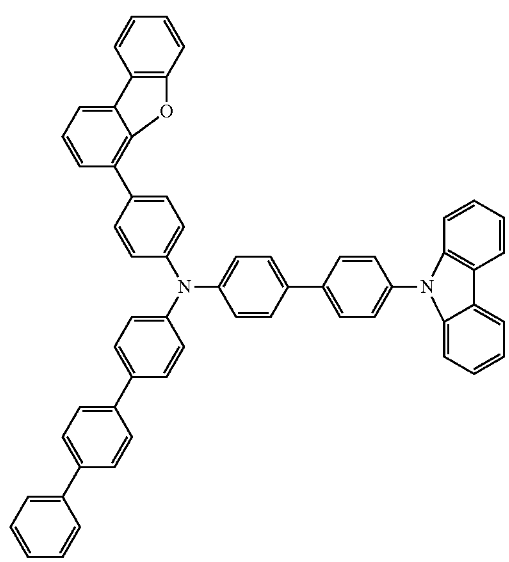

-continued
(6-188)
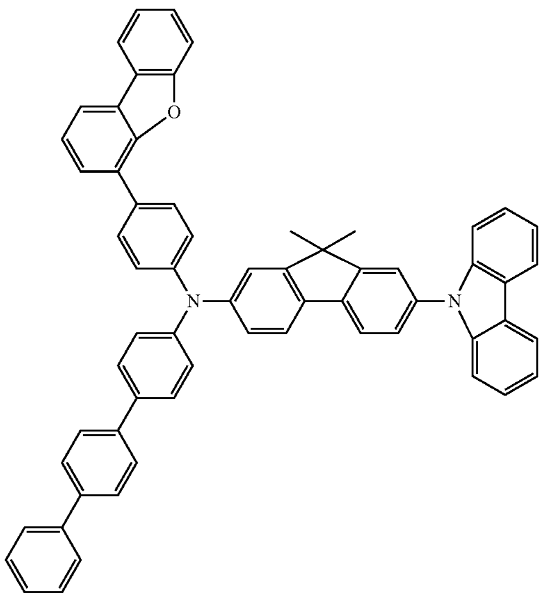
(6-189)
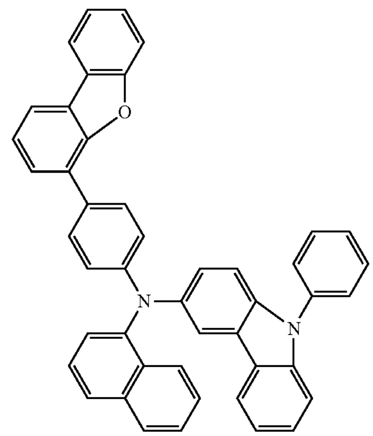
(6-190)
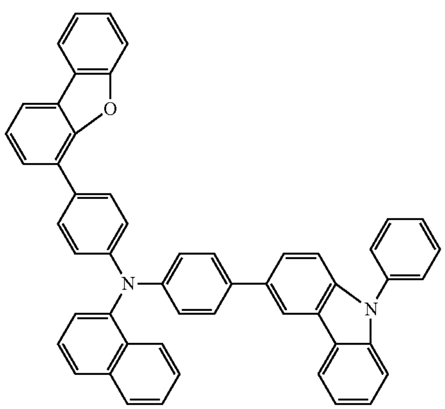
(6-191)
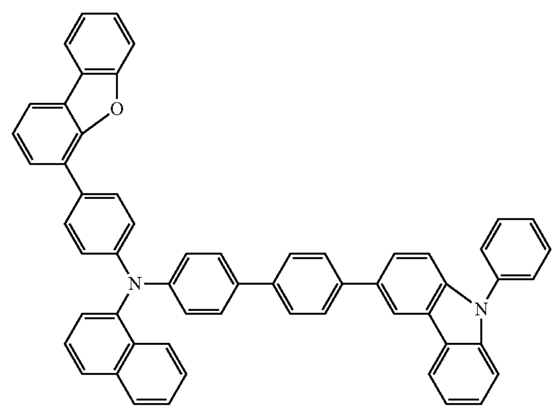
(6-192)
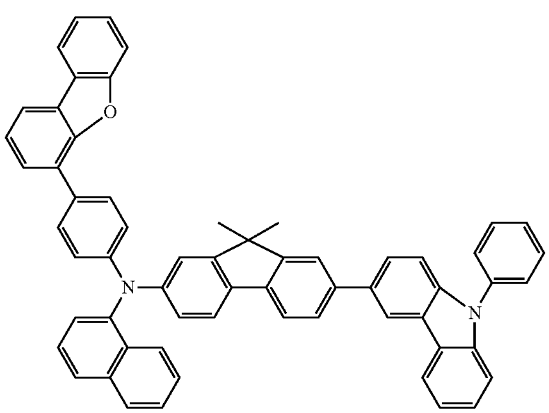
(6-193)
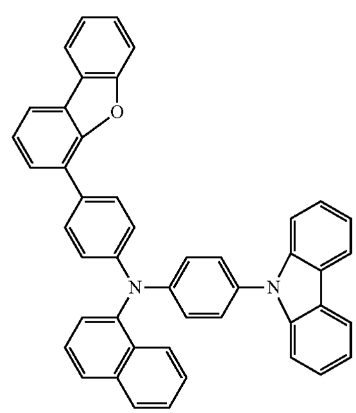

-continued
(6-194)
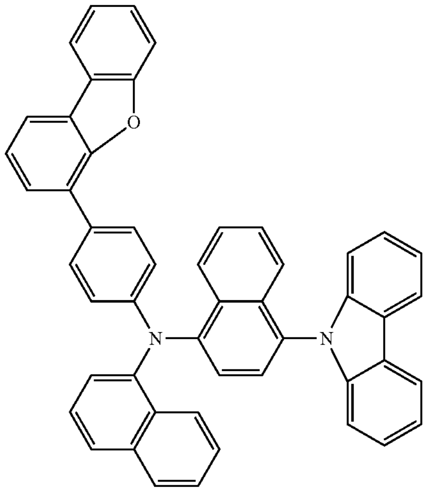
(6-195)
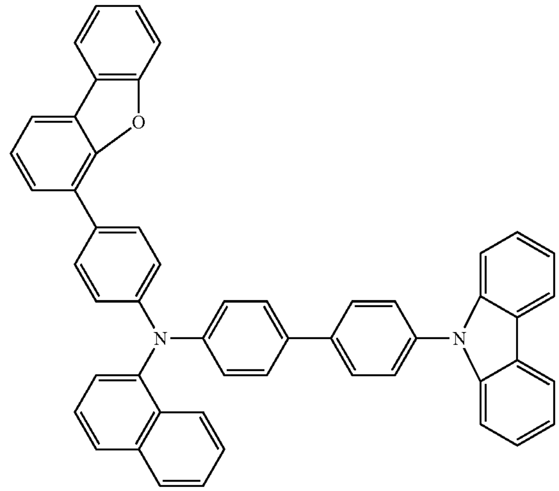
(6-196)
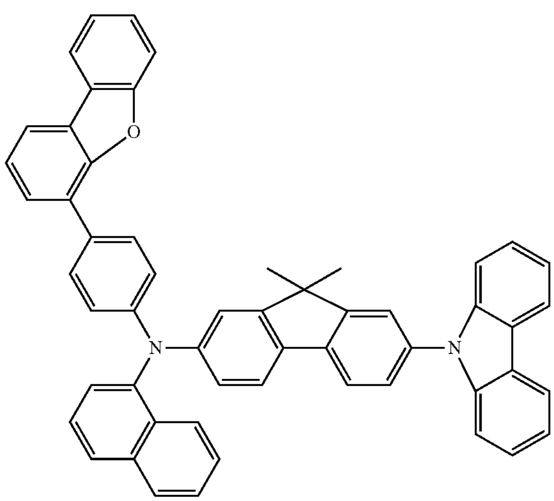
(6-197)
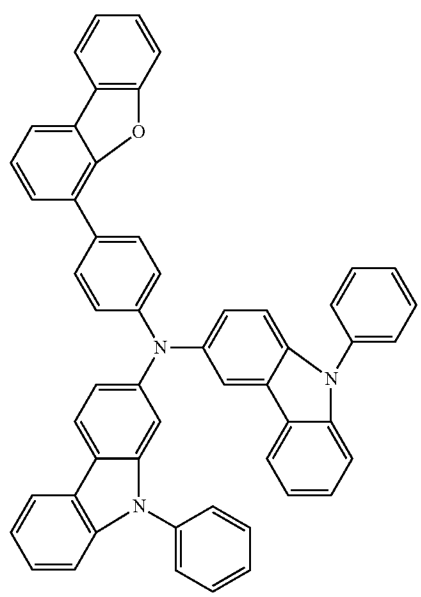

-continued
(6-198)
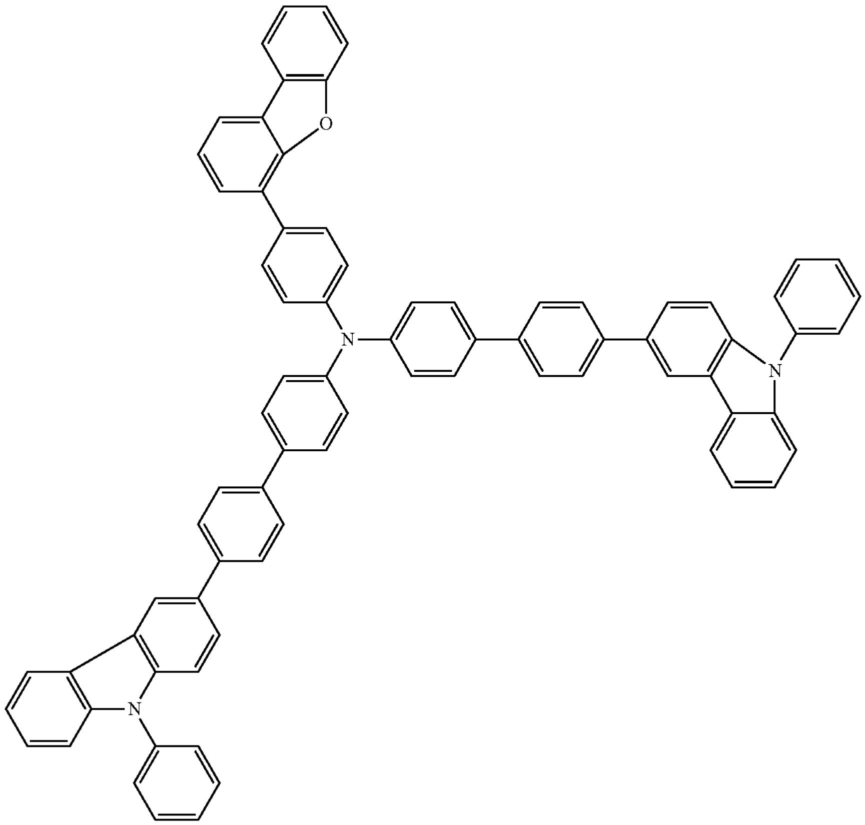
(6-199)
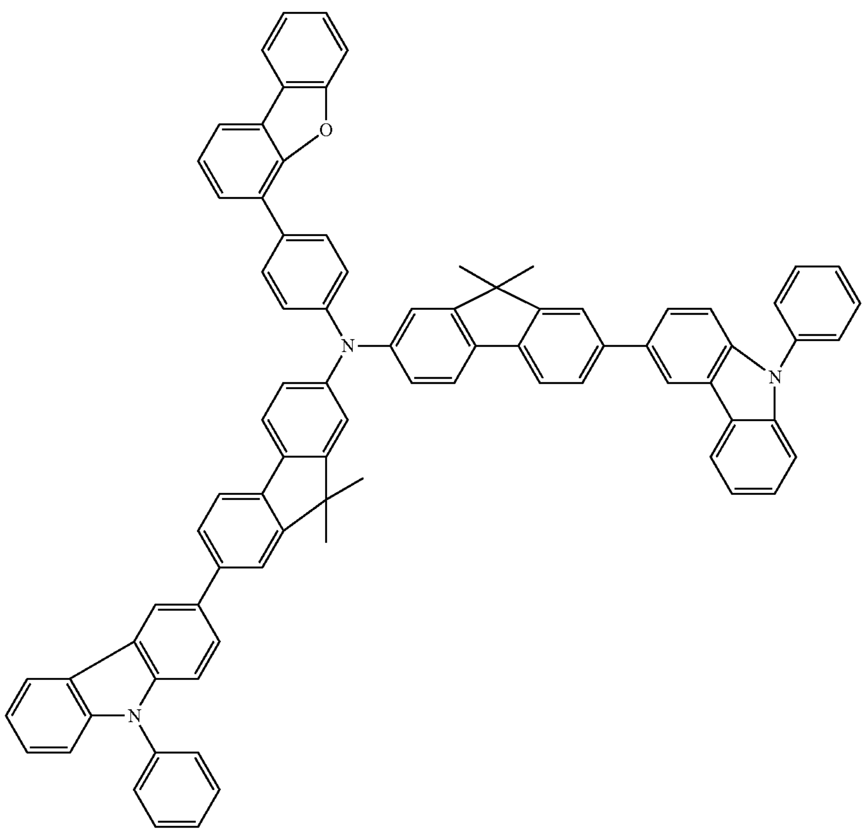

-continued
(6-200)
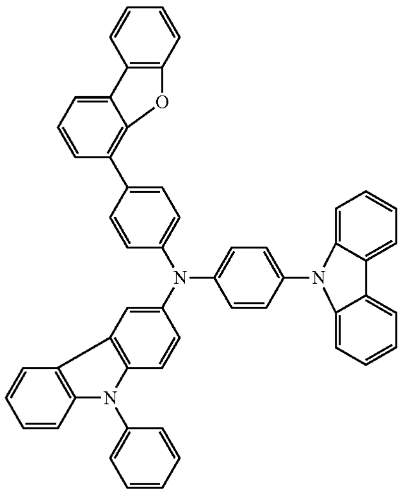
(6-201)
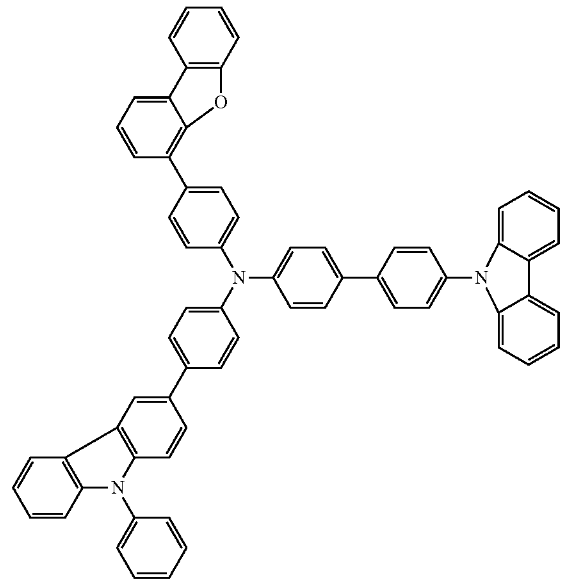
(6-202)
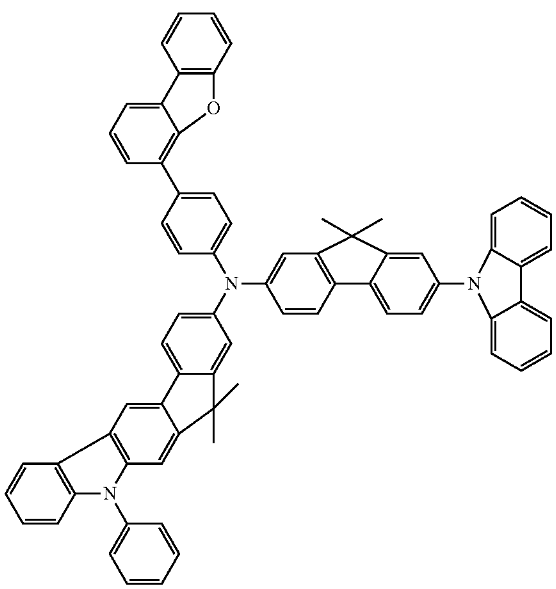
(6-203)
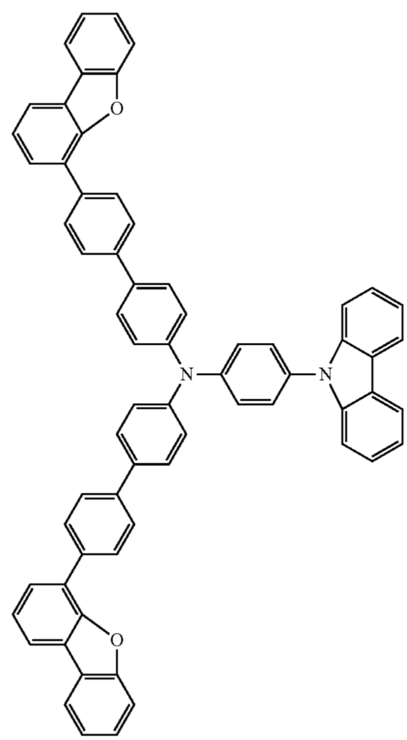

-continued
(6-204)
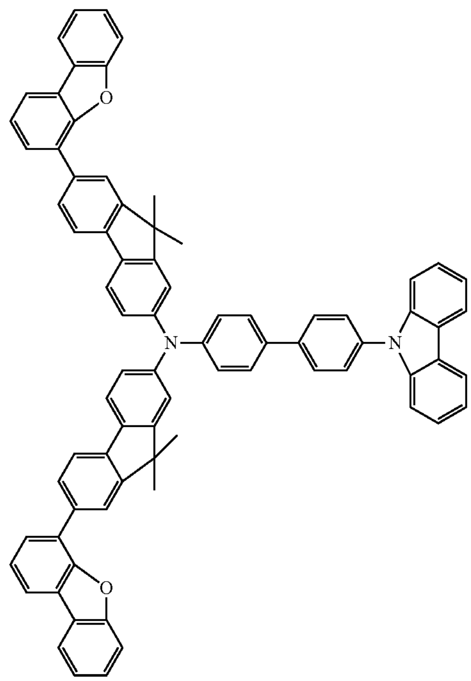
(6-205)
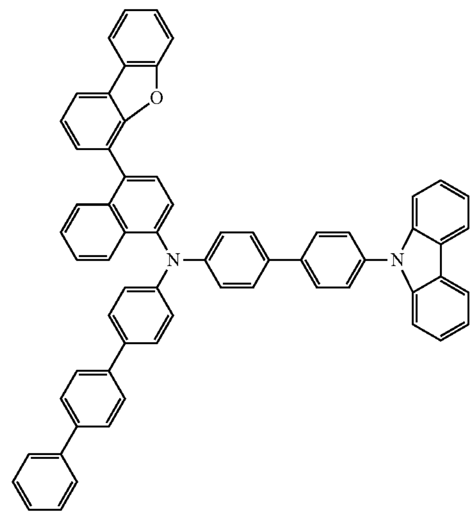
(6-206)
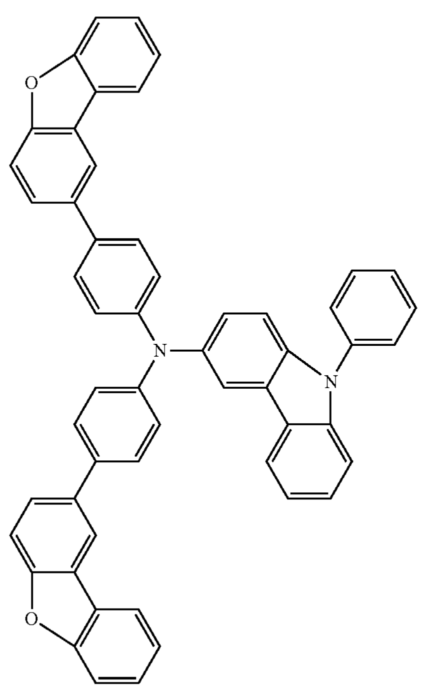
(6-207)
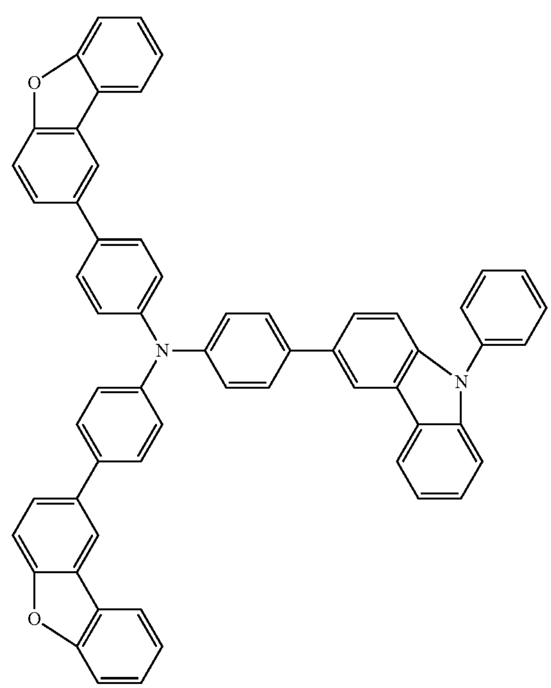

-continued
(6-208)
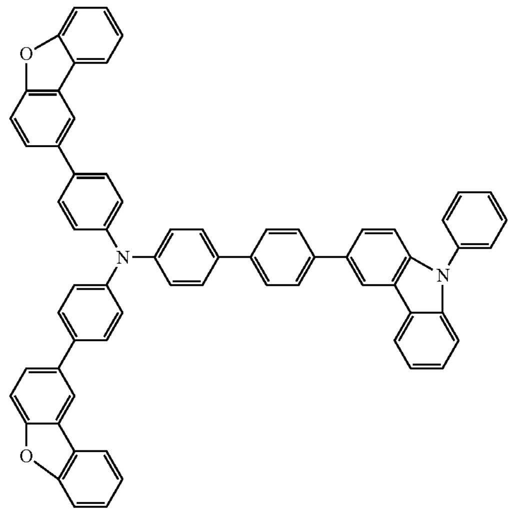
(6-209)
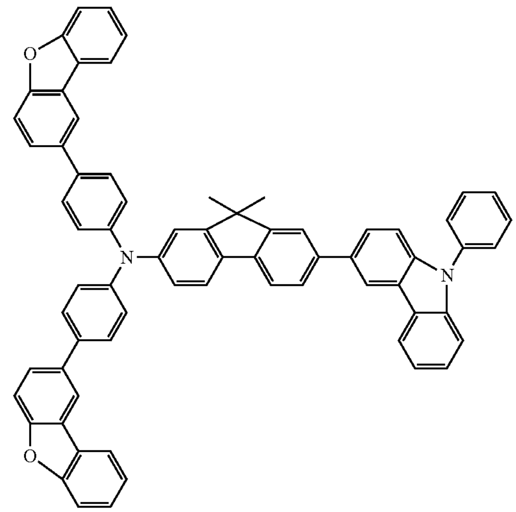
(6-210)
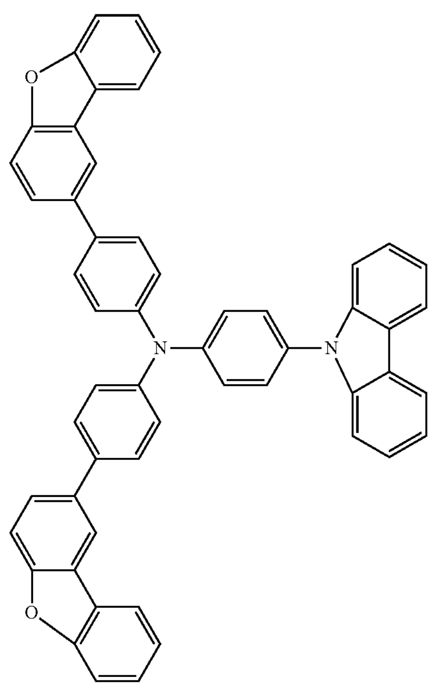
(6-211)
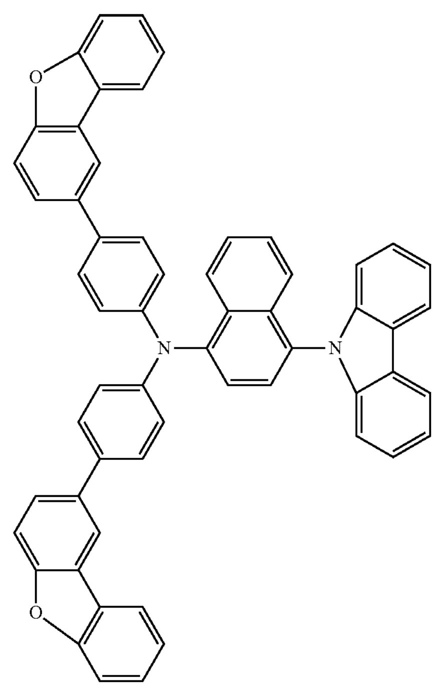

-continued
(6-212)
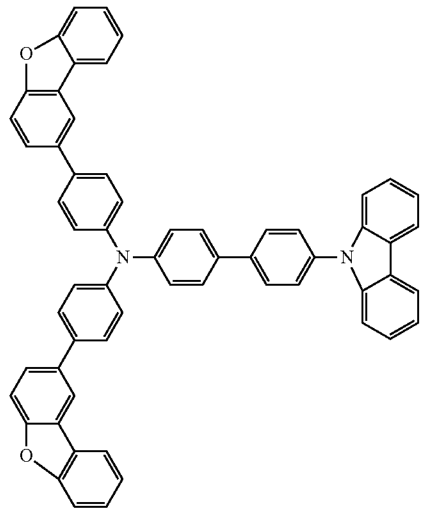
(6-213)
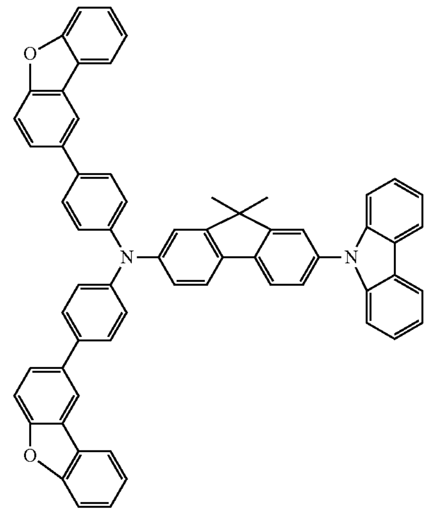
(6-214)
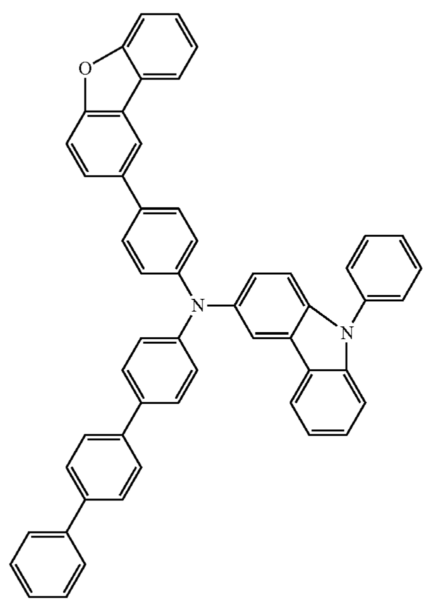
(6-215)
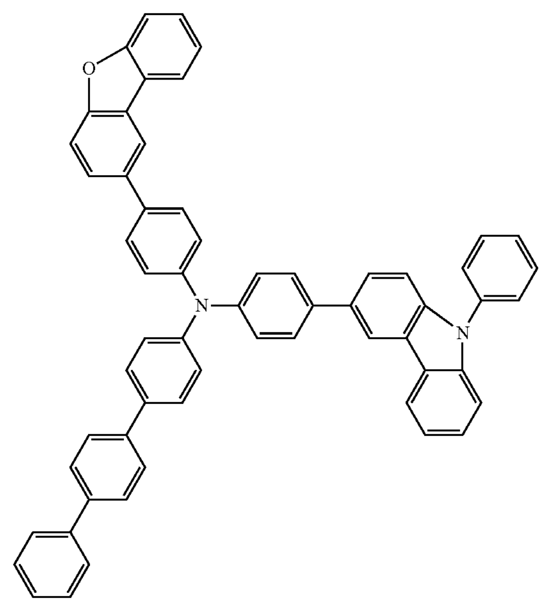
(6-216)
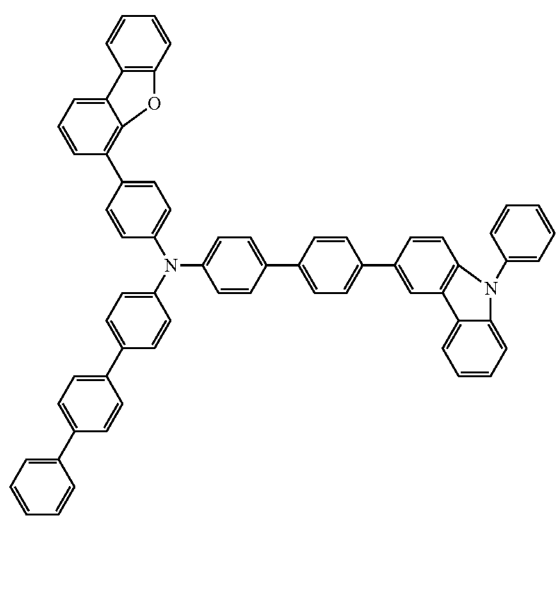
(6-217)
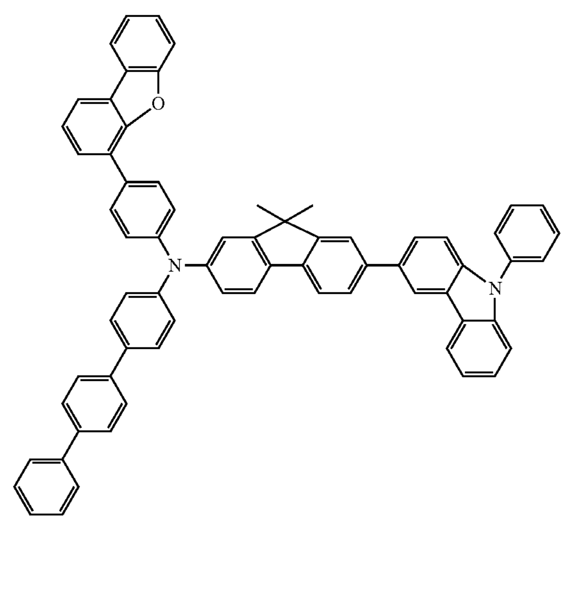

-continued
(6-218)
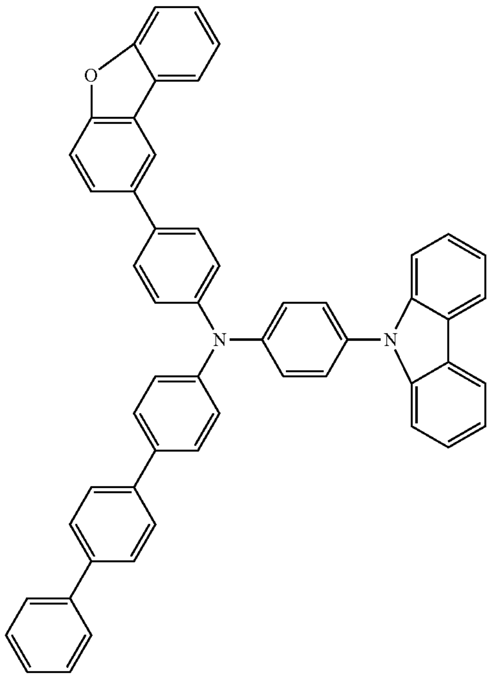
(6-219)
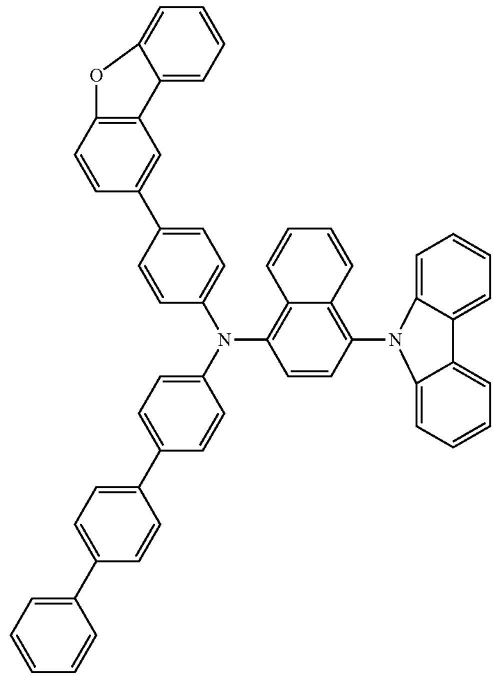
(6-220)
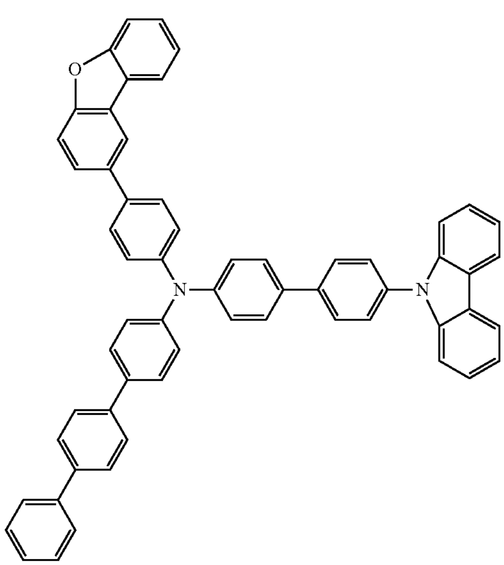
(6-221)
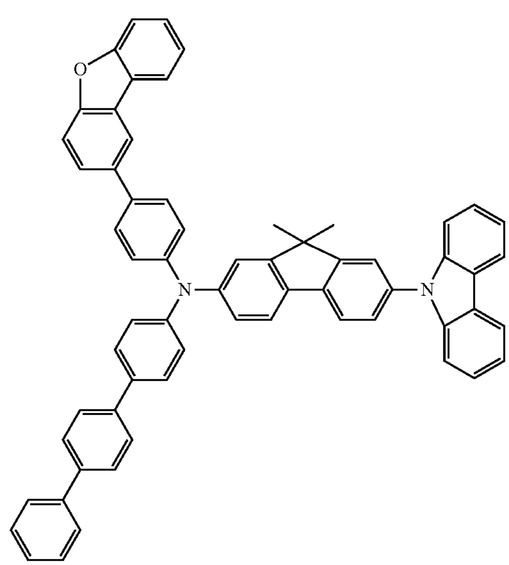

-continued
(6-222)
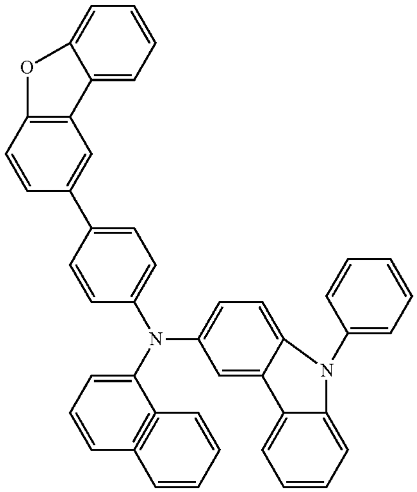
(6-223)
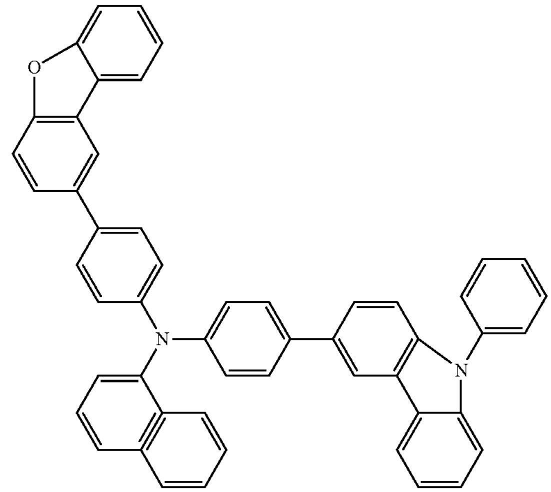
(6-224)
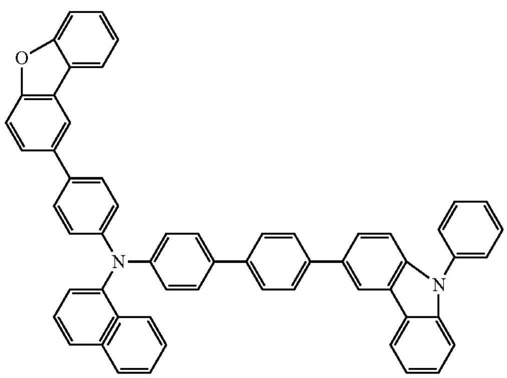
(6-225)
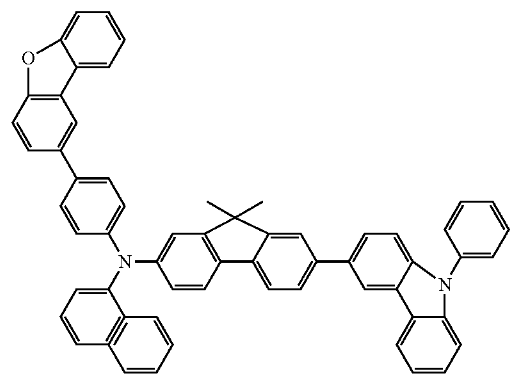
(6-226)
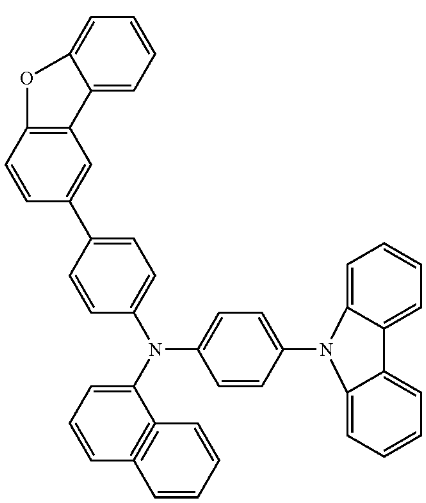
(6-227)
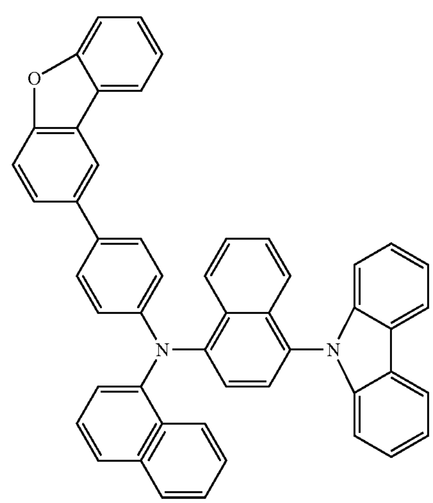

-continued
(6-228)
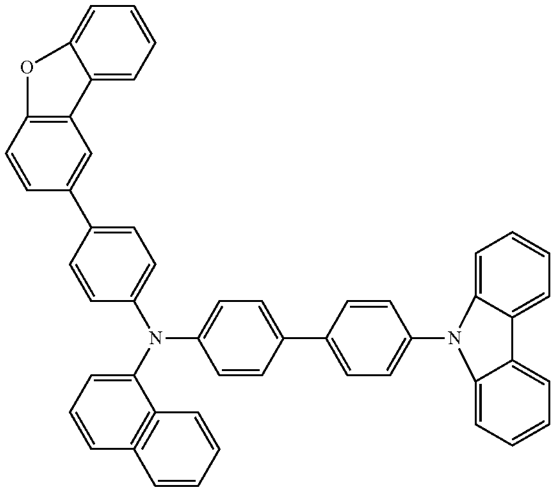
(6-229)
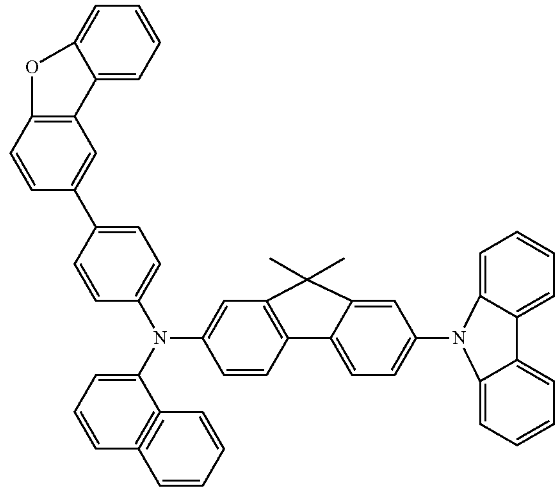
(6-230)
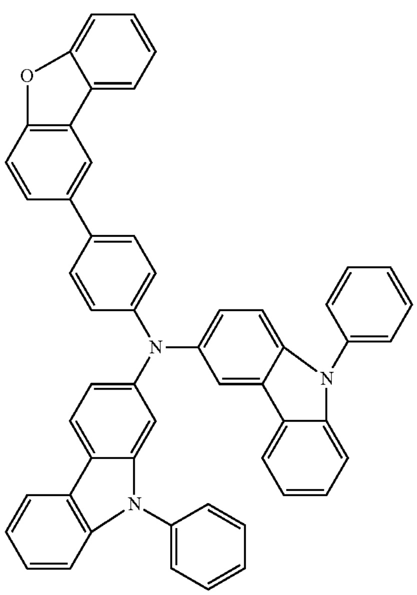

-continued
(6-231)
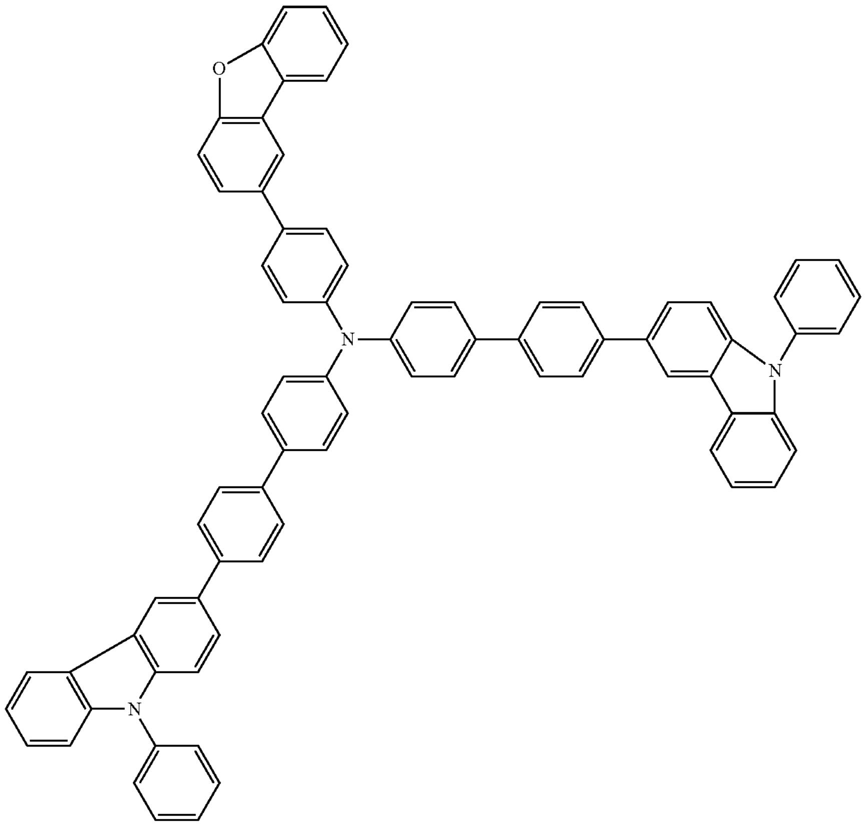
(6-232)
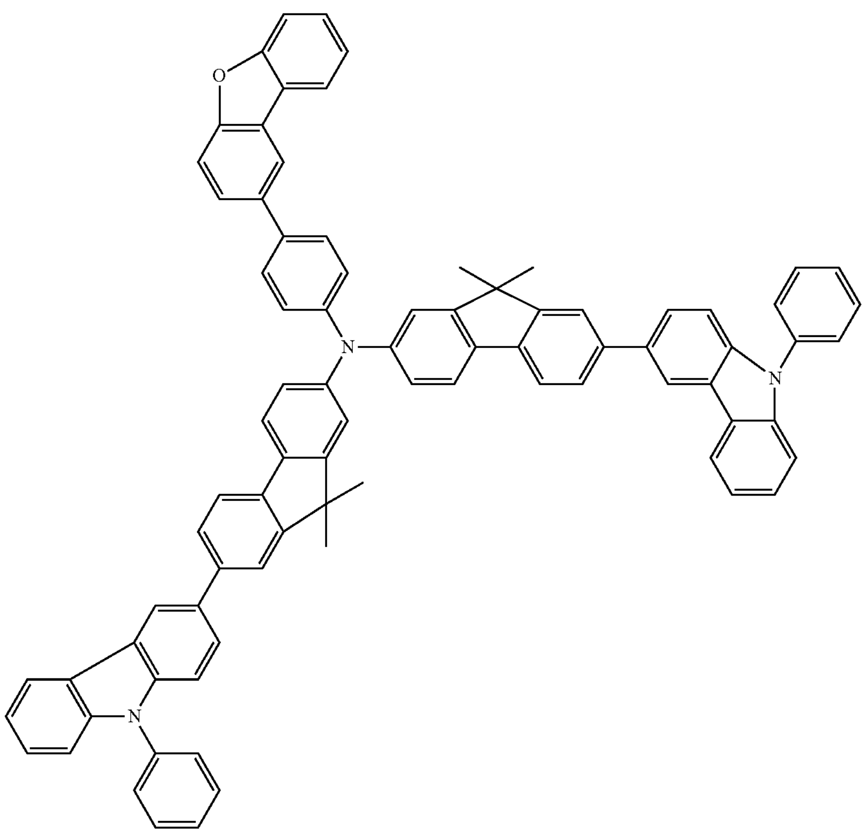

-continued
(6-233)
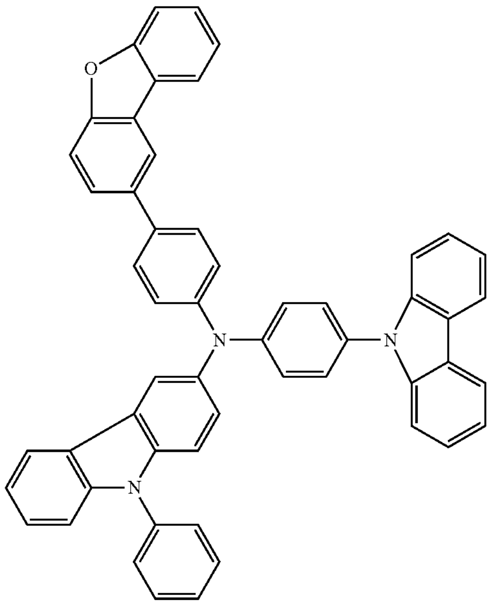
(6-234)
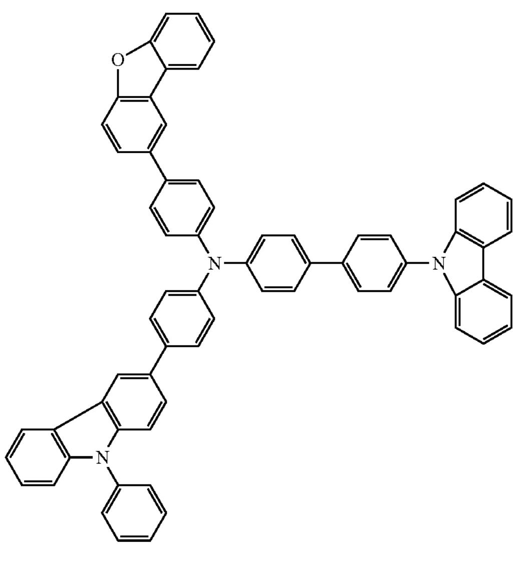
(6-235)
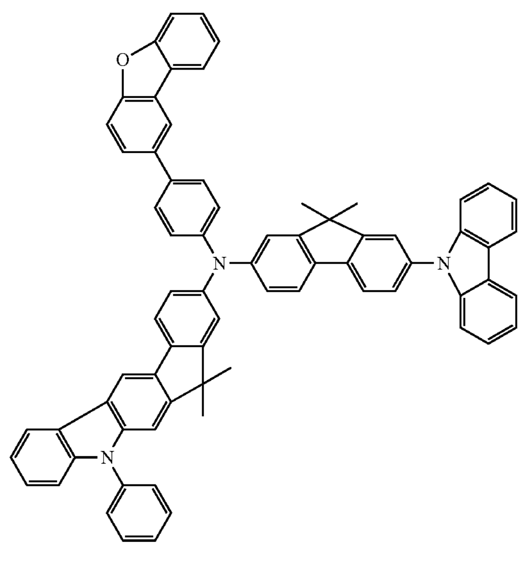

-continued
(6-236)
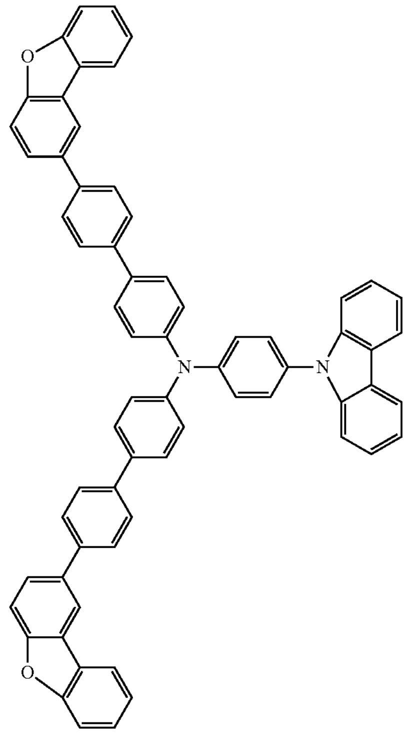
(6-237)
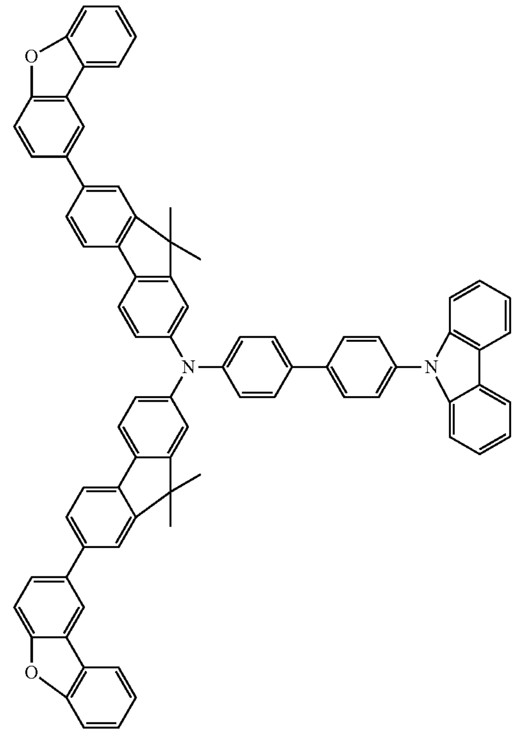
(6-238)
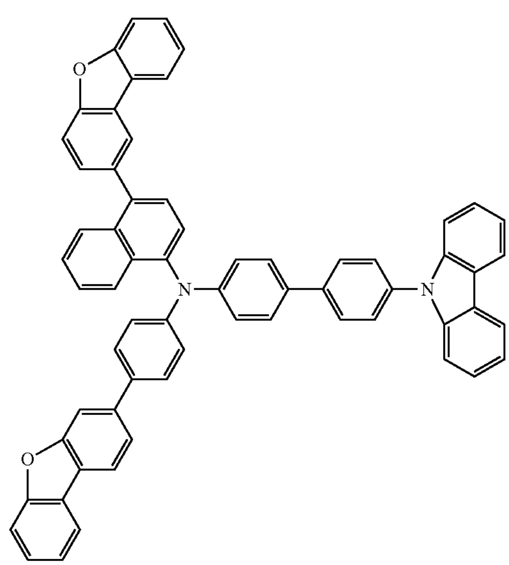
(6-239)
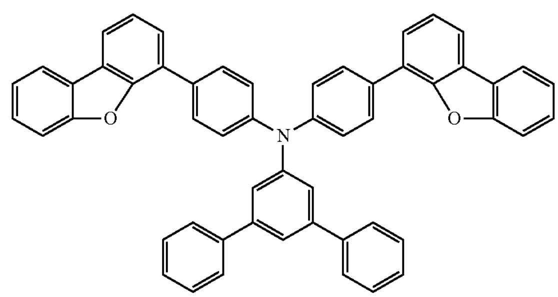

-continued
(6-240)
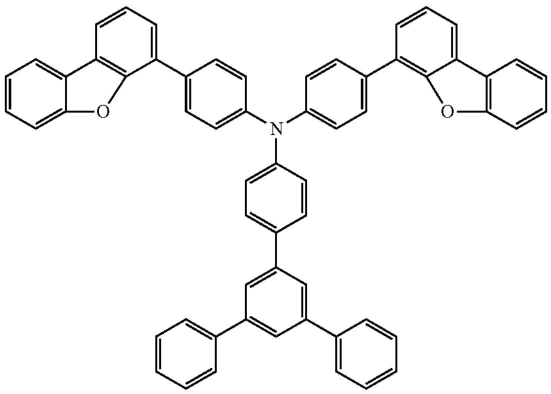
(6-241)
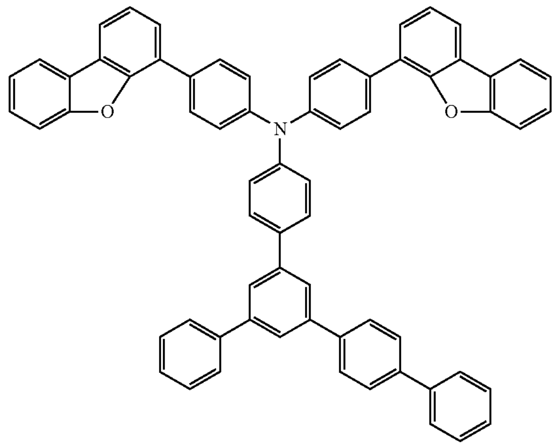
(6-242)
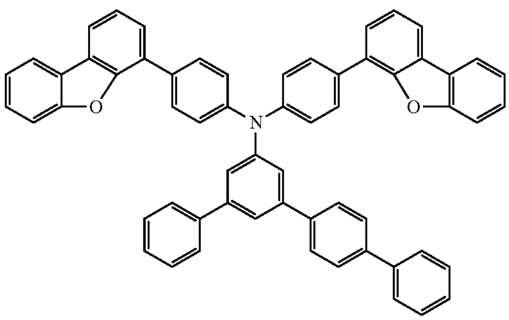
(6-243)
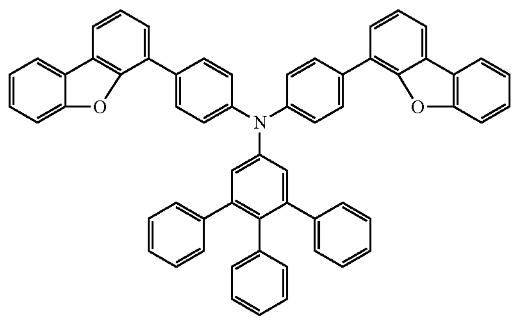
(6-244)
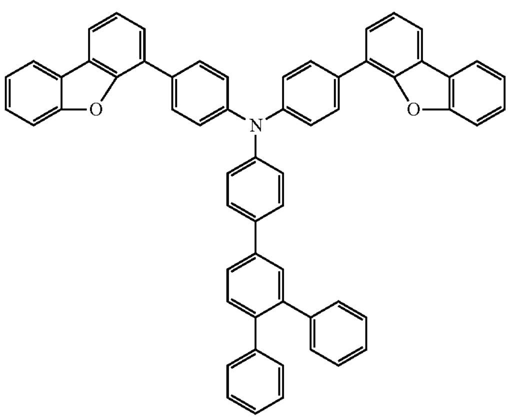
(6-245)
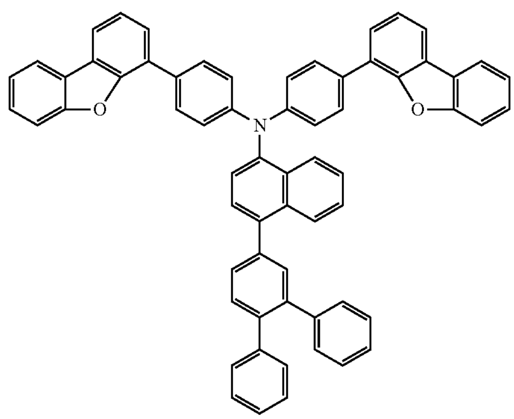
(6-246)
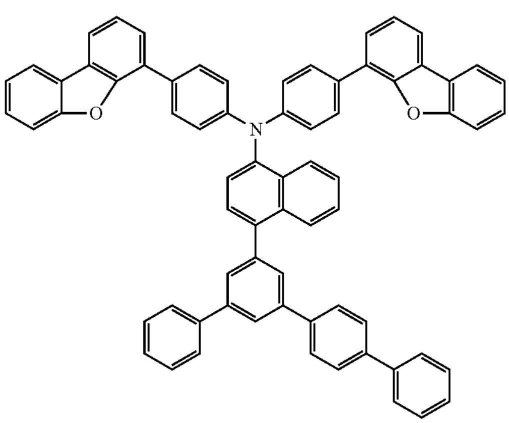
(6-247)
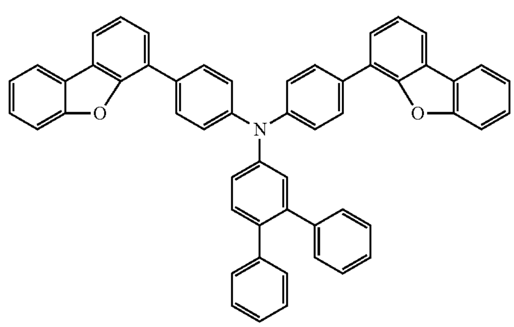

-continued
(6-248)
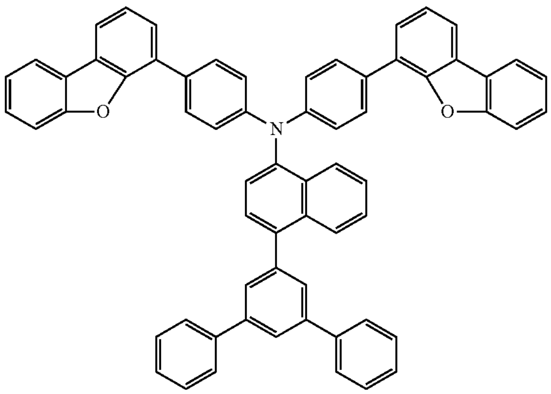
(6-249)
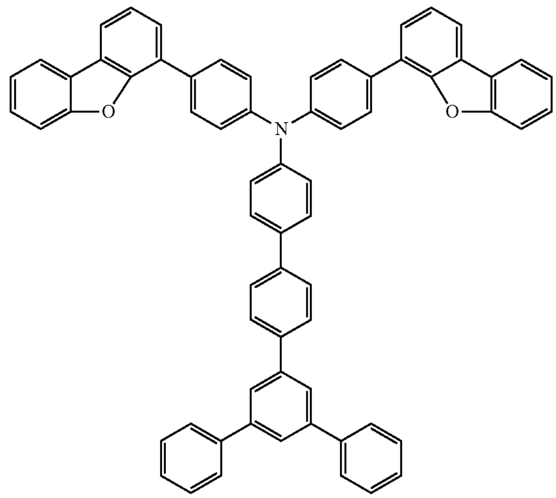
(6-250)
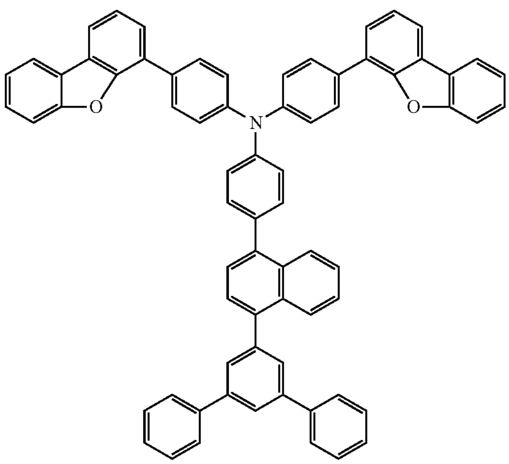
(6-251)
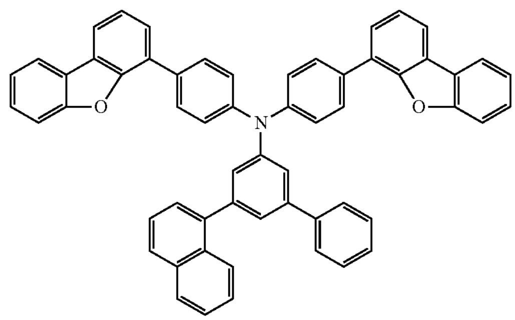
(6-252)
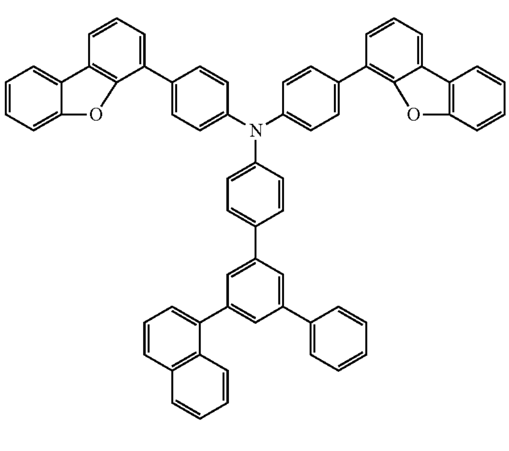
(6-253)
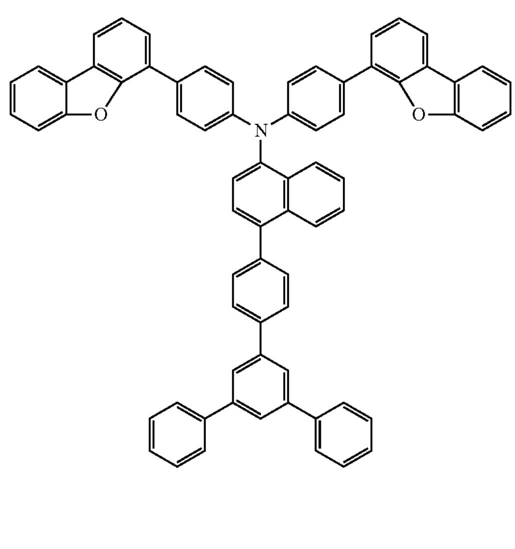

-continued
(6-254)
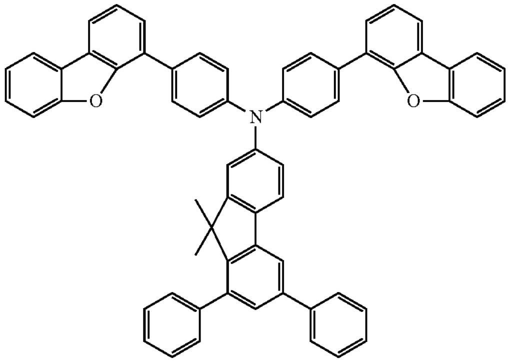
(6-255)
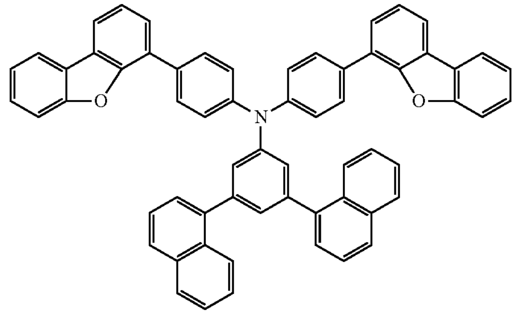
(6-256)
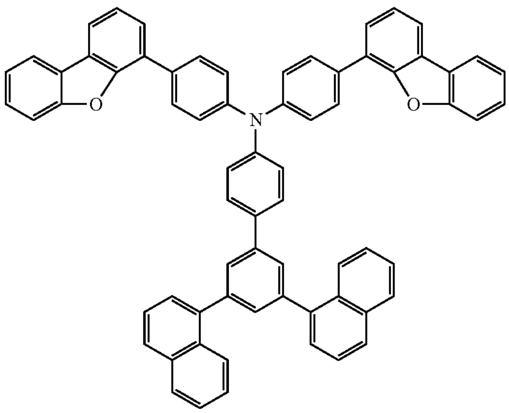
(6-257)
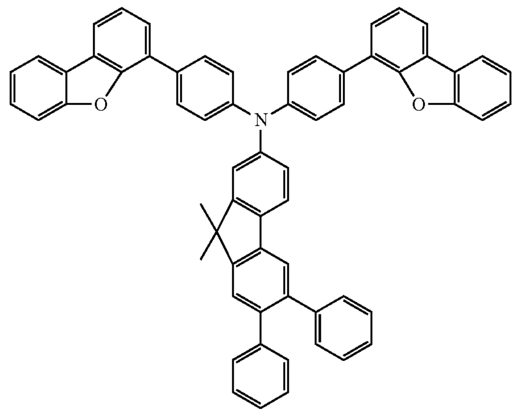
(6-258)
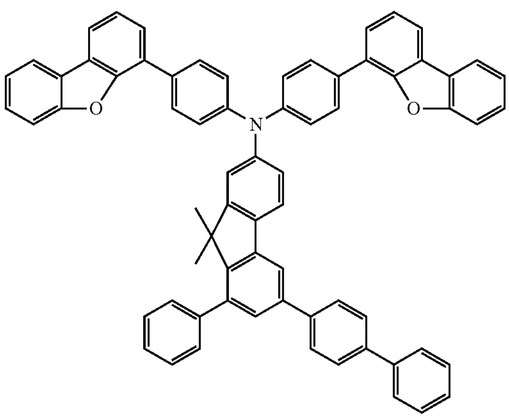
(6-259)
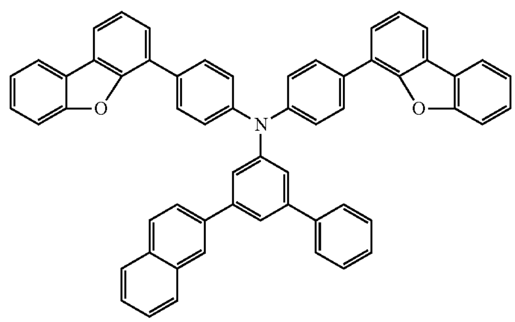
(6-260)
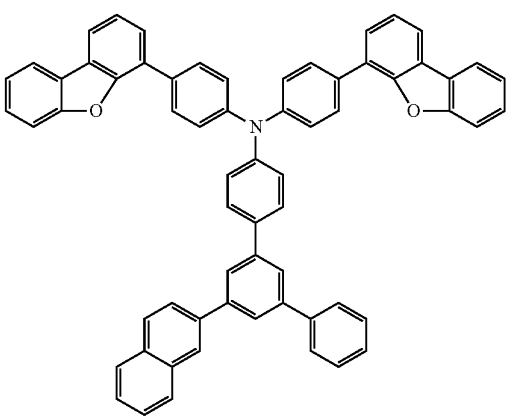
(6-261)
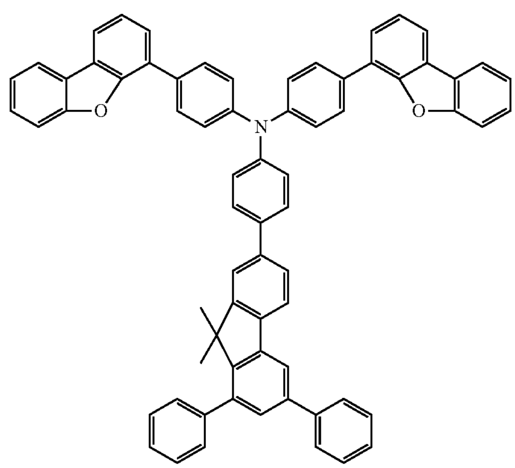

-continued
(6-262)
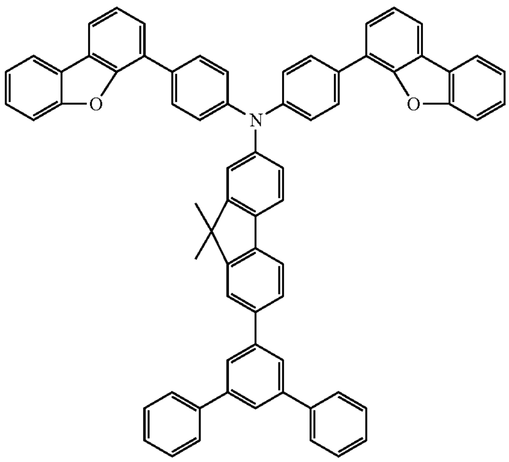
(6-263)
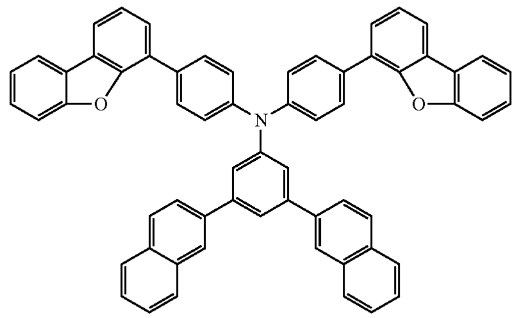
(6-264)
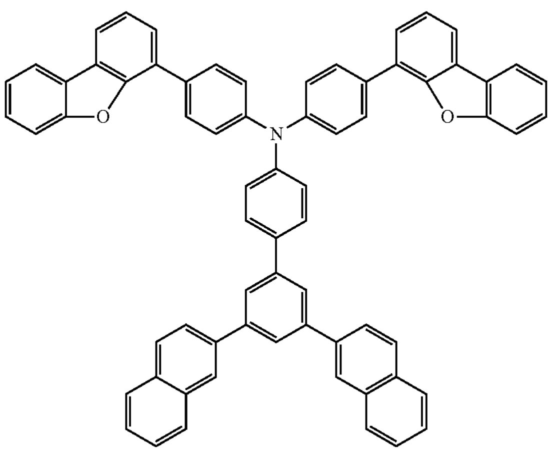
(6-265)
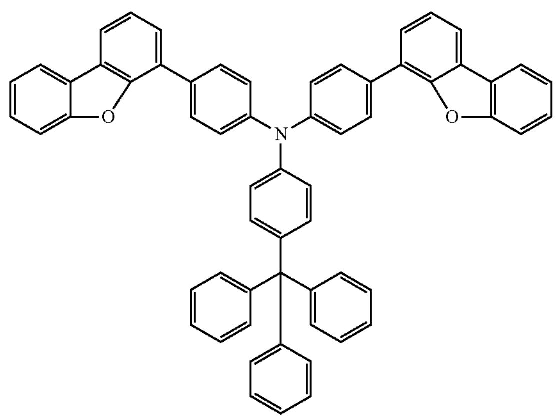
(6-266)
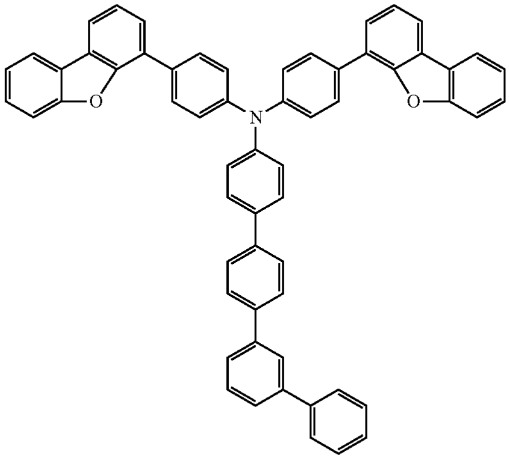
(6-267)
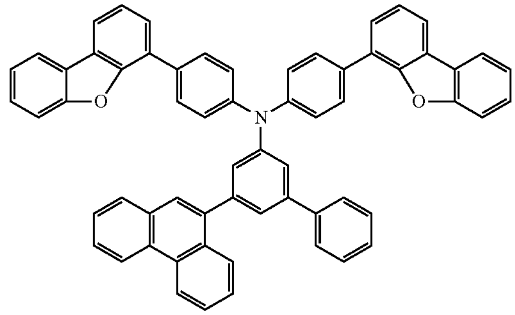

-continued
(6-268)
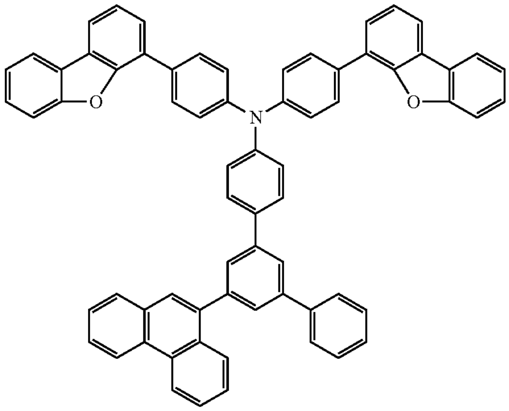
(6-269)
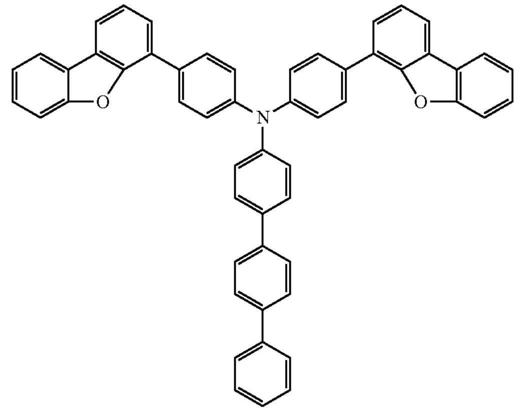
(6-270)
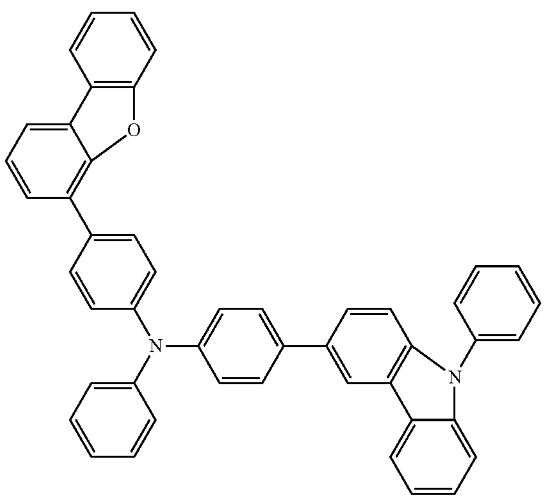
(6-271)
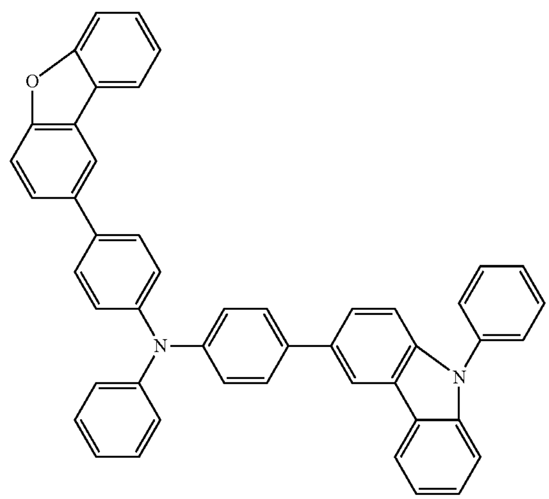
(6-272)
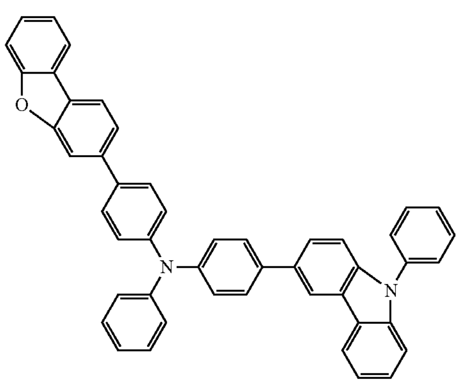
(6-273)
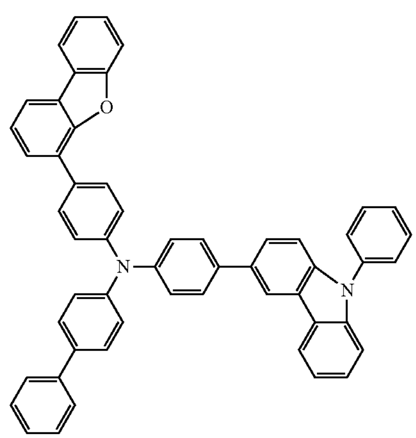

-continued
(6-274)
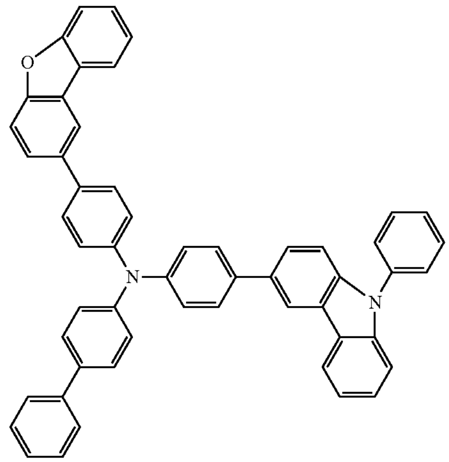
(6-275)
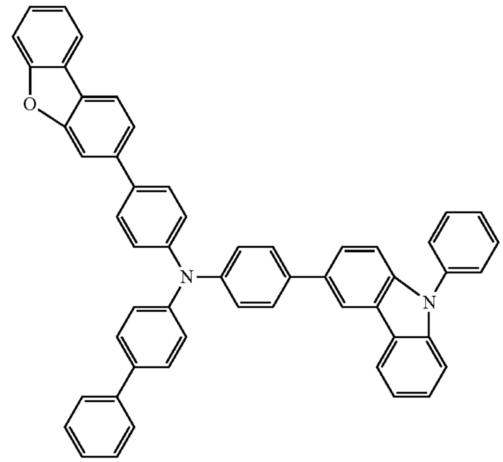
(6-276)
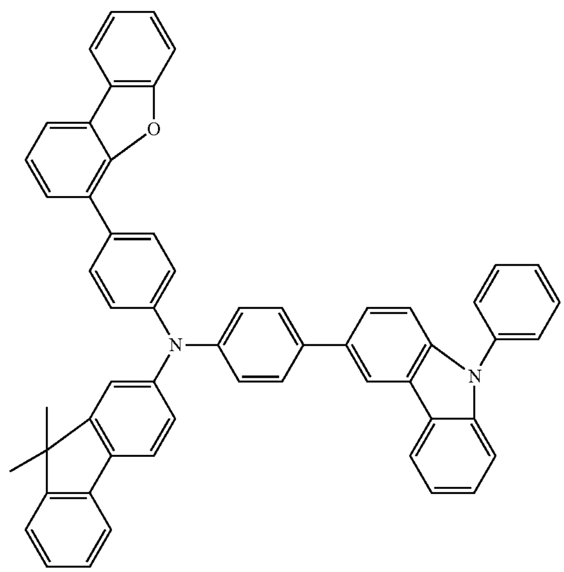
(6-277)
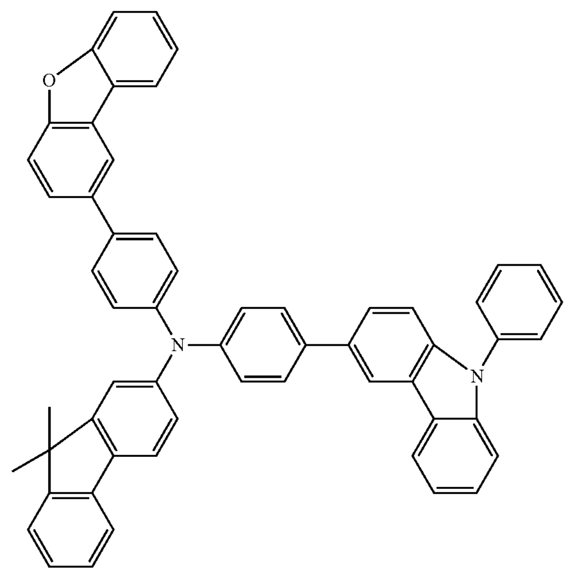
(6-278)
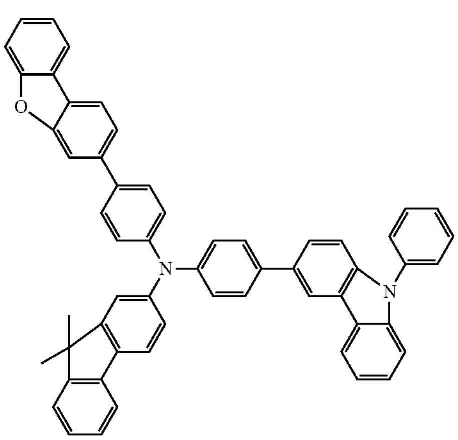
(6-279)
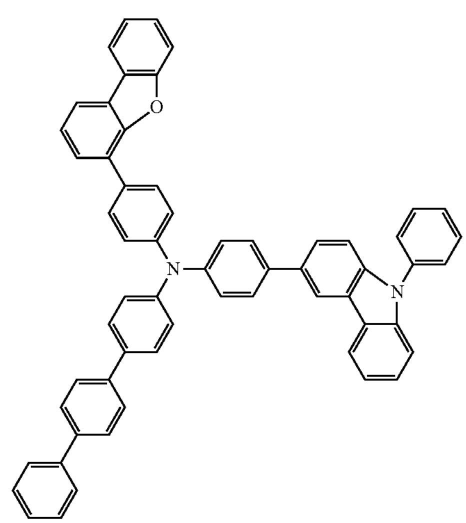

-continued
(6-280)
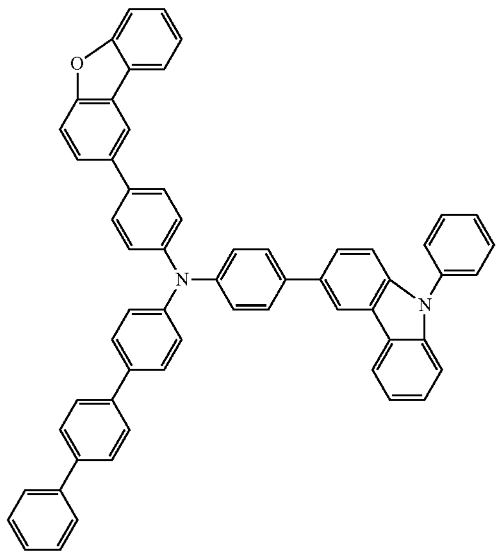
(6-290)
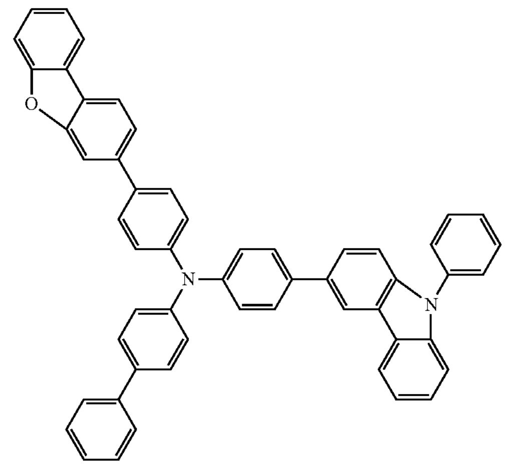
(6-291)
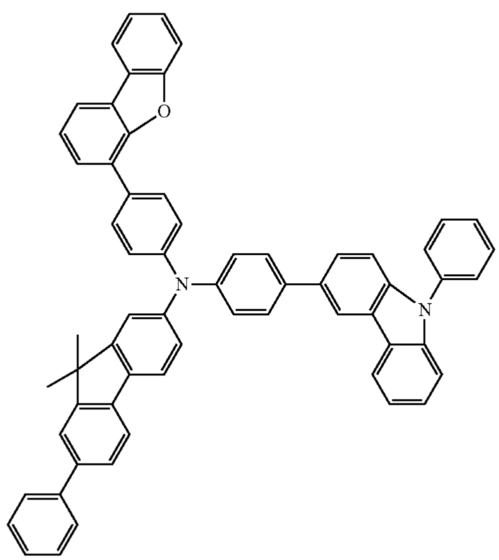
(6-292)
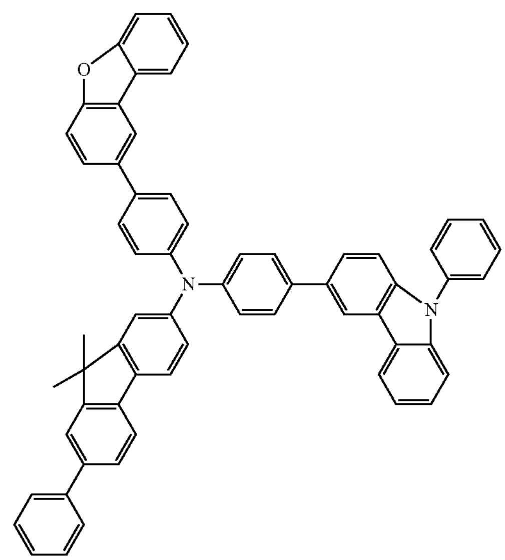
(6-293)
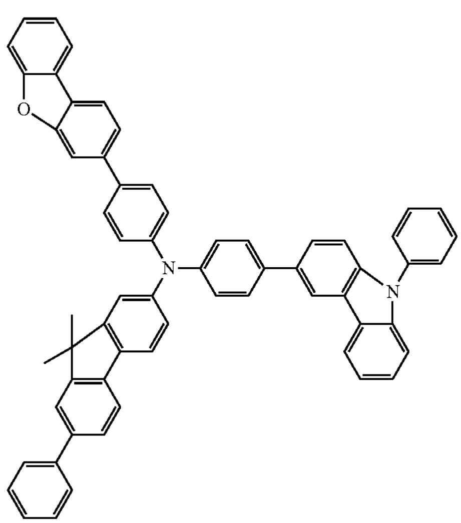
(6-294)
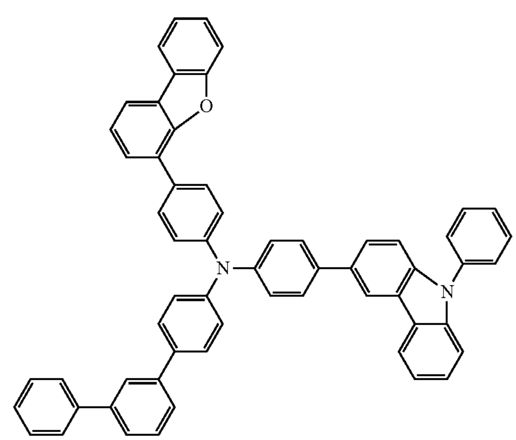

-continued
(6-295)
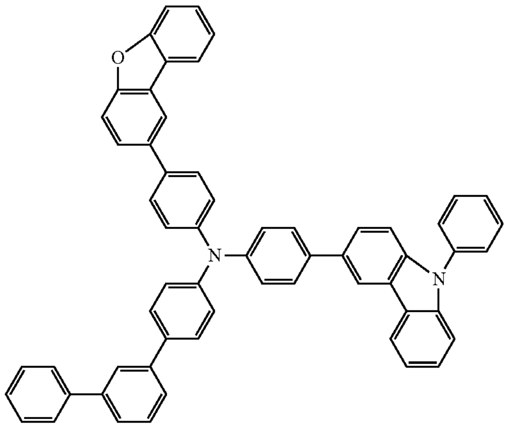
(6-296)
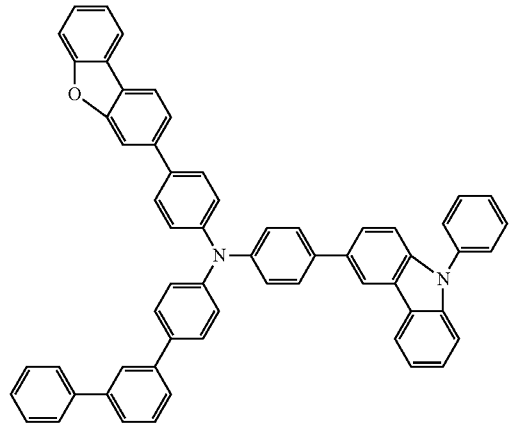
(6-297)
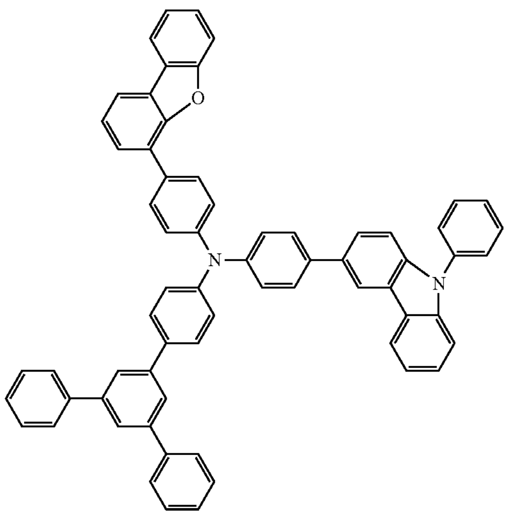
(6-298)
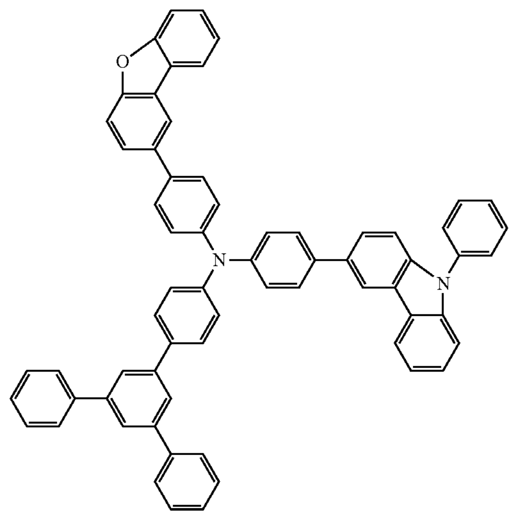
(6-299)
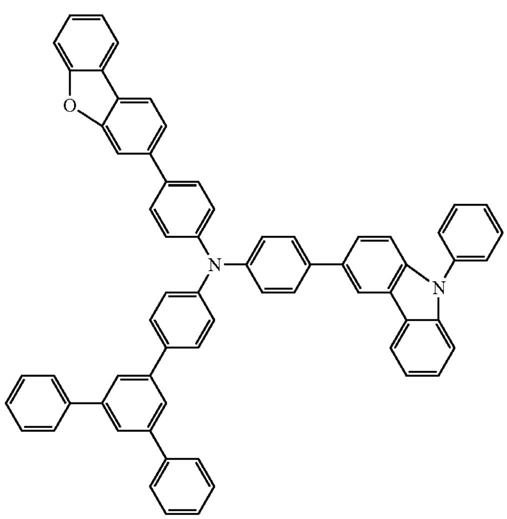
(6-300)
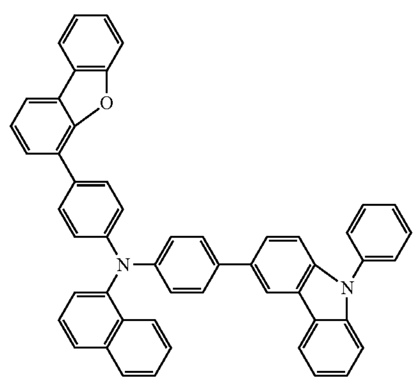

-continued
(6-301)
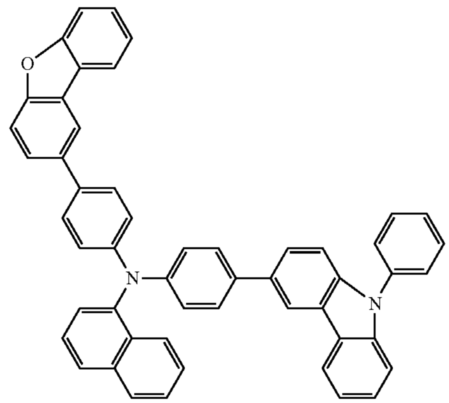
(6-302)
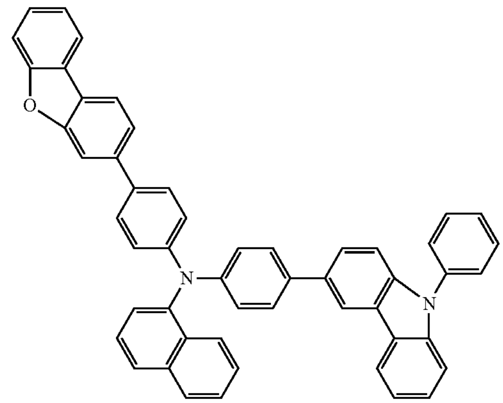
(6-303)
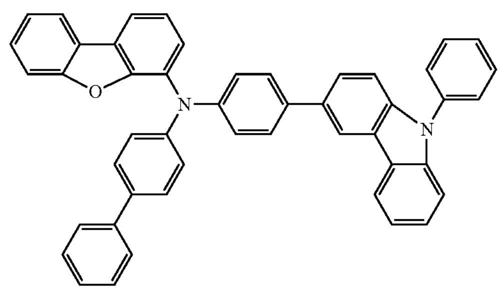
(6-304)
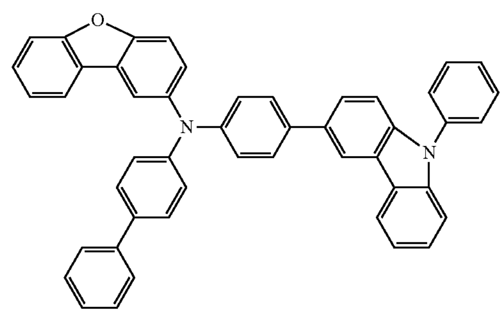
(6-305)
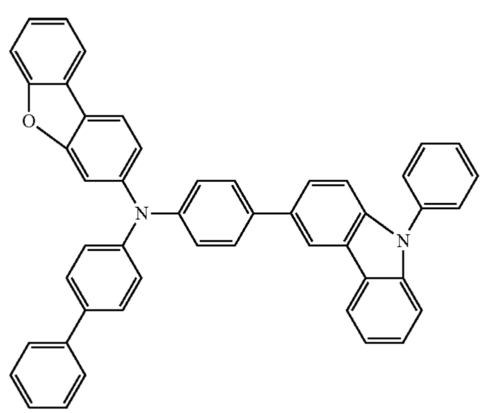
(6-306)
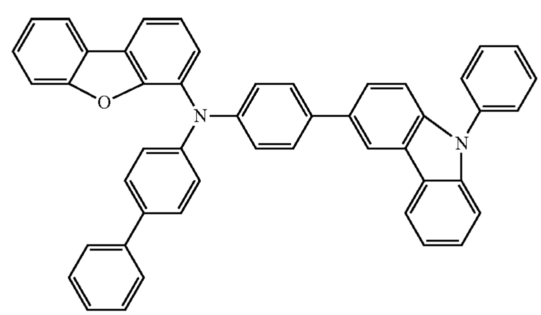
(6-307)
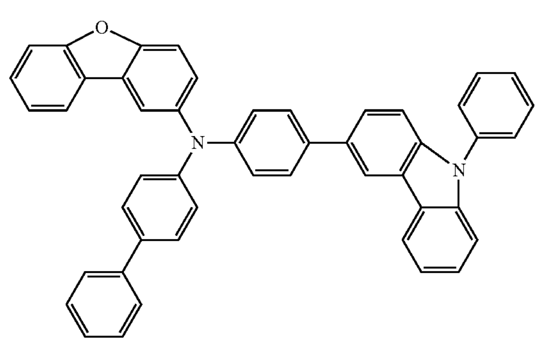
(6-308)
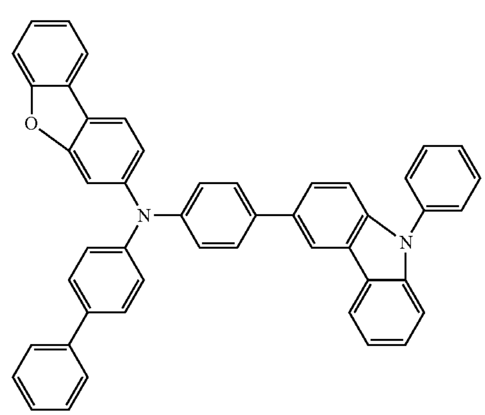

-continued
(6-309)
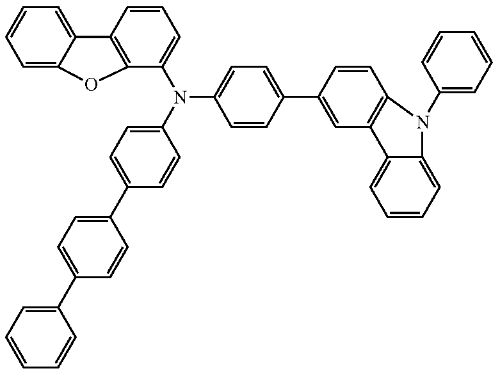
(6-310)
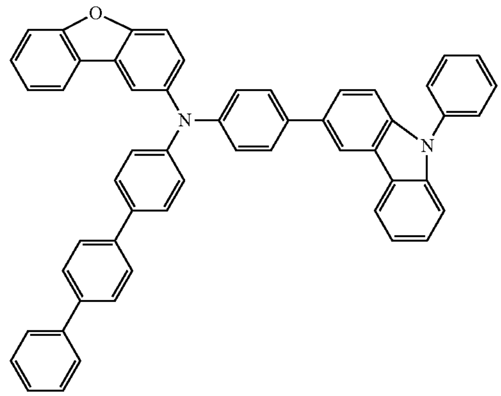
(6-311)
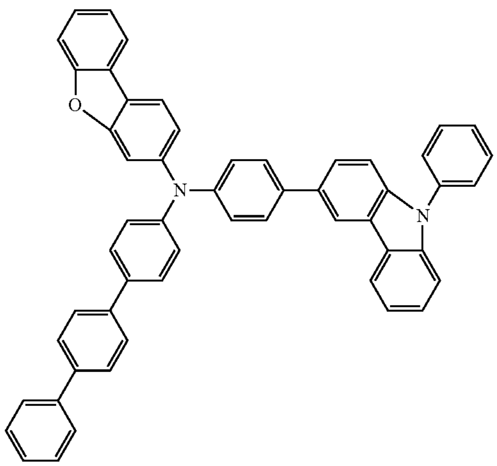
(6-312)
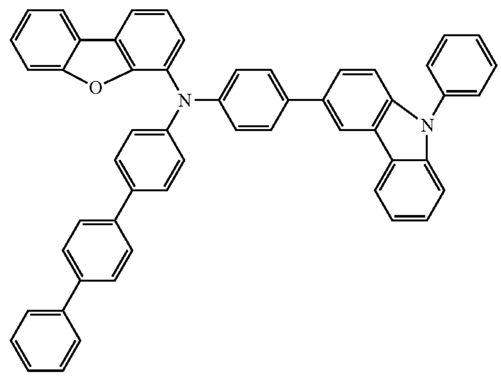
(6-313)
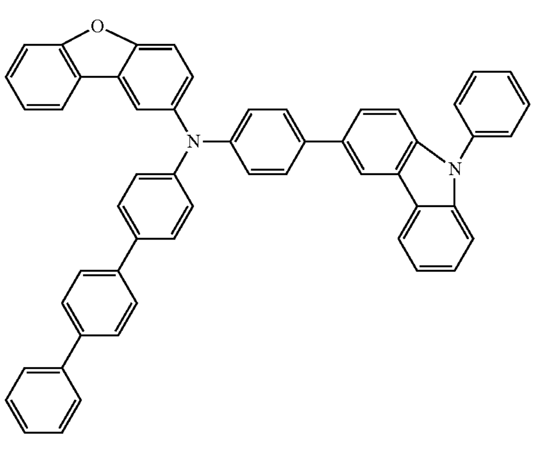
(6-314)
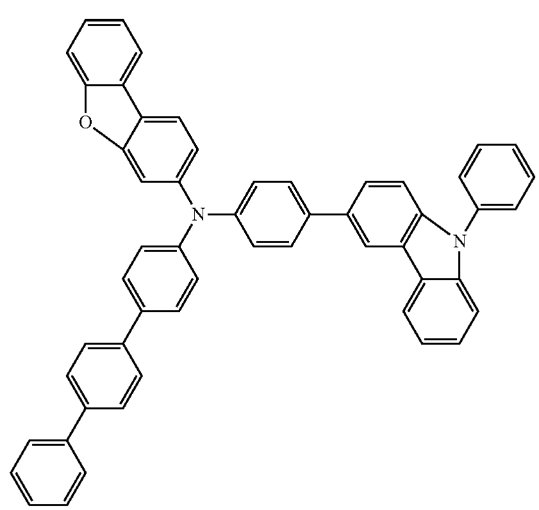

-continued
(6-315)
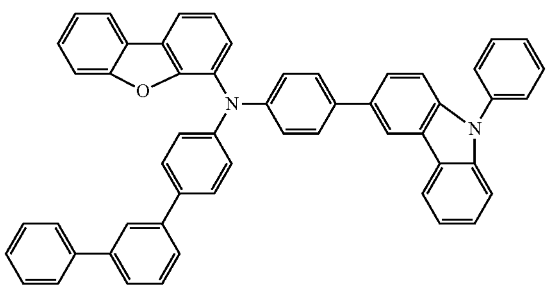
(6-316)
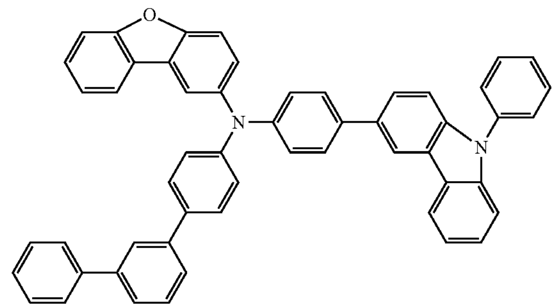
(6-317)
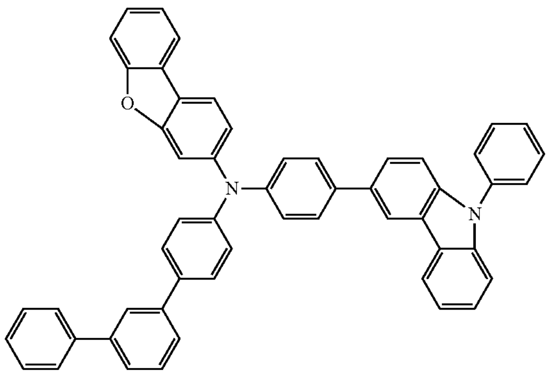
(6-318)
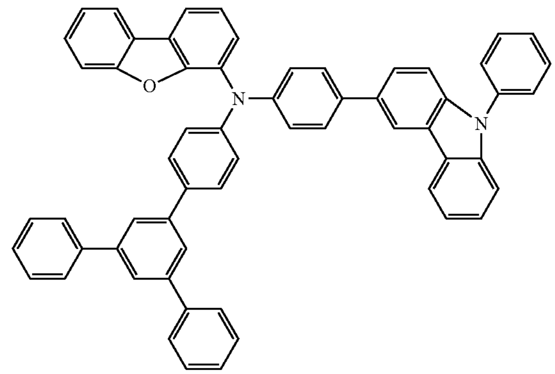
(6-319)
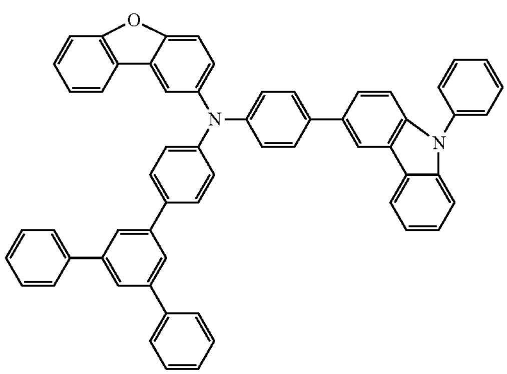
(6-320)
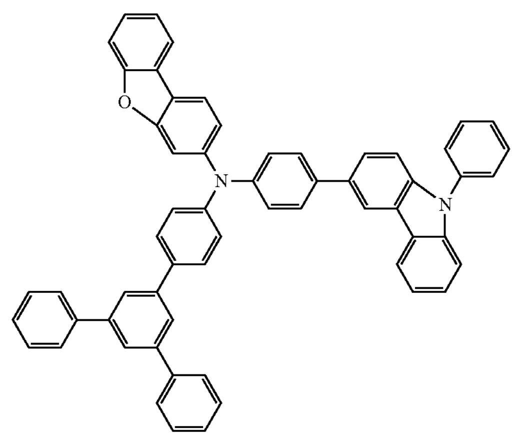
(6-321)
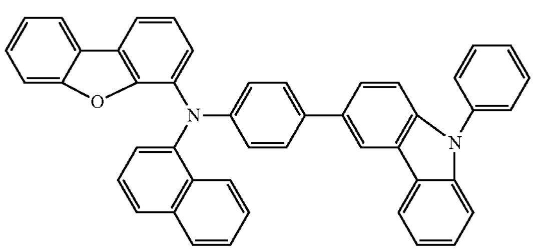
(6-322)
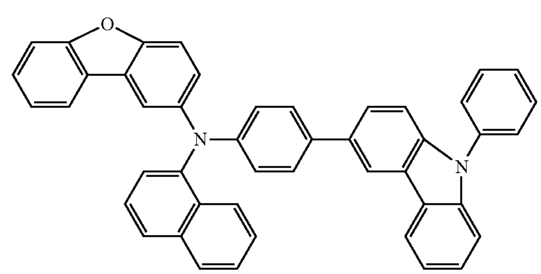

-continued
(6-323)
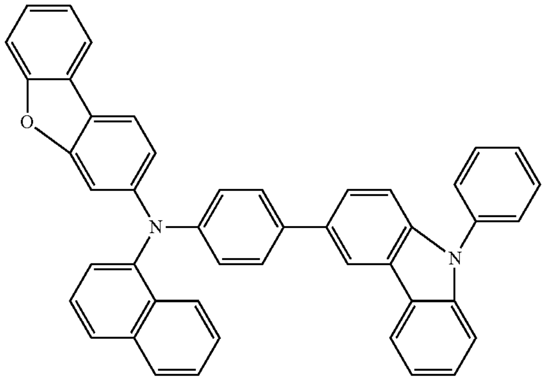
A concrete example of the compound expressed by the general formula (7) includes compounds expressed by the following structural formulas (7-1) to (7-45), and the like:
(7-1)
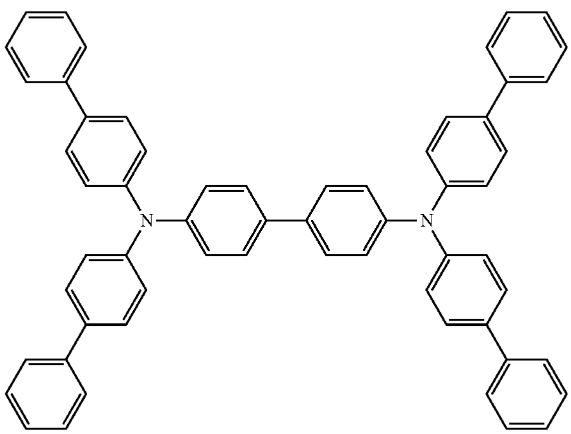
(7-2)
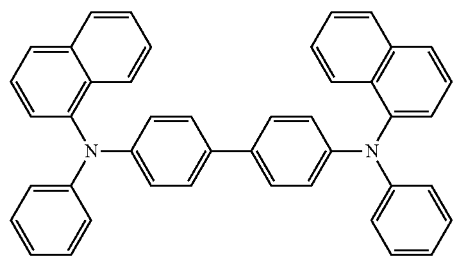
(7-3)
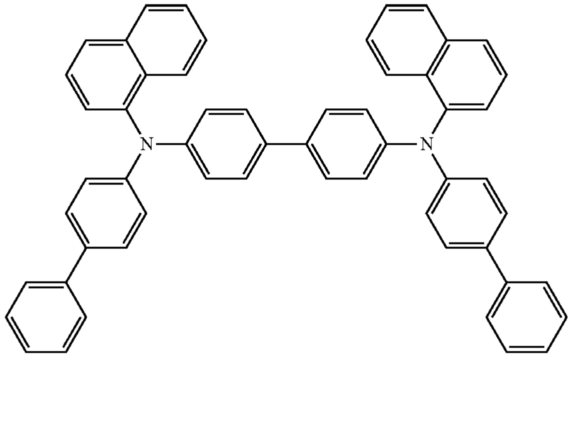
(7-4)
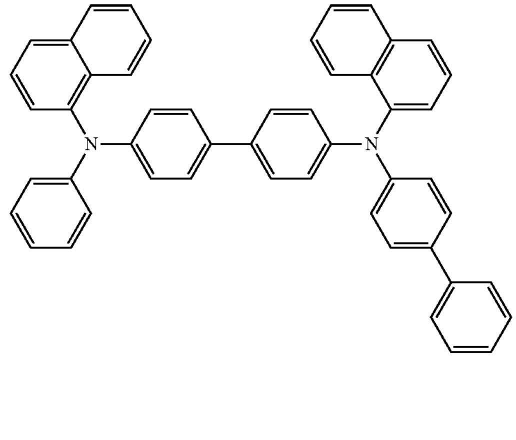

-continued
(7-5)
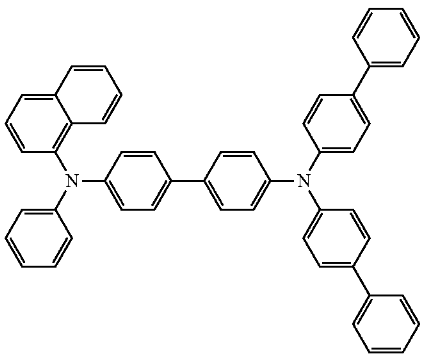
(7-6)
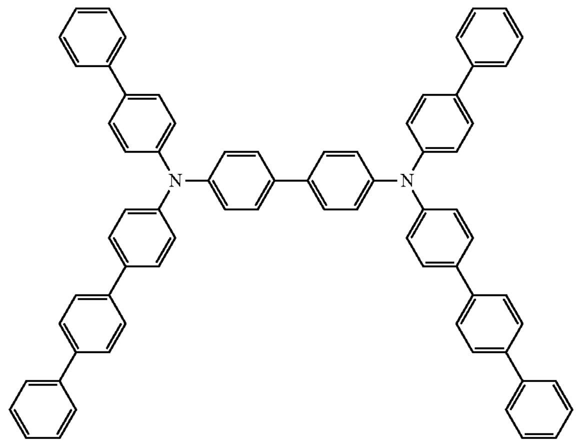
(7-7)
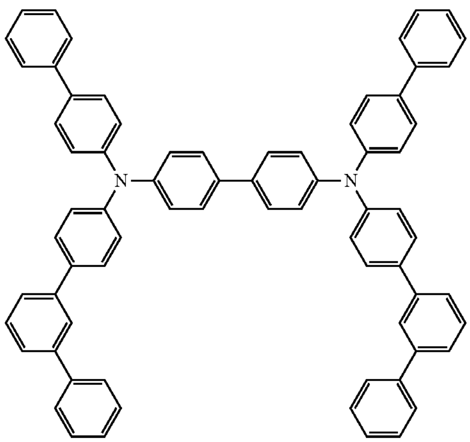
(7-8)
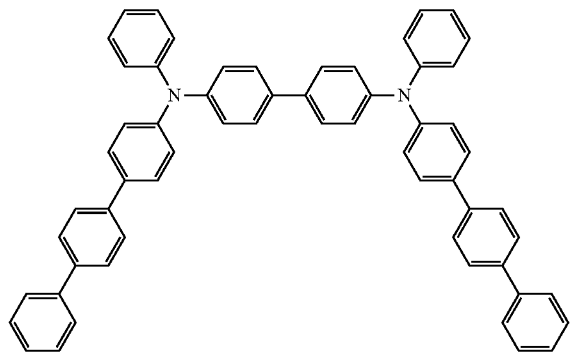
(7-9)
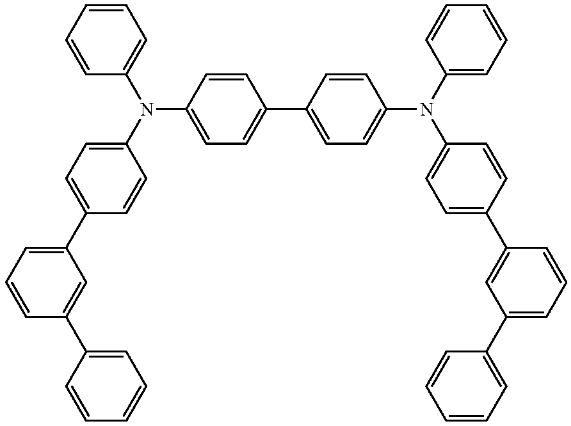
(7-10)
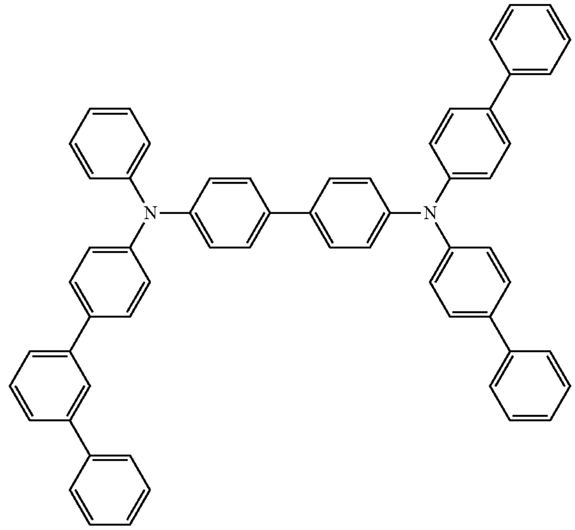

-continued
(7-11)
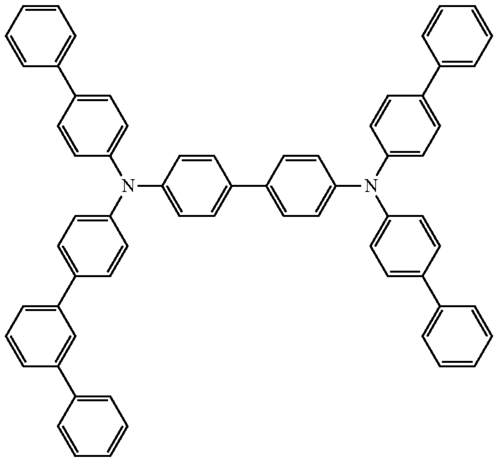
(7-12)
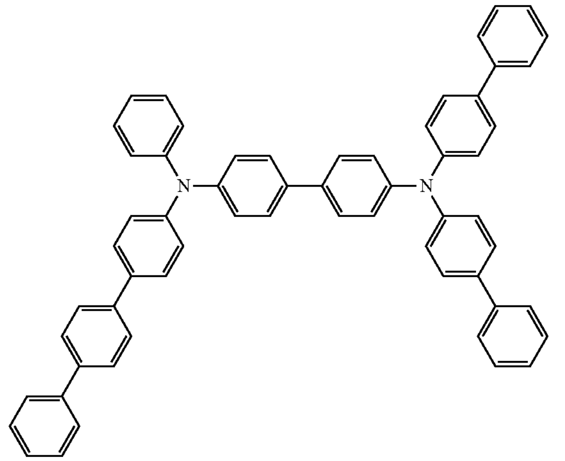
(7-13)
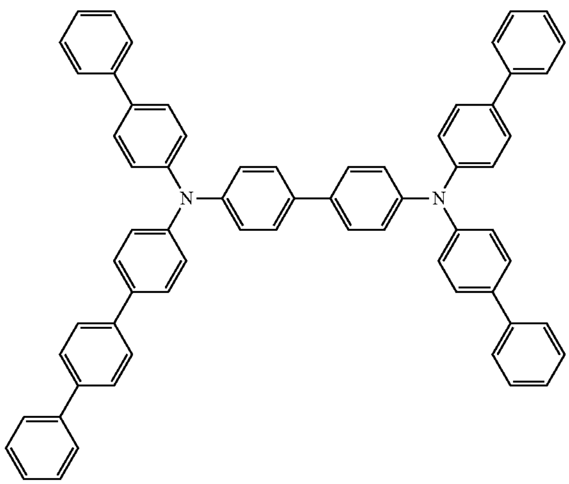
(7-14)
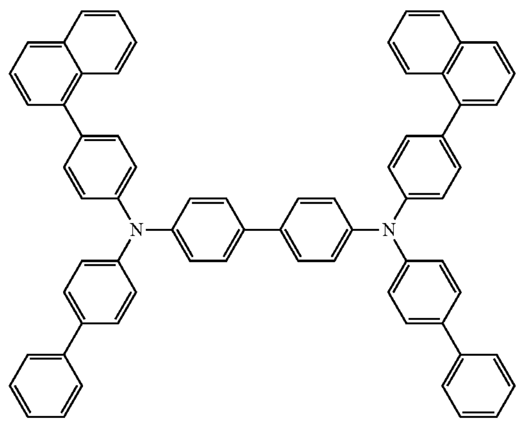
(7-15)
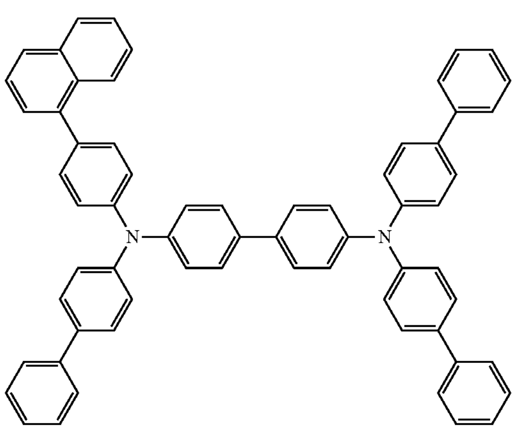
(7-16)
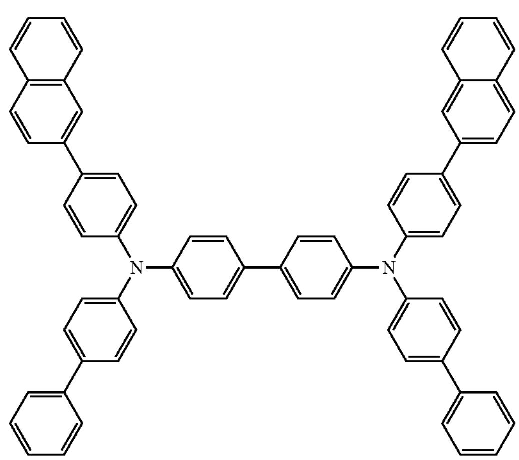

-continued
(7-17)
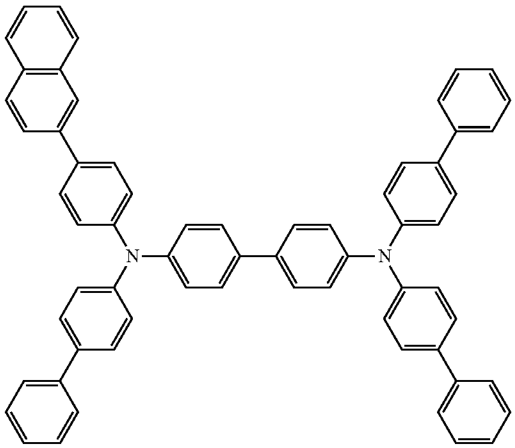
(7-18)
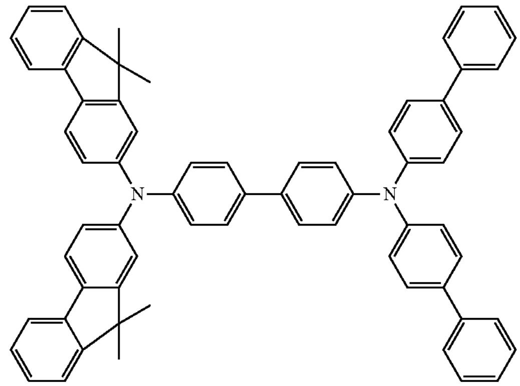
(7-19)
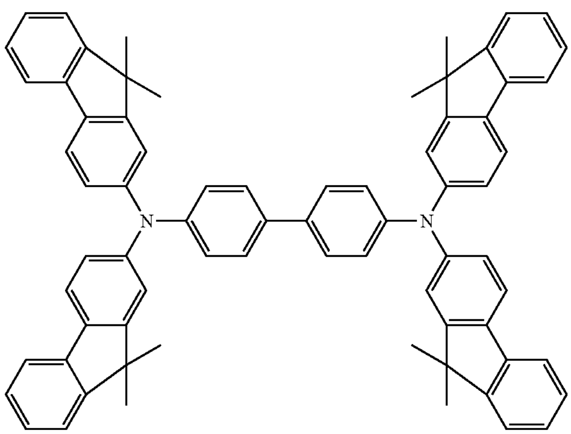
(7-20)
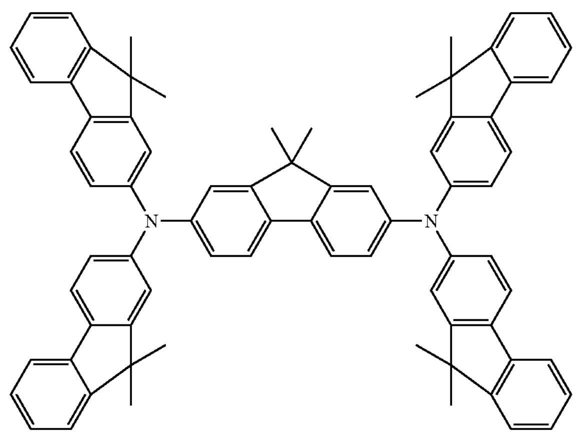
(7-21)
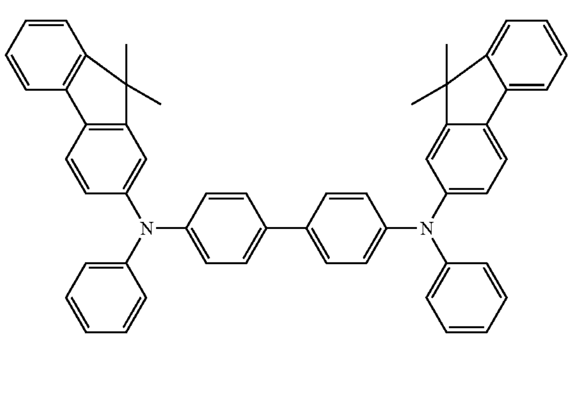
(7-22)
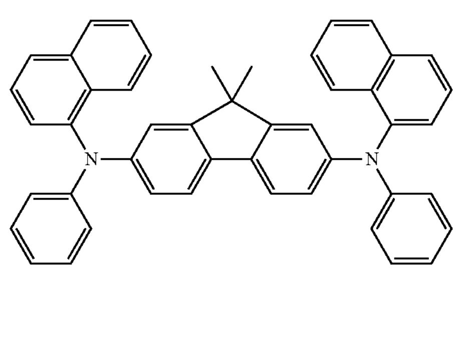

-continued
(7-23)
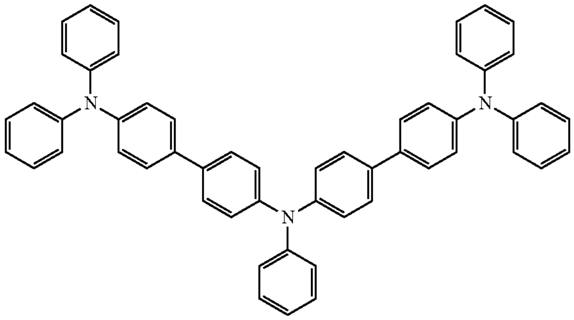
(7-24)
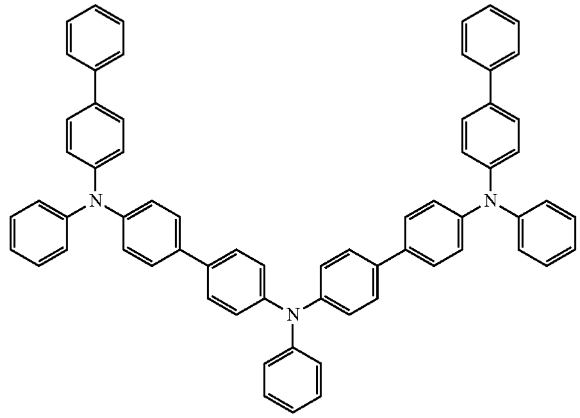
(7-25)
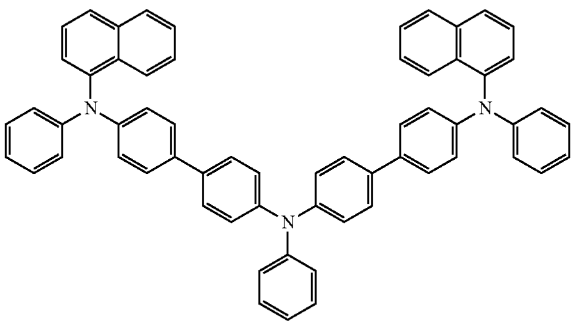
(7-26)
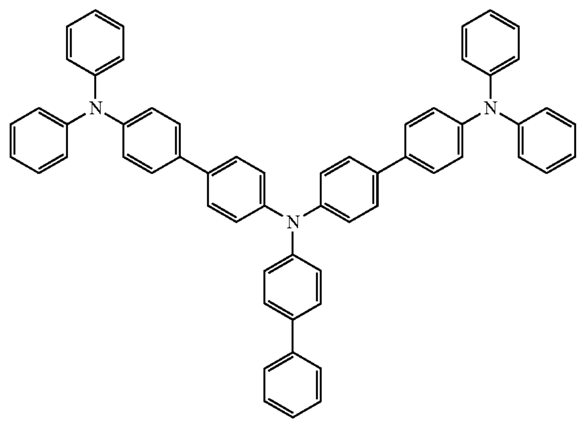
(7-27)
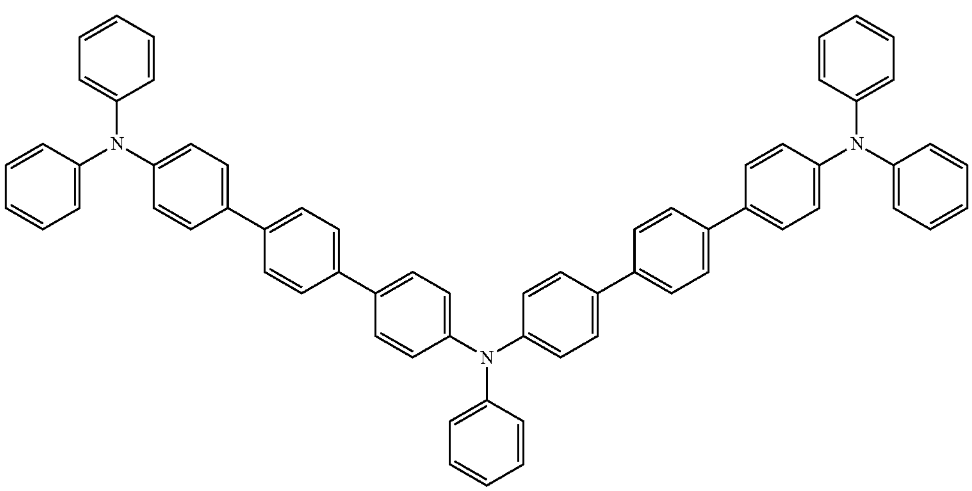

-continued
(7-28)
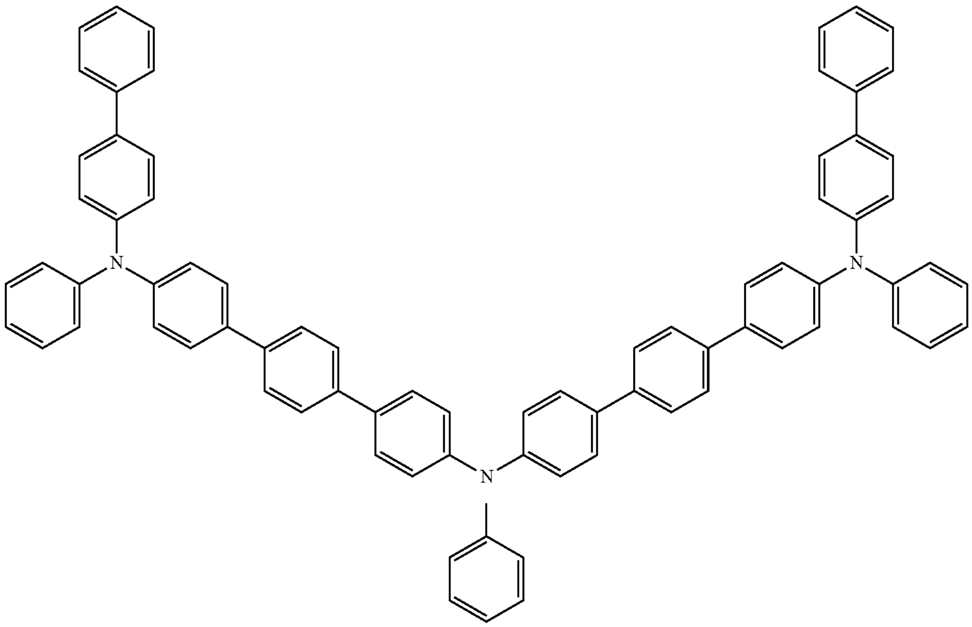
(7-29)
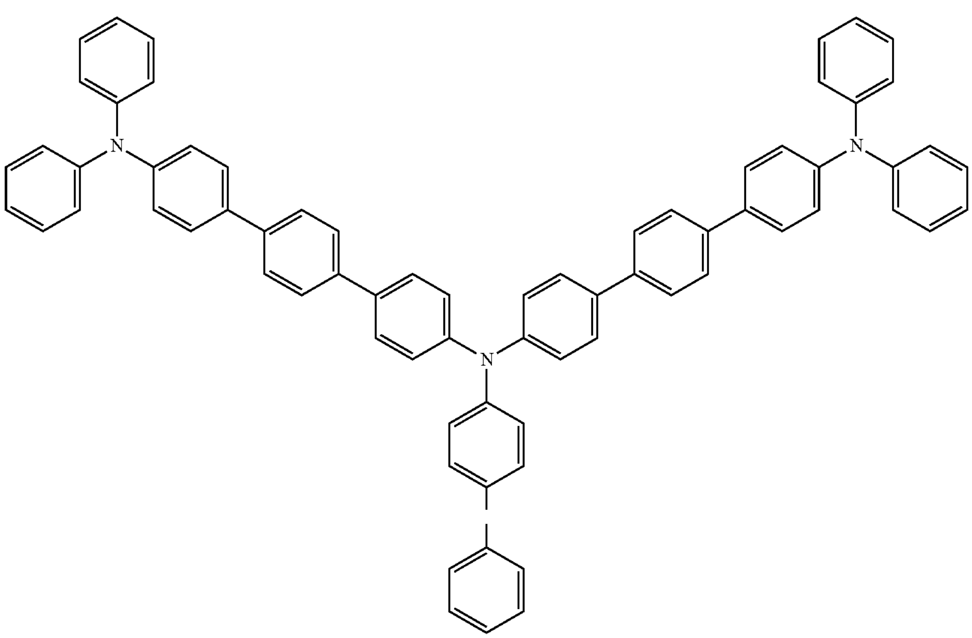

-continued
(7-30)
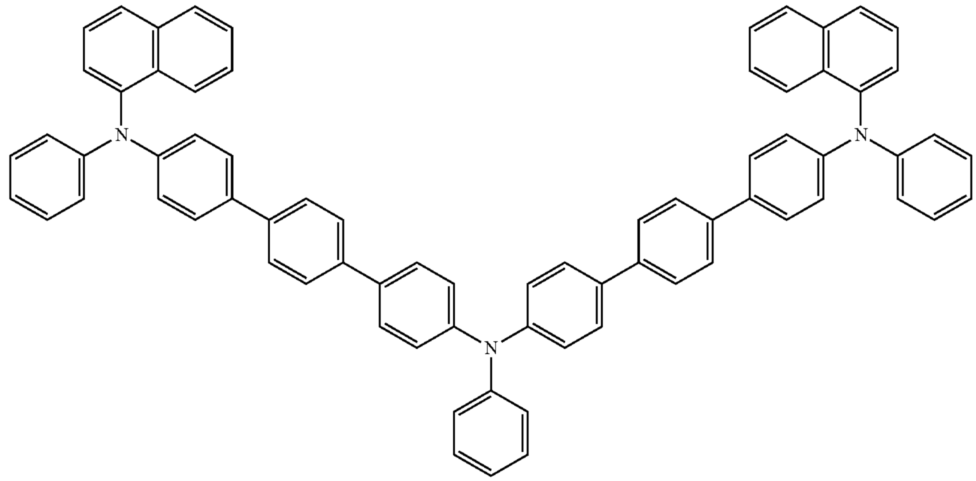
(7-31)
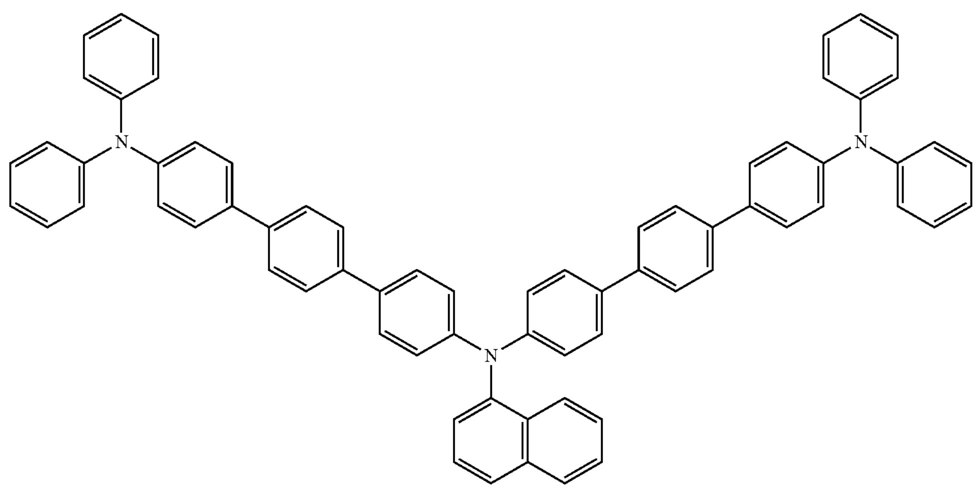
(7-32)
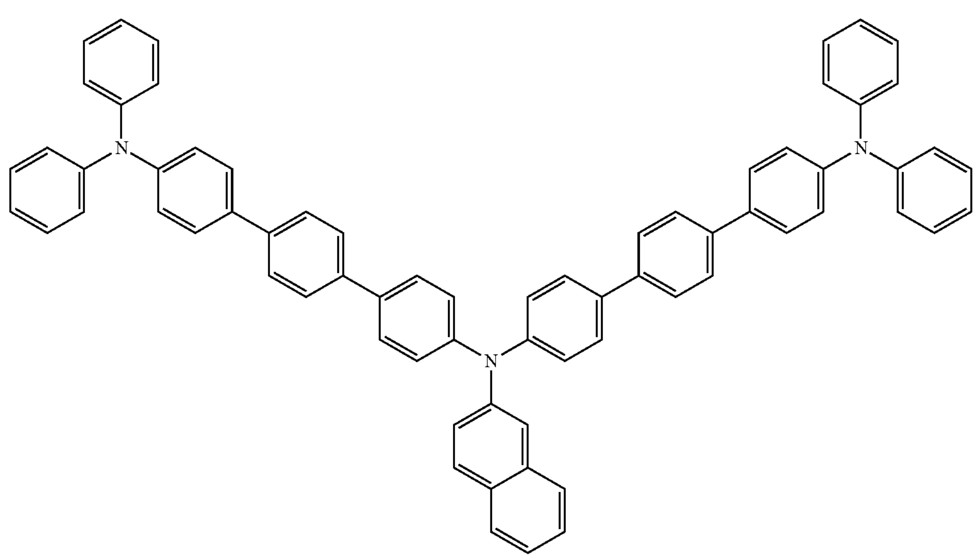

-continued
(7-33)
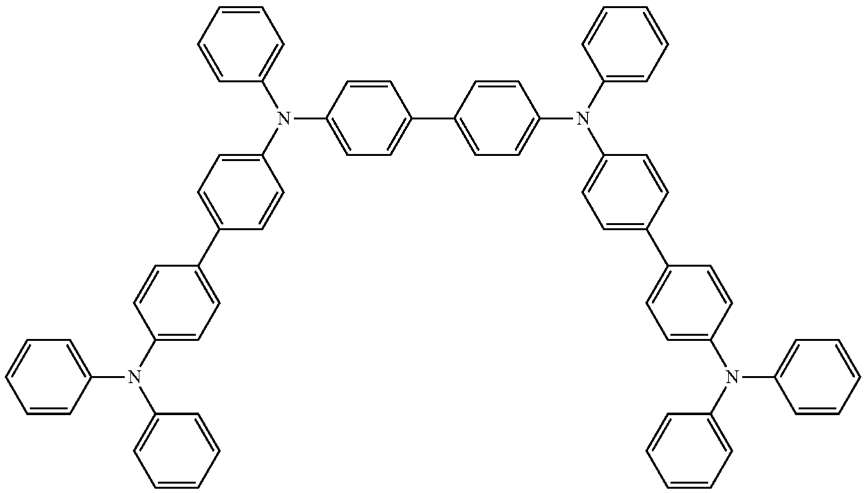
(7-34)
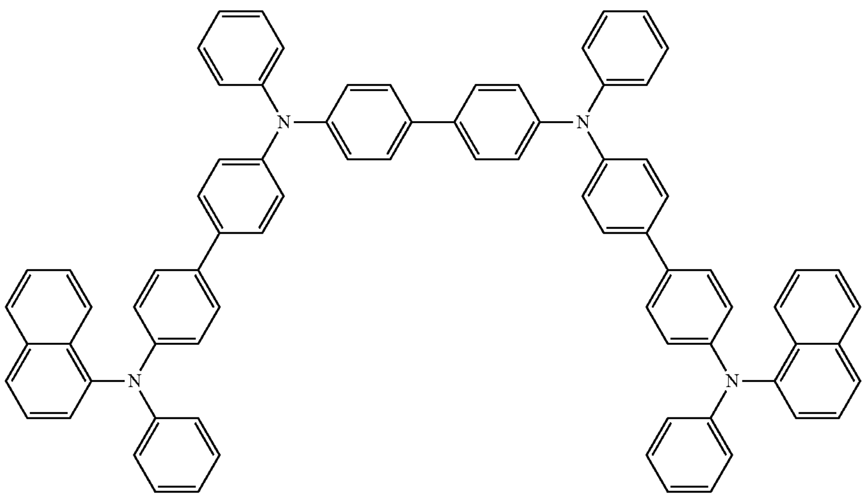
(7-35)
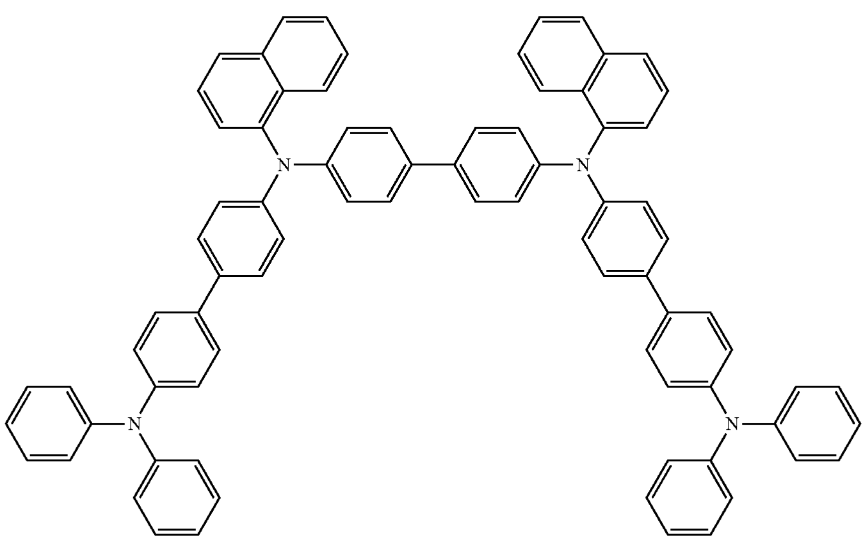

-continued
(7-36)
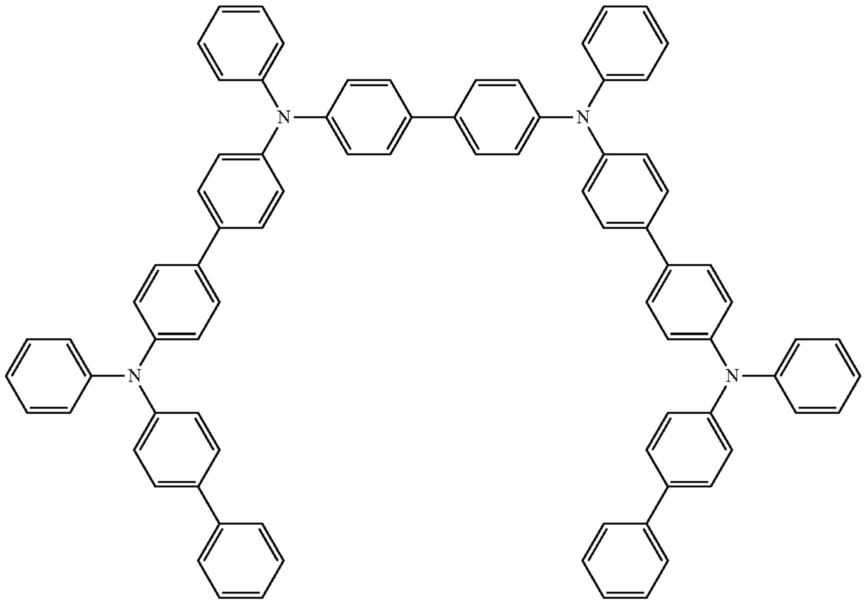
(7-37)
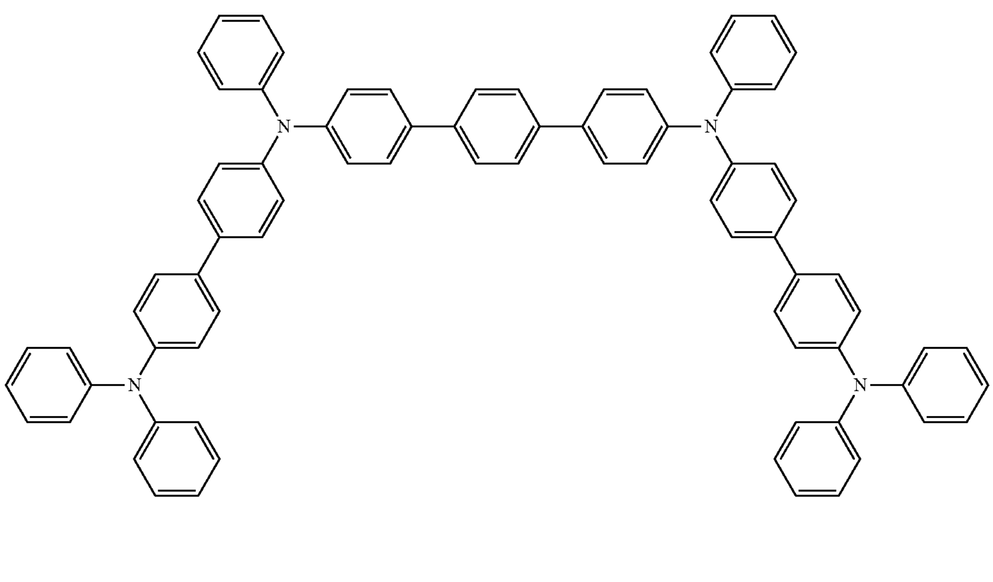

-continued
(7-38)
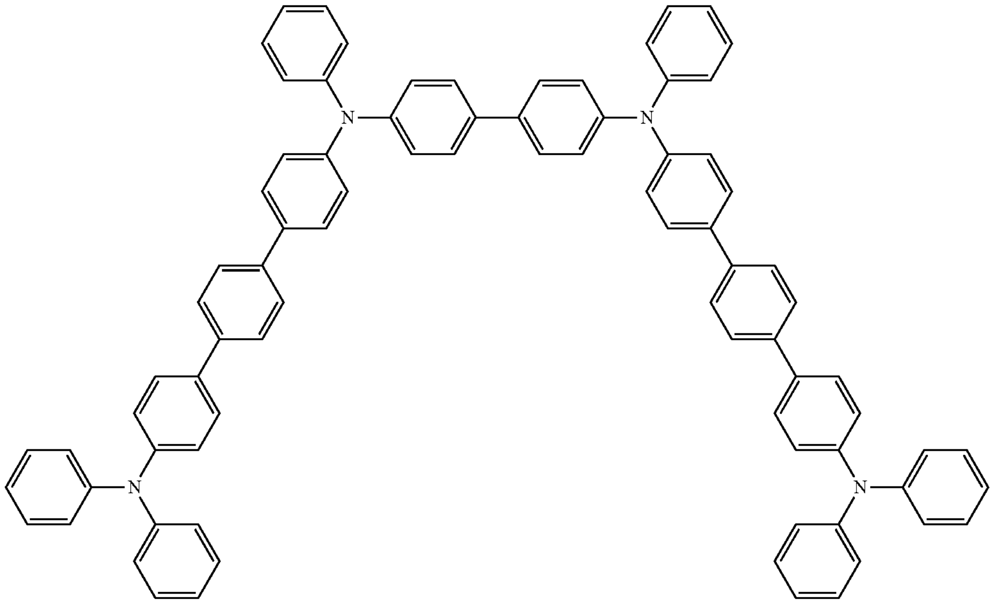
(7-39)
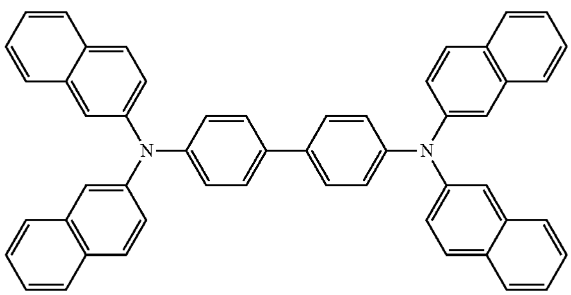
(7-40)
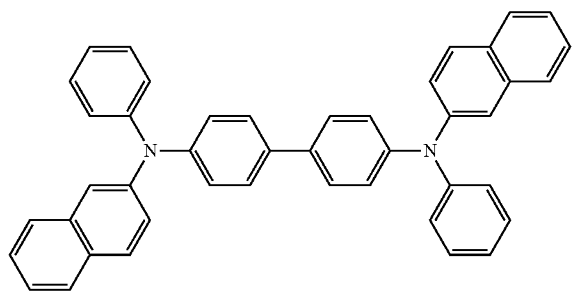
(7-41)
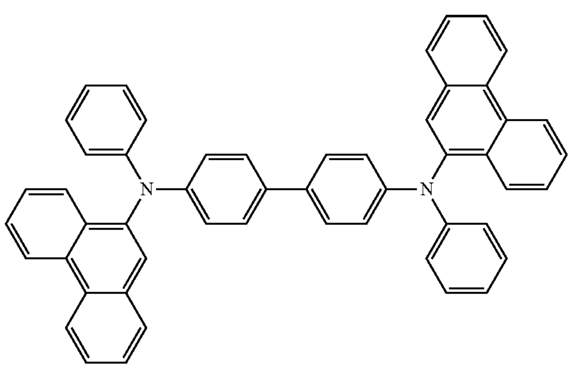
(7-42)
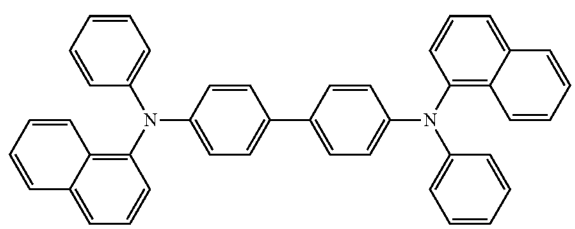
(7-43)
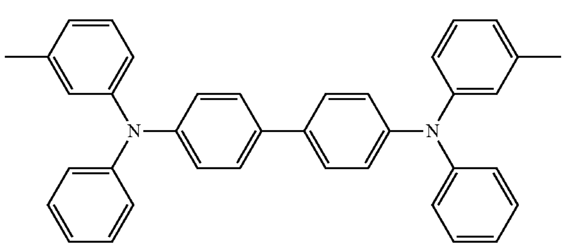
(7-44)
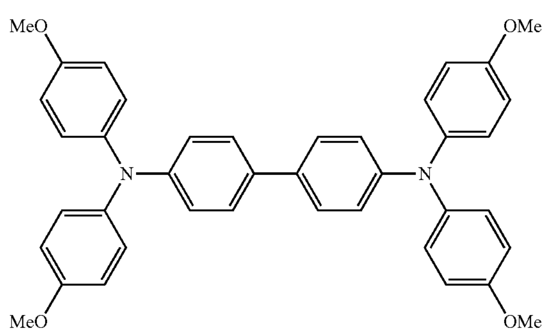

-continued (7-45)

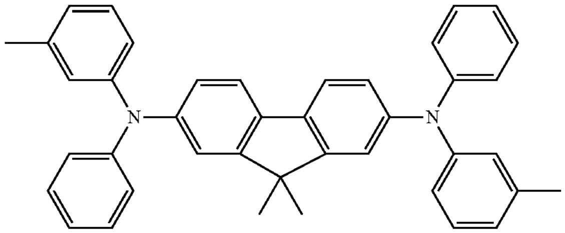

In addition, compounds expressed by the structural formulas (2-97) to (2-166) expressed by the general formula (2) described above, and the like can also be used in addition to the phosphorescence host materials expressed by the structural formulas (2-1) to (2-96). It is noted that although the compounds having the carbazole group and the indole group, for example, are given as the nitrogen-containing hydrocarbon group coupled to L1, the present disclosure is by no means limited thereto. For example, the imidazole group may be used as the nitrogen-containing hydrocarbon group coupled to L1.

(2-97)

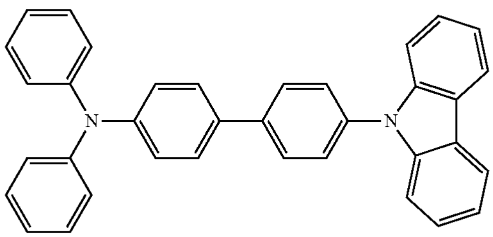

(2-98)

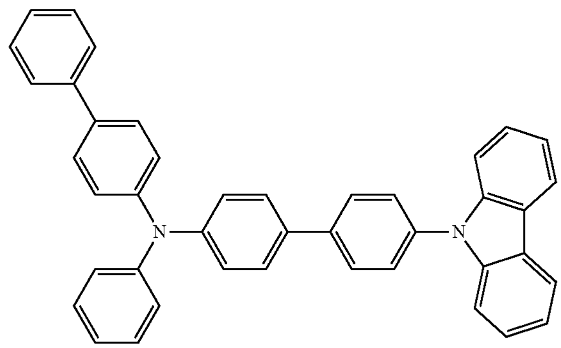

(2-99)

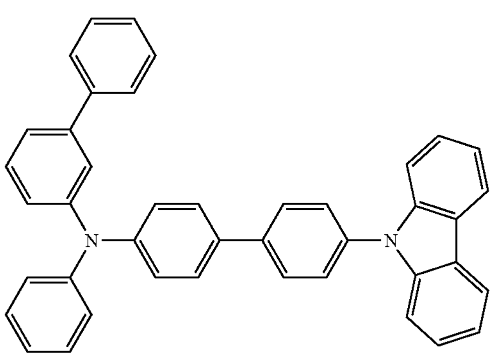

(2-100)

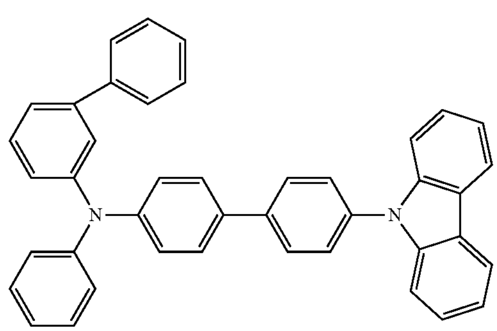

-continued
(2-101)
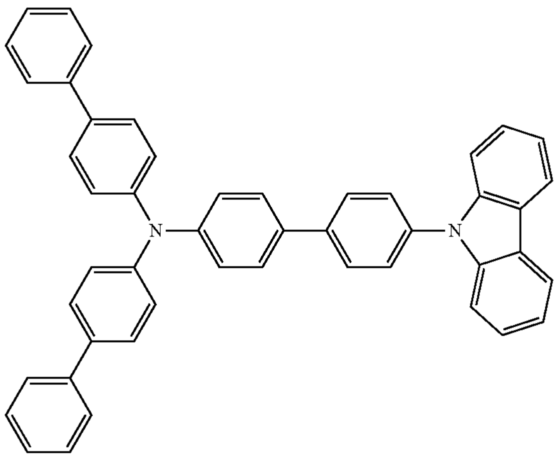
(2-102)
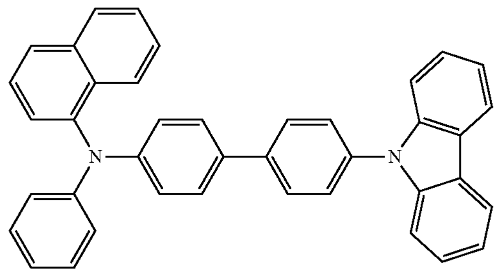
(2-103)
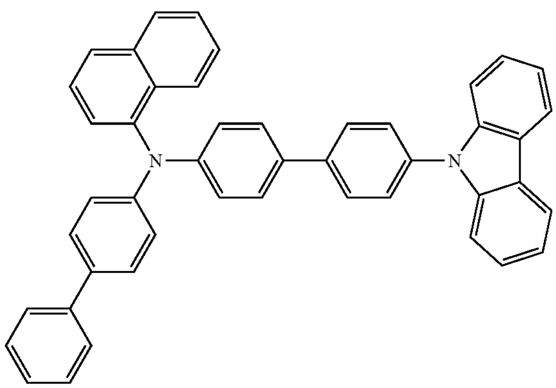
(2-104)
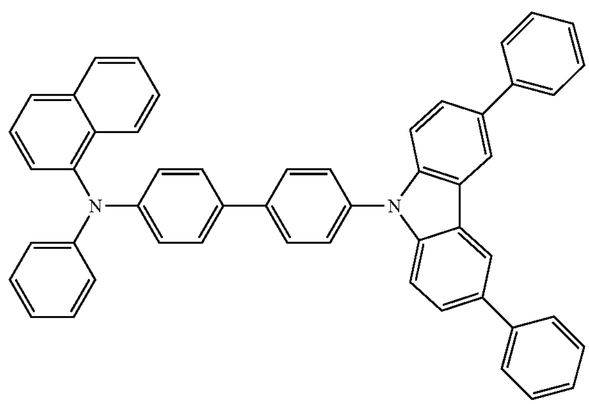
(2-105)
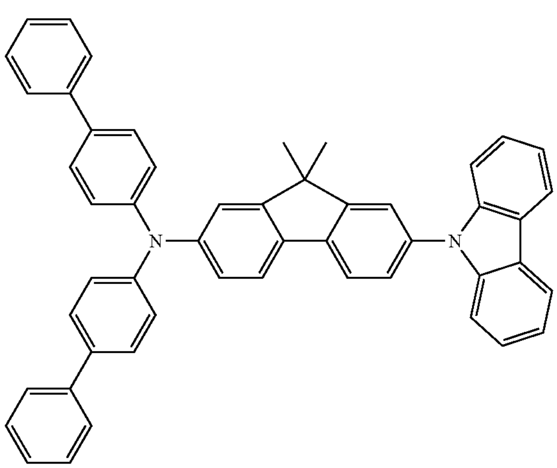
(2-106)
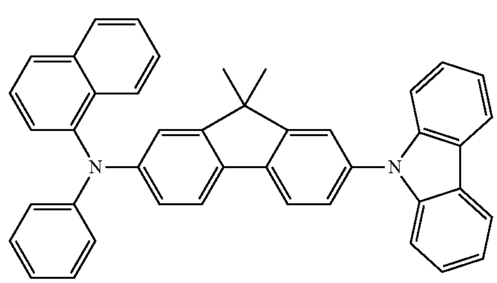

-continued
(2-107)
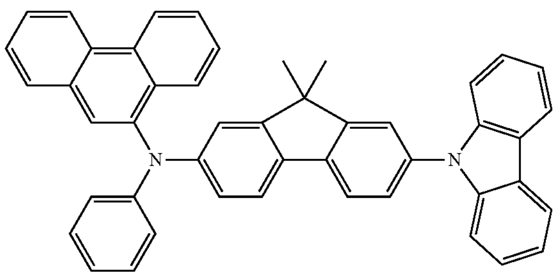
(2-108)
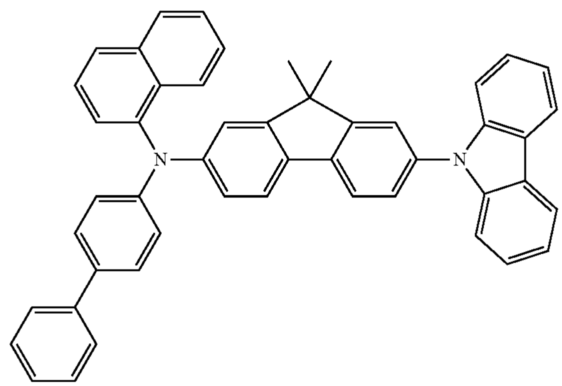
(2-109)
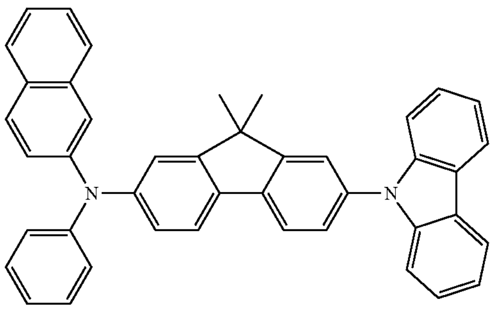
(2-110)
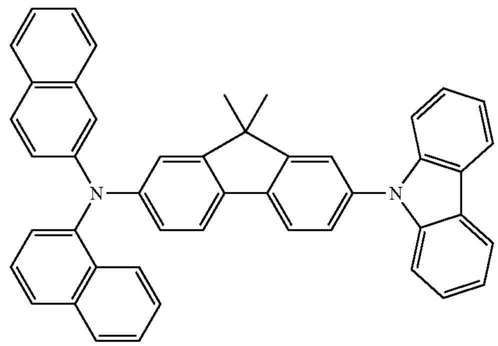
(2-111)
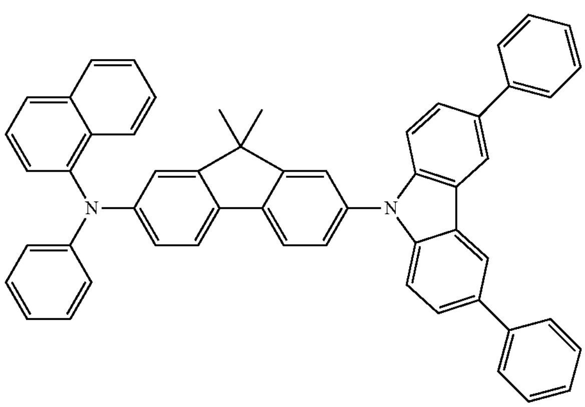
(2-112)
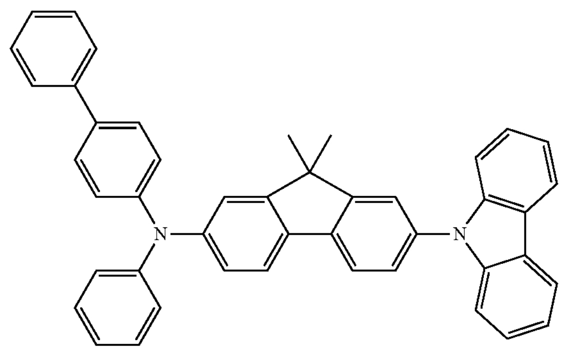
(2-113)
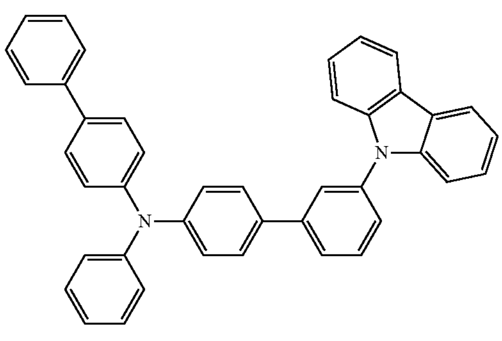
(2-114)
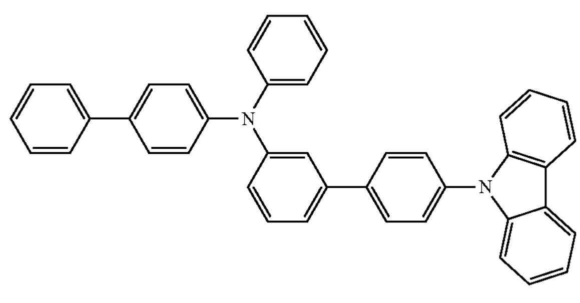

-continued
(2-115)
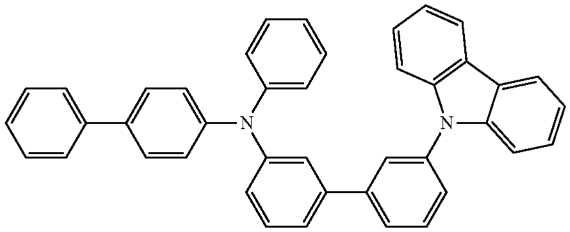
(2-116)
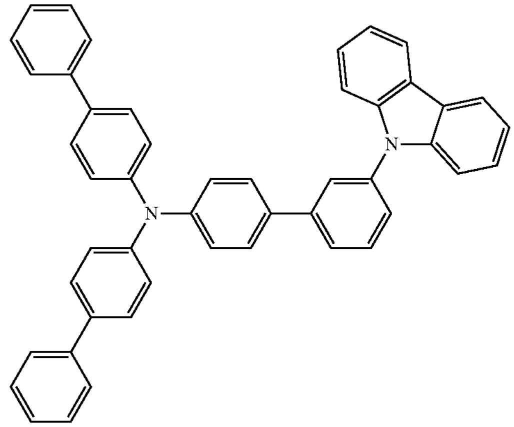
(2-117)
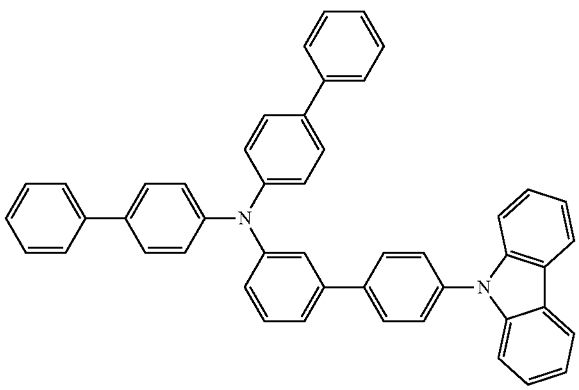
(2-118)
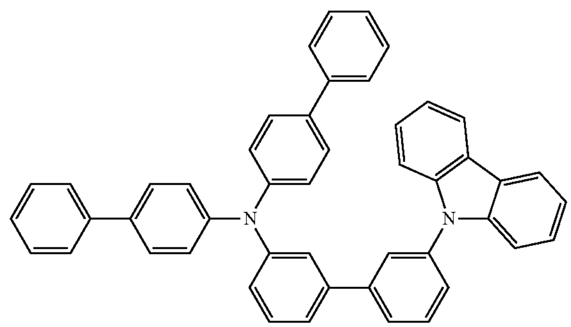
(2-119)
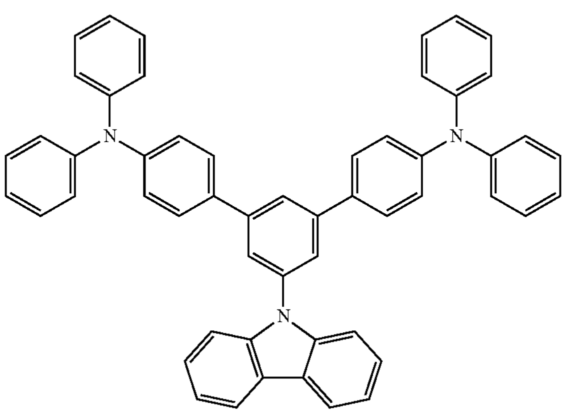
(2-120)
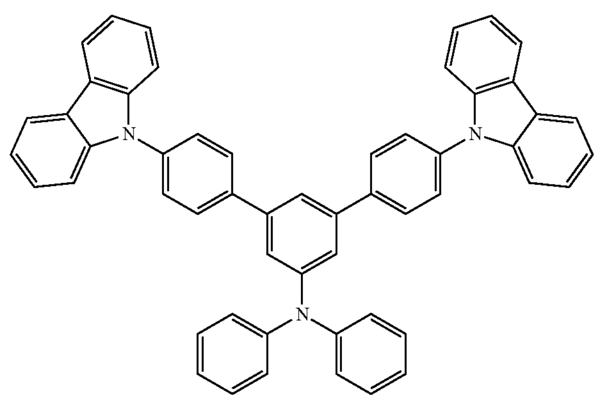

-continued
(2-121)
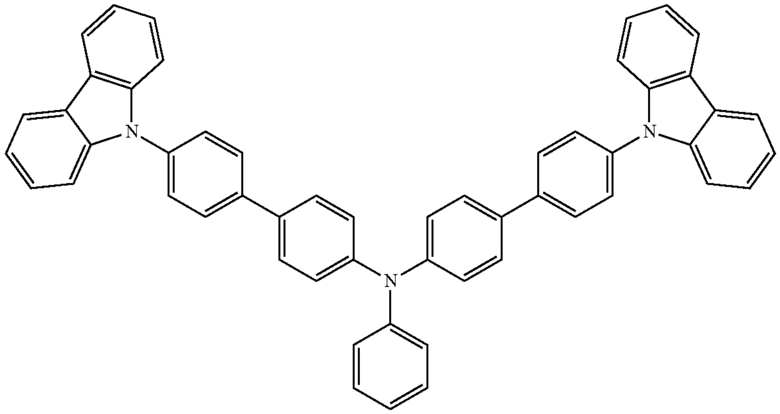
(2-122)
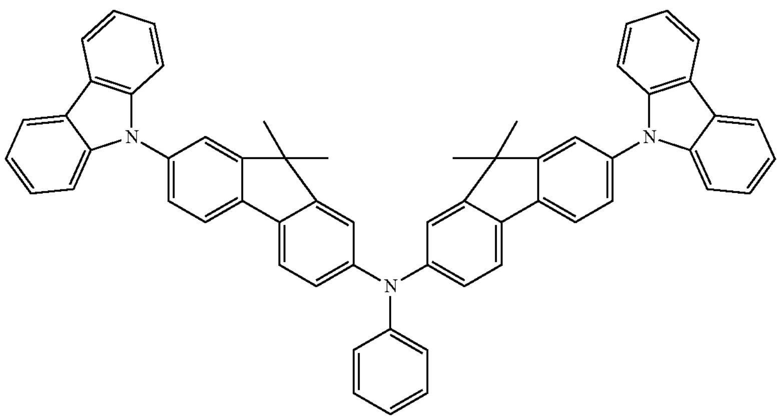
(2-123)
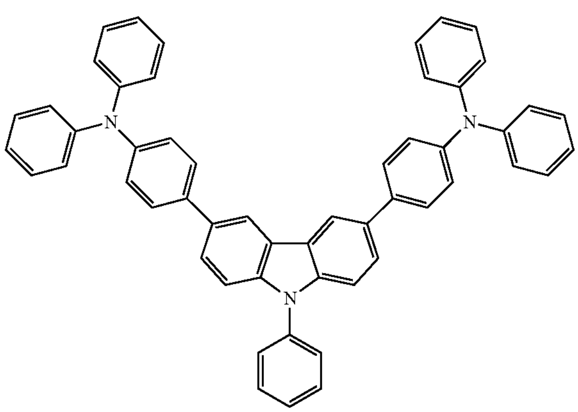
(2-124)
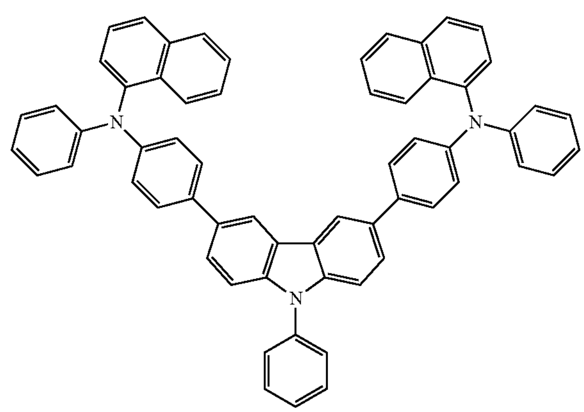
(2-125)
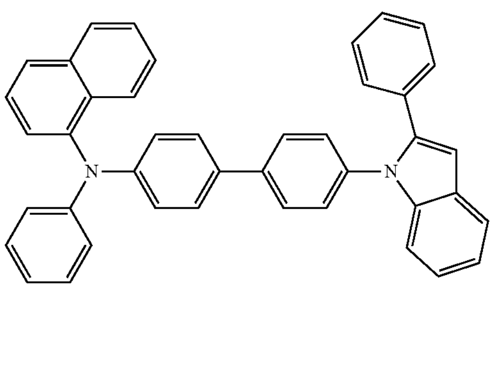
(2-126)
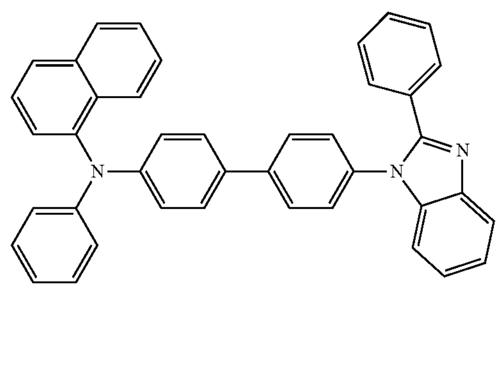

-continued
(2-127)
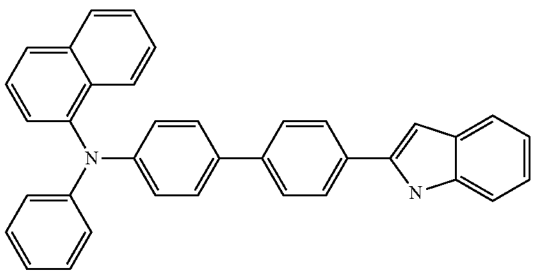
(2-128)
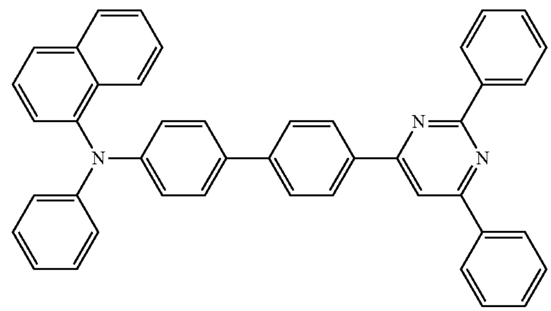
(2-129)
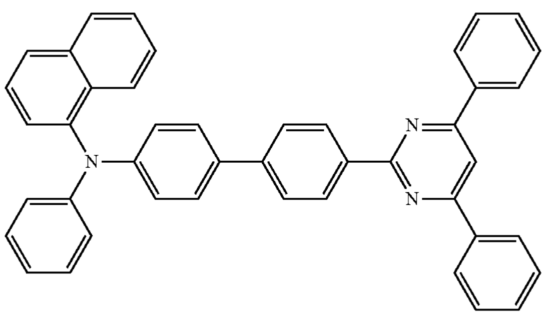
(2-130)
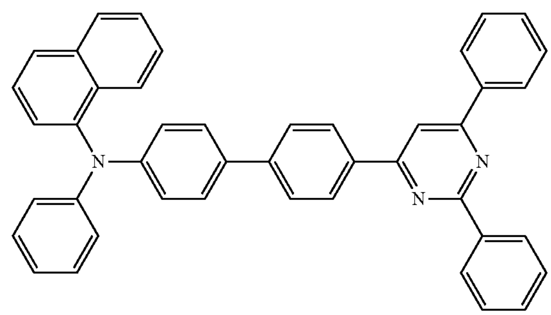
(2-131)
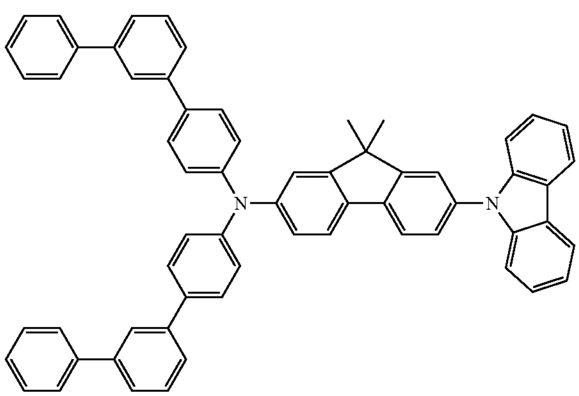
(2-132)
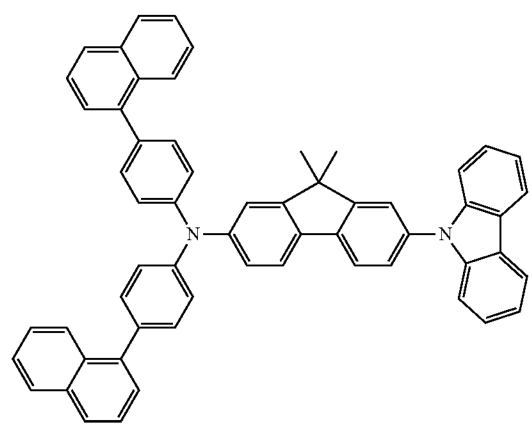
(2-133)
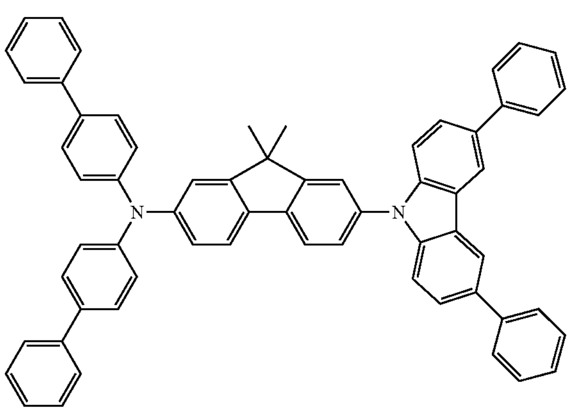
(2-134)
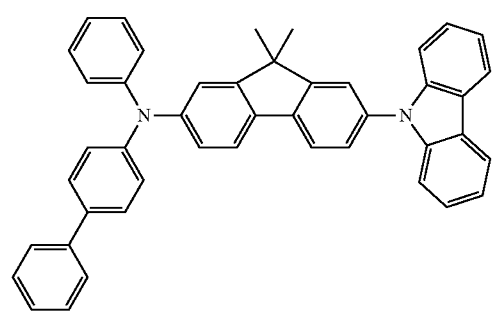

-continued
(2-135)
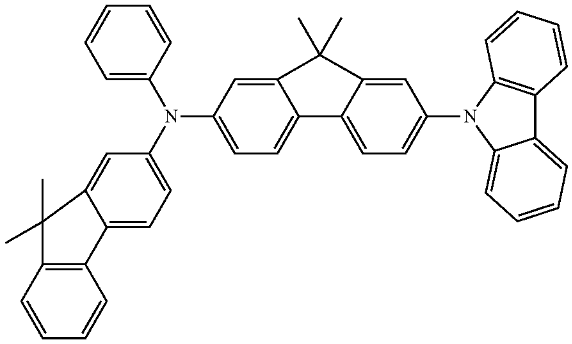
(2-136)
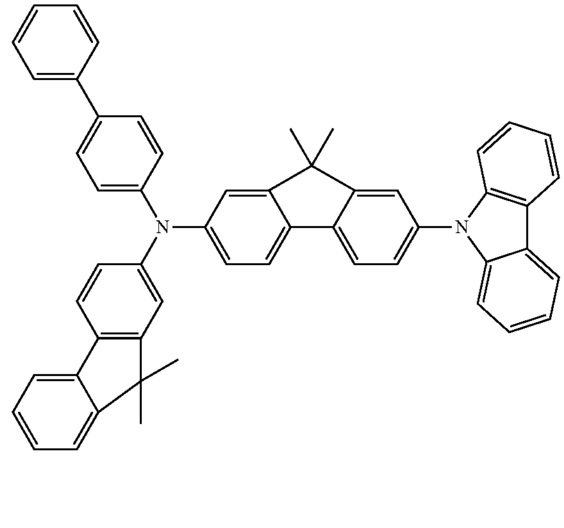
(2-137)
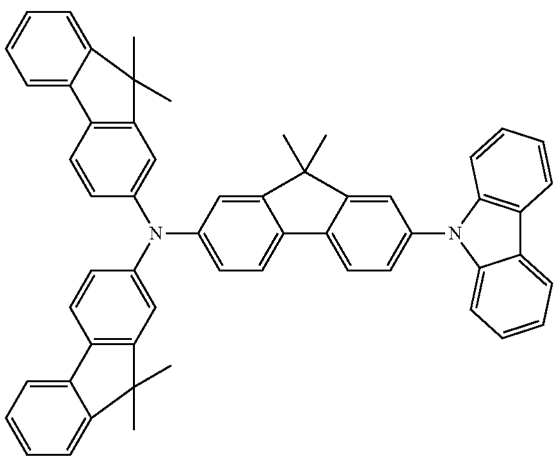
(2-138)
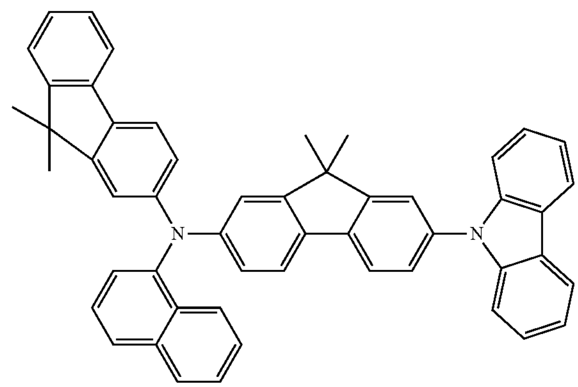
(2-139)
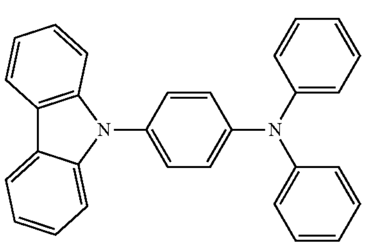
(2-140)
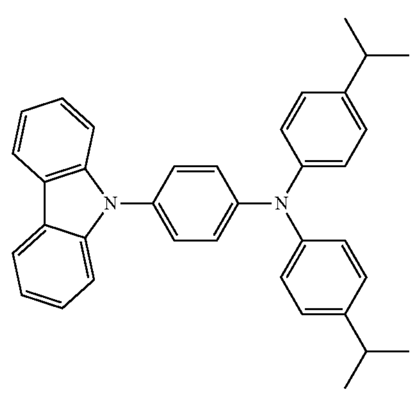

-continued
(2-141)
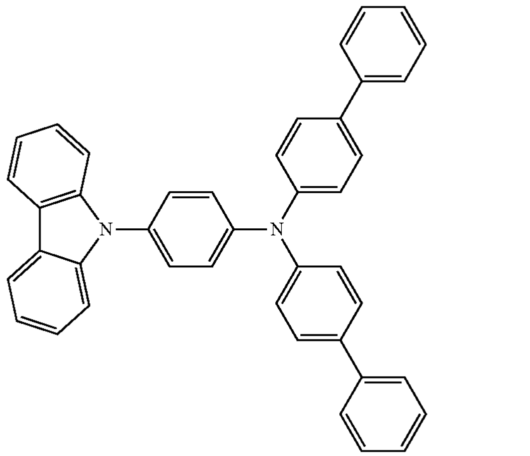
(2-142)
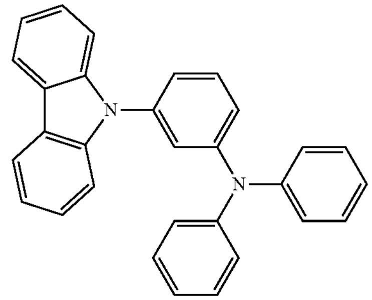
(2-143)
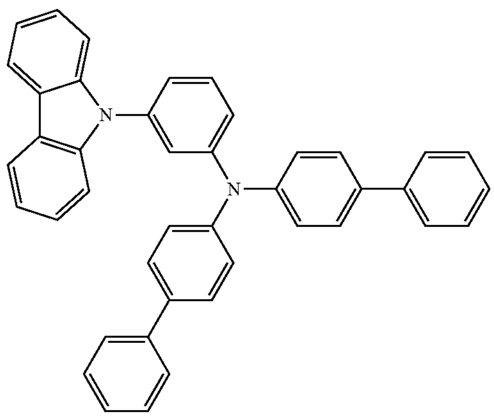
(2-144)
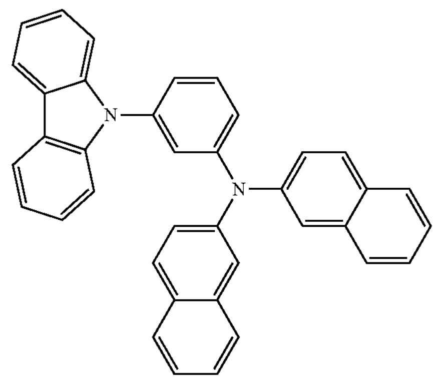
(2-145)
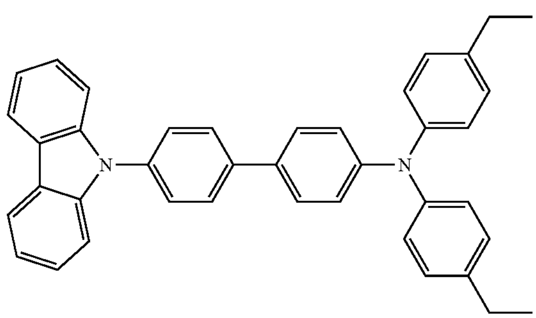
(2-146)
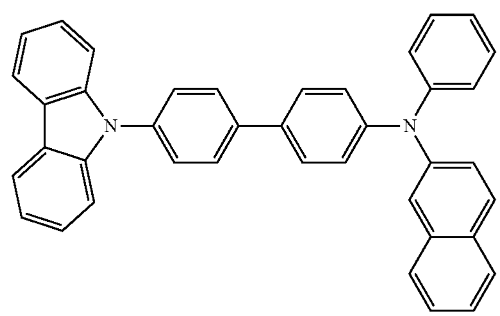
(2-147)
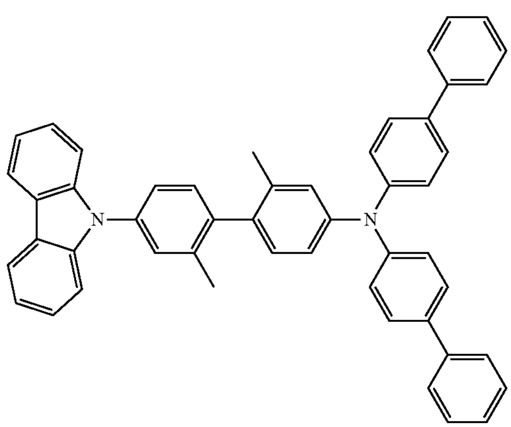
(2-148)
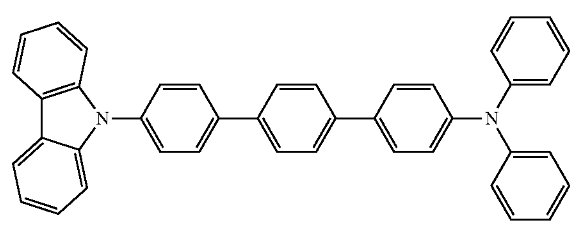

-continued
(2-149)
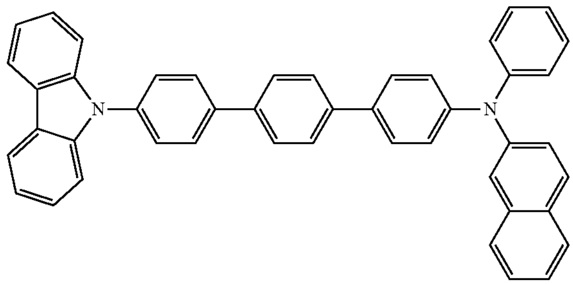
(2-150)
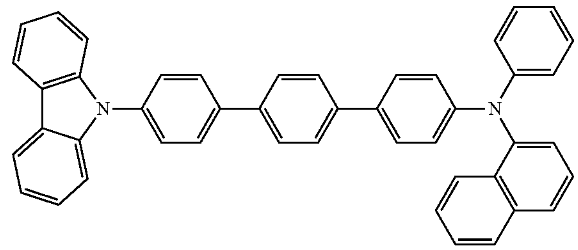
(2-151)
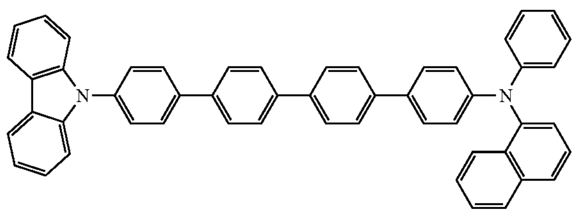
(2-152)
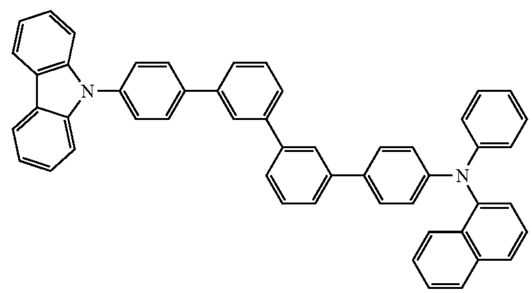
(2-153)
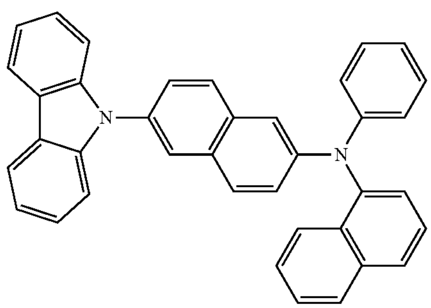
(2-155)
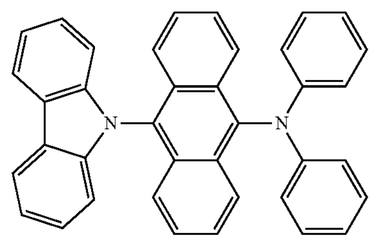
(2-156)
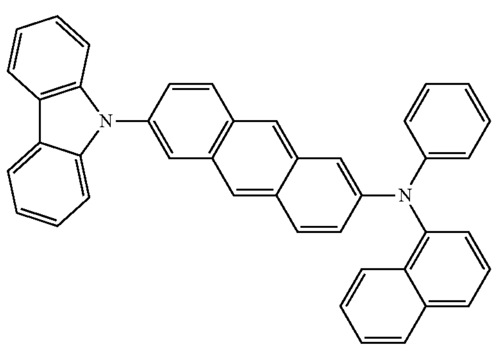
(2-157)
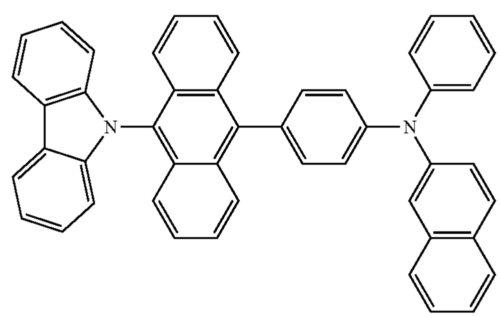
(2-158)
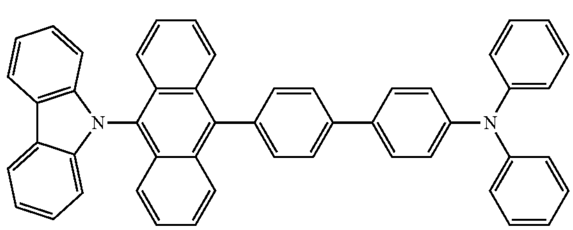
(2-159)
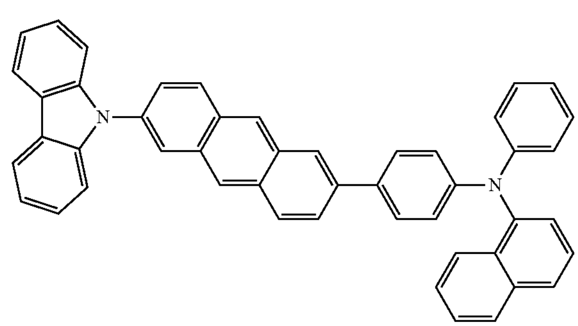

-continued (2-160)

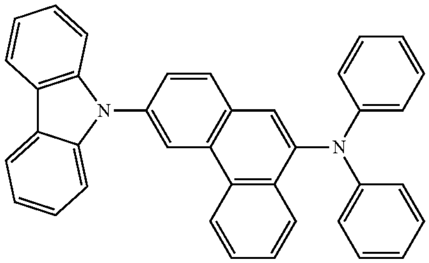

(2-161)

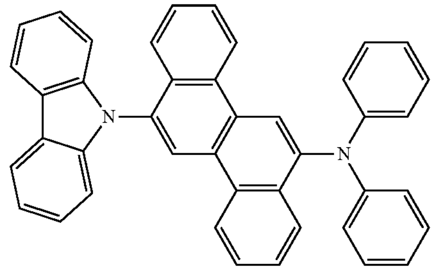

(2-162)

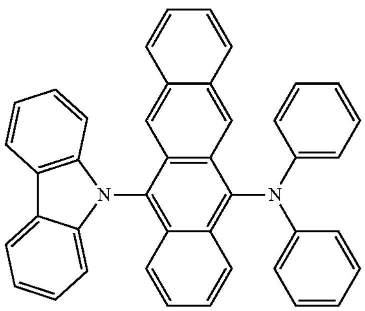

(2-163)

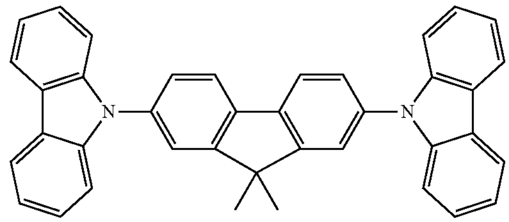

(2-164)

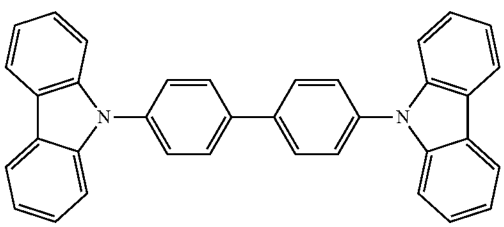

(2-165)

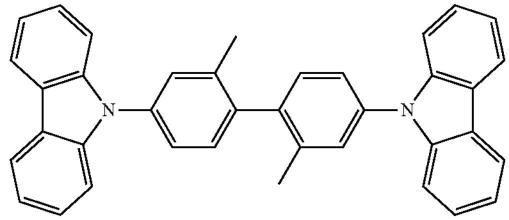

(2-166)

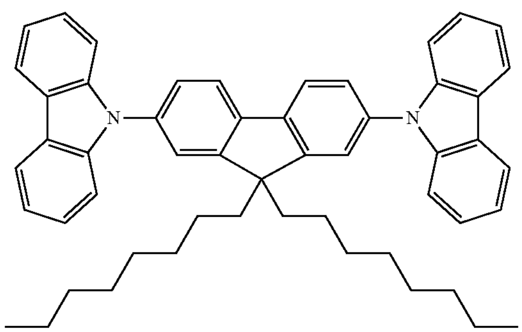

The electron and the hole are recombined with each other in the blue light emitting layer 16CB by application of the electric field, so that the blue light emitting layer 16CB emits the light. Thus, the blue light emitting layer 16CB is provided over the entire surface of the connection layer 16D. The blue light emitting layer 16CB is doped with a guest material of a blue or green color fluorescent dye with an anthracene compound as a host material, and thus emits a blue or green light.

In particular, for the host material composing the blue light emitting layer 16CB, a compound expressed by the general formula (8) is preferably used as the host material:

(8)

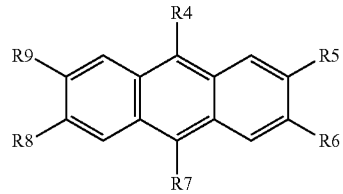

in which R4 to R9 are hydrogen atoms, halogen atoms, hydroxyl groups, alkyl groups each having a carbon number of 20 or less, alkenyl groups, groups each having a carbonyl group, groups each having a carbonylester group, groups each having an alkoxyl group, groups each having a cyano group, groups each having a nitro group or derivatives thereof, groups each having a silyl group having a carbon number of 30 or less, groups each having an aryl group, groups each having a heterocyclic group, or groups each having an amino group or derivatives thereof.

The groups each having the aryl group and represented by R4 to R9 in the compounds expressed by the general formula (8), for example, include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-crycenyl group, a 6-crycenyl group, a 2-fluoranthenyl group, 3-fluoranthenyl group, a 2-biphenylyl group, a 3-biphenylyl group, a 4-biphenylyl group, an o-trill group, an m-trill group, a p-trill group, a p-t-butylphenyl group, and the like.

In addition, the groups each having the heterocyclic group and represented by R4 to R9 include a five-membered or six-membered aromatic cyclic group containing therein an oxygen atom (O), a nitrogen atom (N), and a sulfur atom (S) as hetero atoms: a condensed polycyclic aromatic cyclic group having a carbon number of 2 to 20. Such a heterocyclic group, for example, includes a thienyl group, a furyl group, a pyrrolyl group, a pyridyl group, a quinolyl group, a quinoxalyl group, an imidazopyridyl group, and a benzothiazole group. A typical heterocyclic group includes a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furil group, a 3-furil group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5 quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acrizinyl group, a 2-acridinyl group, a 3-acrizinyl group, a 4-acrizinyl group, a 9-acrizinyl group, and the like.

A group having an amino group represented by R4 to R9 may be any of an alkylamino group, an arylamino group, an aralkylamino group, and the like. These groups preferably have an aliphatic hydrocarbon group having a carbon number of 1 to 6 and/or an aromatic ring group having a carbon number of 1 to 4. Such a group includes a dimethylamino group, a diethylamino group, a dibutylamino group, a diphenylamino group, a ditolylamino group, a bisbiphenylylamino group, and a dinaphthylamino group. It is noted that the substituent described above either may form a condensed ring composed of two or more substituents, or may be a derivative thereof.

A concrete example of the compound expressed by the general formula (8) includes compounds expressed by the following structural formulas (8-1) to (8-51), and the like:

(8-1)

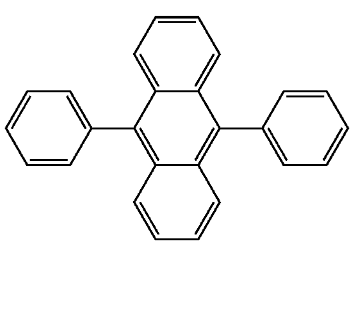

(8-2)

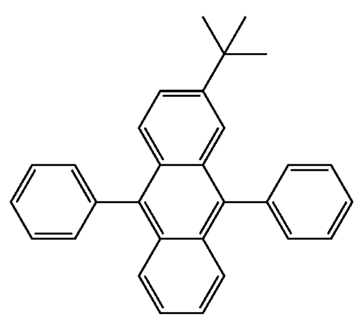

-continued
(8-3)
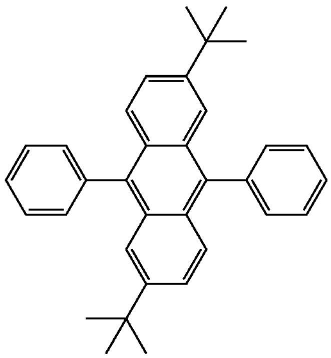
(8-4)
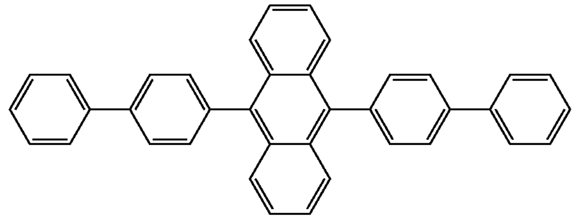
(8-5)
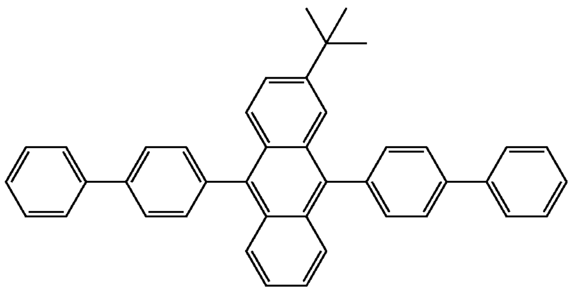
(8-6)
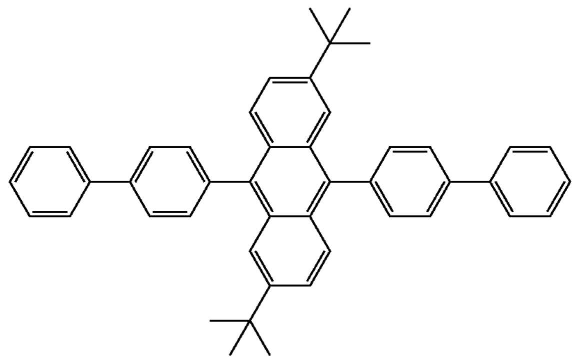
(8-7)
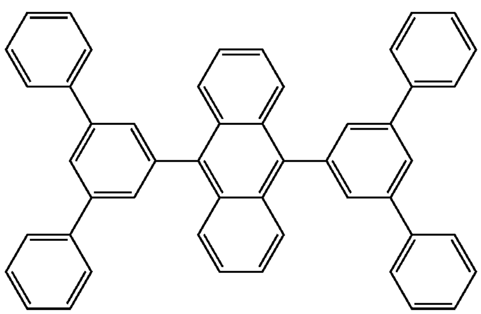
(8-8)
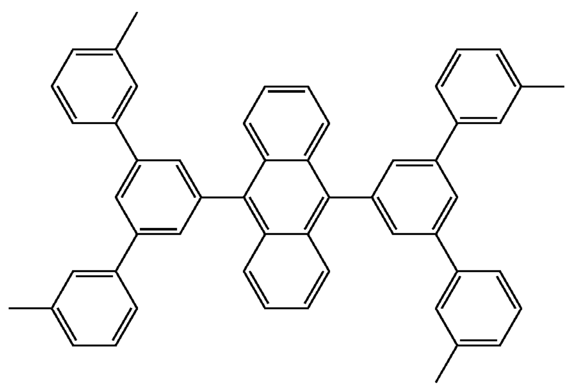
(8-9)
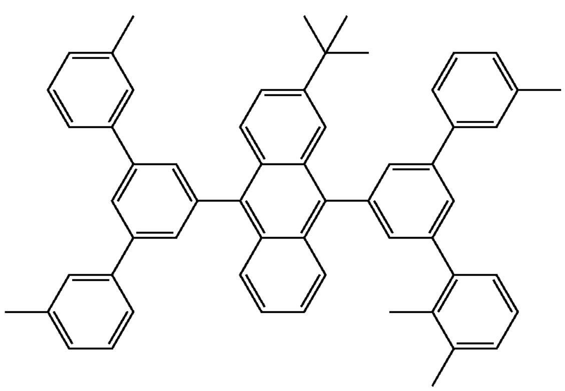
(8-10)
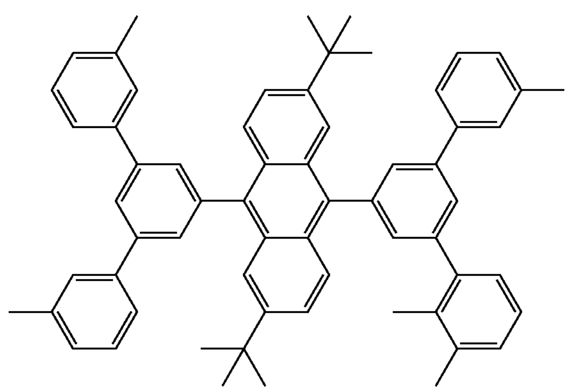

-continued
(8-11)
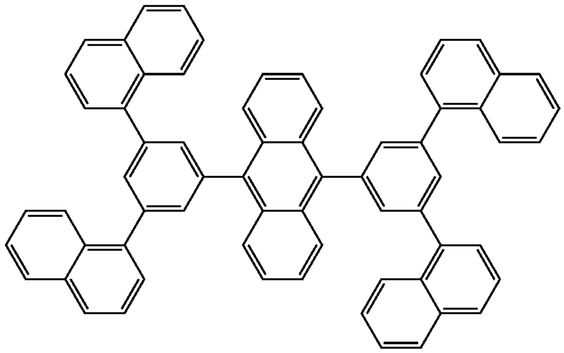
(8-12)
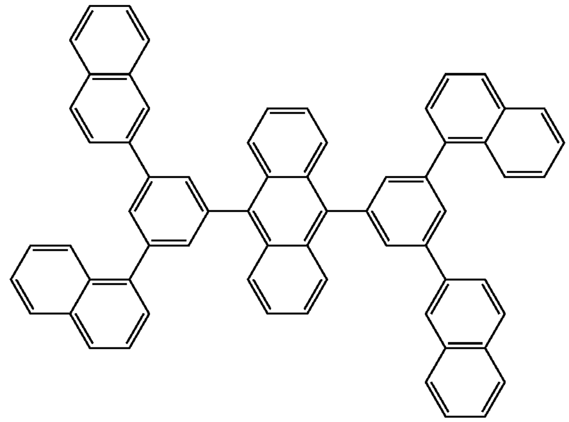
(8-13)
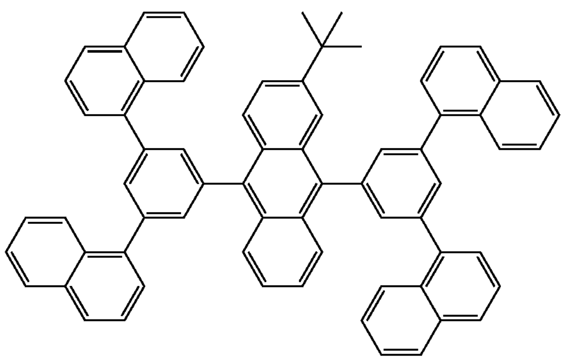
(8-14)
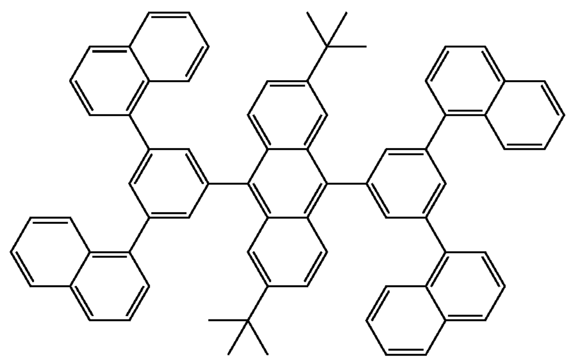
(8-15)
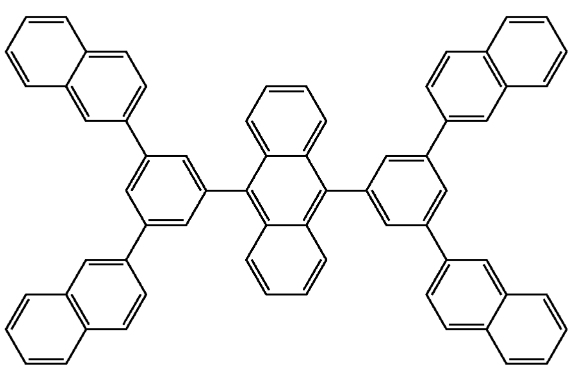
(8-16)
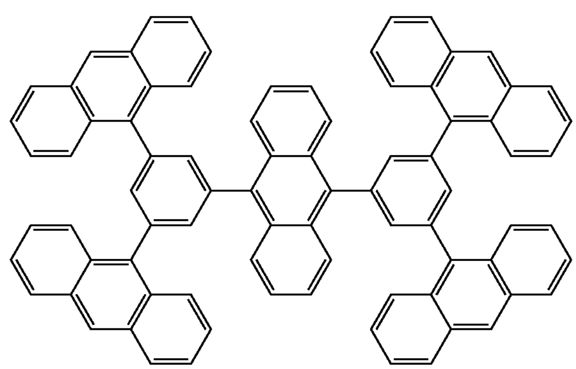

-continued
(8-17)
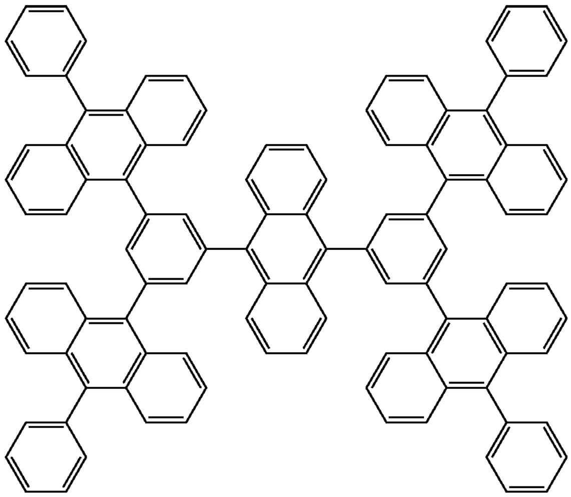
(8-18)
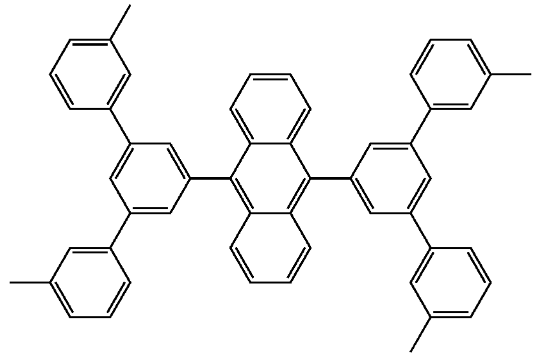
(8-19)
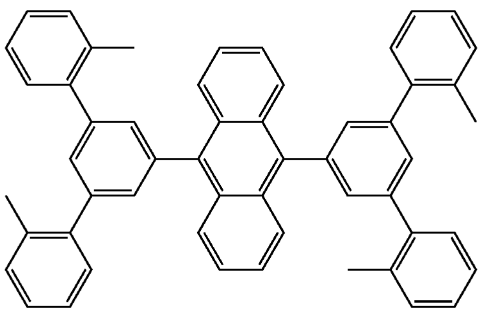
(8-20)
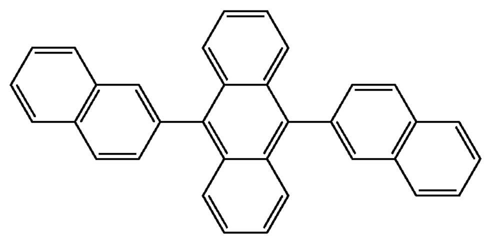
(8-21)
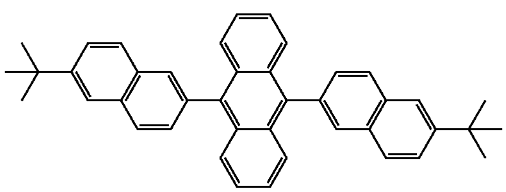
(8-22)
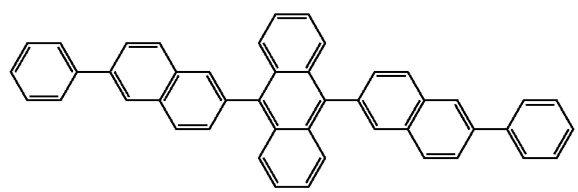
(8-23)
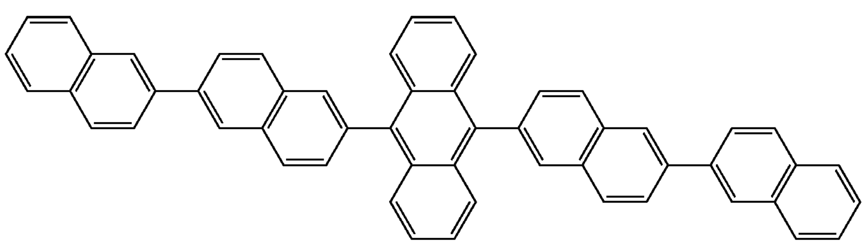
(8-24)
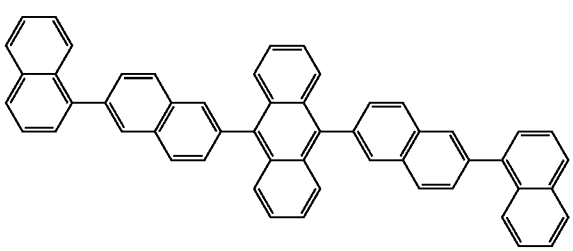
(8-25)
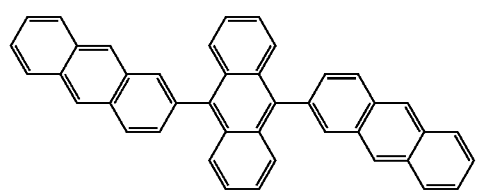

-continued
(8-26)
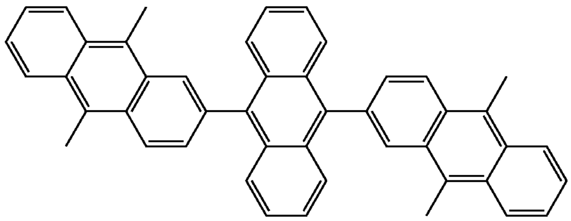
(8-27)
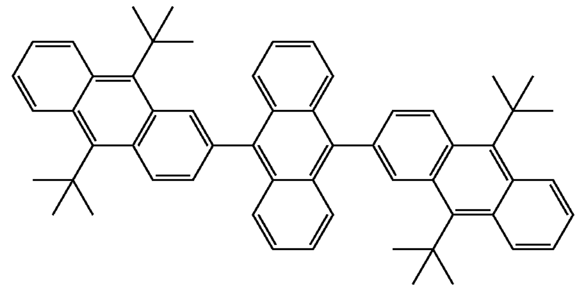
(8-28)
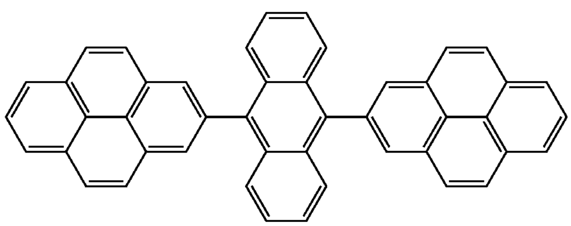
(8-29)
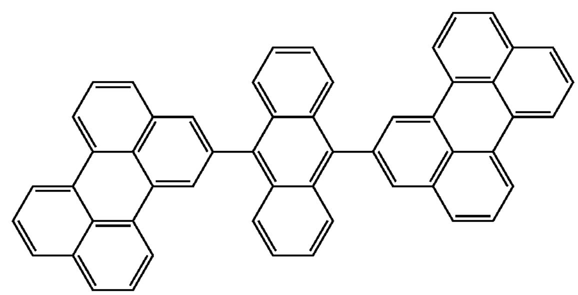
(8-30)
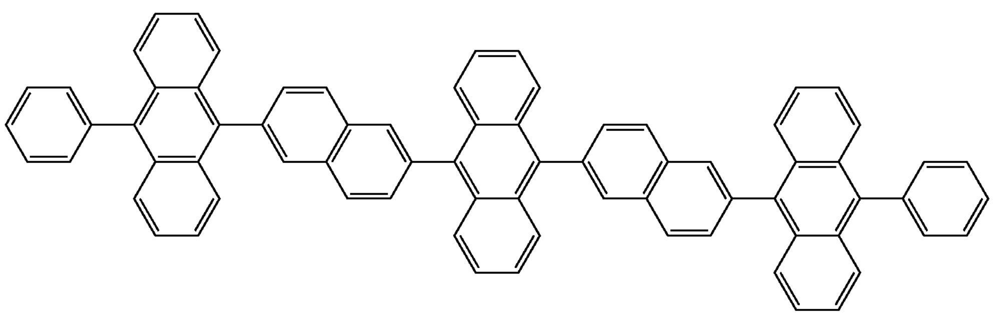
(8-31)
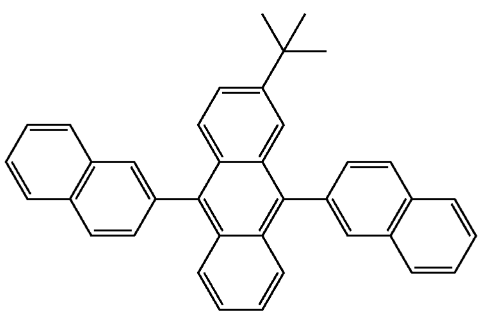
(8-32)
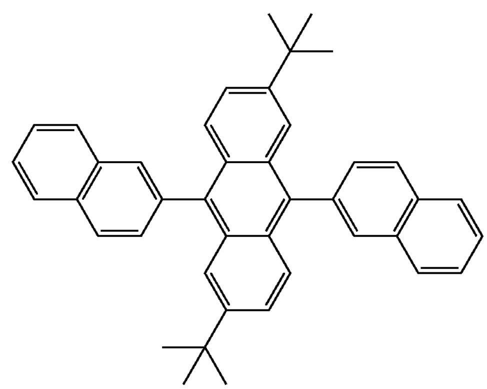
(8-33)
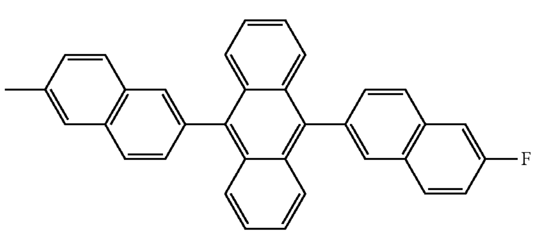
(8-34)
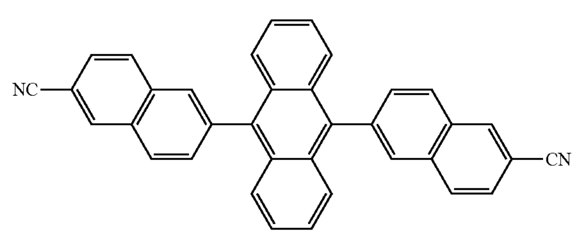

-continued
(8-35)
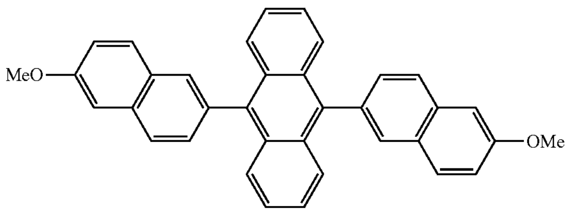
(8-36)
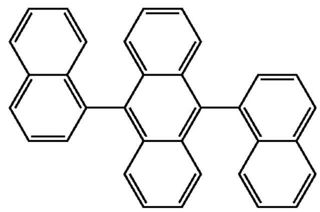
(8-37)
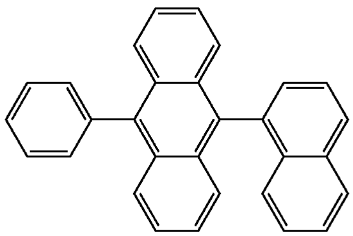
(8-38)
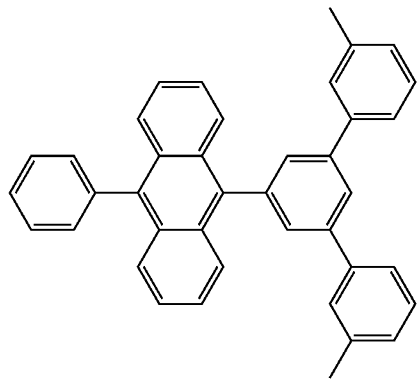
(8-39)
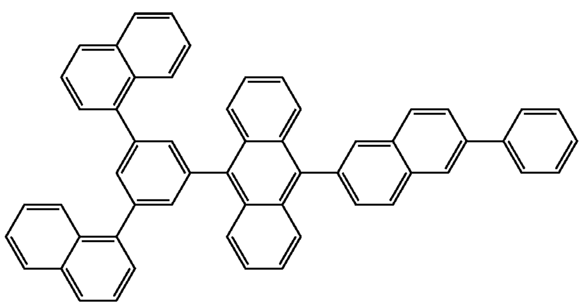
(8-40)
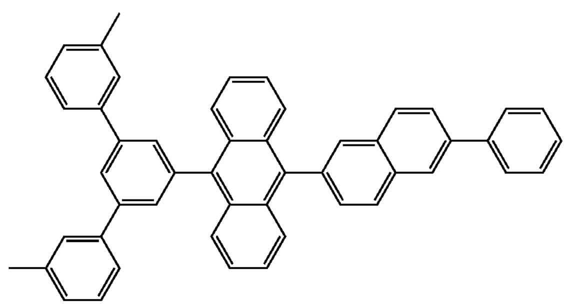
(8-41)
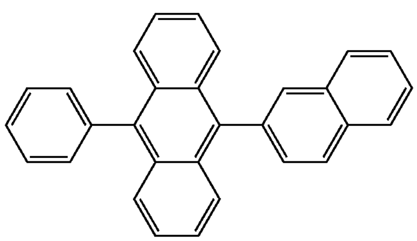
(8-42)
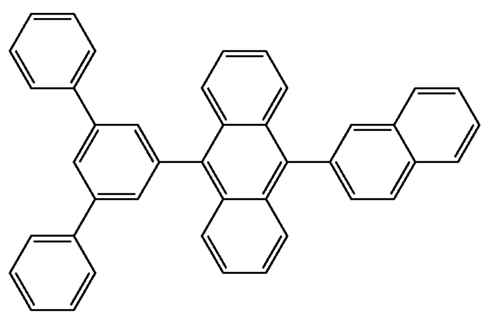
(8-43)
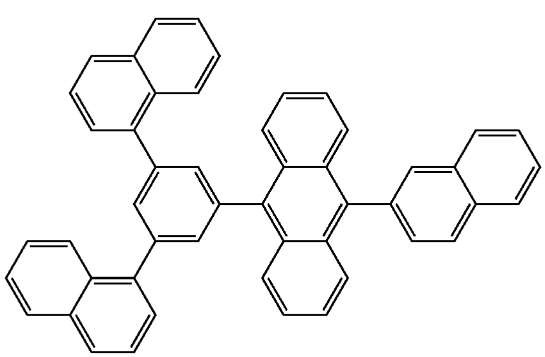
(8-44)
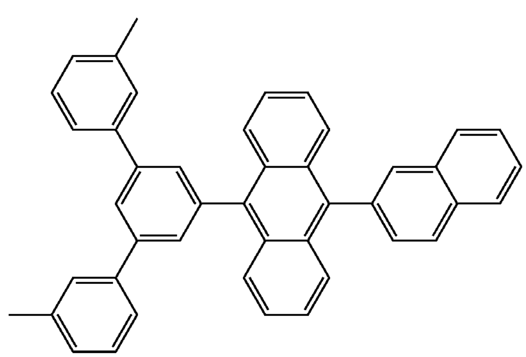

-continued (8-45)

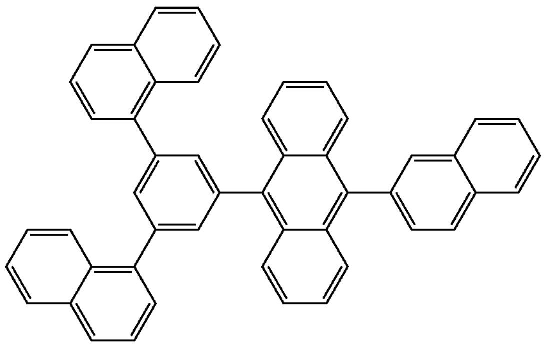

(8-46)

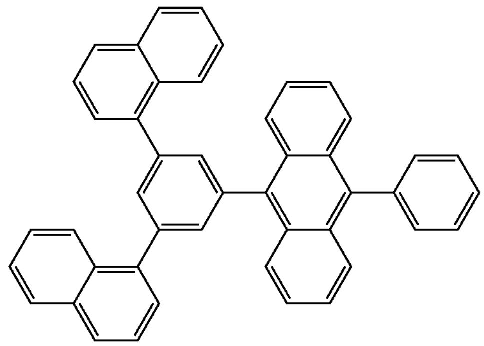

(8-47)

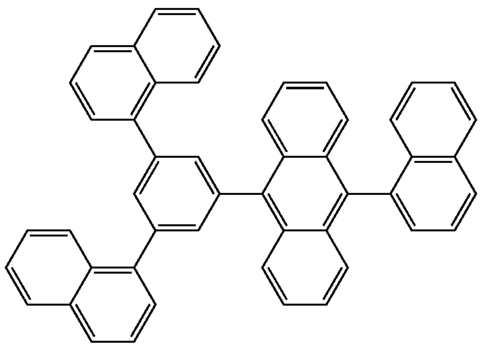

(8-48)

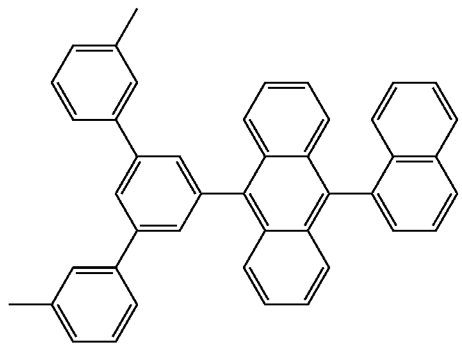

(8-49)

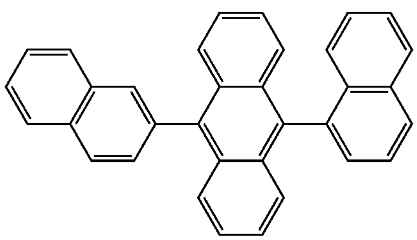

(8-50)

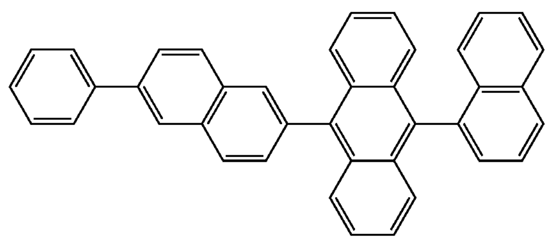

(8-51)

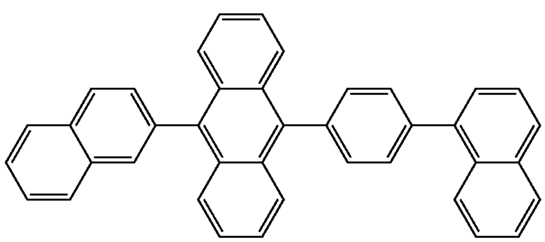

On the other hand, a low-molecular fluorescence material having a high luminous efficiency, an organic luminescent material such as a phosphorescence dye or a metallic complex or the like is used as a luminescence guest material composing the blue light emitting layer 16CB.

Here, the blue luminescence guest material means a compound which has a peak in the range of about 400 to about 490 nm in wavelength range of the light emission. An organic material such as a naphthalene derivative, an anthracene derivative, a naphthacene derivative, a styrylamine derivative or a bis(azinyl)methene boron complex is used as such a compound. In particular, preferably, such a compound is selected from an aminonaphthalene derivative, an aminoanthracene derivative, an aminochrysene derivative, an aminopyrene derivative, a styrylamine derivative, a bis(azinyl) methene boron complex. It is noted that the material used in the blue light emitting layer is by no means limited to the fluorescent material described above, and the phosphorescence may also be used. In this case, since the connection layer 16D described above is the hole transport layer for the blue light emitting layer 16CB, the connection layer 16D described above is preferably structured so as to have a triplet energy higher than that of the blue light emitting layer 16CB.

The electron transport layer 16E is provided in order to increase the efficiency of the transport of the electrons to each of the red light emitting layer 16CR, the green light emitting layer 16CG, and the blue light emitting layer 16CB, and is formed as the common layer over the entire surface of the blue light emitting layer 16CB. Although depending on the entire structure of the element, for example, a thickness of the electron transport layer 16E is preferably in the range of 5 to 300 nm, and more preferably in the range of 10 to 170 nm.

An organic material having an excellent electron transporting ability is preferably as the material for the electron transport layer 16E. The efficiency of the transport of the electrons to the luminescence layer, especially, each of the red light emitting layer 16CR and the green light emitting layer 16CG is increased, whereby the change in the luminescent color in each of the red organic EL element 10R and the green organic EL element 10G due to an electric field strength which will be described later is suppressed. Specifically, a nitrogen-containing heterocyclic ring derivative in which an electron mobility is $10^{-6}$ cm$^2$/Vs to $1.0\times10^{-1}$ cm$^2$/Vs can be used as such an organic material.

Although a more concrete material includes a benzoimidazole derivative (the general formula (9)), a pyridylphenyl derivative (the general formula (10)), and a bipyridine derivative (the general formula (11)) which are expressed by the following general formulas (9) to (11), respectively, the present disclosure is by no means limited thereto:

(9)

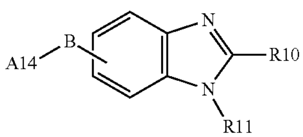

in which A14 is a hydrogen atom, a halogen atom, an alkyl group having a carbon number of 1 to 20, a hydrocarbon group having a carbon number of 6 to 60 and having a polycyclic aromatic hydrocarbon group into which 3 to 40 aromatic rings are condensed, or a nitrogen-containing heterocyclic group or a derivative thereof, B is a bivalent aromatic cyclic group having a single bound or a derivative thereof, and R10 and R11 are independently hydrogen atoms or halogen atoms, alkyl groups each having a carbon number of 1 to 20, aromatic hydrocarbon groups each having a carbon number of 6 to 60, nitrogen-containing heterocyclic groups or alkoxy groups each having a carbon number of 1 to 20 or derivatives thereof, (10)

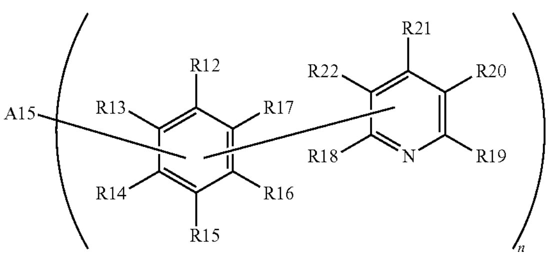

in which A15 is an n-valent group into which 2 to 5 aromatic rings are condensed, specifically, an n-valent acene system aromatic ring group into which 3 aromatic rings are condensed or a derivative thereof, R12 to R17 are independently a hydrogen atom or a halogen atom, or a free atomic valence coupled to any one of A15 or R18 to R22, R18 to R22 are independently a hydrogen atom or a halogen atom, or a free atomic valence coupled to any one of R12 to R17, n is an integral number of 2 or more, and n pyridylphenyl groups either may be identical to one another or may be different from one another, and (11)

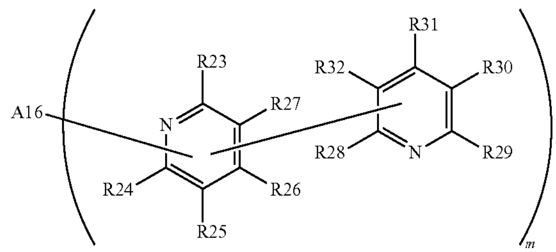

in which A16 is an m-valent group into which 2 to 5 aromatic rings are condensed, specifically, an n-valent acene system aromatic ring group into which 3 aromatic rings are condensed or a derivative thereof, R23 to R27 are independently a hydrogen atom or a halogen atom, or a free atomic valence coupled to any one of A16 or R28 to R32, R28 to R32 are independently a hydrogen atom or a halogen atom, or a free atomic valence coupled to any one of R23 to R27, m is an integral number of 2 or more, and m bipyridyl groups either may be identical to one another or may be different from one another.

A concrete example of the compound expressed by the general formula (9) includes compounds expressed by the following structural formulas (9-1) to (9-49). It is noted that Ar(α) corresponds to benzoimidazole skeleton containing therein R10 and R11 in the general formula (9), and B corresponds to B in the general formula (9). Also, Ar(1) and Ar(2) correspond to R10 and R11 in the general formula (9), and Ar(1) and Ar(2) are coupled in the order of Ar(1) and Ar(2) to B.

| | Ar (α) | B | Ar (1) | Ar (2) |
|---|---|---|---|---|
| (9-1) | 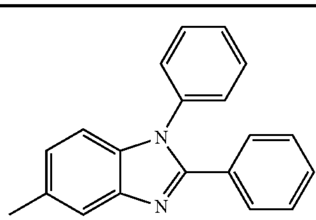 | 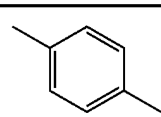 | 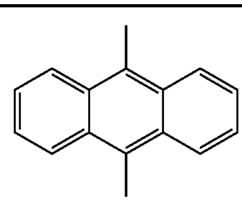 | 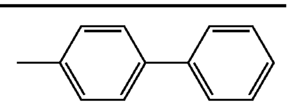 |

-continued
(9-2)
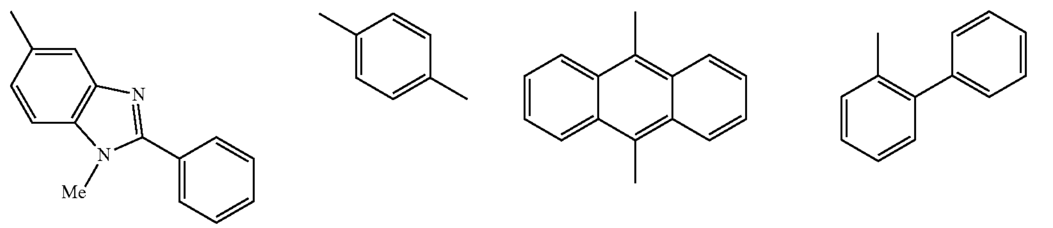
(9-3)
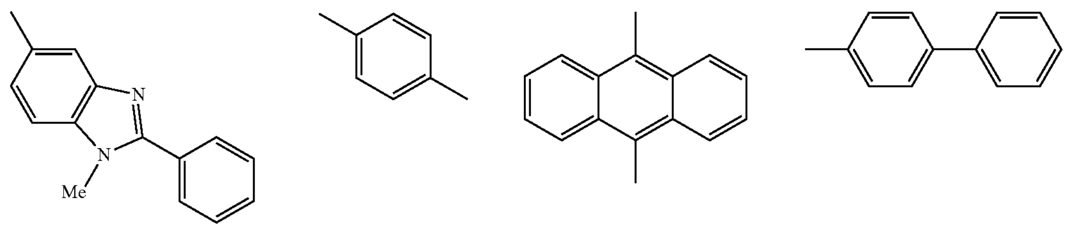
(9-4)
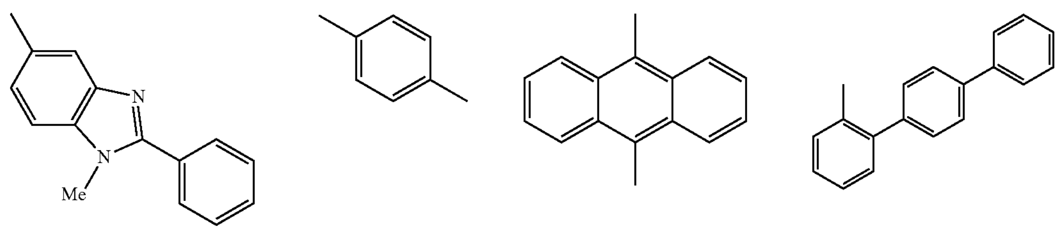
(9-5)
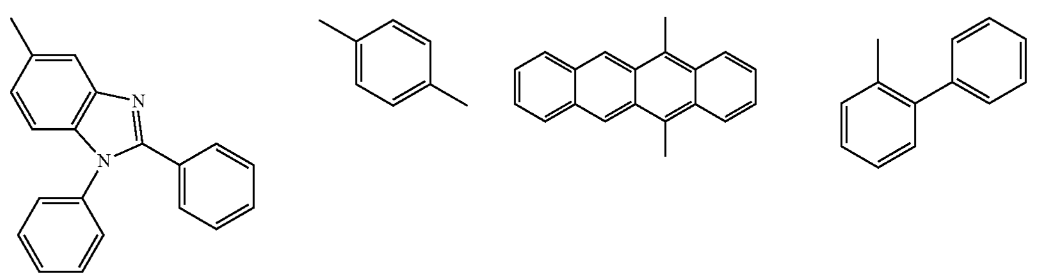
(9-6)
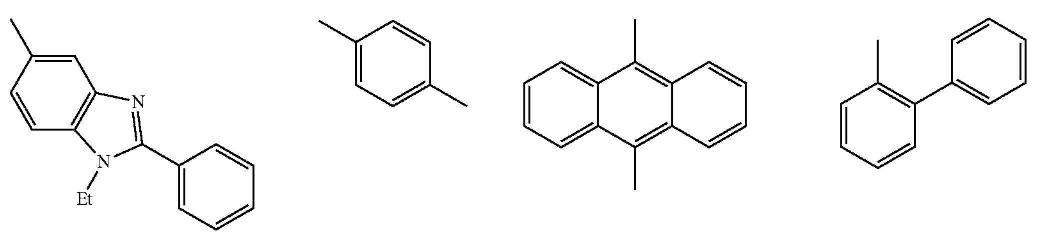
(9-7)
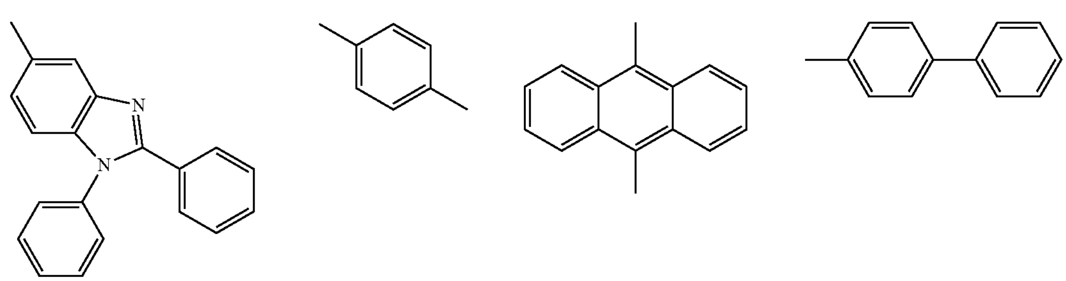

-continued
(9-8)
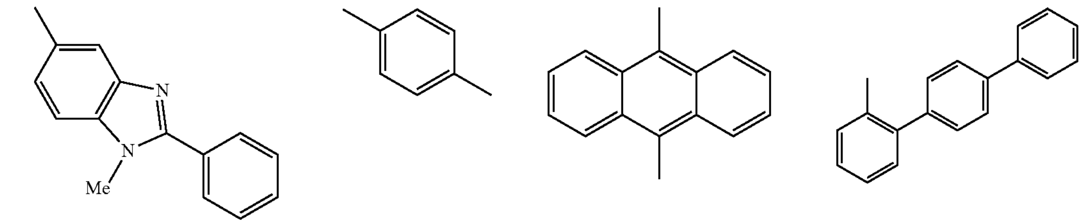
(9-9)
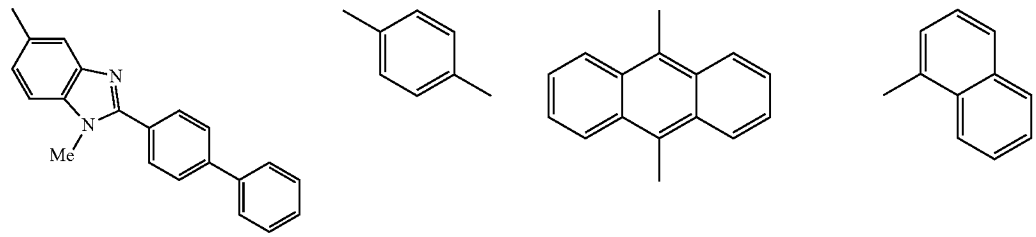
(9-10)
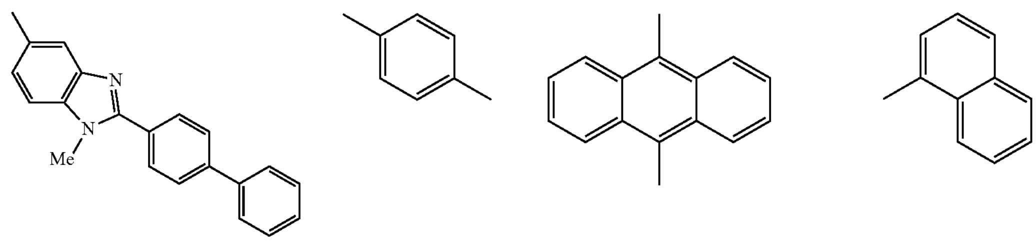
(9-11)
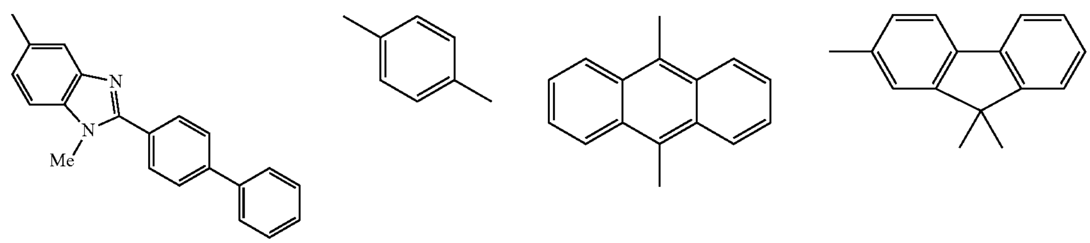
(9-12)
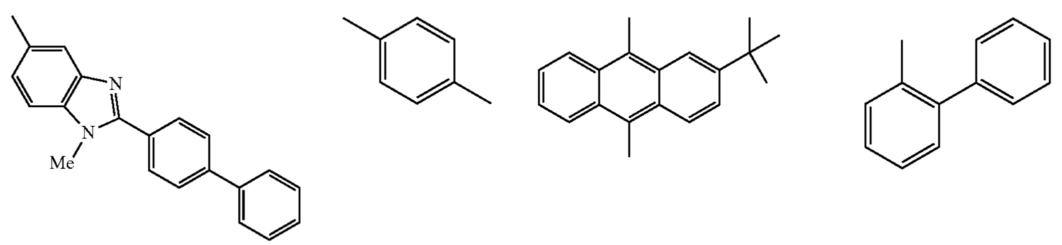
(9-13)
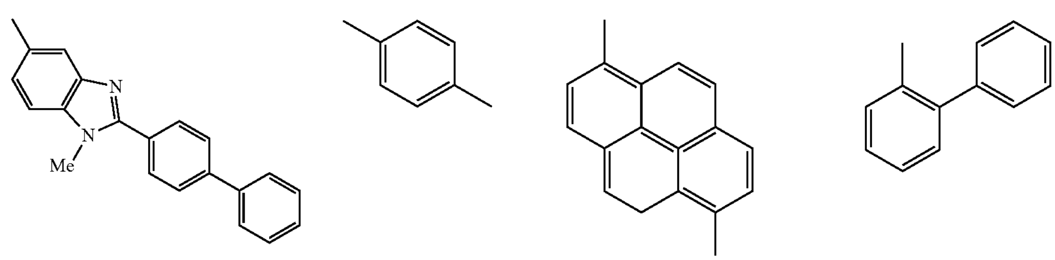

-continued
| | | | | |
|---|---|---|---|---|
| (9-14) | 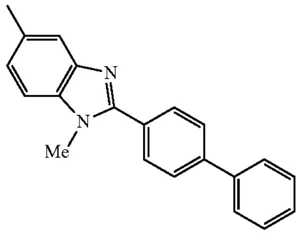 [SMILES: Cc1ccc2c(c1)nc(-c1ccc(-c3ccccc3)cc1)n2C] | 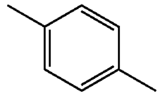 | 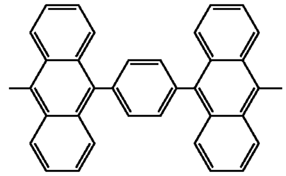 | 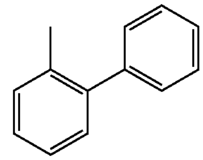 |
| (9-15) | 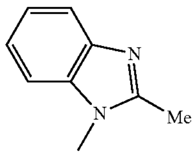 | 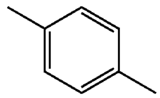 | 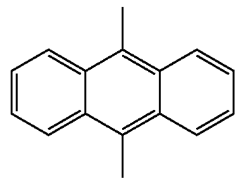 [SMILES: Cc1c2ccccc2c(C)c2ccccc12] | 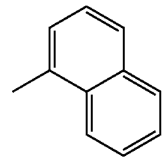 |
| (9-16) | 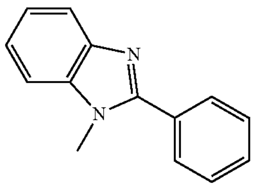 [SMILES: Cn1c(-c2ccccc2)nc2ccccc21] | 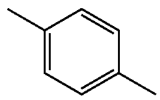 | 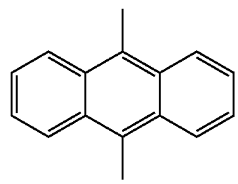 [SMILES: Cc1c2ccccc2c(C)c2ccccc12] | 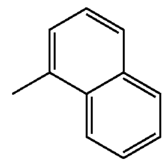 |
| (9-17) | 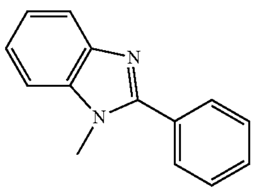 [SMILES: Cn1c(-c2ccccc2)nc2ccccc21] | 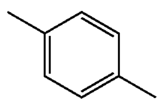 | 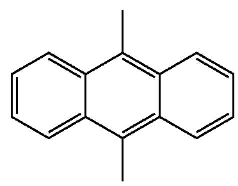 [SMILES: Cc1c2ccccc2c(C)c2ccccc12] | 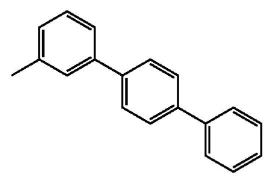 [SMILES: Cc1cccc(-c2ccc(-c3ccccc3)cc2)c1] |
| (9-18) | 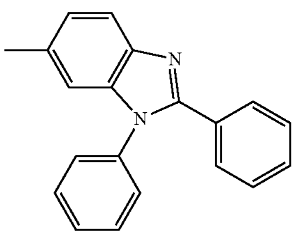 | — | 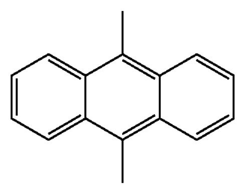 [SMILES: Cc1c2ccccc2c(C)c2ccccc12] | 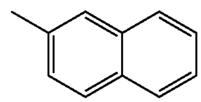 |
| (9-19) | 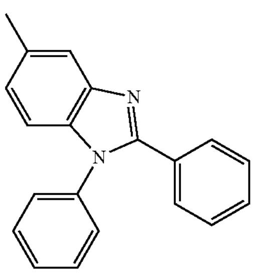 | — | 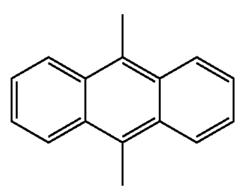 [SMILES: Cc1c2ccccc2c(C)c2ccccc12] | 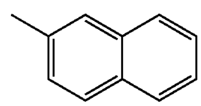 |
| (9-20) | 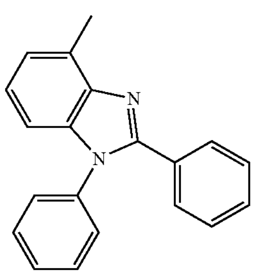 [SMILES: Cc1cccc2c1nc(-c1ccccc1)n2-c1ccccc1] | — | 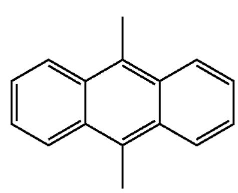 [SMILES: Cc1c2ccccc2c(C)c2ccccc12] | 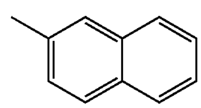 |

-continued
| | | | | |
|---|---|---|---|---|
| (9-21) | 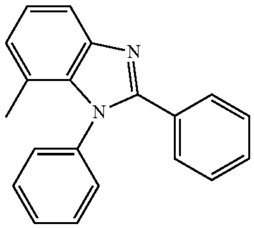 [SMILES: Cc1cccc2nc(-c3ccccc3)n(-c3ccccc3)c12] | — | 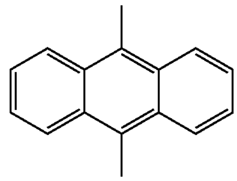 [SMILES: Cc1c2ccccc2c(C)c2ccccc12] | 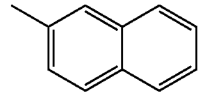 |
| (9-22) | 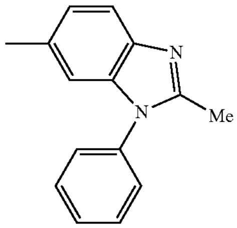 [SMILES: Cc1ccc2nc(C)n(-c3ccccc3)c2c1] | — | 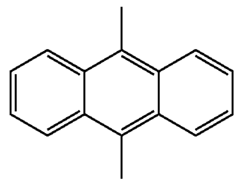 [SMILES: Cc1c2ccccc2c(C)c2ccccc12] | 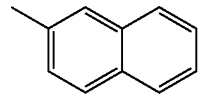 |
| (9-23) | 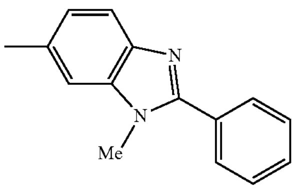 [SMILES: Cc1ccc2nc(-c3ccccc3)n(C)c2c1] | — | 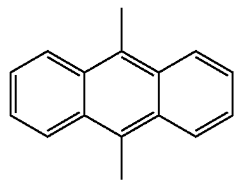 [SMILES: Cc1c2ccccc2c(C)c2ccccc12] | 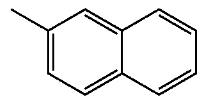 |
| (9-24) | 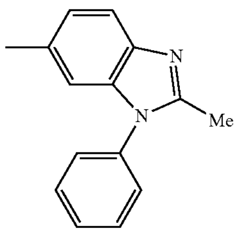 [SMILES: Cc1ccc2nc(C)n(-c3ccccc3)c2c1] | — | 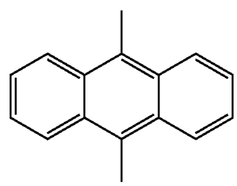 [SMILES: Cc1c2ccccc2c(C)c2ccccc12] | 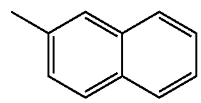 |
| (9-25) | 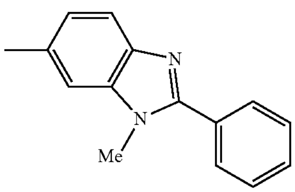 [SMILES: Cc1ccc2nc(-c3ccccc3)n(C)c2c1] | — | 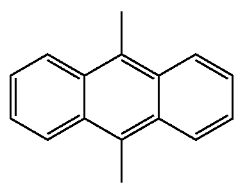 [SMILES: Cc1c2ccccc2c(C)c2ccccc12] | 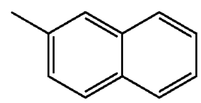 |
| (9-26) | 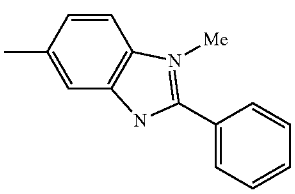 | — | 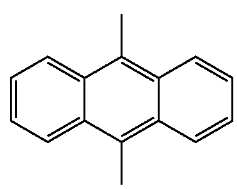 [SMILES: Cc1c2ccccc2c(C)c2ccccc12] | 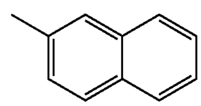 |
| (9-27) | 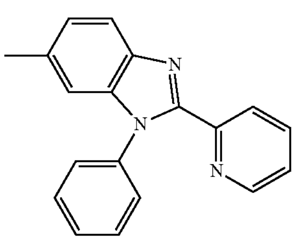 [SMILES: Cc1ccc2nc(-c3ccccn3)n(-c3ccccc3)c2c1] | — | 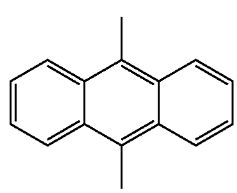 [SMILES: Cc1c2ccccc2c(C)c2ccccc12] | 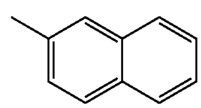 |

-continued
| | | | | |
|---|---|---|---|---|
| (9-28) | 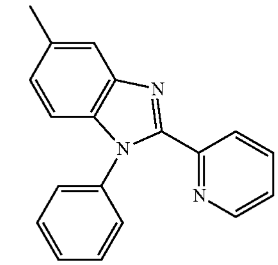 [SMILES: Cc1ccc2c(c1)nc(-c1ccccn1)n2-c1ccccc1] | — | 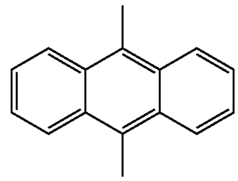 [SMILES: Cc1c2ccccc2c(C)c2ccccc12] | 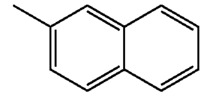 |
| (9-29) | 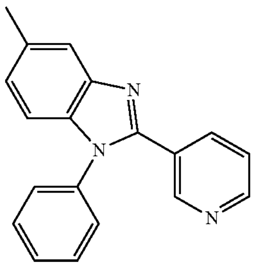 [SMILES: Cc1ccc2c(c1)nc(-c1cccnc1)n2-c1ccccc1] | — | 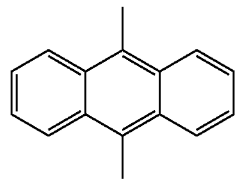 [SMILES: Cc1c2ccccc2c(C)c2ccccc12] | 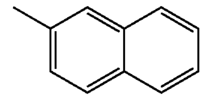 |
| (9-30) | 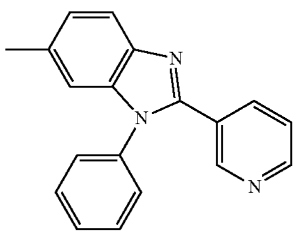 [SMILES: Cc1ccc2nc(-c3cccnc3)n(-c3ccccc3)c2c1] | — | 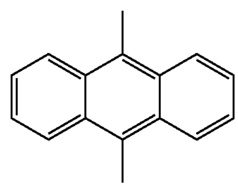 [SMILES: Cc1c2ccccc2c(C)c2ccccc12] | 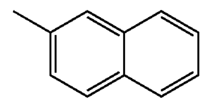 |
| (9-31) | 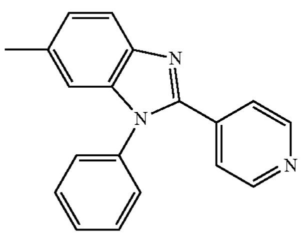 [SMILES: Cc1ccc2nc(-c3ccncc3)n(-c3ccccc3)c2c1] | — | 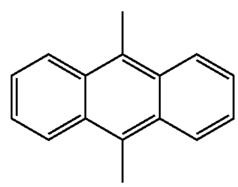 [SMILES: Cc1c2ccccc2c(C)c2ccccc12] | 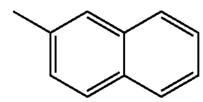 |
| (9-32) | 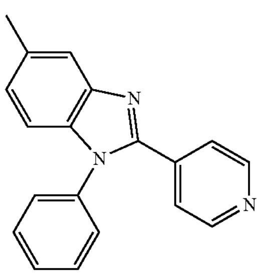 [SMILES: Cc1ccc2c(c1)nc(-c1ccncc1)n2-c1ccccc1] | — | 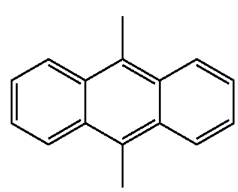 [SMILES: Cc1c2ccccc2c(C)c2ccccc12] | 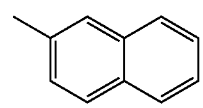 |
| (9-33) | 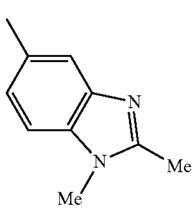 | — | 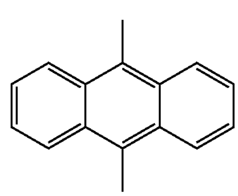 [SMILES: Cc1c2ccccc2c(C)c2ccccc12] | 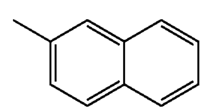 |

-continued
| | | | | |
|---|---|---|---|---|
| (9-34) | 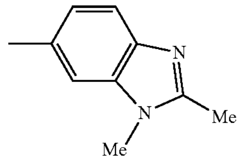 | — | 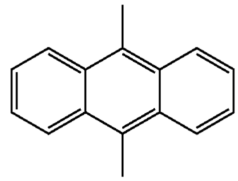 [SMILES: Cc1c2ccccc2c(C)c2ccccc12] | 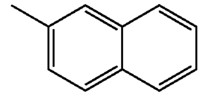 |
| (9-35) | 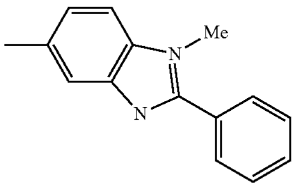 | — | 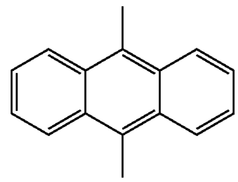 [SMILES: Cc1c2ccccc2c(C)c2ccccc12] | 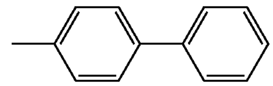 |
| (9-36) | 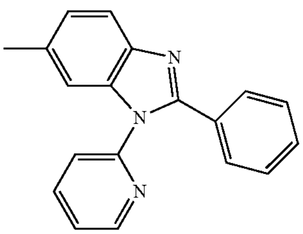 [SMILES: Cc1ccc2nc(-c3ccccc3)n(-c3ccccn3)c2c1] | — | 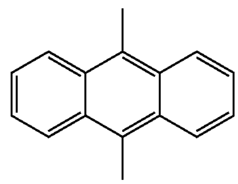 [SMILES: Cc1c2ccccc2c(C)c2ccccc12] | 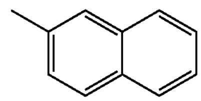 |
| (9-37) | 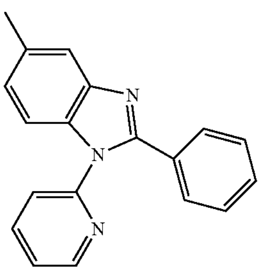 [SMILES: Cc1ccc2c(c1)nc(-c1ccccc1)n2-c1ccccn1] | — | 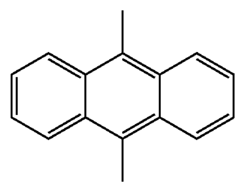 [SMILES: Cc1c2ccccc2c(C)c2ccccc12] | 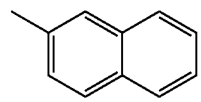 |
| (9-38) | 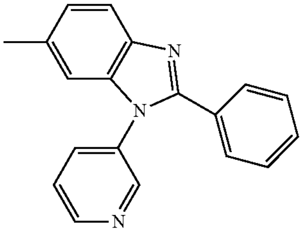 [SMILES: Cc1ccc2nc(-c3ccccc3)n(-c3cccnc3)c2c1] | — | 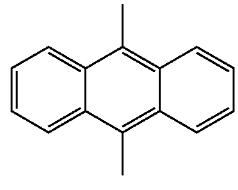 [SMILES: Cc1c2ccccc2c(C)c2ccccc12] | 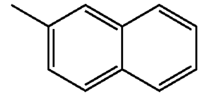 |
| (9-39) | 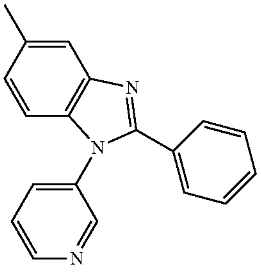 [SMILES: Cc1ccc2c(c1)nc(-c1ccccc1)n2-c1cccnc1] | — | 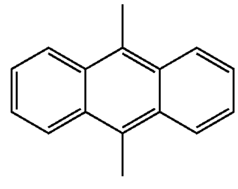 [SMILES: Cc1c2ccccc2c(C)c2ccccc12] | 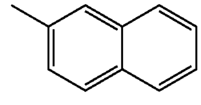 |

-continued
| | | | | |
|---|---|---|---|---|
| (9-40) | 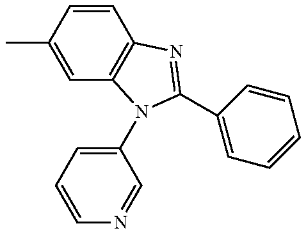 [SMILES: Cc1ccc2nc(-c3ccccc3)n(-c3cccnc3)c2c1] | — | 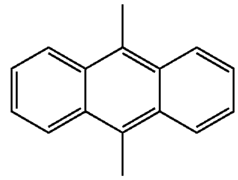 [SMILES: Cc1c2ccccc2c(C)c2ccccc12] | 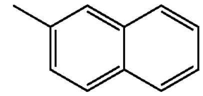 |
| (9-41) | 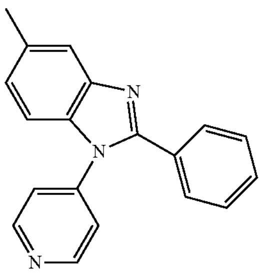 [SMILES: Cc1ccc2c(c1)nc(-c1ccccc1)n2-c1ccncc1] | — | 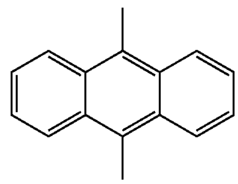 [SMILES: Cc1c2ccccc2c(C)c2ccccc12] | 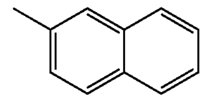 |
| (9-42) | 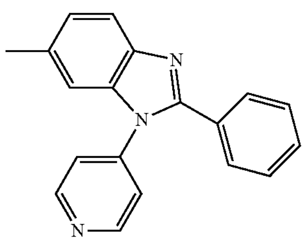 | — | 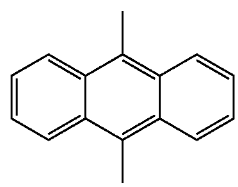 [SMILES: Cc1c2ccccc2c(C)c2ccccc12] | 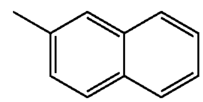 |
| (9-43) | 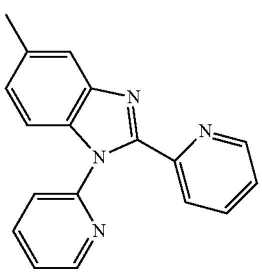 [SMILES: Cc1ccc2c(c1)nc(-c1ccccn1)n2-c1ccccn1] | — | 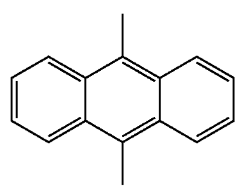 [SMILES: Cc1c2ccccc2c(C)c2ccccc12] | 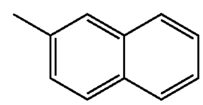 |
(9-44)
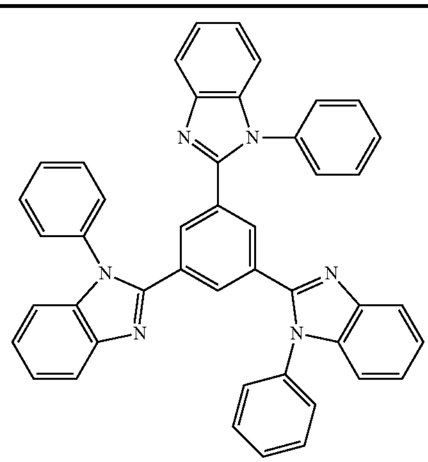

-continued
(9-45)
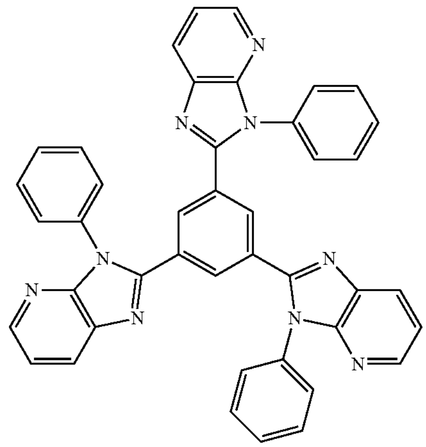 [SMILES: c1ccc(-n2c(-c3cc(-c4nc5cccnc5n4-c4ccccc4)cc(-c4nc5cccnc5n4-c4ccccc4)c3)nc3cccnc32)cc1]
(9-46)
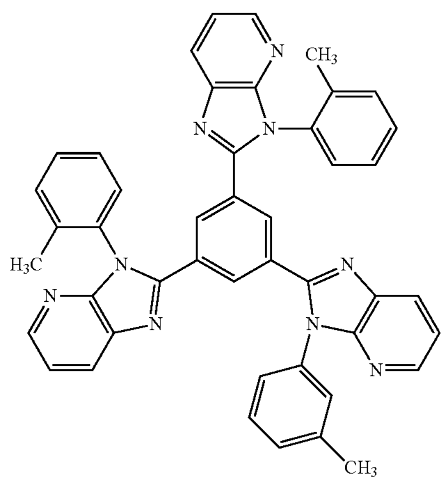 [SMILES: Cc1cccc(-n2c(-c3cc(-c4nc5cccnc5n4-c4ccccc4C)cc(-c4nc5cccnc5n4-c4ccccc4C)c3)nc3cccnc32)c1]
(9-47)
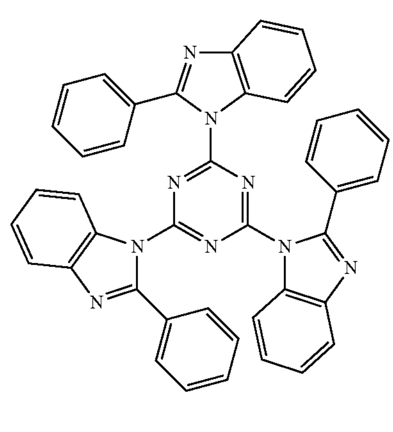 [SMILES: c1ccc(-c2nc3ccccc3n2-c2nc(-n3c(-c4ccccc4)nc4ccccc43)nc(-n3c(-c4ccccc4)nc4ccccc43)n2)cc1]

-continued
(9-48)
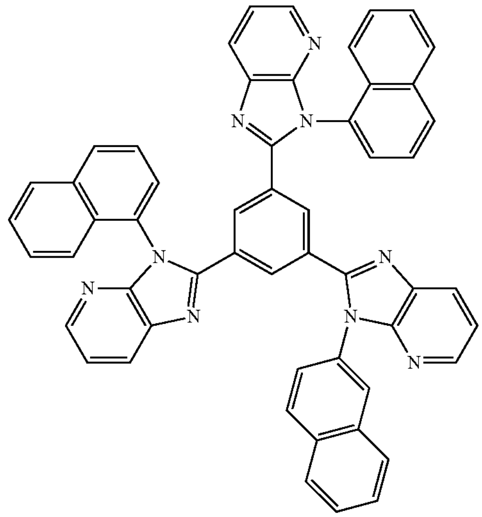 [SMILES: c1ccc2cc(-n3c(-c4cc(-c5nc6cccnc6n5-c5cccc6ccccc56)cc(-c5nc6cccnc6n5-c5cccc6ccccc56)c4)nc4cccnc43)ccc2c1]
(9-49)
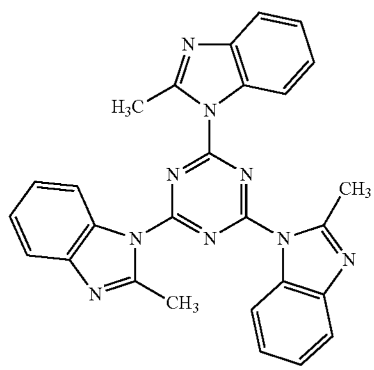 [SMILES: Cc1nc2ccccc2n1-c1nc(-n2c(C)nc3ccccc32)nc(-n2c(C)nc3ccccc32)n1]
A concrete example of the compound expressed by the general formula (10) includes compounds expressed by the following structural formulas (10-1) to (10-81), and the like:
(10-1)
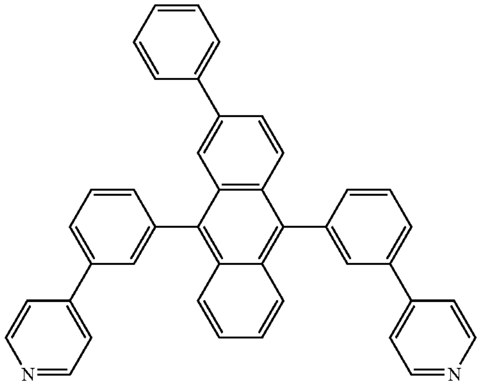
-continued
(10-2)
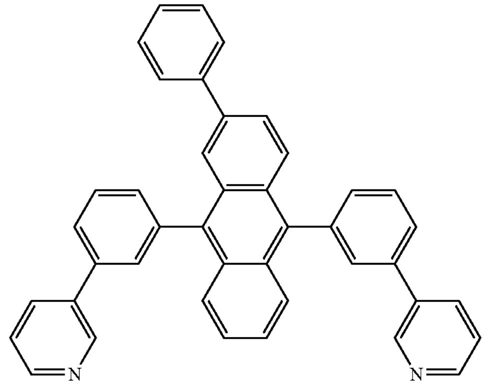

-continued
(10-3)
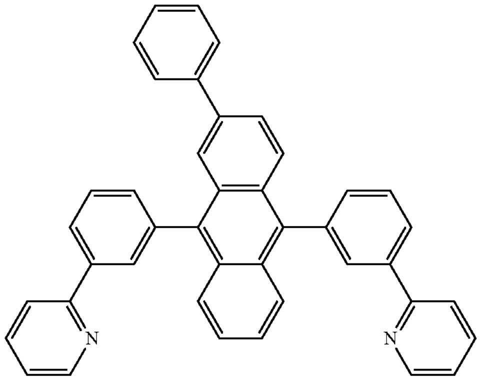
(10-4)
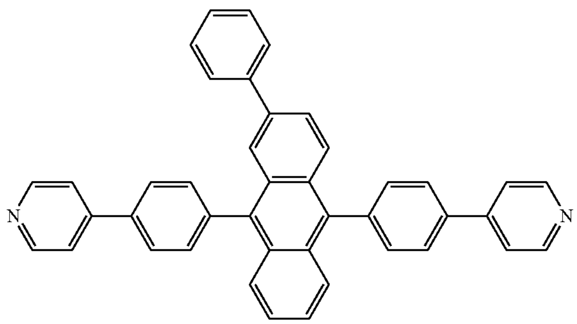
(10-5)
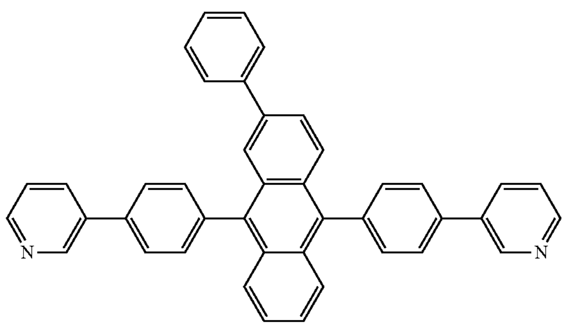
(10-6)
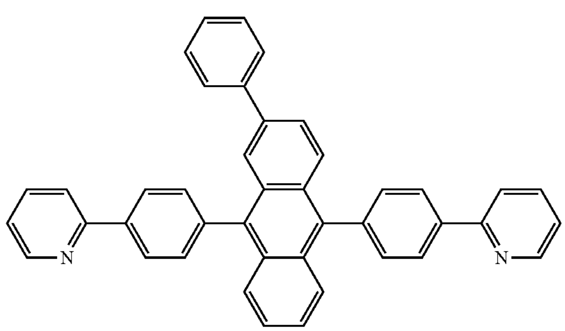
-continued
(10-7)
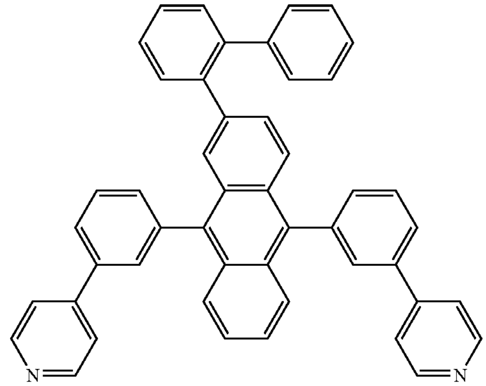
(10-8)
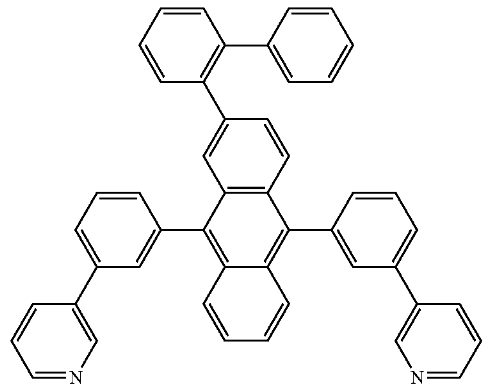
(10-9)
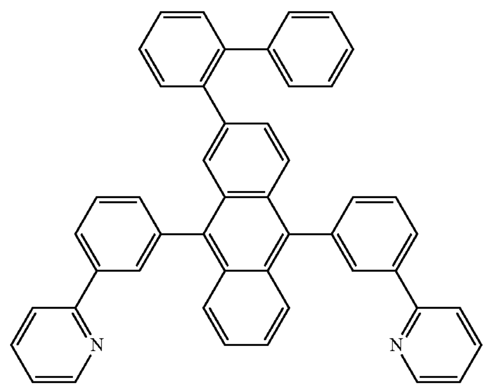
(10-10)
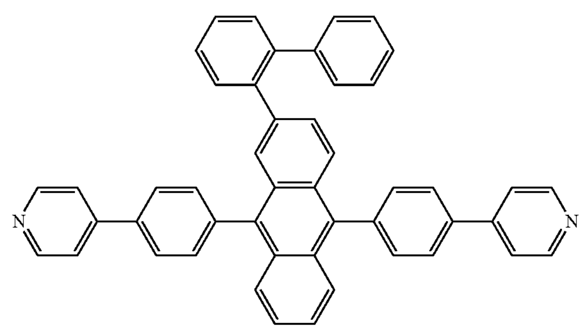

-continued
(10-11)
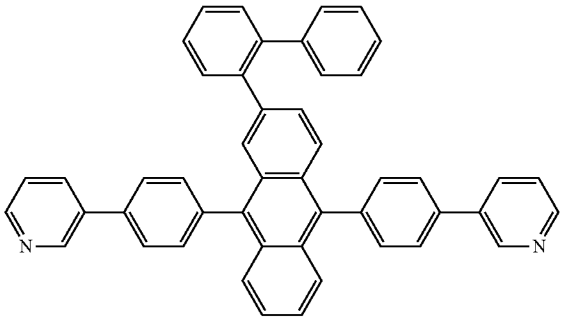
(10-12)
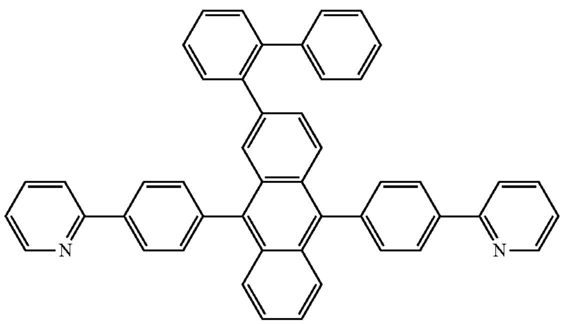
(10-13)
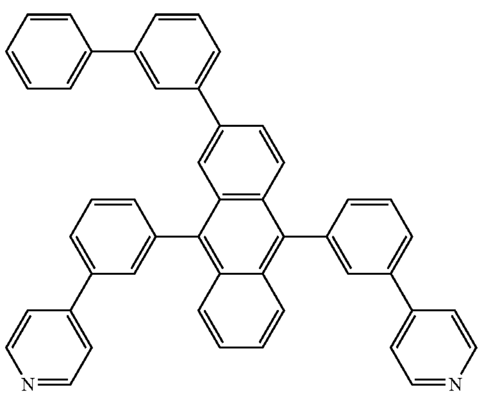
(10-14)
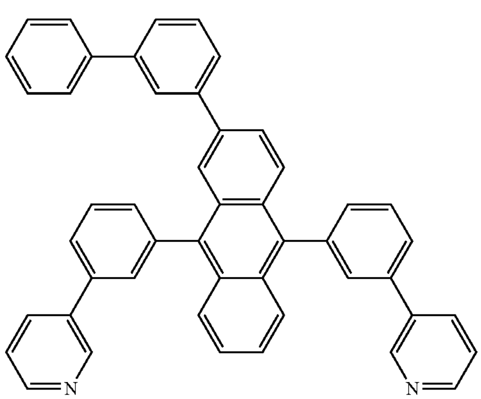
-continued
(10-15)
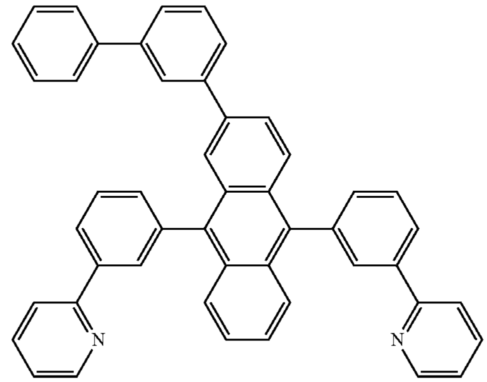
(10-16)
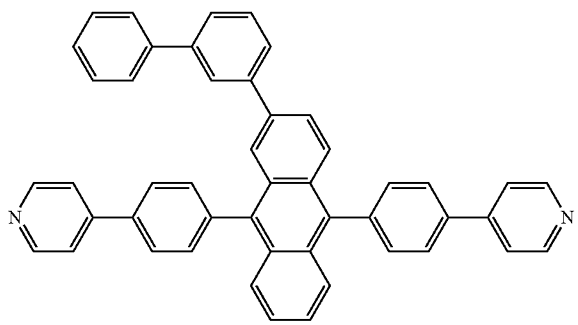
(10-17)
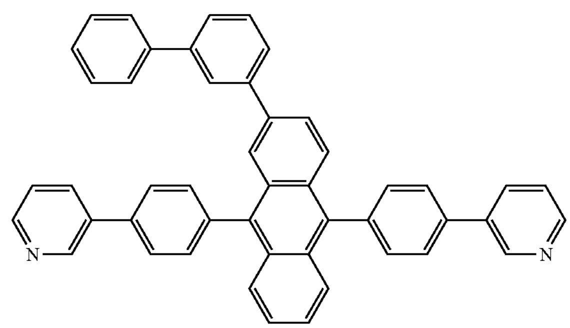
(10-18)
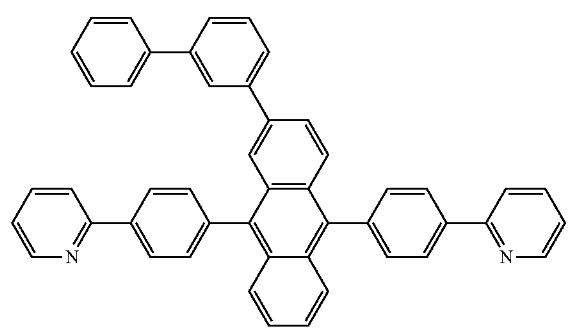

(10-19)
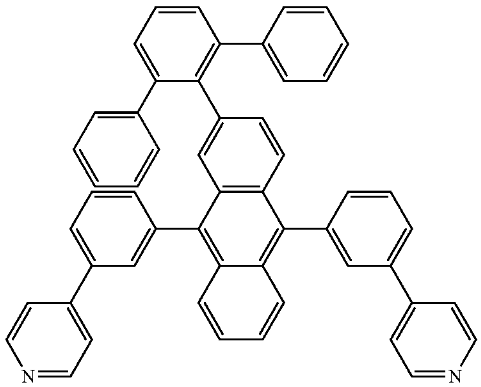
(10-20)
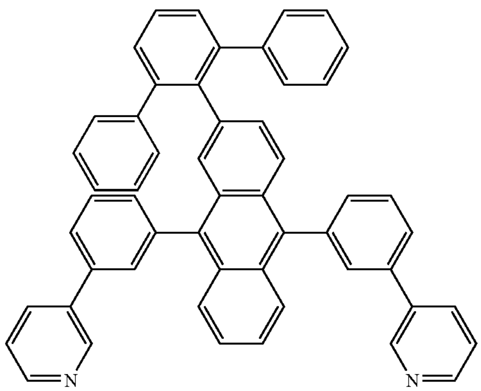
(10-21)
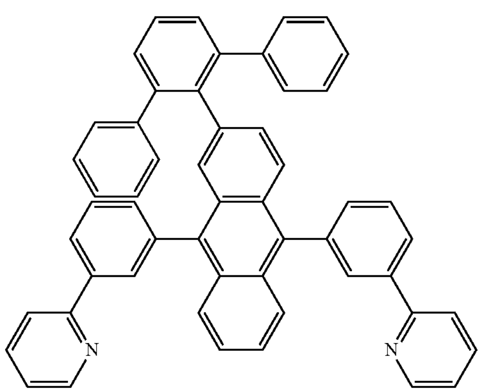
(10-22)
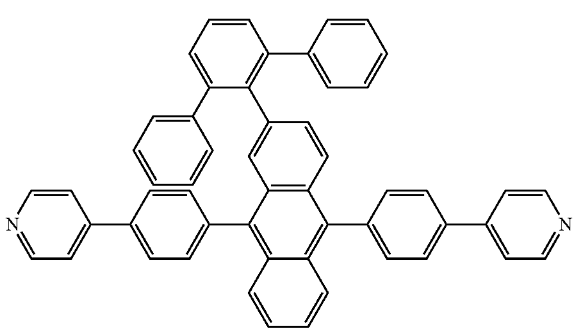
(10-23)
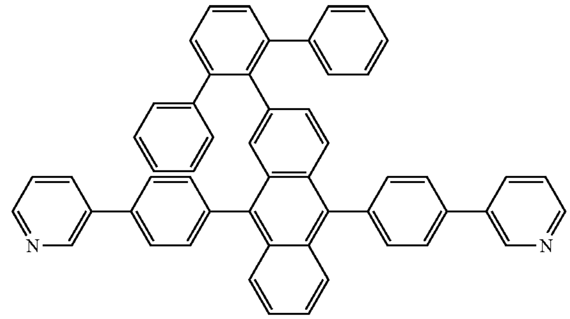
(10-24)
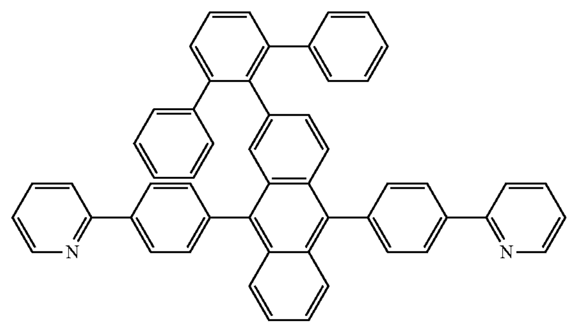
(10-25)
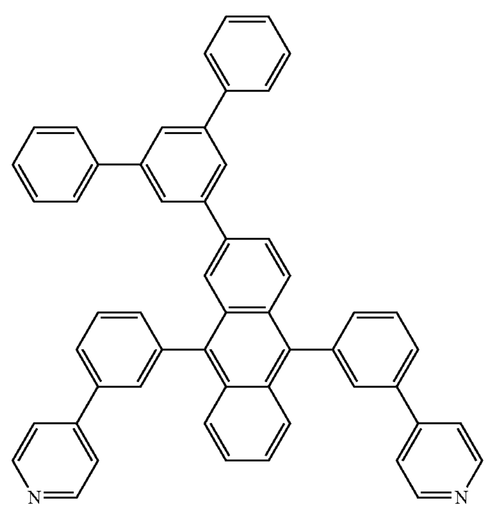

-continued
(10-26)
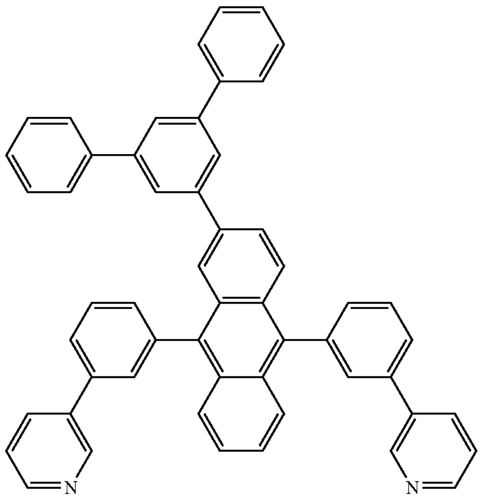
(10-27)
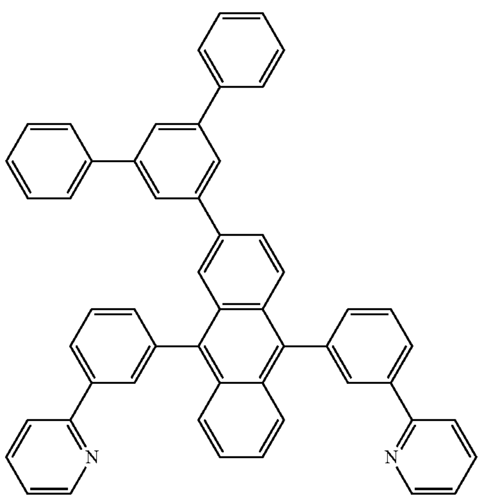
(10-28)
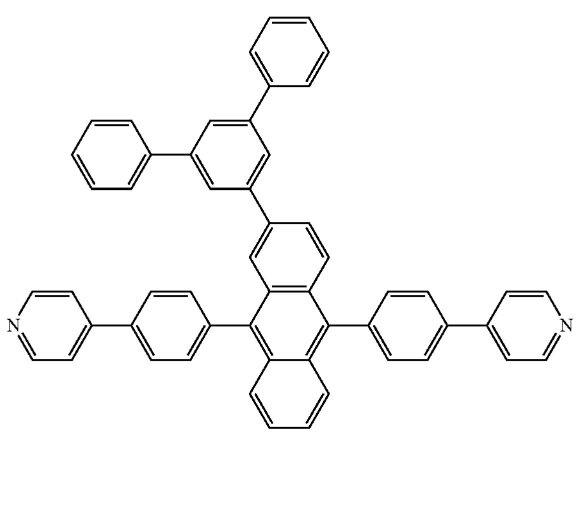
-continued
(10-29)
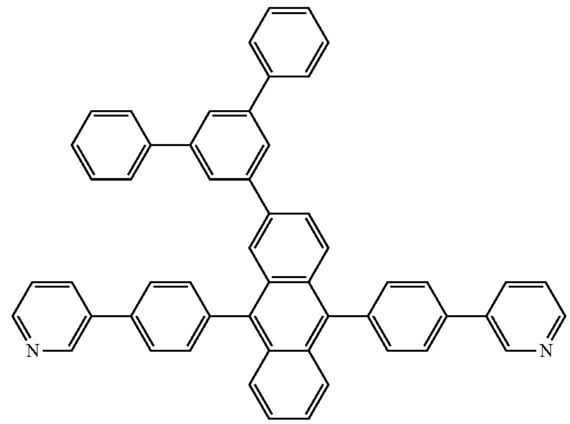
(10-30)
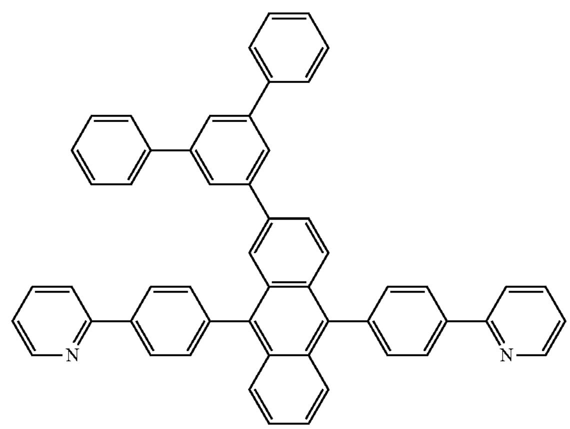
(10-31)
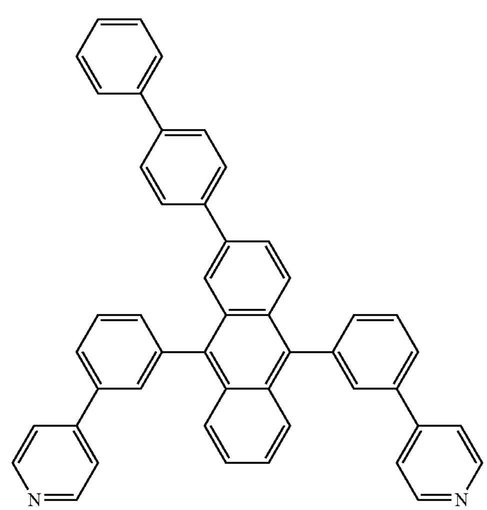

-continued
(10-32)
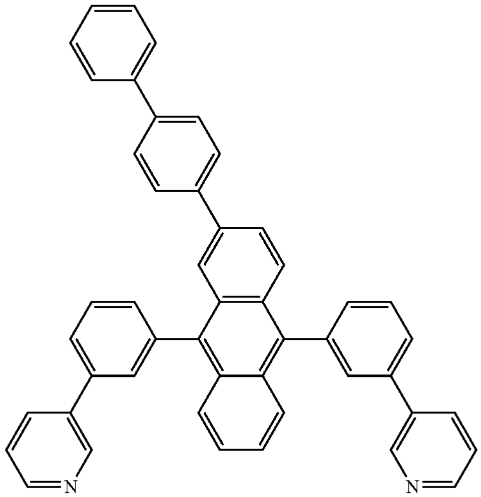
(10-33)
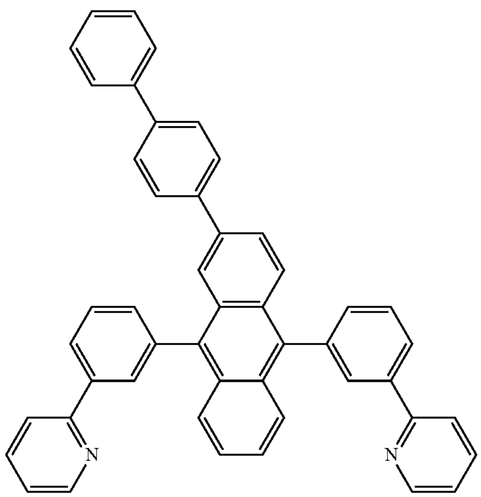
(10-34)
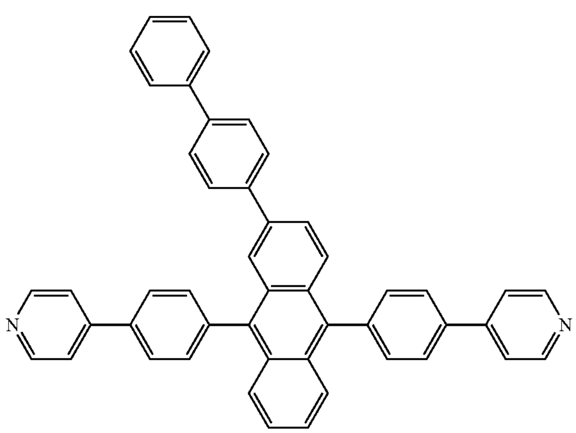
-continued
(10-35)
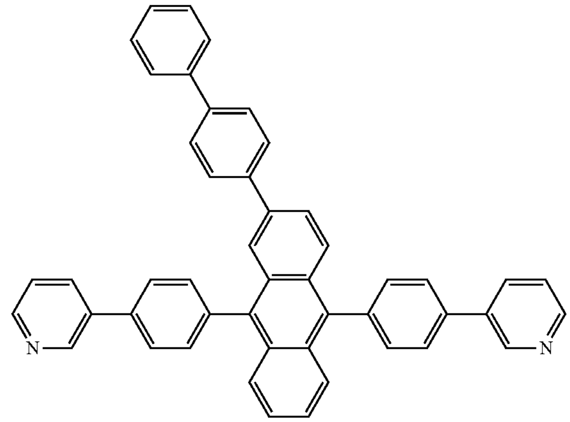
(10-36)
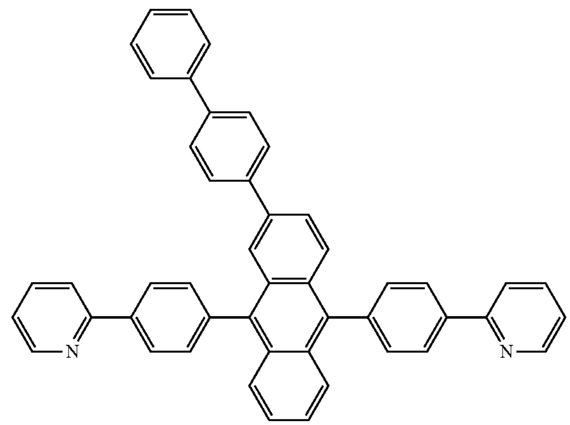
(10-37)
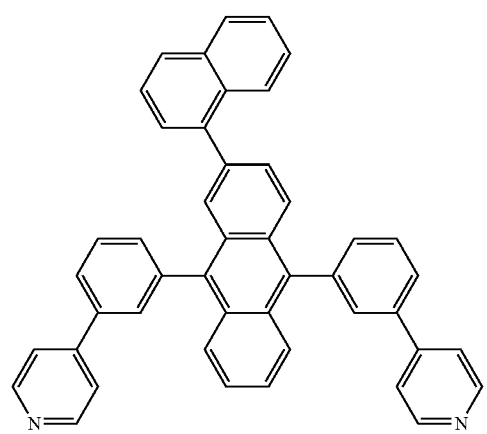

-continued
(10-38)
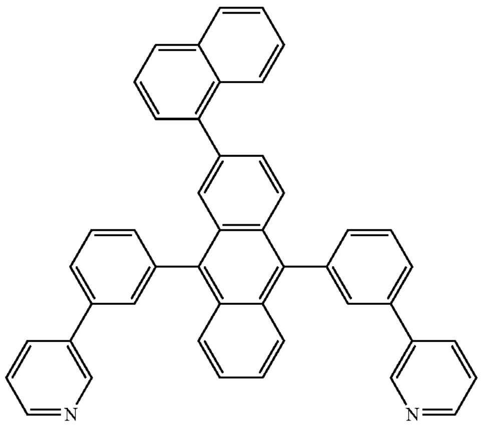
(10-39)
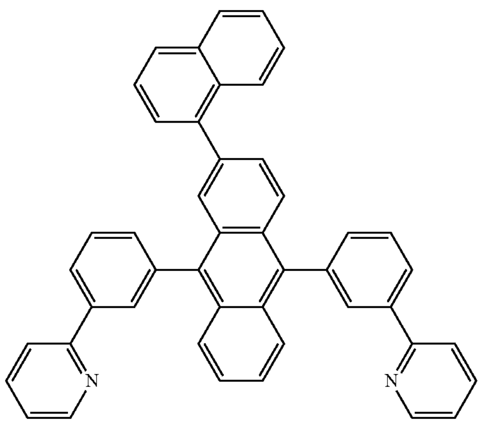
(10-40)
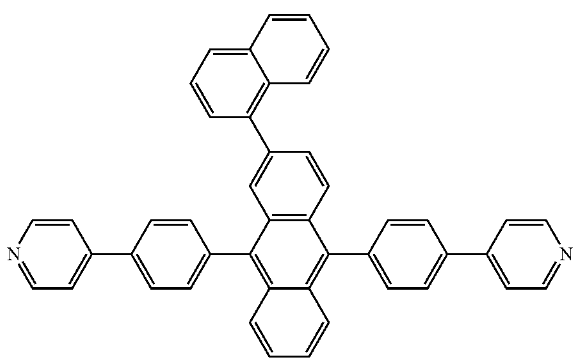
(10-41)
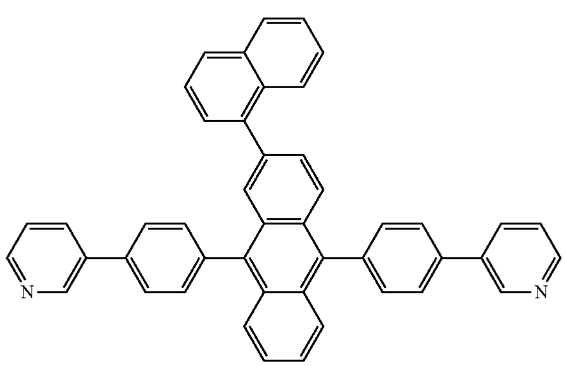
-continued
(10-42)
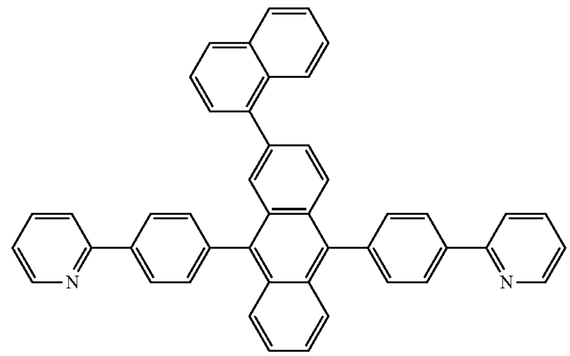
(10-43)
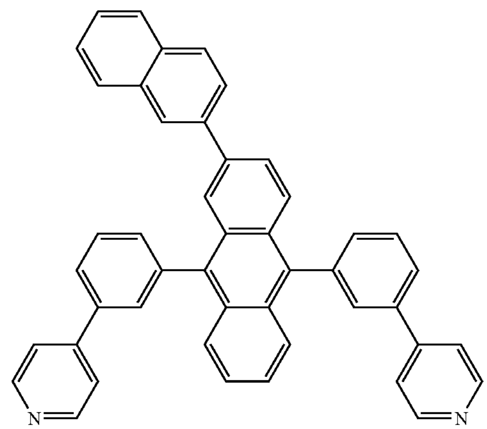
(10-44)
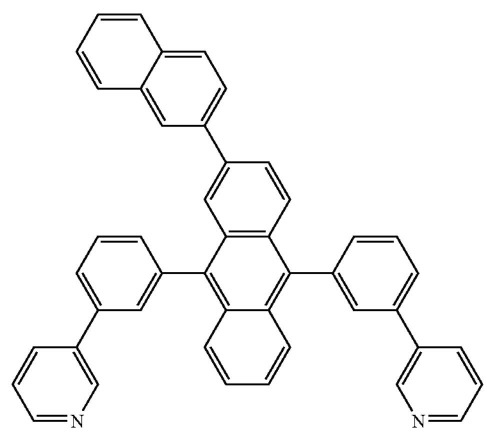
(10-45)
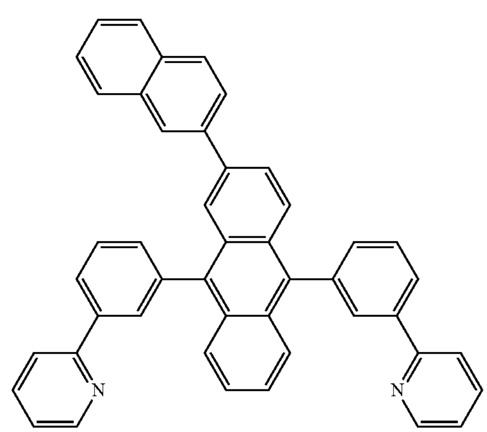

-continued
(10-46)
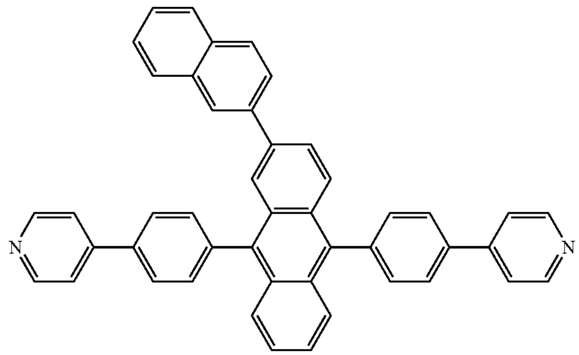
(10-47)
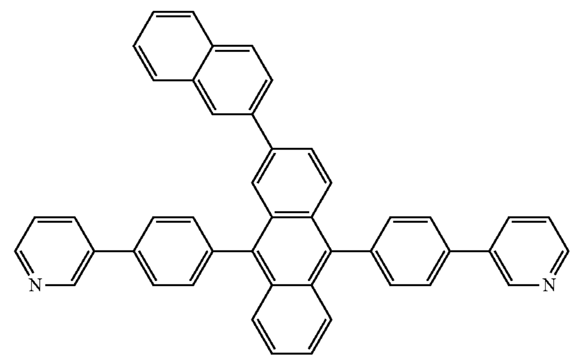
(10-48)
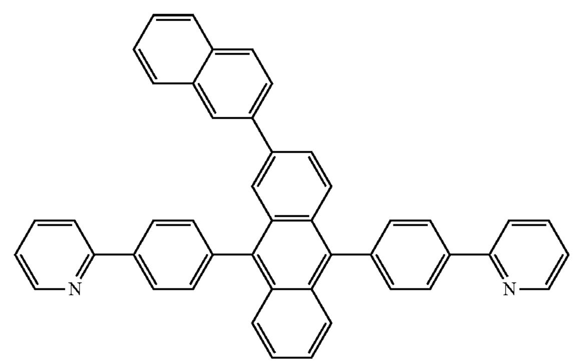
(10-49)
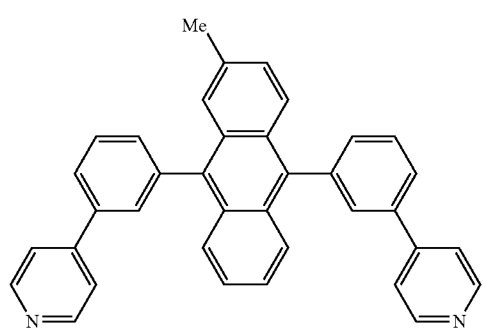
-continued
(10-50)
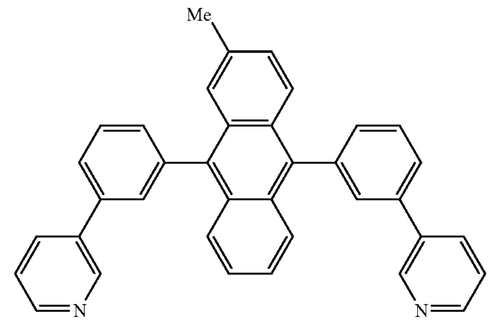
(10-51)
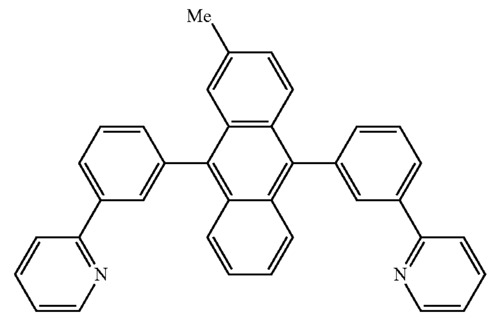
(10-52)
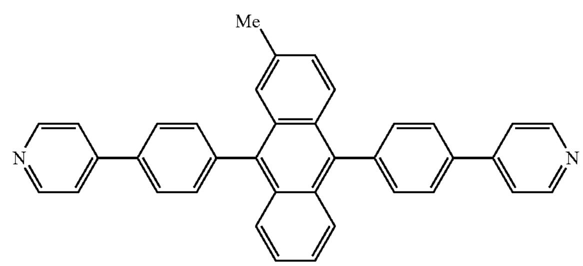
(10-53)
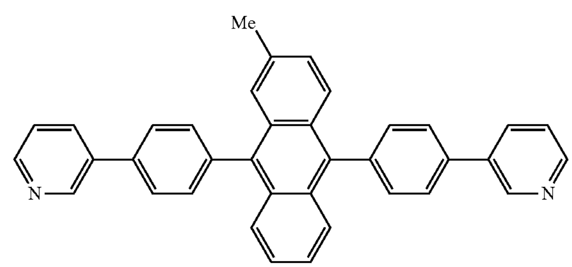
(10-54)
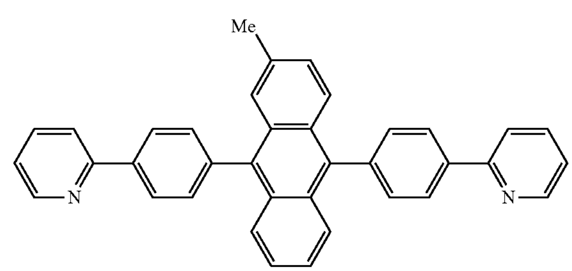

-continued
(10-55)
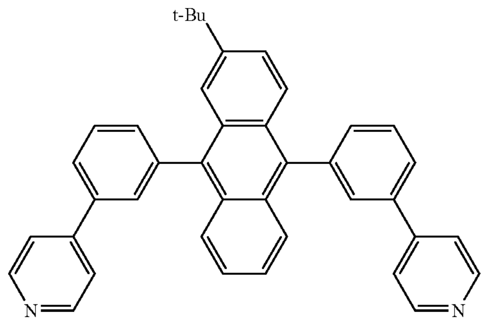
(10-56)
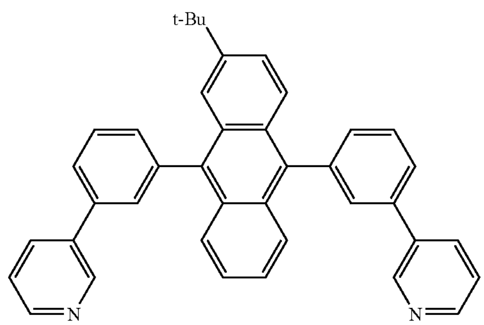
(10-57)
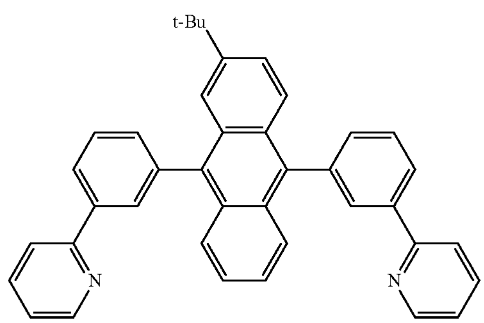
(10-58)
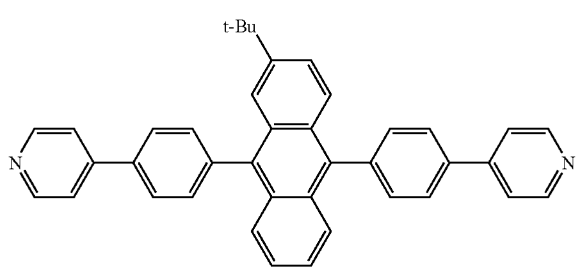
(10-59)
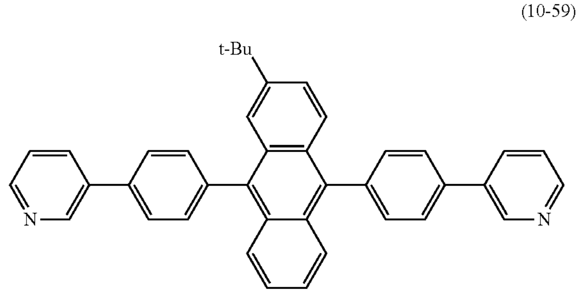
-continued
(10-60)
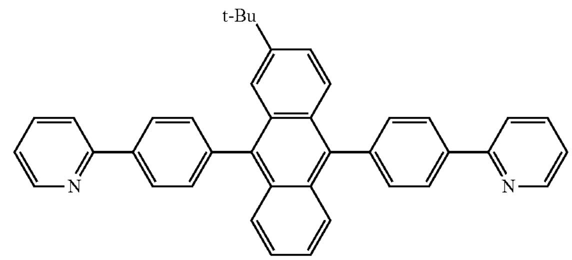
(10-61)
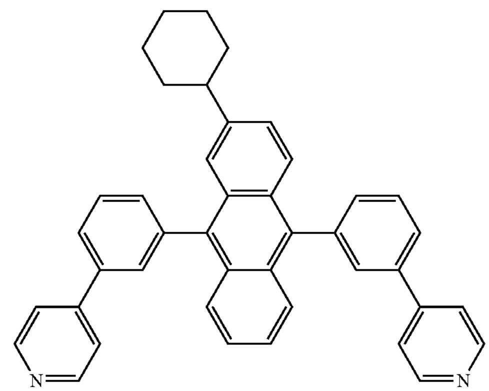
(10-62)
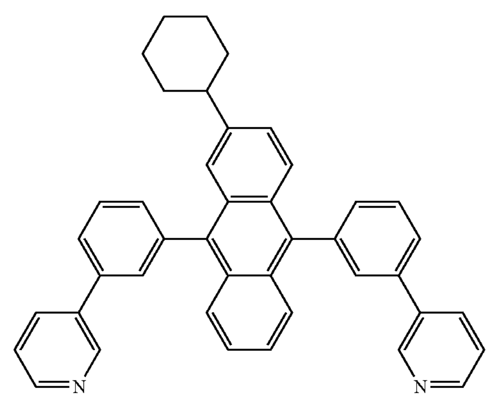
(10-63)
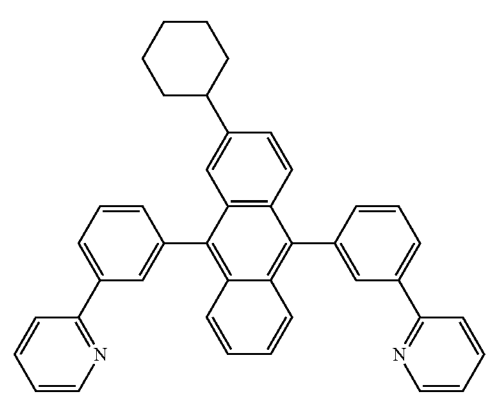

(10-64)
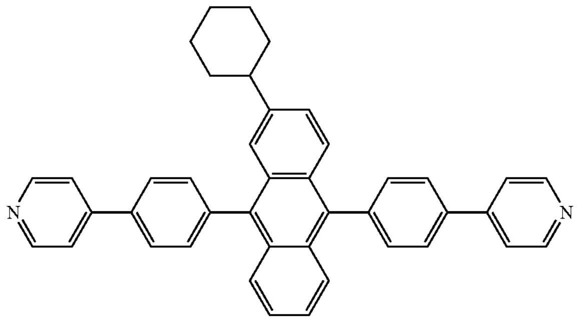
(10-65)
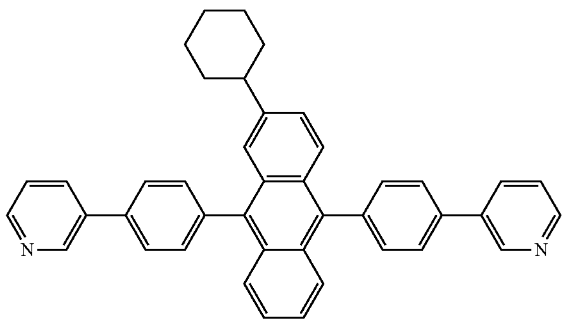
(10-66)
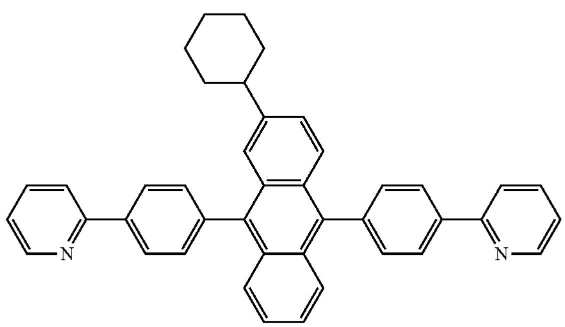
(10-67)
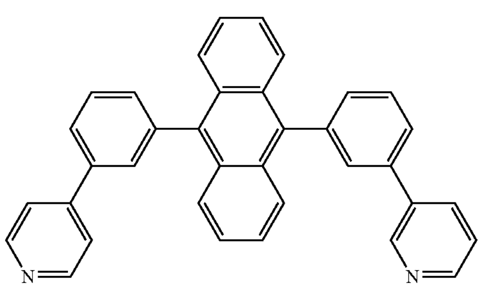
(10-68)
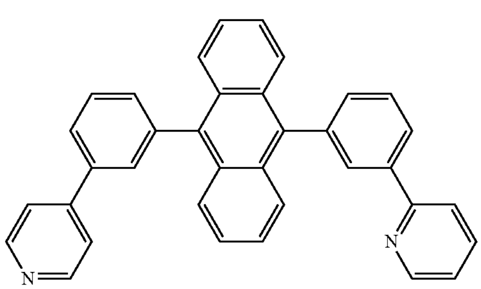
(10-69)
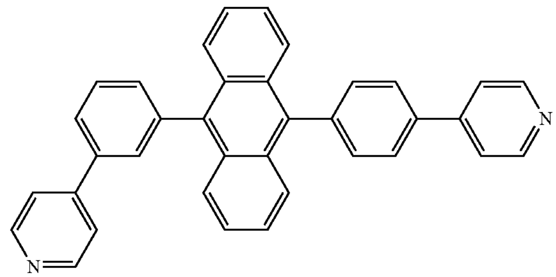
(10-70)
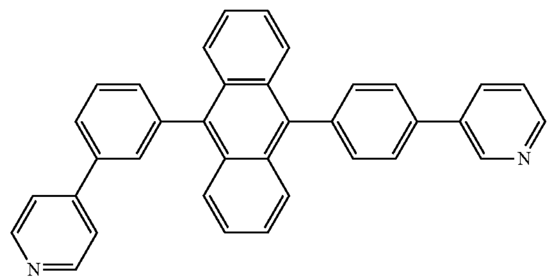
(10-71)
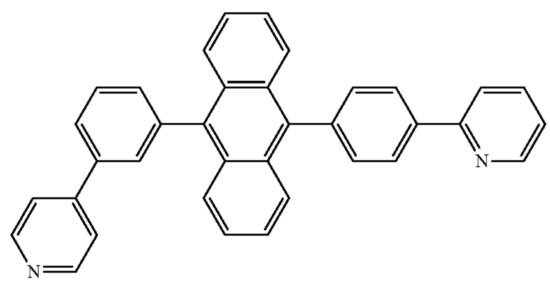
(10-72)
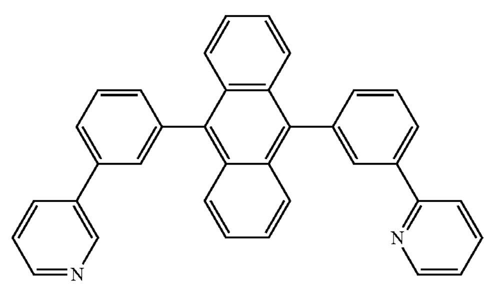
(10-73)
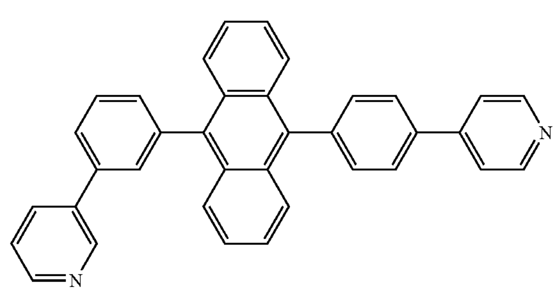

-continued
(10-74)
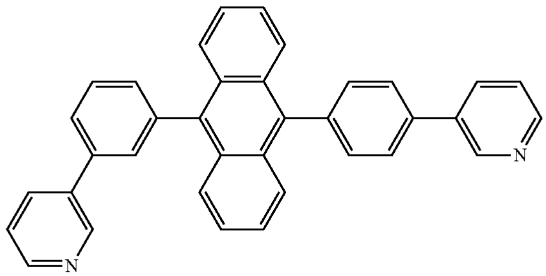
(10-75)
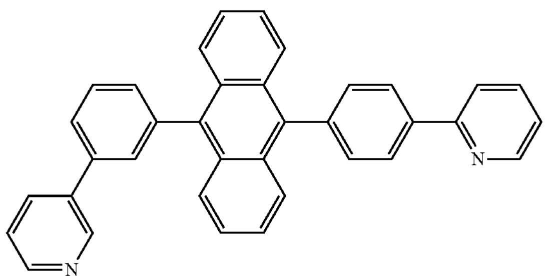
(10-76)
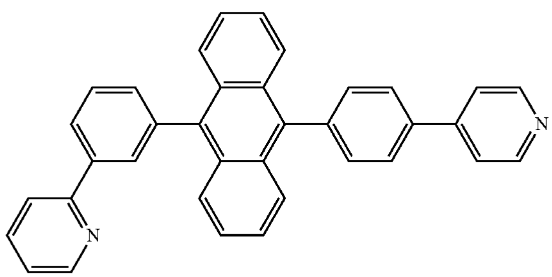
(10-77)
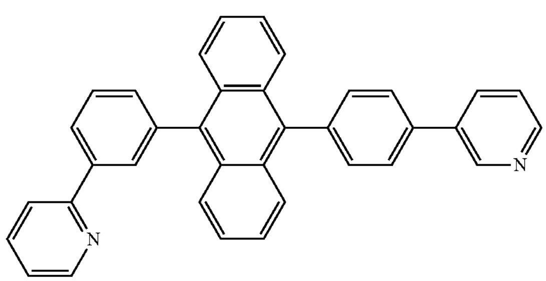
(10-78)
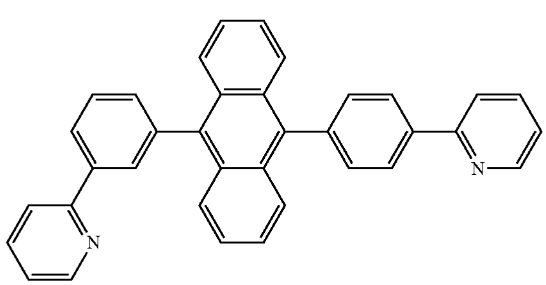
-continued
(10-79)
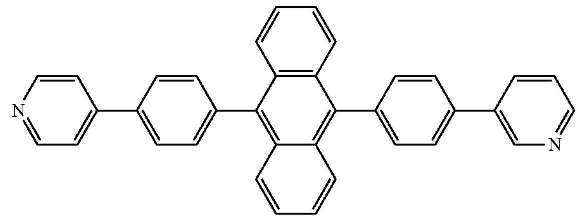
(10-80)
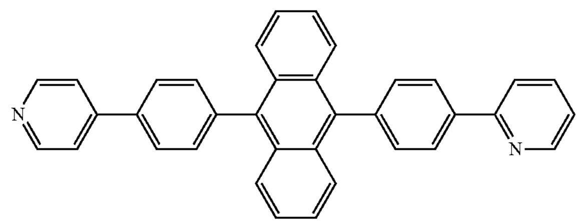
(10-81)
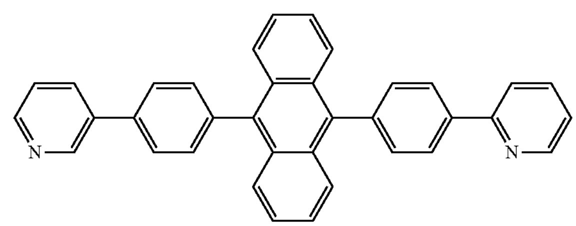
In addition, a concrete example of the compound expressed by the general formula (11) includes compounds expressed by the following structural formulas (11-1) to (11-17), and the like:
(11-1)
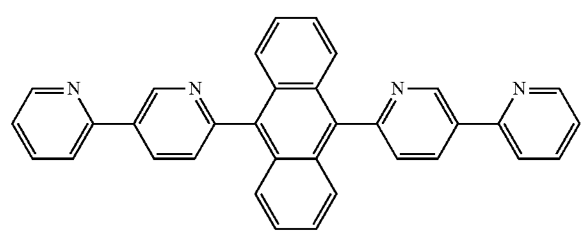
(11-2)
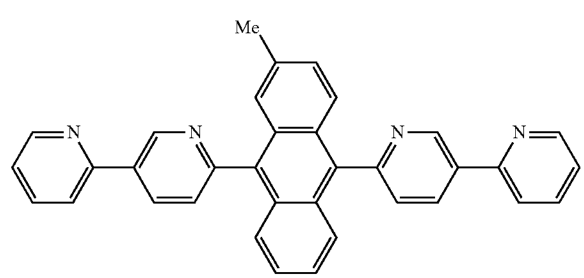

-continued
(11-3)
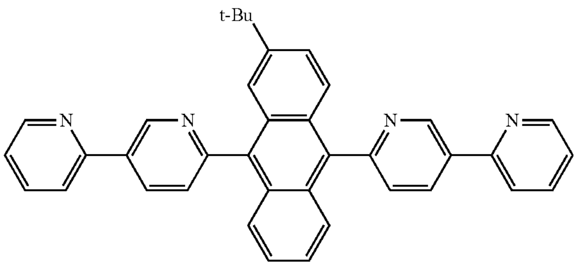
(11-4)
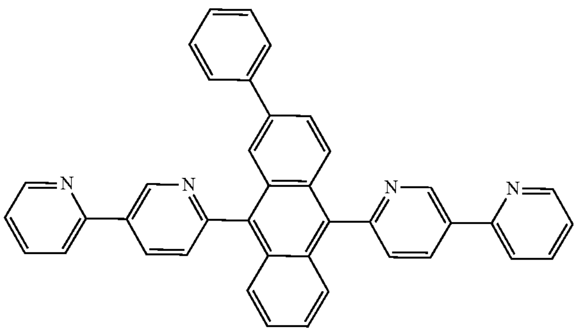
(11-5)
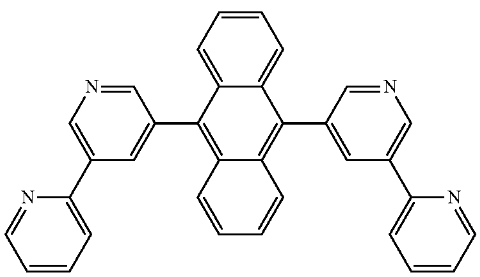
(11-6)
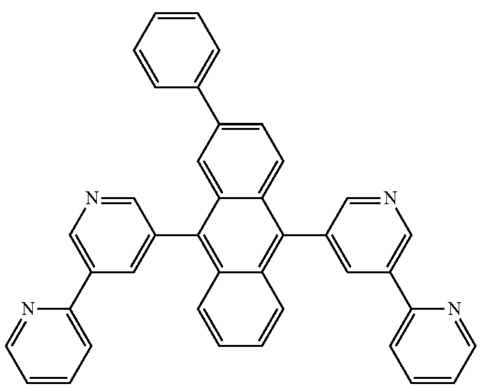
(11-7)
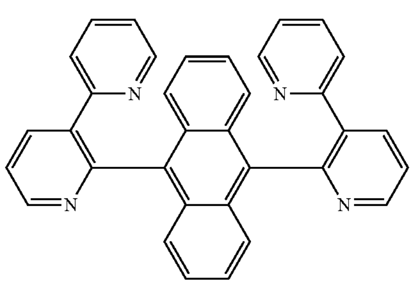
-continued
(11-8)
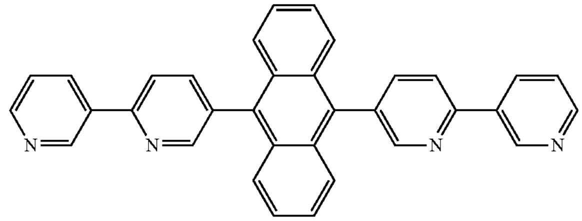
(11-9)
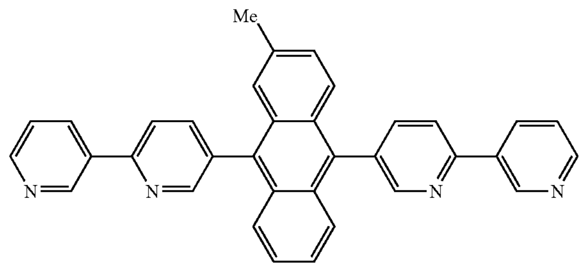
(11-10)
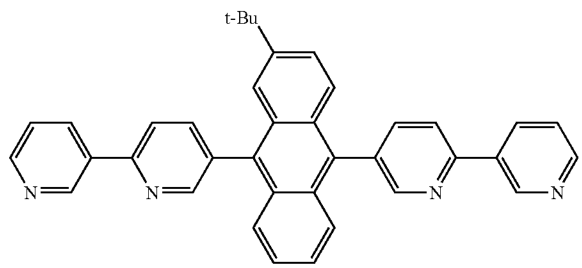
(11-11)
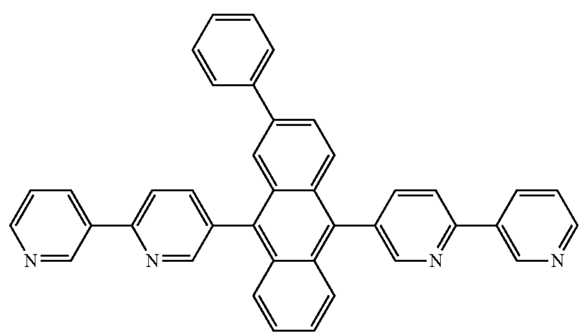
(11-12)
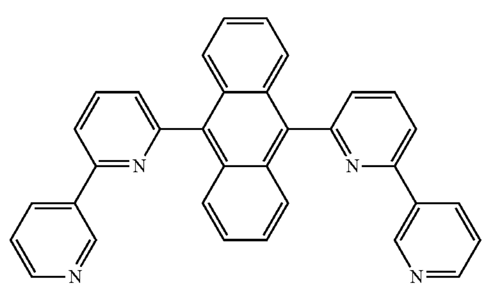

-continued (11-13)

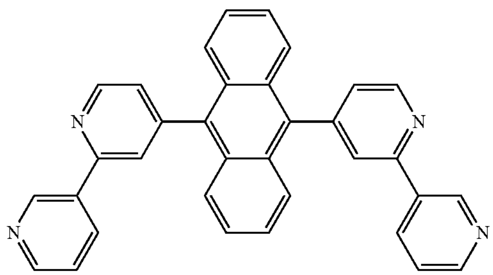

(11-14)

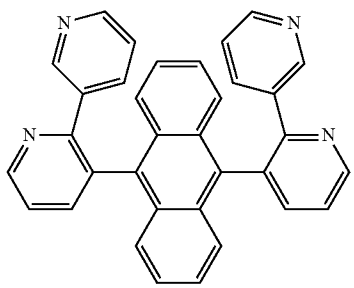

(11-15)

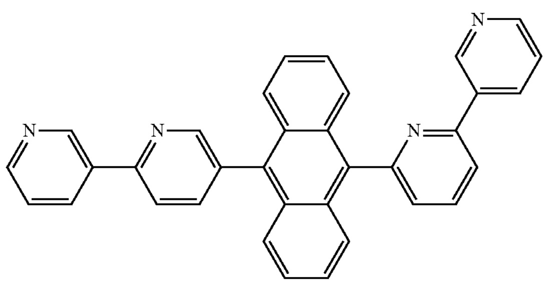

(11-16)

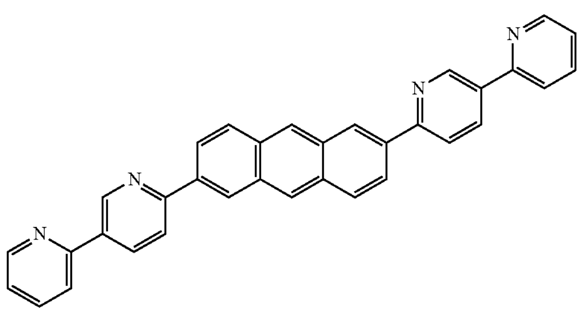

(11-17)

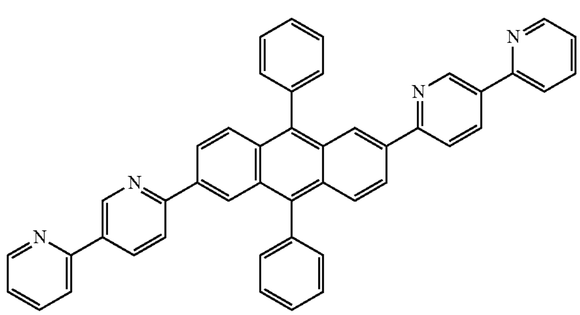

It is noted that although a compound having an anthracene skeleton as with the compound described above is preferable as an organic material used in the electron transport layer 16E, the present disclosure is by no means limited thereto. For example, a benzoimidazole derivative, a pyridylphenyl derivative or a bipyridyl derivative including either a pyrene skeleton or a chrysene skeleton instead of the anthracene skelton may be used. In addition, not only one kind of organic material is used in the electron transport layer 16E, but also organic materials into which plural kinds of organic materials are mixed with one another or laminated one upon another may be used in the electron transport layer 16E. Moreover, the compound described above may be used in the electron injection layer 16F which will be described later.

The electron injection layer 16F is provided in order to increase the electron injection efficiency, and is also provided as the common layer over the entire surface of the electron transport layer 16E. A lithium oxide ($LiO_2$) as an oxide of lithium (Li), a cesium carbonate ($Cs_2CO_3$) as a composite oxide of cesium (Cs), or a mixture of the oxide and the composite oxide, for example, can be used as the material for the electron injection layer 16F. In addition, the electron injection layer 16F is by no means limited to these materials. That is to say, for example, an alkaline earth metal such as calcium (Ca) or barium (Ba), an alkaline metal such as lithium (Li) or cesium (Cs), or a metal, having a small work function, such as indium (In) or magnesium (Mg), or an oxide, a composite oxide, or a fluoride of any of these metals, or the like either may also be used in the form of a single substance or may also be used as the form of a mixture or an alloy of these metals, oxides, and composite oxides, or fluorides in order to obtain the increased stability in terms of the material for the electron injection layer 16F. In addition, any of the organic materials expressed by the general formulas (6) to (8) and given as the material for the electron transport layer 16E may be used.

The upper electrode 17, for example, is in the range of 2 to 150 nm in thickness and is made with a metallic conductive film. Specifically, the metallic conductive film includes an alloy of Al, Mg, Ca or Na. In particular, an alloy of magnesium and silver (Mg—Ag alloy) is preferable as the material of the upper electrode 17 because it has both of the conductive property and the small absorption in thin film. Although a ratio of magnesium to silver in the Mg—Ag alloy is especially by no means limited, the ratio is preferably in the range of Mg:Ag=20:1 to 1:1 in thickness ratio. In addition, the material for the upper electrode 17 may also be an alloy of Al and Li (Al—Li alloy).

In addition, the material for the upper electrode 17 may also be made with a mixture layer containing therein an organic luminescent material such as an alumiquinoline complex, a styrylamine derivative or a phthalocyanine derivative. In this case, the upper electrode 17 may specially further have a layer having a light permeability made of MgAg or the like as a third layer. It is noted that in the case of the active matrix drive system, the upper electrode 17 is formed in the solid-film shape on the substrate 11 in the state in which it is insulated from the lower electrode 14 through both of the organic layer 16 and the partition wall 15. Also, the upper electrode 17 is formed as the common electrode for the red organic EL element 10R, the green organic EL element 10G, and the blue organic EL element 10B.

The protective layer 30, for example, is in the range of 2 to 3 μm in thickness and may be made of either an insulating material or a conductive material. An inorganic amorphous insulating material, for example, amorphous silicon (α-Si), amorphous silicon carbide (α-SiC), an amorphous silicon nitride ($\alpha\text{-}Si_{1-x}N_x$), an amorphous carbon (α-C) or the like is preferable as the insulating material. Since such an inorganic amorphous insulating material does not compose a grain, it is low in water permeability and thus becomes an excellent protective film.

The sealing substrate 40 is located on the side of the upper electrode 17 of the red organic EL element 10R, the green organic EL element 10G, and the blue organic EL element 10B. Also, the red organic EL element 10R, the green organic EL element 10G, and the blue organic EL element 10B are sealed with the sealing substrate 40 together with an adhesive layer (not shown). The sealing substrate 40 is made of a material such as a glass which is transparent for lights emitted from the red organic EL element 10R, the green organic EL element 10G, and the blue organic EL element 10B, respectively. The sealing substrate 40, for example, is provided with a color filter (not shown) and a light blocking film (not shown) as a black matrix. Thus, the sealing substrate 40 takes out the lights emitted from the red organic EL element 10R, the green organic EL element 10G, and the blue organic EL element 10B, respectively, and absorbs outside lights reflected from the red organic EL element 10R, the green organic EL element 10G, and the blue organic EL element 10B, and wirings among them, thereby improving the contrast. It is noted that a structure in which the upper electrode 17 is the reflecting electrode, and the light generated from the transparent lower electrode 14 is taken out is by no means limited thereto. For example, the protective layer 30 and the sealing substrate 40 may be made of opaque materials, respectively. In this case, the color filter and the light blocking film as the black matrix are formed on the pixel drive circuit 140 on the lower electrode 14 side, thereby making it possible to obtain the same effects as those described above.

The color filter has a red filter, a green filter, and a blue filter (each not shown) which are disposed in order so as to correspond to the red organic EL element 10R, the green organic EL element 10G, and the blue organic EL element 10B, respectively. The red filter, the green filter, and the blue filter, for example, have rectangular shapes, and are formed without any space among them. The red filter, the green filter, and the blue filter are made of resins mixed with pigments, respectively. Thus, by selecting the pigments, the red filter, the green filter, and the blue filter are adjusted in such a way that light transmittance in a wavelength region of objective red, green or blue becomes high, and light transmittance in other wavelength regions becomes low.

In addition, a wavelength range in which the transmittance in the color filter is high agrees with a peak wavelength, λ, of a spectrum of a light desired to be taken out from a resonance structure MC1. As a result, of the outside lights made incident from the sealing substrate 40, only the outside light having the wavelength equal to the peak wavelength, λ, of the spectrum of the light desired to be taken out is transmitted through the color filter. Also, the outside lights having other waveforms are prevented from entering the organic EL elements 10R, 10G, and 10B of R, G, and B.

The light blocking film, for example, is composed of a black resin film having an optical density of 1 or more and mixed with a black coloring agent, or a thin film filter utilizing interference between thin films. In particular, composing the light blocking filter of the black resin film is preferable because the light blocking filter can be inexpensively, readily formed. The thin film filter, for example, is formed by laminating one or more thin films each made of a metal, a metal nitride or a metal oxide one upon another, and serves to attenuate the light by utilizing the interference between the thin films. Specifically, the thin film filter includes a thin film filter formed by alternately laminating Cr and a chromium oxide (III) ($Cr_2O_3$).

This organic EL display device, for example, can be manufactured as follows.

Figure 5:
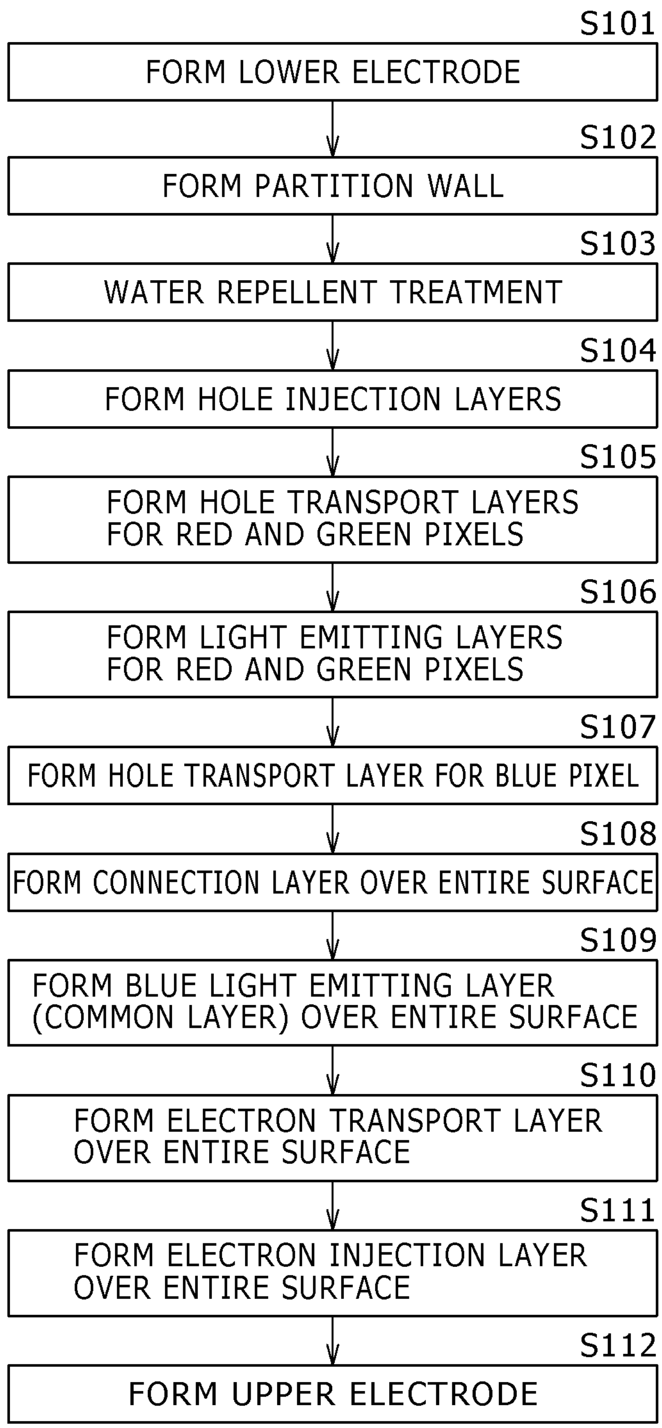
FIG. 5 is a flow chart explaining a method of manufacturing the organic EL display device shown in FIG. 1.

FIG. 5 shows a flow of a method of manufacturing this organic EL display device. FIGS. 6A to 6J show the manufacturing method in the order of processes. Firstly, the pixel drive circuit 140 including the drive transistor Tr1 is formed on the substrate 11 made of the material described above, and a planarizing insulating film (not shown), for example, made of the photosensitive resin is provided.

(A Process for Forming the Lower Electrode 14)

Figure 6A:
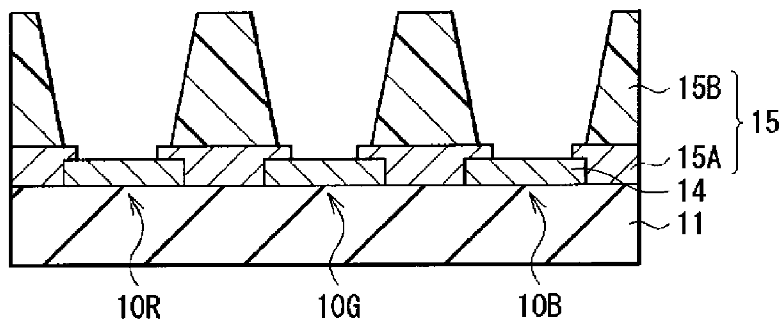
FIGS. 6A to 6J are respectively cross sectional views showing the manufacturing method shown in FIG. 5 in the order of processes.

Next, the transparent conductive film, for example, made of an ITO is formed over the entire surface of the substrate 11. Also, the transparent conductive film is patterned, whereby as shown in FIG. 6A, the lower electrodes 14 are formed so as to correspond to the red organic EL element 10R, the green organic EL element 10G, and the blue organic EL element 10B, respectively (Step S101). In this case, the lower electrode 14 is made to communicate with a drain electrode of the drive transistor Tr1 through a contact hole (not shown) of the planarizing insulating film (not shown).

(A Process for Forming the Partition Wall 15)

Subsequently, similarly, as shown in FIG. 6A, an inorganic insulating material such as $SiO_2$ is deposited on each of the lower electrode 14 and the planarizing insulating film (not shown) by, for example, utilizing a Chemical Vapor Deposition (CVD) method. Also, the inorganic insulating material is patterned by utilizing a photolithography technique and an etching technique, thereby forming a lower partition wall 15A.

After that, similarly, as shown in FIG. 6A, an upper partition wall 15B made of the photosensitive resin described above is formed in a predetermined position of the lower partition wall 15A, specifically, in a position surrounding a light emission area of the pixel. As a result, the partition wall 15 including the upper partition wall 15A and the lower partition wall 15B is formed (Step S102).

After completion of the formation of the partition wall 15, a surface on a side of the substrate 11 on which the lower electrode 14 and the partition wall 15 are formed is subjected to an oxygen plasma treatment to remove contamination such as an organic matter adhered to the surface concerned, thereby increasing wettability. Specifically, the substrate 11 is heated at a predetermined temperature, for example, at a temperature of about 70 to about 80° C. Subsequently, the substrate 11 is subjected to a plasma treatment ($O_2$ plasma treatment) at an atmospheric pressure using oxygen as a reactive gas.

(A Process for Carrying Out Water Repellent)

After the plasma treatment has been carried out, a water repellent treatment is carried out (Step S103), thereby especially reducing the wettability of an upper surface and a side surface of the upper partition wall 15B. Specifically, a plasma treatment ($CF_4$ plasma treatment) at an atmospheric pressure using 4-fluoromethane as a reactive gas is carried out. After that, the substrate 11 heated for the plasma treatment is cooled to a room temperature to subject the upper surface and the side surface of the upper partition wall 15B to the water repellent treatment, thereby reducing the wettability of the upper surface and the side surface of the upper partition wall 15B.

It is noted that although an exposed surface of the lower electrode 14, and the lower partition wall 15A are slightly influenced in the $CF_4$ plasma treatment, since the ITO as the material for the lower electrode 14, $SiO_2$ as the material composing the lower partition wall 15A, and the like are each poor in affinity for fluorine, the wettability of the surface having the increased wettability in the oxygen plasma treatment is held as it is.

(A Process for Forming the Hole Injection Layers 16AR, 16AG, and 16AB)

Figure 6B:
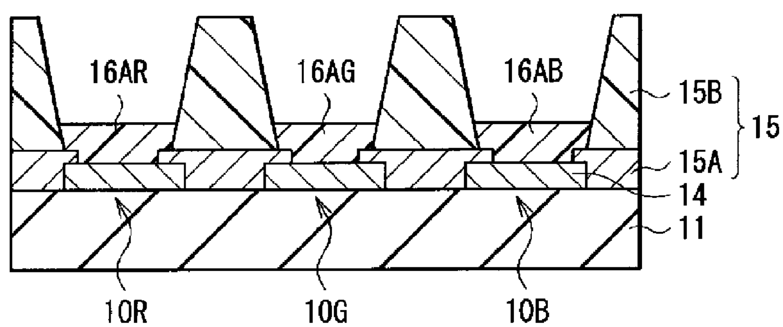

After the water repellent treatment has been carried out, as shown in FIG. 6B, the hole injection layers 16AR, 16AG, and 16AB made of the materials described above are formed in regions which are surrounded by the upper partition walls 15B (Step S104). The hole injection layers 16AR, 16AG, and 16AB are formed by utilizing an application method such as a spin coating method or a droplet discharging method. In particular, when the materials for formation of the hole injection layers 16AR, 16AG, and 16AB are selectively arranged in the regions surrounded by the upper partition walls 15B, an ink-jet method or a nozzle coating method as the droplet discharging method is preferably used. It is noted that when the hole injection layers 16AR, 16AG, and 16AB are formed so as to have the same thickness, the materials are collectively applied within the regions, respectively, by using a slit coating method or the like, thereby making it possible to reduce the number of processes.

Specifically, a liquid solution or a dispersion liquid of polyaniline, polythiophene or the like as the material for formation of the hole injection layers 16AR, 16AG, and 16AB are disposed above the exposed surfaces of the lower electrodes 14 by, for example, utilizing the ink-jet method. After that, a heat treatment (drying treatment) is carried out, thereby forming the hole injection layers 16AR, 16AG, and 16AB.

In the heat treatment, after either a solvent or a dispersion media is dried, the heating is carried out at a high temperature. When a conductive polymer of polyaniline, polythiophene or the like is used, either the atmospheric ambient or an oxygen ambient is preferable. The reason for this is because the conductivity becomes easy to develop due to the oxidation of the conductive polymer by oxygen.

The heating temperature is preferably in the range of 150 to 300° C., and more preferably in the range of 180 to 250° C. Although depending on the temperature and the ambient, the heating time is preferably in the range of about 5 to about 300 minutes, and more preferably in the range of 10 to 240 minutes. A film thickness after completion of the drying is preferably in the range of 5 to 100 nm, and more preferably in the range of 8 to 50 nm.

(A Process for Forming the Hole Transport Layers 16BR, 16BG, and 16BB)

Figure 6C:
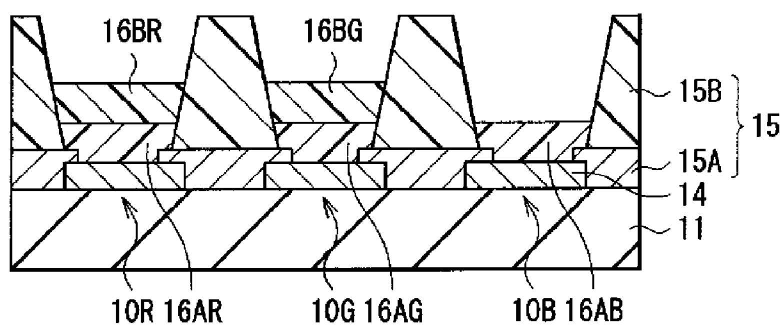

After completion of the formation of the hole injection layers 16AR, 16AG, and 16AB, as shown in FIG. 6C, the hole transport layers 16BR and 16BG containing therein the polymers described above are formed so as to correspond to the red organic EL element 10R and the green organic EL element 10G, respectively (Step S105). The hole transport layer 16BR and the hole transport layer 16BG are formed by utilizing the application method such as the spin coating method or the droplet discharging method. In particular, from necessity for selectively disposing the materials of formation of the hole transport layers 16BR and 16BG in the regions surrounded by the upper partition walls 15B, the ink-jet method or the nozzle coating method as the droplet discharging method is preferably utilized.

Specifically, mixed liquid solutions or dispersion liquids of the high-molecular polymer as the materials for formation of the hole transport layers 16BR and 16BG, and the low-molecular materials are disposed on the exposed surfaces of the hole injection layers 16AR and 16AG by, for example, utilizing the ink-jet method. After that, the heat treatment (drying treatment) is carried out, thereby forming the hole transport layers 16BR and 16BG of the red organic EL element 10R and the green organic EL element 10G.

In the heat treatment, after a solvent or a dispersion media has been dried, the heating is carried out at a high temperature. An ambient containing therein nitrogen ($N_2$) as a principal component is preferable as an ambient for application or an ambient in which the solvent is dried and heated. If there is oxygen or moisture, there is the possibility that the luminous efficiency and life of the manufactured organic EL display device are reduced. In particular, since an influence of oxygen or the moisture is large in the heating process, attention needs to be paid thereto. An oxygen concentration is preferably in the range of 0.1 to 100 ppm, and more preferably in the range of 0.1 to 50 ppm. When the oxygen concentration exceeds 100 ppm, it is feared that the interface of the formed thin film is contaminated, and thus the luminous efficiency and life of the resulting organic EL display device are reduced. In addition, when the oxygen concentration is smaller than 0.1 ppm, although there is no problem in characteristics of the element, there is possible that the system cost for holding the ambient at the oxygen concentration smaller than 0.1 ppm becomes enormous in terms of the processes for the exciting mass production.

In addition, with regard to the moisture, a dew point, for example, is preferably in the range of −80° C. to −40° C. Also, the dew point is more preferably equal to or lower than −50° C., and furthermore preferably in the range of −80° C. to −60° C. When there is the moisture showing the dew point higher than −40° C., it is feared that the interface of the formed thin film is contaminated, and thus the luminous efficiency and life of the resulting organic EL display device are reduced. In addition, in the case of the moisture showing the dew point lower than −80° C., although there is no problem in characteristics of the element, it is possible that the system cost for holding the ambient at the dew point lower than −80° C. becomes enormous in terms of the processes for the exciting mass production.

The heating temperature is preferably in the range of 100 to 230° C., and more preferably in the range of 100 to 200° C. The heating temperature is at least lower than that in a phase of formation of the hole injection layers 16AR, 16AG, and 16AB. Although depending on the temperature and the ambient, the heating time is preferably in the range of about 5 to about 300 minutes, and more preferably in the range of 10 to 240 minutes. Although depending on the entire structure of the element, a film thickness after completion of the drying is preferably in the range of 10 to 200 nm, and more preferably in the range of 15 to 150 nm.

(A Process for Forming the Red Light Emitting Layer 16CR and the Green Light Emitting Layer 16CG)

Figure 6D:
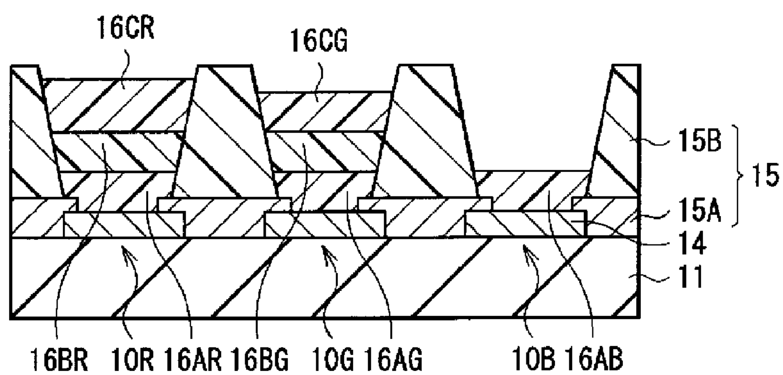

After completion of the formation of the hole transport layers 16BR and 16BG of the red organic EL element 10R and the green organic EL element 10G, as shown in FIG. 6D, the red light emitting layer 16CR made of the phosphorescent host material containing therein the phosphorescent dopant described above is formed on the hole transport layer 16BR of the red organic EL element 10R. In addition, the green light emitting layer 16CG made of the phosphorescent host material containing therein the phosphorescent dopant described above is formed on the hole transport layer 16BG of the green organic EL element 10G (Step S106). The red light emitting layer 16CR and the green light emitting layer 16CG are formed by utilizing the application method such as the spin coating method or the droplet discharging method. In particular, from necessity for selectively disposing the materials of formation of the red light emitting layer 16CR and the green light emitting layer 16CG in the regions surrounded by the upper partition walls 15B, the ink-jet method or the nozzle coating method as the droplet discharging method is preferably utilized.

Specifically, mixed liquid solutions or dispersion liquids in which the phosphorescent host materials as the materials for formation of the red light emitting layer 16CR and the green light emitting layer 16CG are dissolved into solvents in each of which xylene and cyclohexylbenzene are mixed with each other at a ratio of 2:8 in such a way that the phosphorescent host materials, for example, are doped with 1 wt % of phosphorescent dopant are disposed on the exposed surfaces of the hole transport layers 16BR and 16BG by, for example, utilizing the ink-jet method. After that, a heat treatment is carried out by utilizing the same method and condition as those in the heat treatment (dying treatment) described in the process for forming the hole transport layers 16BR and 16BG of the red organic EL element 10R and green organic EL element 10G described above, thereby forming the red light emitting layer 16CR and the green light emitting layer 16CG.

(A Process for Forming the Hole Transport Layer 16BB of the Blue Organic EL Element 10B)

Figure 6E:
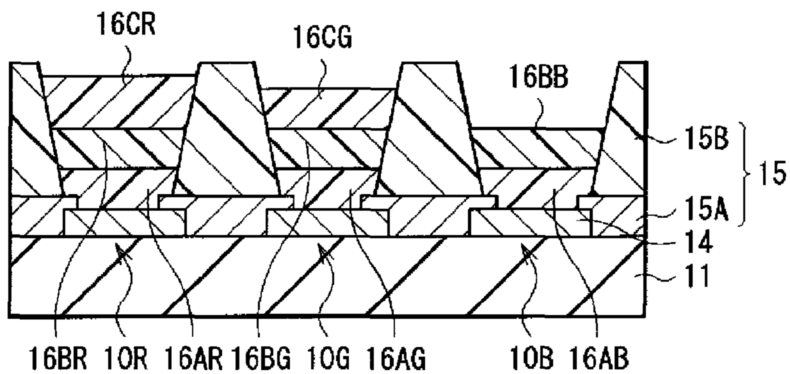

After completion of the formation of the red light emitting layer 16CR and the green light emitting layer 16CG, as shown in FIG. 6E, the hole transport layer 16BB made of the low-molecular material described above is formed on the hole injection layer 16AB for the blue organic light emitting element 10B (Step S107). The hole transport layer 16BB is formed by utilizing the application method such as the spin coating method or the droplet discharging method. In particular, from necessity for selectively disposing the materials of formation of the hole transport layer 16BB in each of the regions surrounded by the upper partition walls 15B, the ink-jet method or the nozzle coating method as the droplet discharging method is preferably utilized.

Specifically, a liquid solution or dispersion liquid of low-molecular materials as the material for formation of the hole transport layer 16BB is disposed on the exposed surface of the hole injection layer 16AB by, for example, utilizing the ink-jet method. After that, a heat treatment is carried out by utilizing the same method and condition as those in the heat treatment (dying treatment) described in the process for forming the hole transport layers 16BR and 16BG of the red organic EL element 10R and green organic EL element 10G described above, thereby forming the hole transport layer 16BB.

(With Respect to the Order of the Processes)

The process for forming the hole transport layers 16BR and 16BG of the red organic EL element 10R and the green organic EL element 10G, the process for forming the hole transport layer 16BB of the blue organic EL element 10B, and the process for forming the red light emitting layer 16CR and the green light emitting layer 16CG may be carried out in any order. However, it is necessary that at least the base on which the layer(s) to be formed is(are) developed is formerly formed, and is subjected to the heating process of the heating process and the drying process. In addition, the application needs to be carried out in such a way that the temperature in the phase of the heating process is at least equal to or lower than that in the preceding process. For example, when the heating temperatures for the red light emitting layer 16CR and the green light emitting layer 16CG are each 130° C. and the heating temperature for the hole transport layer 16BB for the blue organic EL element 10B is also 130° C., the application of the red light emitting layer 16CR and the green light emitting layer 16CG is carried out without drying. Subsequently, after the application of the hole transport layer 16BB for the blue organic EL element 10CB has been carried out, the process for drying and heating the red light emitting layer 16CR, the green light emitting layer 16CG, and the hole transport layer 16BB for the blue organic EL element 10B may be carried out.

It is noted that when the hole transport layers 16BR, 16BG, and 16BB are made of the same material and formed so as to have a uniform thickness, as described above, the hole transport layers 16BR, 16BG, and 16BB may be collectively formed as the common layer over the entire surface within the regions by utilizing the slit coating method or the like. As a result, the number of processes can be reduced. Specifically, after the hole transport layers 16BR, 16BG, and 16BB have been formed as the common layer over the entire surfaces of the hole injection layers 16AR 16AG and 16AB by utilizing the application method such as the slit coating method, a heat treatment is carried out by utilizing the same method and condition as those in the heat treatment (dying treatment) described in the process for forming the hole transport layers 16BR and 16BG of the red organic EL element 10R and green organic EL element 10G described above. After that, as described above, the red light emitting layer 16CR and the green light emitting layer 16CG are formed.

In addition, in the processes described above, the dry process and the heating process are preferably carried out as the different processes separately from each other. The reason for this is because in the drying process, the film uniformity is easy to occur since the wet film applied is very easy to flow. A preferable drying process utilizes a method of uniformly carrying out vacuum drying at normal pressure. Moreover, the drying is preferably carried out without winding during the drying. In the heating process, the solvent is evaporated to some degree to reduce the fluidity, and thus the cured film is obtained. By slowly heating the film from this state, a minute amount of solvent can be removed away, and also the rearrangement can be caused in the luminescent material and the material for the hole transport layer on the molecular level.

(A Process for Forming the Connection Layer 16D)

Figure 6F:
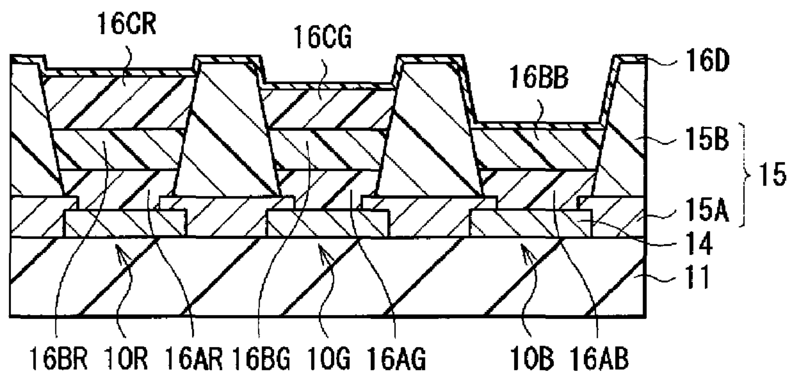

After up to the red light emitting layer 16CR and the green light emitting layer 16CG have been formed, as shown in FIG. 6F, the connection layer 16D made of the low-molecular material described above is formed as the common layer over the entire surfaces of the red light emitting layer 16CR and the green light emitting layer 16CG by utilizing the evaporation method (Step S108).

(A Process for Forming the Blue Light Emitting Layer 16CB)

Figure 6G:
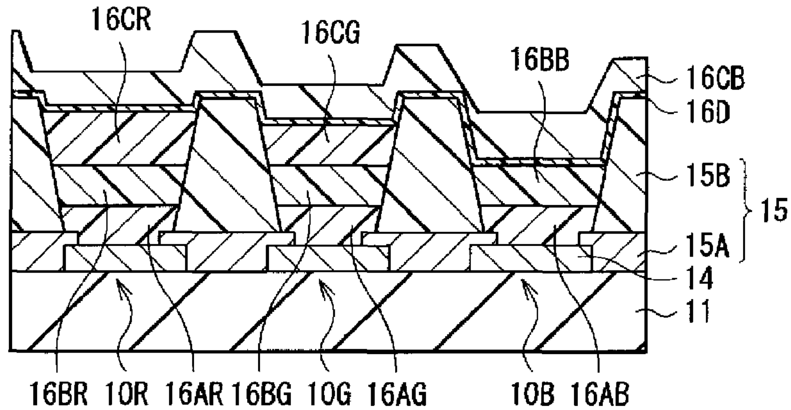

After completion of the formation of the red light emitting layer 16CR, the green light emitting layer 16CG, and the blue hole transport layer 16BB, as shown in FIG. 6G, the blue light emitting layer 16CB made of the low-molecular material described above is formed as the common layer over the entire surface of the connection layer 16D by utilizing the evaporation method (Step S109).

(A Process for Forming the Electron Transfer Layer 16E, the Electron Injection Layer 16F, and the Upper Electrode 17)

Figure 6H:
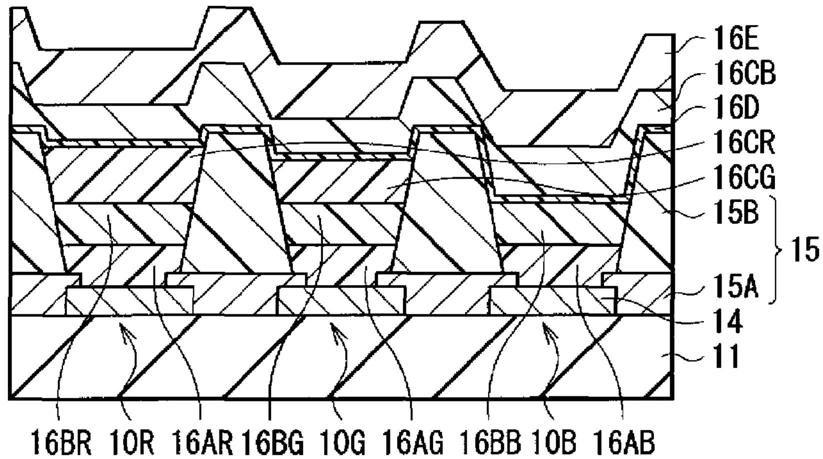
Figure 6I:
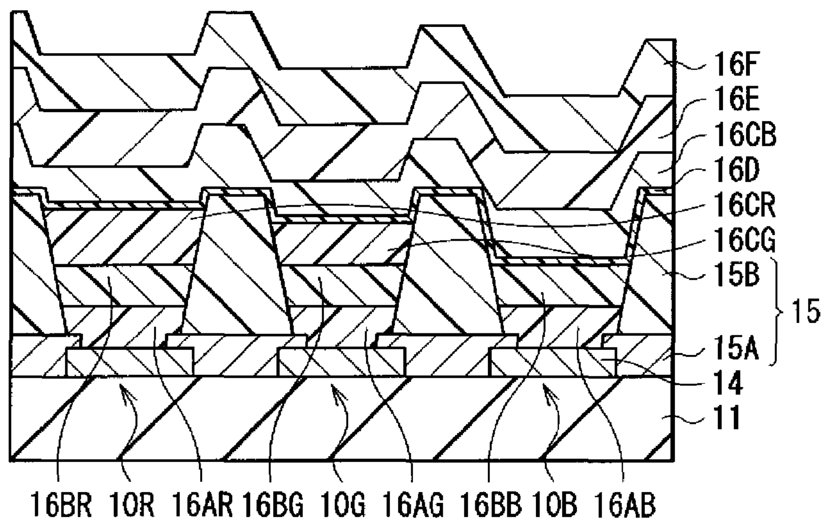
Figure 6J:
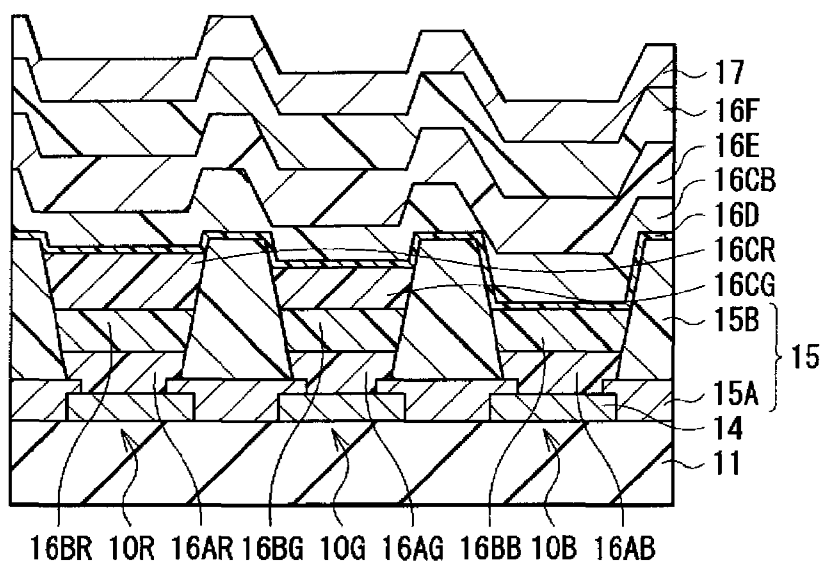

After completion of the formation of the blue light emitting layer 16CB, as shown in FIGS. 6H, 6I, and 6J, the electron transport layer 16E, the electron injection layer 16F, and the upper electrode 17 made of the materials described above, respectively, are formed in this order over the entire surface of the blue light emitting layer 16CB by utilizing the evaporation method (Steps S110, S111, and S112).

After completion of the formation of the upper electrode 17, as shown in FIG. 3, the protective layer 30 is formed by utilizing a deposition method with which deposition particles each having a low energy to the degree that no influence is exerted on the base are obtained such as the evaporation method or the CVD method. For example, when the protective layer 30 made of an amorphous silicon nitride is formed, the protective layer 30 is formed so as to have a thickness of 2 to 3 μm by utilizing the CVD method. In this case, for the purpose of preventing the reduction of the luminance due to the deterioration of the organic layer 16, preferably, the deposition temperature is set to a normal temperature. Also, for the purpose of preventing the peeling-off of the protective layer 30, preferably, the protective layer 30 is deposited under the condition in which a stress of the film becomes minimum.

The connection layer 16D, the blue light emitting layer 16CB, the electron transport layer 16E, the electron injection layer 16F, the upper electrode 17, and the protective layer 30 are formed as the solid films over the entire surface without using a fine mask. In addition, the blue light emitting layer 16CB, the electron transport layer 16E, the electron injection layer 16F, the upper electrode 17, and the protective layer 30 are preferably continuously formed within the same deposition system without being exposed to the atmosphere. As a result, the deterioration of the organic layer 16 due to the moisture in the atmosphere is prevented.

It is noted that when an auxiliary electrode (not shown) is formed in the same process as that for the lower electrode 14, the organic layer 16 formed as the solid film on the upper portion of the auxiliary electrode may be removed away before formation of the upper electrode 17 by utilizing a technique such as laser ablation. As a result, the upper electrode 17 can be made to directly contact the auxiliary electrode, and thus the contact property is enhanced.

After completion of the formation of the protective layer 30, for example, the light blocking film made of the material described above is formed on the sealing substrate 40 made of the material described above. Subsequently, a material for the red filter (not shown) is applied onto the sealing substrate 40 by utilizing the spin coating method or the like, and is then patterned by utilizing the photolithography technique, and is then fired, thereby forming the red filter. Subsequently, similarly to the case of the red filter (not shown), the blue filter (not shown) and the green filter (not shown) are formed in order.

After that, a bonding layer (not shown) is formed on the protective layer 30, and the sealing substrate 40 is stuck through the bonding layer. With that, the organic EL display device 1 shown in FIGS. 1 to 3 is completed.

In the organic EL display device 1, scanning signals are supplied from the scanning line drive circuit 130 to the pixels through the gate electrodes of the write transistors Tr2. Also, image signals from the signal line drive circuit 120 are held in the hold capacitor Cs through the write transistors Tr2, respectively. That is to say, the drive transistor Tr1 is controlled so as to be turned ON or OFF in accordance with the image signal held in the hold capacitor Cs. As a result, the drive current Id is injected to the red organic EL element 10R, the green organic EL element 10G, the blue organic EL element 10B, so that the hole and the electron are recombined with each other to emit a light. In the case of the bottom-emission, the light is transmitted through the lower electrode 14 and the substrate 11 to be taken out. On the other hand, in the case of the top-emission, the light is transmitted through the upper electrode 17, the color filter (not shown), and the sealing substrate 40 to be taken out.

As previously stated, the organic EL display device using the phosphorescent material having the higher internal quantum efficiency than that in the fluorescence emission material conventionally used as the fluorescent material has been recently developed. However, actually, it may be impossible to utilize the internal quantum efficiency which the phosphorescent material essentially has, which causes the reduction of the luminous efficiency. This is related to the light emission principles of the phosphorescence described above. The phosphorescent material returns from the singlet state back to the ground state through the triplet state at the lower energy level. For this reason, for obtaining the phosphorescence emission at a high efficiency, the excited triplet energy of each of the material becoming the host matrix contained in the phosphorescence emission layer and the material adjacent to the phosphorescence emission layer needs to be larger than the excited triplet energy of the phosphorescence emitter contained together with the host matrix in the phosphorescence emission layer.

In general, although in the host material of the fluorescence, the excited singlet energy S1BH is larger than that of the fluorescence dopant material, the excited triplet energy T1BH is not necessarily larger than that of the fluorescence dopant material. Therefore, the host material of the fluorescence is not suitable as the material for the layer adjacent to the phosphorescence emission layer. For example, a description will now be given with respect to the organic EL display device in which the blue light emitting layer containing therein the anthracene derivative is provided as the common layer on the upper portion of the light emitting layer containing therein the phosphorescence emission layer given in Japanese Patent Laid-Open No. 2006-140434 described above. Since the anthracene derivative is as relatively low as about 1.9 eV in excited triplet energy T1BH, the anthracene derivative cannot confine the excited triplet energy in the light emitting layer for the phosphorescence emitter having the light emission wavelength in the visible light region of 500 to 720 nm. For this reason, the triplet energy diffuses into the blue light emitting layer, so that the luminous efficiency of the phosphorescence emission layer is reduced. In addition, there is also caused a problem that the emission amount in the blue light emitting layer is changed to change the chromaticity.

On the other hand, in the first embodiment, the connection layer 16D made of the low-molecular material is provided between the red light emitting layer 16CR and the green light emitting layer 16CG which are formed every element, and the blue light emitting layer 16CB formed as the solid film. As a result, the excited energies, of the luminescent material, excited in the red light emitting layer 16CR and the green light emitting layer 16CG are prevented from diffusing into the adjacent layer, especially, into the blue light emitting layer 16CB, thereby allowing the excited energies to be held in the red light emitting layer 16CR and the green light emitting layer 16CG.

In such a way, in the organic EL display device 1 of the first embodiment, the connection layer 16D is provided between the red light emitting layer 16CR and the green light emitting layer 16CG, and the blue light emitting layer 16CB. Therefore, the excited energies, of the light emitting material, excited in the red light emitting layer 16CR and the green light emitting layer 16CG can be confined in the red light emitting layer 16CR and the green light emitting layer 16CG. As a result, the luminous efficiency of the red light emitting layer 16CR and the green light emitting layer 16CG is increased. In addition, since the energies are prevented from diffusing into the blue light emitting layer 16CB, the change in chromaticity due to the change in the emission amount in the blue light emitting layer 16CB is suppressed to enhance the color purity.

In addition, since the energy difference in ground state between the connection layer 16D and the hole transport layer 16BB is set equal to or lower than 0.4 eV, the efficiency of the injection of the holes into the blue light emitting layer 16CB is increased. Therefore, the current density dependency is suppressed, and the change in the chromaticity in the phase of the low current is suppressed. As a result, it becomes possible to manufacture the high-definition organic EL display device in which the change in the color reproduction region due to the gradation is suppressed.

Hereinafter, a description will be given with respect to a change of the first embodiment, and second and third embodiments of the present disclosure. It is noted that the same constituent elements as those in the first embodiment are designated by the same reference numerals, respectively, and a description thereof is omitted here for the sake of simplicity.

2. Change

Figure 7:
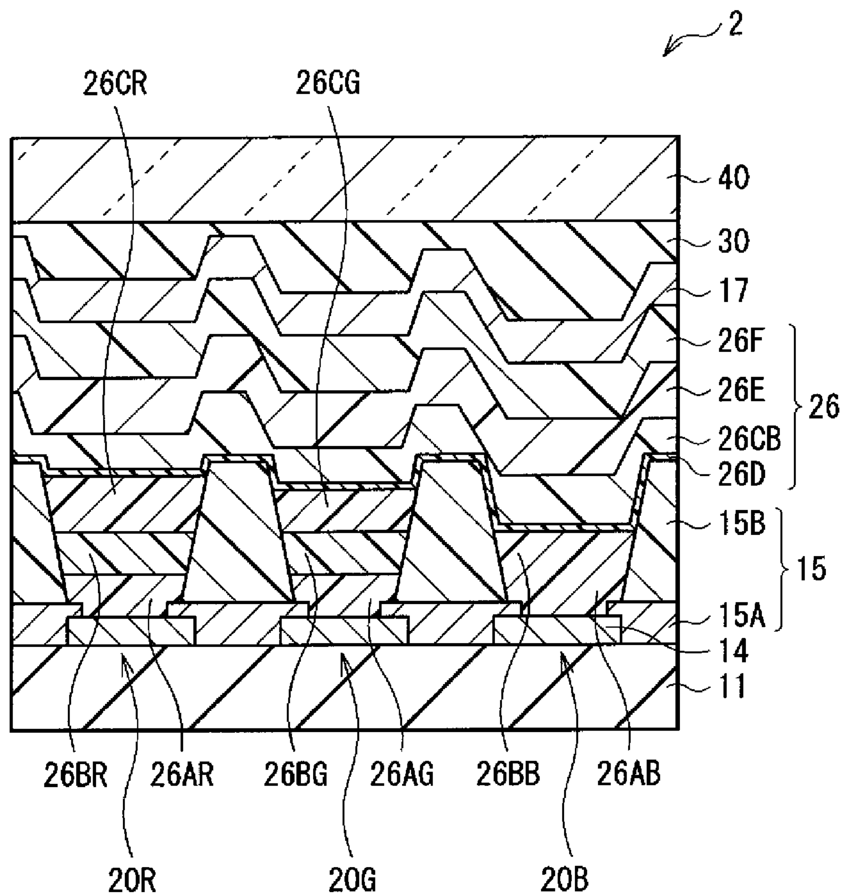
FIG. 7 is a cross sectional view showing a structure of an organic EL display device according to a change of the first embodiment of the present disclosure.

FIG. 7 is a cross sectional view showing a structure of an organic EL display device 2 according to a change of the first embodiment. The organic EL display device 2 of the change of the first embodiment is different from the organic EL display device 1 of the first embodiment in that the red light emitting layer 26CR and the green light emitting layer 26CG are formed by utilizing the evaporation method and a laser transfer method.

Specifically, a mask having an opening portion in an area corresponding to the red organic EL element 20R, for example, a stripe-like mask is formed and the red light emitting layer 26CR is deposited by utilizing the evaporation method. Subsequently, a stripe-like mask having an opening portion in an area corresponding to the green organic EL element 20G is formed, and the green light emitting layer 26CG is deposited by utilizing the evaporation method. It is noted that when the layer is formed by utilizing a thermal transfer method typified by the laser transfer method or the like, it is possible to use a thermal transfer method of related art. Specifically, for example, a transferring substrate on which a transfer material layer is formed, and a transfer receiving substrate on which up to the hole transfer layers 26BR, 26BG, and 26BB of the red organic EL element 20R, the green organic EL element 20G, and the blue organic EL element 20B are previously formed are disposed so as to face each other. Then, by carrying out the light radiation, the red light emitting layer 26CR and the green light emitting layer 26CG are formed in accordance with a transfer pattern.

After completion of the formation of the red light emitting layer 26CR and the green light emitting layer 26CG, the layers in and after the connection layer 16D are formed by utilizing the same method as that in the first embodiment described above, thereby completing the organic EL display device 2 having the same structure as that of the organic EL display device 1 of the first embodiment.

3. Second Embodiment

Figure 8:
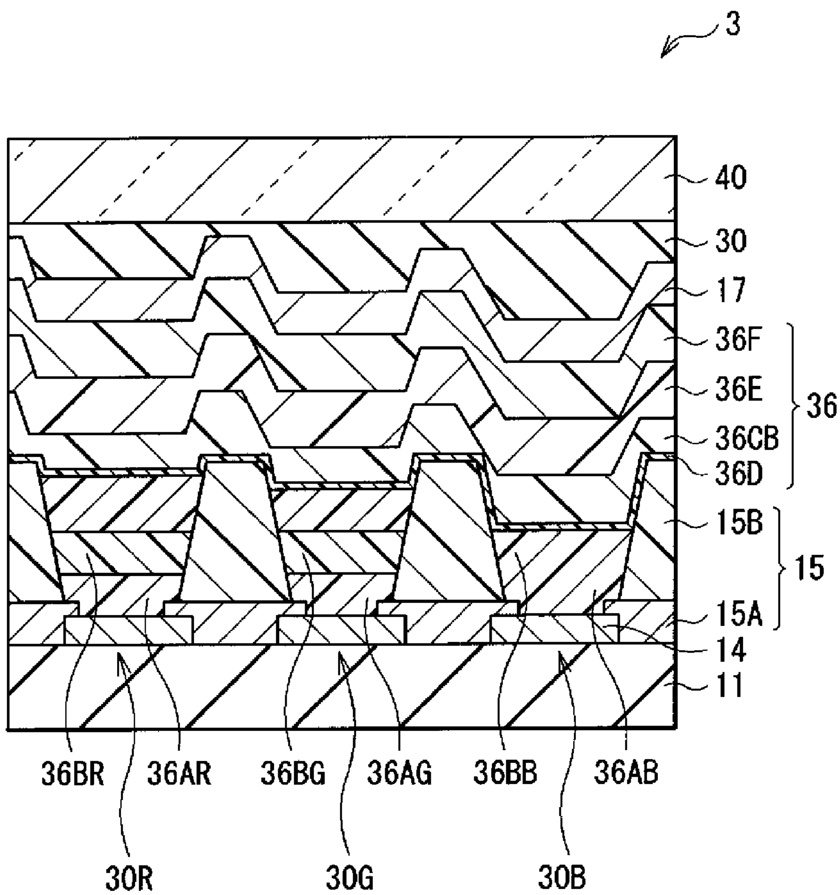
FIG. 8 is a cross sectional view showing a structure of an organic EL display device according to a second embodiment of the present disclosure.

FIG. 8 is a cross sectional view showing a structure of an organic EL display device 3 according to the second embodiment of the present disclosure. The organic EL display device 3 of the second embodiment is different from the organic EL display device 1 of the first embodiment in that each of the red light emitting layer 36CR and the green light emitting layer 36CG is made of a mixed material in which a phosphorescence luminescent low-molecular material is added to a high-molecular material.

The high-molecular material used in each of the red light emitting layer 36CR and the green light emitting layer 36CG includes a high-molecular material which does not include a light emitting portion. Specifically, for example, polyvinylcarbazole expressed by the following general formula (12) is preferable because an excited triplet level is high. In addition thereto, even a high-molecular material including a light emitting portion can be used as long as it is a material not impeding the light emission of the low-molecular material added. Specifically, for example, polyfluorene and a derivative thereof are given as such a high-molecular material:

(12)

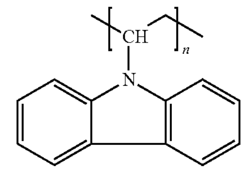

in which n is an integral number of 10 to 5,000.

It is noted that when the high-molecular material not including the luminescent portion is used, it is necessary to add a phosphorescence luminescent dopant. Specifically, the phosphorescence metallic complex compound described in the first embodiment described above, specifically, the ortho metalated metallic complex or the porphyrin metallic complex is given. For example, although the compounds expressed by the structural formulas (4-1) to (4-12), and the structural formulas (5-1) to (5-7) are given, the present disclosure is by no means limited thereto.

In addition, the effects which will be described below are obtained by adding the low-molecular materials to the high-molecular materials composing the red light emitting layer 36CR and the green light emitting layer 36CG, respectively.

When the connection layer 16D made of the low-molecular material is formed on the upper portions of the red light emitting layer 36CR and the green light emitting layer 36CG composed of only the high-molecular materials, respectively, a difference between the energy level of each of the red light emitting layer 36CR and the green light emitting layer 36CG, and the energy level of the connection layer 16D is large. For this reason, the efficiency of the injection of the holes or the electrons between the connection layer 16D, and the red light emitting layer 36CR and the green light emitting layer 36CG is very low, and thus there is caused the problem that as described above, it may be impossible to sufficiently obtain the original characteristics which the light emitting layer made of the original high-molecular material has. In the second embodiment, for the purpose of enhancing the characteristics of the injection of the holes or the electrons, a low-molecular material (either monomer or oligomer) serving to reduce the difference between the energy level of each of the red light emitting layer 36CR and the green light emitting layer 36CG, and the energy level which the connection layer 16D has is added to each of the red light emitting layer 36CR and the green light emitting layer 36CG. In this case, a relationship among the Highest Occupied Molecular Orbital (HOMO) levels and the Lowest Unoccupied Molecular Orbital (LUMO) levels of the red light emitting layer 36CR and the green light emitting layer 36CG, the HOMO level and LUMO level of the connection layer 16D, and the HOMO level and LUMO level of the low-molecular material added to the red light emitting layer 36CR and the green light emitting layer 36CG is taken into consideration. Specifically, a compound which has a deeper value than each of the LUMO levels of the red light emitting layer 36CR and the green light emitting layer 36CG, and has a shallower value than the LUMO level of the connection layer 16D, and which has a deeper value of each of the HOMO levels of the red light emitting layer 36CR and the green light emitting layer 36CG, and a shallower value than the HOMO level of the connection layer 16D is selected as the low-molecular material to be added.

However, the materials used in the red light emitting layer 36CR and the green light emitting layer 36CG are not necessarily limited to the reference based on the values of the HOMO and LUMO described above. In addition, the low-molecular materials with which the red light emitting layer 36CR and the green light emitting layer 36CG are mixed are not necessarily limited to the case where the red light emitting layer 36CR and the green light emitting layer 36CG are mixed singularly with the low-molecular materials. That is to say, plural kinds of materials different in energy level from one another are mixed to be used, whereby the transfer of the holes and the electrons are smoothly carried out.

The low-molecular materials added to the red light emitting layer 36CR and the green light emitting layer 36CG mean organic materials which are other than the compound composed of the molecules of the polymer or the condensation body having a high molecular weight and generated by repeating the same or similar reaction in a chain reaction by the low-molecular compound, and whose molecular weights are substantially single. In addition, new chemical bounding between the molecules due to the heating is not caused in the low-molecular material described above, and thus the low-molecular material described above exists in the form of a single molecule. The weight-average molecular weight (Mw) of such a low-molecular material is preferably equal to or smaller than 10,000. In addition, a molecular weight ratio of the high-molecular material to the low-molecular material is preferably equal to or larger than 10. The reason for this is because the material having somewhat small molecular weight as compared with the material having the large molecular weight, for example, the material having the molecular weight of 50,000 or more has the various characteristics, and thus the mobility of the hole or the electron, the band gap, the solubility of such a material into the solvent or the like is easy to adjust. In addition, with regard to an addition amount of low-molecular material, the mixing ratio of the high-molecular material to the low-molecular material used in the red light emitting layer 36CR and the green light emitting layer 36CG is preferably set equal to or larger than 20:1 and equal to or smaller than 1:9 in weight ratio. The reason for this is because when the mixing ratio of the high-molecular material to the low-molecular material is smaller than 20:1, the effect due to the addition of the low-molecular material is reduced. Also, the reason for this is because when that mixing ratio exceeds 1:9, the characteristics which the high-molecular material as the luminescent material has become hard to obtain.

As described above, the low-molecular materials are added to the red light emitting layer 36CR and the green light emitting layer 36CG, respectively, whereby it becomes easier to adjust the carrier balance between the holes and the electrons. As a result, the reduction of the electron injection property between the connection layer 16D made of the low-molecular material, and the red light emitting layer 36CR and the green light emitting layer 36CG, and the reduction of the hole transport property between them are suppressed. That is to say, the reduction of the luminous efficiency and lives of the red organic EL element 10R, the green organic EL element 10G, and the blue organic EL element 10B, and the rise of the drive voltages are suppressed.

Such a low-molecular material includes the components expressed by the general formulas (5) to (7), respectively.

In the second embodiment, the high-molecular material such as polyvinylcarbazole in which the low-molecular materials are added to the red light emitting layer 36CR and the green light emitting layer 36CG, respectively, is used, thereby obtaining the organic EL display device having the high luminous efficiency and the high color purity similarly to the case of the first embodiment described above. In addition thereto, the mixed material of the low-molecular material and the high-molecular material is used as with the second embodiment, whereby the crystallization is suppressed as compared with the case where only the low-molecular material is used as with the first embodiment. Therefore, there is offered an effect that the printing becomes easy.

4. Third Embodiment

Figure 9:
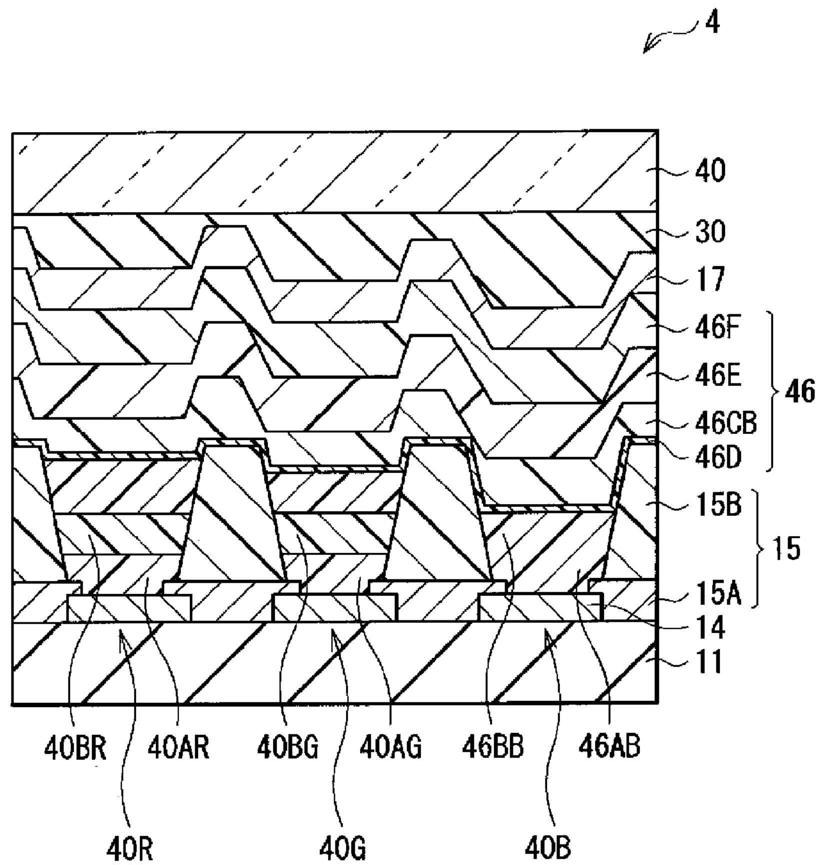
FIG. 9 is a cross sectional view showing a structure of an organic EL display device according to a third embodiment of the present disclosure.

FIG. 9 is a cross sectional view showing a structure of an organic EL display device 4 according to a third embodiment of the present disclosure. The organic EL display device 4 of the third embodiment is different from the organic EL display device 1 of the first embodiment in that unlike the high-molecular material such as polyvinylcarbazole described above, a red light emitting layer 46CR and a green light emitting layer 46CG are made of phosphorescence luminescent high-molecular materials each containing therein a phosphorescence luminescent light emission unit.

The high-molecular materials (light emission units) composing the red light emitting layer 46CR and the green light emitting layer 46CG, respectively, for example, include luminescent high-molecular materials such as a polyfluorene system high-molecular derivative, a polyphenylenevinylene derivative, a polyphenylene derivative, a polyvinylcalbazole derivative, and a polythiophene derivative. It is noted that the high-molecular material used herein is by no means limited only to the conjugated system polymer, and thus also includes a pendant-shaped non-conjugated polymer and a dye mixing non-conjugated system polymer. Thus, the high-molecular material may also be a dendrimer type high-molecular luminescent material composed of a side chain having core molecules disposed at the center and called a dendron. The development of the dendrimer type high-molecular luminescent material has been recently advanced. In addition, with regard to the light emitting portion, there is known a light emitting portion in which a light is emitted from a singlet exciton, a light emitting portion in which a light is emitted from a triplet exciton, or a light emitting portion in which lights are emitted from the both of the singlet exciton and the triplet exciton. However, the light emitting portion in which the light is emitted from the triplet exiton is used in the red light emitting layer 46CR and the green light emitting layer 46CG in the third embodiment.

Although with regard to the light emission unit followed by the triplet excited state, there are many compounds containing therein the metal complexes such as an iridium metal complex, a metal complex may also be used which contains therein any other suitable metal as a central metal. With regard to a concrete example of the high-molecular luminescent material in which the light is emitted from the triplet excited state, an RPP (the structural formula (13-1)) is given as a red phosphorescence luminescent material, and a GPP (the structural formula (13-2)) is given as a green phosphorescence luminescent material. In addition, there, for example, are given a PP[Ir(tBuppy)$_3$] (the structural formula (14-1) and a PP[Ir(ppy)$_2$acac] (the structural formula (14-2)) each having a hole transport group (for example, HMTPD) and an electron transport group (for example, TBPhB) in a side chain of a polyvinyl main chain skeleton in addition to a phosphorescence luminescent group:

-continued
(13-1)
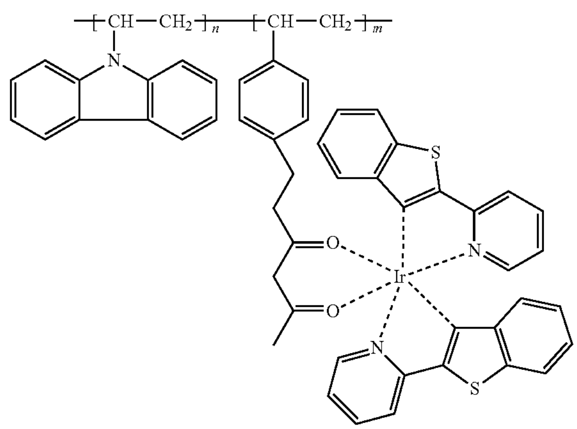
RPP
(13-2)
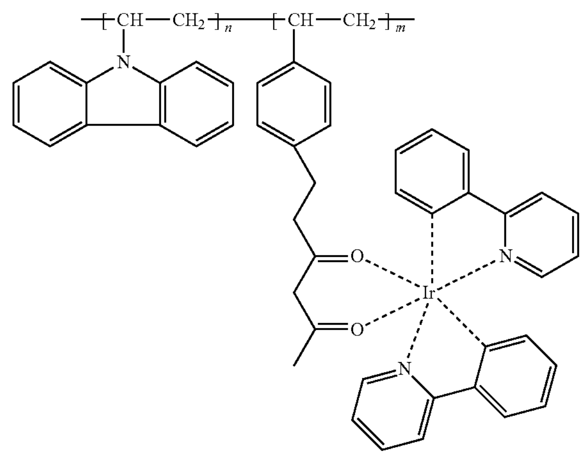
GPP
in which each of m and n is an integral number of 10 to 5,000, and
(14-1)
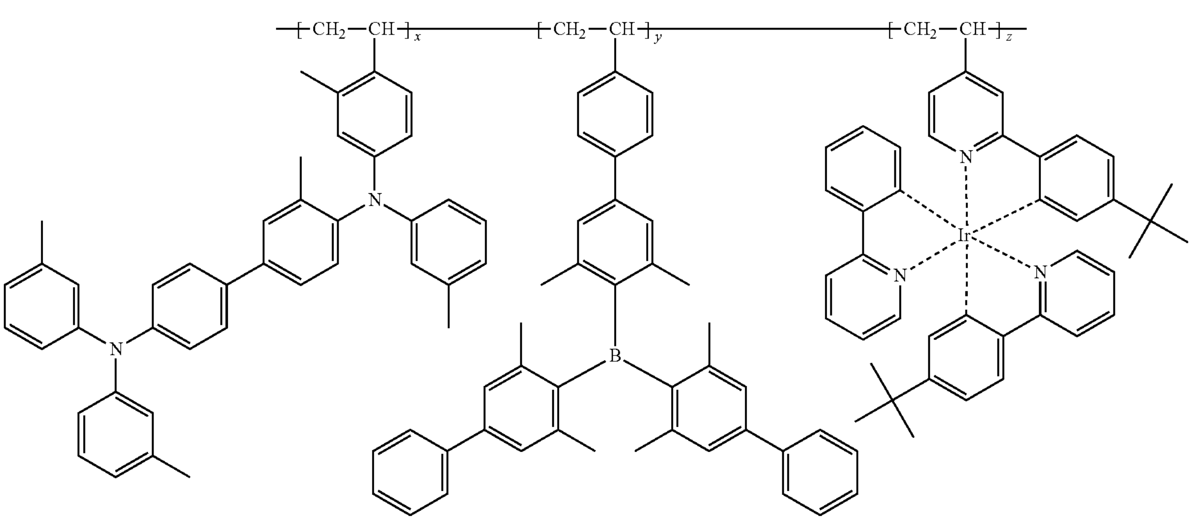
HMTPD TBphB $Ir(tBuppy)_3$ -continued (14-2)

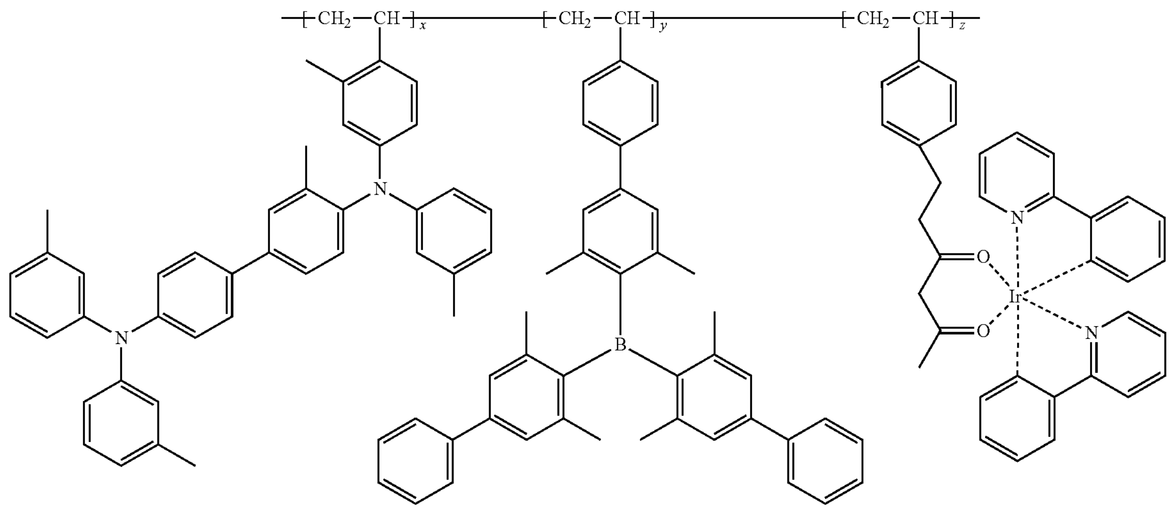

HMTPD TBphB Ir(ppy)3 acac in which each of x, y, and z is an integral number of 10 to 5,000.

In addition, as described above, for the purpose of enhancing the adjustment of the carrier balance between the holes and the electrons, especially, the efficiency of the injection of the electrons from the connection layer 16D to each of the red light emitting layer 46CR and the green light emitting layer 46CG, it is preferable to add the low-molecular materials expressed by the general formulas (5) to (7) described above, respectively.

In the third embodiment, the high-molecular materials in each of which the light is emitted from the triplet exciton is used in the red light emitting layer 46CR and the green light emitting layer 46CG, thereby obtaining the same effects as those in the second embodiment described above.

5. Module and Examples of Application

Hereinafter, a description will be given with respect to examples of application of the organic EL display device 1 according to the first embodiment of the present disclosure described above. The organic EL display device 1 of the first embodiment described above can be applied to the display devices, of electronic apparatuses in all the fields, in each of which a video signal inputted from the outside to the electronic apparatus, or a video signal generated in the electronic apparatus is displayed in the form of an image or a video image. In this case, the electronic apparatuses include a television set, a digital camera, a notebook-size personal computer, mobile terminal equipment such as a mobile phone, and a video camera.

(Module)

Figure 10:
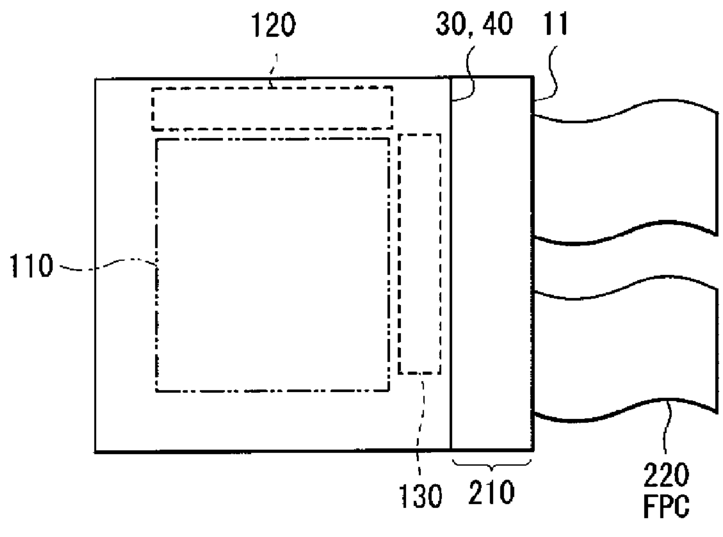
FIG. 10 is a top plan view showing a module-shaped display device in the form of which the organic EL display device shown in FIG. 1 is incorporated in various electronic apparatuses.

The organic EL display device 1 of the first embodiment described above is incorporated as a module, for example, as shown in FIG. 10, in various kinds of electronics apparatuses exemplified as first to fifth examples of application which will be described later. In the module, for example, an area 210 exposed either from the protective layer 30 and the sealing substrate 40 in the first embodiment is provided in one side of the substrate 11, and wirings of the signal line drive circuit 120 and the scanning line drive circuit 130 are made to extend to form external connection terminals (not shown) in the exposed area 210. A Flexible Printed Circuit (FPC) board 220 for input/output of the signals may be provided in those external connection terminals.

First Examples of Application

Figure 11:
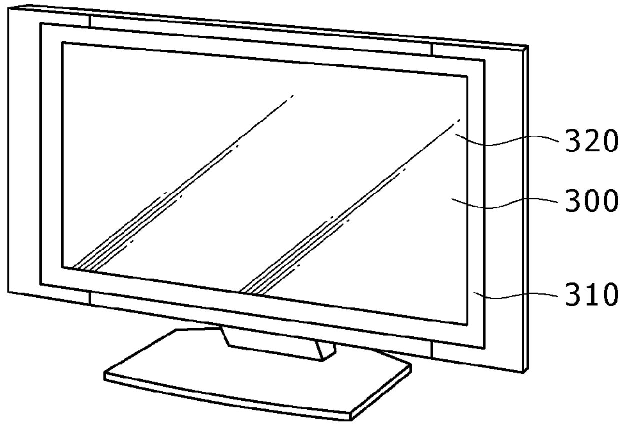
FIG. 11 is a perspective view of a television set as a first example of application to which the organic EL display device shown in FIG. 1 is applied.

FIG. 11 is a perspective view showing an external appearance of a television set as a first example of application to which the organic EL display device 1 of the first embodiment is applied. The television set, for example, includes an image display screen portion 300 composed of a front panel 310 and a filter glass 320. In this case, the image display screen portion 300 is composed of the organic EL display device 1 of the first embodiment described above.

Second Example of Application

Figure 12A:
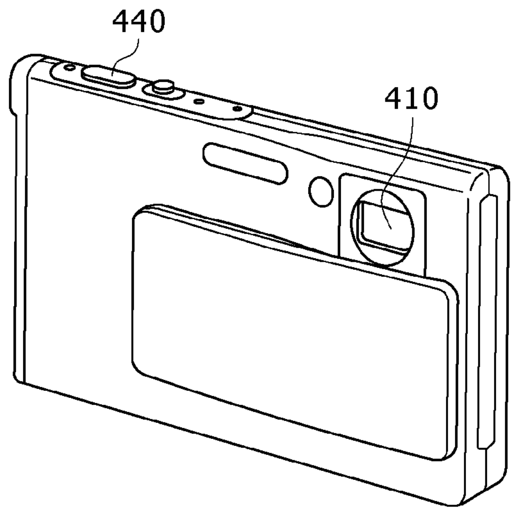
FIGS. 12A and 12B are respectively a perspective view of a digital camera as a second example of application to which the organic EL display device shown in FIG. 1 is applied, FIG. 12A being a front side view and FIG. 12B being a back side view thereof.
Figure 12B:
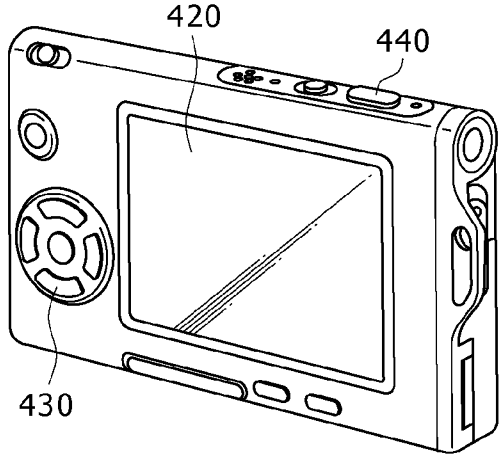

FIGS. 12A and 12B are respectively perspective views showing respective external appearances of a digital camera as a second example of application to which the organic EL display device 1 of the first embodiment descried above is applied. The digital camera, for example, includes a light emitting portion 410 for flash, a display portion 420, a menu switch 430, and a shutter button 440. In this case, the display portion 420 is composed of the organic EL display device 1 of the first embodiment described above.

Third Example of Application

Figure 13:
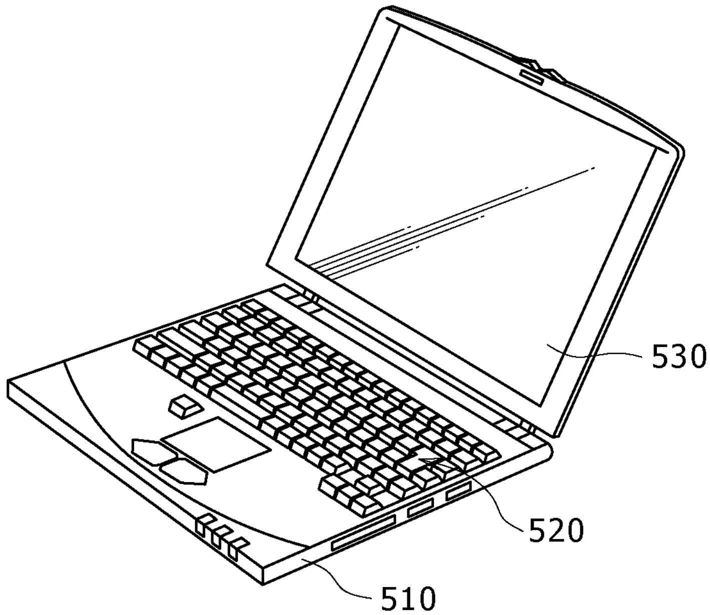
FIG. 13 is a perspective view showing a notebook-size personal computer as a third example of application to which the organic EL display device shown in FIG. 1 is applied.

FIG. 13 is a perspective view showing an external appearance of a notebook-size personal computer as a third example of application to which the organic EL display device 1 of the first embodiment described above is applied. The notebook-size personal computer, for example, includes a main body 510, a keyboard 520 which is manipulated when characters or the like are inputted, and a display portion 530 for displaying thereon an image. In this case, the display portion 530 is composed of the organic EL display device 1 of the first embodiment described above.

Fourth Example of Application

Figure 14:
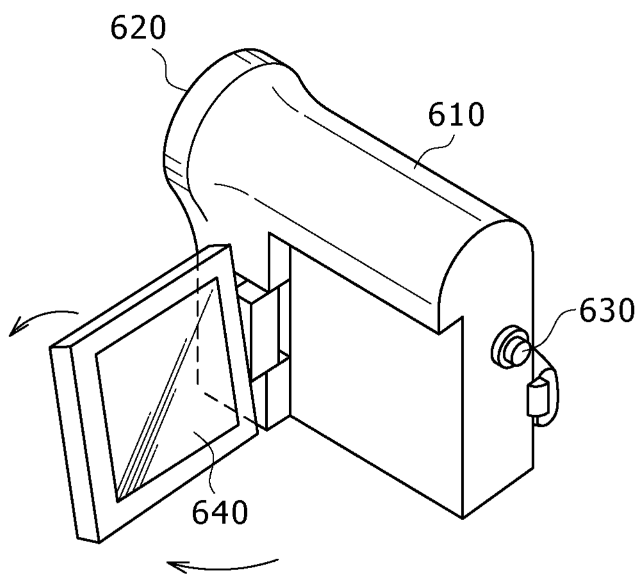
FIG. 14 is a perspective view showing a video camera as a fourth example of application to which the organic EL display device shown in FIG. 1 is applied.
Figure 15A:
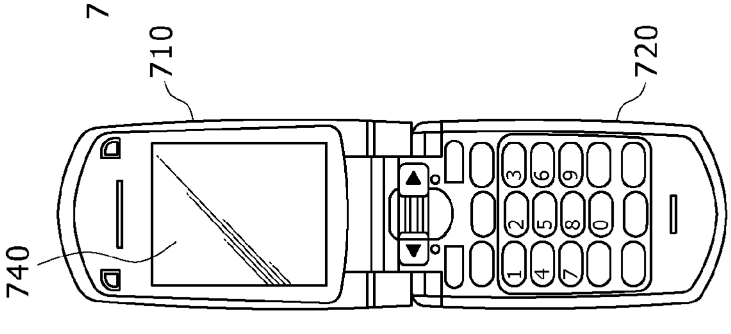
FIGS. 15A to 15G are respectively a front view of a mobile phone as a fifth example of application, in an open state, to which the organic EL display device shown in FIG. 1 is applied, a side elevational view thereof in the open state, a front view thereof in a close state, a left side elevational view thereof in the close state, a right side elevational view thereof in the close state, a top plan view thereof in the close state, and a bottom view thereof in the close state.
Figure 15B:
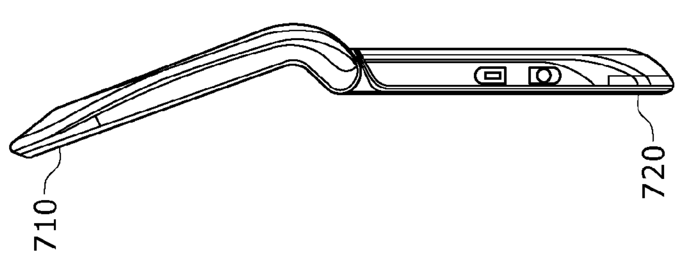
Figure 15D:
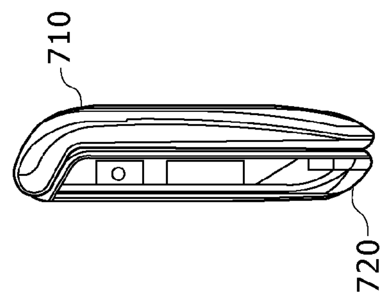
Figure 15C:
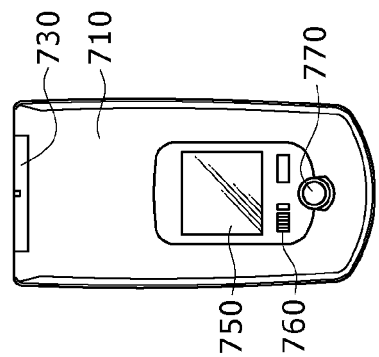
Figure 15E:
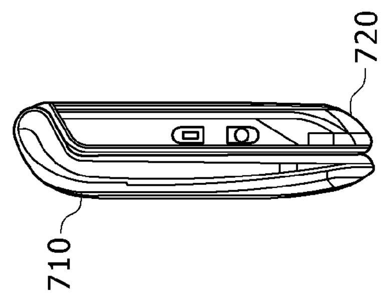
Figure 15F:
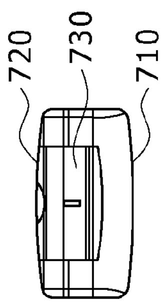
Figure 15G:
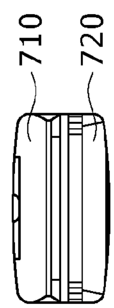

FIG. 14 is a perspective view showing an external appearance of a video camera as a fourth example of application to which the organic EL display device 1 of the first embodiment described above is applied. The video camera, for example, includes a main body portion 610, a lens 620 which captures an image of a subject and which is provided on a side surface directed forward, a start/stop switch 630 which is manufactured when an image of a subject is captured, and a display portion 640. In this case, the display portion 640 is composed of the organic EL display device 1 of the first embodiment described above.

Fifth Example of Application

FIGS. 15A to 15G are respectively views showing respective external appearances of a mobile phone as a fifth example of application to which the organic EL display device 1 of the first embodiment described above is applied. The mobile phone, for example, is constructed in such a way that an upper chassis 710 and a lower chassis 720 are coupled to each other through a coupling portion (hinge portion) 730. The mobile phone, for example, includes a display portion 740, a sub-display portion 750, a picture light 760, and a camera 770 in addition to the upper chassis 710, the lower chassis 720, and the coupling portion (hinge portion) 730. In this case, of these constituent elements, either the display portion 740 or the sub-display portion 750 is composed of the organic EL display device 1 of the first embodiment described above.

It should be noted that although the organic EL display device of the first embodiment described above is applied to each of the first to fifth examples of application, the organic EL display device 2, 3 or 4 of any of the change of the first embodiment, and the second and third embodiments can also be applied to each of the first to fifth examples of application.

Example 1

The red organic EL elements 10R, the green organic EL elements 10G, and the blue organic EL elements 10B were formed on the substrate 11 of 25 mm×25 mm.

Firstly, a glass substrate (of 25 mm×25 mm) was prepared as the substrate 11, and a transprarent conductive film having a thickness of 100 nm and made of an ITO was formed as the lower electrode 14 on the substrate 11 (Step S101). Subsequently, the partition wall 15A was made of an inorganic material such as $SiO_2$, and the partition wall 15B was made of a resin material such as polyimide, acrylic or novolac, thereby forming the partition wall 15 (Step S102). Next, the partition wall 15 was introduced into a system including a plasma power source and electrodes, and was then subjected to the plasma treatment by using a fluorine system gas such as $CF_4$, thereby carrying out the water repellent treatment for the surface of the partition wall 15.

Subsequently, for formation of the hole injection layers 16AR, 16AG, and 16AB, ND1501 (polyaniline manufactured by NISSAN CHEMICAL INDUSTRIES, LTD.) was applied in the atmosphere so as to have a thickness of 15 nm by utilizing the nozzle coating method. Then, the ND1501 thus applied was thermally cured on a hot plate at 220° C. for 30 minutes.

After that, for formation of the hole transport layers 16BR, 16BG, and 16BB, a liquid solution in which the compound expressed by the structural formula (1-1) was dissolved at a ratio of 1 wt % into either xylene or a solvent having a higher boiling point than that of xylene was applied onto the hole injection layers 16AR, 16AG, and 16AB by utilizing the nozzle coating method. With regard to a thickness, a thickness of the hole transport layer 16BR for the red organic EL element 10R was set to 50 nm, a thickness of the hole transport layer 16BG for the green organic EL element 10G was set to 30 nm, and a thickness of the hole transport layer 16BB for the blue organic EL element 10B was set to 20 nm. Next, after the gas was exhausted up to a state in which the substrate 11 underwent a negative pressure to vacuum-dry the solvent, a heat treatment was carried out at 180° C. for 30 minutes.

Subsequently, after completion of the formation of the hole transport layers 16BR, 16BG, and 16BB, the red light emitting layer 16CR was formed on the hole transport layer 16BR of the red organic EL element 10R. Specifically for example, the compound expressed by the structural formula (2-7), and the compound expressed by the structural formula (4-4) were respectively dissolved as the host material and the guest material into either xylene or the solvent having the higher boiling point than that of xylene, and was then applied and printed so as to have a thickness of 60 nm by utilizing the nozzle coating method. In addition, the green light emitting layer 16CG was formed on the hole transport layer 16BG of the green organic EL element 10G. Specifically, for example, the compound expressed by the structural formula (2-3), and the compound expressed by the structural formula (4-1) were respectively dissolved as the host material and the guest material into either xylene or the solvent having the higher boiling point than that of xylene, and was then applied and printed so as to have a thickness of 50 nm by utilizing the nozzle coating method. Subsequently, after the gas was exhausted up to a state in which the substrate 11 underwent the negative pressure to vacuum-dry the solvent, a heat treatment was carried out at 130° C. for 30 minutes.

Next, the substrate 11 was moved into a vacuum evaporation system, and the layers in and after the connection layer 16D were formed through the evaporation. Firstly, for formation of the connection layer 16D, the compound, for example, expressed by the structural formula (6-22) was evaporated so as to have a thickness of 10 nm by utilizing the vacuum evaporation method. It is noted that when the connection layer 16D was formed so as to have a lamination structure composed of two kinds of materials, the two kinds of materials were formed so as for each of them to have a thickness of 5 nm, thereby having a thickness of 10 nm in total. After the connection layer 16D was commonly formed, the ADN(9,10-di(2-naphthyl)anthracene) expressed as the blue light emitting layer by the structural formula (8-20), and the blue dopant expressed by the general formula (15) were co-evaporated at a weight ratio of 95:5 so as to have a thickness of 25 nm in total. For formation of the electron transport layer 16E, the organic material, for example, expressed by the structural formula (9-50) was evaporated so as to have a thickness of 15 nm by utilizing the vacuum evaporation method. Subsequently, for formation of the electron injection layer 16E, an LiF film was deposited so as to have a thickness of 0.3 mm by utilizing the evaporation method, and for formation of the upper electrode 17, an Al film was deposited so as to have a thickness of 100 nm. Finally, the protective layer 30 made of SiN was formed so as to have a thickness of 3 μm by utilizing the CVD method, and is solid-sealed with an epoxy resin. The red organic EL element 10R, green organic EL element 10G, and blue organic EL element 10B thus obtained were combined with one another, thereby obtaining the full-color organic EL display device (Examples 1-1 to 1-4, Comparative Examples 1-1 to 1-4).

(15)

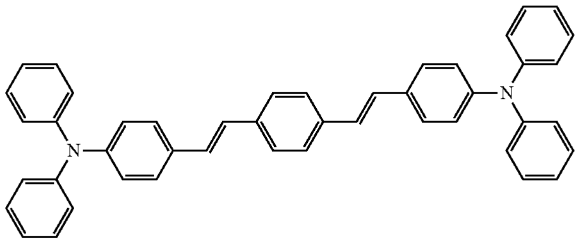

It is noted in addition to Examples 1-1 to 1-4 and Comparative Examples 1-1 to 1-4 each of which had the material structure similar to that in each of the first embodiment and change of the first embodiment described above, and in each of which the red light emitting layer 16CR and the green light emitting layer 16CG were formed by utilizing the application method, organic EL display devices were respectively formed as Example 1-5, Comparative Example 1-5 and Example 1-6, Comparative Example 1-6 by utilizing the evaporation method and the laser transfer method. In addition, an organic EL display device in which a yellow organic EL element was added to the red, green, and blue organic EL elements was manufactured as Example 1-7.

With regard to Examples 1-1 to 1-7 and Comparative Examples 1-1 to 1-6, a luminous efficiency (Cd/A), a drive voltage (V), and chromaticity coordinates (x, y) in a phase of the drive with a current density of 10 mA/cm$^2$ were measured. It is noted that the measurements described above were carried out under the environment in which the temperature was controlled at 23±0.5° C.

Table 1 shows a list of the layer structures and the materials in Examples 1-1 to 1-7 and Comparative Examples 1-1 to 1-6. Table 2 is a list of the measurement result obtained from Examples 1-1 to 1-7 and Comparative Examples 1-1 to 1-6.

TABLE 1

| | Hole injection layer | Hole transport layer | Green light emitting layer Host material | Green light emitting layer Guest material | Red light emitting layer Host material | Red light emitting layer Guest material | Yellow light emitting layer Host material | Yellow light emitting layer Guest material |
|---|---|---|---|---|---|---|---|---|
| Ex. 1-1 | ND1501 | Structural formula 1-1 | Structural formula 2-3 | Structural formula 4-1 (10%) | Structural formula 2-7 | Structural formula 4-4 (5%) | — | — |
| Ex. 1-2 | ND1501 | Structural formula 1-1 | Structural formula 2-3 | Structural formula 4-1 (10%) | Structural formula 2-7 | Structural formula 4-4 (5%) | — | — |
| Ex. 1-3 | ND1501 | Structural formula 1-1 | Structural formula 2-3 | Structural formula 4-1 (10%) | Structural formula 2-7 | Structural formula 4-4 (5%) | — | — |
| Ex. 1-4 | ND1501 | Structural formula 1-1 | Structural formula 2-3 | Structural formula 4-1 (10%) | Structural formula 2-7 | Structural formula 4-4 (5%) | — | — |
| Ex. 1-5 | ND1501 | Structural formula 1-1 | Structural formula 2-3 | Structural formula 4-1 (10%) | Structural formula 2-7 | Structural formula 4-4 (5%) | — | — |
| Ex. 1-6 | ND1501 | Structural formula 1-1 | Structural formula 2-3 | Structural formula 4-1 (10%) | Structural formula 2-7 | Structural formula 4-4 (5%) | — | — |
| Ex. 1-7 | ND1501 | Structural formula 1-1 | Structural formula 2-3 | Structural formula 4-1 (10%) | Structural formula 2-7 | Structural formula 4-4 (5%) | Structural formula 2-3 | Structural formula 4-3 (10%) |
| Comp. Ex. 1-1 | ND1501 | Structural formula 1-1 | Structural formula 2-3 | Structural formula 4-1 (10%) | Structural formula 2-7 | Structural formula 4-4 (5%) | — | — |
| Comp. Ex. 1-2 | ND1501 | Structural formula 1-1 | Structural formula 2-3 | Structural formula 4-1 (10%) | Structural formula 2-7 | Structural formula 4-4 (5%) | — | — |
| Comp. Ex. 1-3 | ND1501 | Structural formula 1-1 | Structural formula 2-3 | Structural formula 4-1 (10%) | Structural formula 2-7 | Structural formula 4-4 (5%) | — | — |
| Comp. Ex. 1-4 | ND1501 | Structural formula 1-1 | Structural formula 2-3 | Structural formula 4-1 (10%) | Structural formula 2-7 | Structural formula 4-4 (5%) | — | — |
| Comp. Ex. 1-5 | ND1501 | Structural formula 1-1 | Structural formula 2-3 | Structural formula 4-1 (10%) | Structural formula 2-7 | Structural formula 4-4 (5%) | — | — |
| Comp. Ex. 1-6 | ND1501 | Structural formula 1-1 | Structural formula 2-3 | Structural formula 4-1 (10%) | Structural formula 2-7 | Structural formula 4-4 (5%) | — | — |
| Comp. Ex. 1-7 | ND1501 | Structural formula 1-1 | Structural formula 2-3 | Structural formula 4-1 (10%) | Structural formula 2-7 | Structural formula 4-4 (5%) | Structural formula 2-3 | Structural formula 4-3 (10%) |

| | Connection layer 1 | Connection layer 2 | Blue common layer | Electron transport layer | Electron injection layer | Electrode |
|---|---|---|---|---|---|---|
| Ex. 1-1 | Structural formula 6-22 | — | Structural formula 8-20 + general formula 14 (5%) | Structural formula 9-50 | LiF | Al |

TABLE 1-continued

| | | | | | | |
|---|---|---|---|---|---|---|
| Ex. 1-2 | Structural formula 6-49 | — | Structural formula 8-20 + general formula 14 (5%) | Structural formula 9-50 | LiF | Al |
| Ex. 1-3 | Structural formula 2-1 | — | Structural formula 8-20 + general formula 14 (5%) | Structural formula 9-50 | LiF | Al |
| Ex. 1-4 | Structural formula 3-10 | — | Structural formula 8-20 + general formula 14 (5%) | Structural formula 9-50 | LiF | Al |
| Ex. 1-5 | Structural formula 6-49 | — | Structural formula 8-20 + general formula 14 (5%) | Structural formula 9-50 | LiF | Al |
| Ex. 1-6 | Structural formula 6-49 | — | Structural formula 8-20 + general formula 14 (5%) | Structural formula 9-50 | LiF | Al |
| Ex. 1-7 | Structural formula 6-49 | — | Structural formula 8-20 + general formula 14 (5%) | Structural formula 9-50 | LiF | Al |
| Comp. Ex. 1-1 | — | — | Structural formula 8-20 + general formula 14 (5%) | Structural formula 9-50 | LiF | Al |
| Comp. Ex. 1-2 | BCP | — | Structural formula 8-20 + general formula 14 (5%) | Structural formula 9-50 | LiF | Al |
| Comp. Ex. 1-3 | αNPD | — | Structural formula 8-20 + general formula 14 (5%) | Structural formula 9-50 | LiF | Al |
| Comp. Ex. 1-4 | Structural formula 3-10 | — | Structural formula 8-20 + general formula 14 (5%) | Structural formula 9-50 | LiF | Al |
| Comp. Ex. 1-5 | — | — | Structural formula 8-20 + general formula 14 (5%) | Structural formula 9-50 | LiF | Al |
| Comp. Ex. 1-6 | — | — | Structural formula 8-20 + general formula 14 (5%) | Structural formula 9-50 | LiF | Al |
| Comp. Ex. 1-7 | — | — | Structural formula 8-20 + general formula 14 (5%) | Structural formula 9-50 | LiF | Al |

TABLE 2

| | Blue organic EL element | | | | Green organic EL element | | | |
|---|---|---|---|---|---|---|---|---|
| | Luminous efficiency (Cd/A) | Voltage (V) | Chromaticity x, y | Life/h | Luminous efficiency (Cd/A) | Voltage (V) | Chromaticity x, y | Life/h |
| Ex. 1-1 | 7.2 | 5.1 | 0.15, 0.11 | 80 | 55.6 | 5.8 | 0.26, 0.65 | 0.005 |
| Ex. 1-2 | 7.1 | 5.2 | 0.15, 0.11 | 120 | 50.2 | 5.8 | 0.26, 0.65 | 0.005 |
| Ex. 1-3 | 7.5 | 5.2 | 0.15, 0.11 | 110 | 54.3 | 5.8 | 0.26, 0.65 | 0.003 |
| Ex. 1-4 | 7.5 | 5.2 | 0.15, 0.11 | 80 | 58.5 | 5.8 | 0.26, 0.65 | 0.002 |
| Ex. 1-5 | 7.2 | 5.1 | 0.15, 0.11 | 130 | 60.5 | 5.1 | 0.26, 0.65 | 0.003 |
| Ex. 1-6 | 7.1 | 5.3 | 0.15, 0.11 | 110 | 50.8 | 6.1 | 0.26, 0.65 | 0.005 |
| Ex. 1-7 | 7.1 | 5.2 | 0.15, 0.11 | 120 | 50.2 | 5.8 | 0.26, 0.65 | 0.005 |
| Comp. Ex. 1-1 | 3.1 | 4.9 | 0.15, 0.11 | 10 | 32.5 | 5.6 | 0.22, 0.57 | 0.012 |
| Comp. Ex. 1-2 | 2.1 | 4.9 | 0.12, 0.13 | 5 | 35.4 | 5.6 | 0.26, 0.64 | 0.007 |
| Comp. Ex. 1-3 | 4.5 | 4.9 | 0.15, 0.11 | 50 | 30.5 | 5.6 | 0.22, 0.56 | 0.039 |
| Comp. Ex. 1-4 | 6.4 | 4.9 | 0.15, 0.11 | 10 | 45.1 | 5.6 | 0.22, 0.55 | 0.028 |

TABLE 2-continued

| | | | | | | | | |
|---|---|---|---|---|---|---|---|---|
| Comp. Ex. 1-5 | 5.1 | 5.3 | 0.15, 0.11 | 50 | 50.1 | 6.1 | 0.26, 0.65 | 0.008 |
| Comp. Ex. 1-6 | 4.1 | 5.3 | 0.15, 0.12 | 20 | 41.5 | 6.1 | 0.26, 0.65 | 0.009 |
| Comp. Ex. 1-7 | 3.1 | 4.9 | 0.15, 0.11 | 10 | 32.5 | 5.6 | 0.22, 0.57 | 0.012 |

| | Red organic EL element | | | | Yellow organic EL element | | | |
|---|---|---|---|---|---|---|---|---|
| | Luminous efficiency (Cd/A) | Voltage (V) | Chromaticity x, y | Life/h | Luminous efficiency (Cd/A) | Voltage (V) | Chromaticity x, y | Life/h |
| Ex. 1-1 | 12.3 | 6.5 | 0.67, 0.32 | 0.002 | | | | |
| Ex. 1-2 | 12.5 | 6.5 | 0.67, 0.32 | 0.003 | | | | |
| Ex. 1-3 | 13.1 | 6.5 | 0.67, 0.32 | 0.002 | | | | |
| Ex. 1-4 | 12.8 | 6.5 | 0.67, 0.32 | 0.001 | | | | |
| Ex. 1-5 | 12.8 | 6.1 | 0.67, 0.32 | 0.002 | | | | |
| Ex. 1-6 | 11.8 | 6.5 | 0.67, 0.32 | 0.003 | | | | |
| Ex. 1-7 | 12.5 | 6.5 | 0.67, 0.32 | 0.003 | 65.4 | 5.9 | 0.46, 0.54 | 0.003 |
| Comp. Ex. 1-1 | 8.7 | 6.5 | 0.62, 0.31 | 0.029 | | | | |
| Comp. Ex. 1-2 | 11.5 | 6.5 | 0.67, 0.32 | 0.008 | | | | |
| Comp. Ex. 1-3 | 8.7 | 6.5 | 0.61, 0.32 | 0.043 | | | | |
| Comp. Ex. 1-4 | 8.6 | 6.5 | 0.58, 0.31 | 0.044 | | | | |
| Comp. Ex. 1-5 | 11.2 | 6.5 | 0.67, 0.32 | 0.003 | | | | |
| Comp. Ex. 1-6 | 9.8 | 6.5 | 0.67, 0.32 | 0.021 | | | | |
| Comp. Ex. 1-7 | 8.7 | 6.5 | 0.62, 0.31 | 0.029 | 42.1 | 5.8 | 0.42, 0.51 | 0.018 |

As can be seen from Table 2, in Comparative Example 1-1 in which no connection layer 16D was provided, the sufficient characteristics are not obtained with respect to the luminous efficiency and life of the blue organic EL element. In addition, the sufficient luminous efficiency is not obtained in each of the green organic EL element and the red organic EL element as well, and the measurement of the chromaticity was also observed. On the other hand, in Examples 1-1 and 1-2 in each of which the connection layer 16D was provided, the enhancement of the life characteristics of the blue EL element was 8 or 10 more times as large as that of the life characteristics of the blue EL element of Comparative Example 1-1. In addition, the chromaticity change in each of the green organic EL element and the red organic EL element was also suppressed. Also, as apparent from the measurement results obtained from Examples 1-3 and 1-4, the suitable materials are laminated one upon another, whereby it is also becomes possible to use the material which does not sufficiently function as the connection layer 16D when being singularly used.

In addition, even in Examples 1-5 and 1-6 in each of which the red light emitting layer 16CR and the green light emitting layer 16CG were formed by utilizing either the evaporation method or the laser transfer method, the luminous efficiency and life characteristics of the blue organic EL element are enhanced comparably with those of each of Examples 1-1 to 1-4. On the other hand, in Comparative Examples 1-5 and 1-6 in each of which no connection layer 16D is provided, and the individual luminescent layers were formed by utilizing either the evaporation method or the laser transfer method, the luminous efficiency and life characteristics of the blue organic EL element remain low. From this fact, it is understood that the improvement in the element characteristics of the individual organic EL elements due to the provision of the connection layer 16D does not depend on the manufacturing processes for the individual layers.

In addition, the present disclosure can be applied not only to the 3-subpixels of red (R), green (G), and blue (B), but also to 4-subpixels in which yellow (Y) is added to red (R), green (G), and blue (B) as with Example 1-7. Thus, it is possible to improve the luminous efficiency and life characteristics of the blue organic EL element. In addition, as can be understood from Table 2, the provision of the connection layer 16D makes it possible to reduce the chromaticity change as well of the yellow organic EL element similarly to the case of the red and green organic EL elements 10R and 10G. It is noted that in the case of the 4-subpixel of R, G, B, and Y, Y having a high visual sensitivity is utilized, whereby it becomes possible to reduce the power consumption in terms of the display system.

Examples 2 and 3

Organic EL display devices 2 and 3 each having the same material compositions as those of each of the second and third embodiments described above were manufactured by utilizing the same methods as those in Example 1 (Examples 2-1 to 2-3, Comparative Example 2-1, and Examples 3-1 to 3-3, Comparative Example 3-1). Table 3 shows a list of the layer structures, and materials in Examples 2-1 to 2-3 and Comparative Example 2-1. Table 4 is a list of measurement results obtained from Examples 2-1 to 2-3 and Comparative Example 2-1 by utilizing the same measurement methods as those in Example 1. Table 5 shows a list of layer structures and materials in Examples 3-1 to 3-3 and Comparative Example 3-1. Also, Table 6 is a list of measurement results obtained from Examples 3-1 to 3-3 and Comparative Example 3-1 by utilizing the same measurement methods as those in Example 1.

TABLE 3

| | | | Green light emitting layer | | | Red light emitting layer | | |
|---|---|---|---|---|---|---|---|---|
| | Hole injection layer | Interlayer | High-molecular material | Low-molecular mixed material | Guest material | High-molecular material | Low-molecular mixed material | Guest material |
| Ex. 2-1 | ND1501 | TFB | General formula 12 | Structural formula 2-3 (50%) | Structural formula 4-1 (10%) | General formula 12 | Structural formula 2-7 (50%) | Structural formula 4-4 (5%) |
| Ex. 2-2 | ND1501 | TFB | General formula 12 | Structural formula 2-3 (50%) | Structural formula 4-1 (10%) | General formula 12 | Structural formula 2-7 (50%) | Structural formula 4-4 (5%) |
| Ex. 2-3 | ND1501 | TFB | General formula 12 | Structural formula 2-3 (50%) | Structural formula 4-1 (10%) | General formula 12 | Structural formula 2-7 (50%) | Structural formula 4-4 (5%) |
| Comp. Ex. 2-1 | ND1501 | TFB | General formula 12 | Structural formula 2-3 (50%) | Structural formula 4-1 (10%) | General formula 12 | Structural formula 2-7 (50%) | Structural formula 4-4 (5%) |

| | Connection layer 1 | Connection layer 2 | Blue common layer | Electron transport layer | Electron injection layer | Electrode |
|---|---|---|---|---|---|---|
| Ex. 2-1 | Structural formula 6-22 | — | Structural formula 8-20 + general formula 14 (5%) | Structural formula 9-50 | LiF | Al |
| Ex. 2-2 | Structural formula 6-49 | — | Structural formula 8-20 + general formula 14 (5%) | Structural formula 9-50 | LiF | Al |
| Ex. 2-3 | Structural formula 3-10 | Structural formula 6-49 | Structural formula 8-20 + general formula 14 (5%) | Structural formula 9-50 | LiF | Al |
| Comp. Ex. 2-1 | no provision | — | Structural formula 8-20 + general formula 14 (5%) | Structural formula 9-50 | LiF | Al |

TABLE 4

| | Blue organic EL element | | | | Green organic EL element | | | | Red organic EL element | | | |
|---|---|---|---|---|---|---|---|---|---|---|---|---|
| | Luminous efficiency (Cd/A) | Voltage (V) | Chromaticity x, y | Life/h | Luminous efficiency (Cd/A) | Voltage (V) | Chromaticity x, y | Life/h | Luminous efficiency (Cd/A) | Voltage (V) | Chromaticity x, y | Life/h |
| Ex. 2-1 | 7.2 | 5.1 | 0.15, 0.11 | 80 | 58.5 | 6.5 | 0.26, 0.64 | 0.003 | 11.5 | 7.3 | 0.67, 0.32 | 0.002 |
| Ex. 2-2 | 7.1 | 5.2 | 0.15, 0.11 | 120 | 60.5 | 6.2 | 0.26, 0.64 | 0.003 | 12.1 | 7.6 | 0.67, 0.32 | 0.003 |
| Ex. 2-3 | 7.5 | 5.2 | 0.15, 0.11 | 80 | 59.5 | 6.4 | 0.26, 0.65 | 0.002 | 12.5 | 7.4 | 0.67, 0.32 | 0.002 |

TABLE 4-continued

| | Blue organic EL element | | | | Green organic EL element | | | | Red organic EL element | | | |
|---|---|---|---|---|---|---|---|---|---|---|---|---|
| | Luminous efficiency (Cd/A) | Voltage (V) | Chromaticity x, y | Life/h | Luminous efficiency (Cd/A) | Voltage (V) | Chromaticity x, y | Life/h | Luminous efficiency (Cd/A) | Voltage (V) | Chromaticity x, y | Life/h |
| Comp. Ex. 2-1 | 3.1 | 4.9 | 0.15, 0.11 | 10 | 39.5 | 6.9 | 0.22, 0.57 | 0.018 | 8.1 | 7 | 0.59, 0.31 | 0.045 |

TABLE 5

| | | | Green light emitting layer | | Red light emitting layer | | Connection layer | |
|---|---|---|---|---|---|---|---|---|
| | Hole injection layer | Hole transport layer | Host material | Low-molecular mixed material | Host material | Low-molecular mixed material | 1 | 2 |
| Ex. 3-1 | ND1501 | TFB | Structural formula 13-2 | — | Structural formula 13-1 | — | Structural formula 6-49 | — |
| Ex. 3-2 | ND1501 | TFB | Structural formula 13-2 | Structural formula 2-1 (30%) | Structural formula 13-1 | Structural formula 4-4 (30%) | Structural formula 6-49 | — |
| Ex. 3-3 | ND1501 | TFB | Structural formula 13-2 | Structural formula 2-1 (30%) | Structural formula 13-1 | Structural formula 4-4 (30%) | Structural formula 3-10 | Structural formula 6-49 |
| Comp. Ex. 3-1 | ND1501 | TFB | Structural formula 13-2 | — | Structural formula 13-1 | — | no provision | — |

| | Blue common layer | Electron transport layer | Electron injection layer | Electrode |
|---|---|---|---|---|
| Ex. 3-1 | Structural formula 8-20 + general formula 14 (5%) | Structural formula 9-50 | LiF | Al |
| Ex. 3-2 | Structural formula 8-20 + general formula 14 (5%) | Structural formula 9-50 | LiF | Al |
| Ex. 3-3 | Structural formula 8-20 + general formula 14 (5%) | Structural formula 9-50 | LiF | Al |
| Comp. Ex. 3-1 | Structural formula 8-20 + general formula 14 (5%) | Structural formula 9-50 | LiF | Al |

TABLE 6

| | Blue organic EL element | | | | Green organic EL element | | | | Red organic EL element | | | |
|---|---|---|---|---|---|---|---|---|---|---|---|---|
| | Luminous efficiency (Cd/A) | Voltage (V) | Chromaticity x, y | Life/h | Luminous efficiency (Cd/A) | Voltage (V) | Chromaticity x, y | Life/h | Luminous efficiency (Cd/A) | Voltage (V) | Chromaticity x, y | Life/h |
| Ex. 3-1 | 7.1 | 5.2 | 0.15, 0.11 | 120 | 55.4 | 7.8 | 0.27, 0.63 | 0.009 | 9.8 | 8.5 | 0.65, 0.34 | 0.008 |
| Ex. 3-2 | 7.1 | 5.2 | 0.15, 0.11 | 120 | 57.8 | 6.4 | 0.26, 0.64 | 0.003 | 9.5 | 7.8 | 0.65, 0.34 | 0.003 |
| Ex. 3-3 | 7.5 | 5.2 | 0.15, 0.11 | 80 | 59.1 | 6.3 | 0.26, 0.65 | 0.002 | 10.1 | 7.7 | 0.65, 0.34 | 0.002 |
| Comp. Ex. 3-1 | 3.1 | 4.9 | 0.15, 0.11 | 10 | 41.5 | 7.7 | 0.22, 0.55 | 0.025 | 7.5 | 8.4 | 0.57, 0.35 | 0.048 |

As can been seen from Table 4, even when each of the red light emitting layer 36CR and the green light emitting layer 36CG was made of the phosphorescence luminescent low-molecular material and high-molecular material, the provision of the connection layer 36D results in that the luminous efficiency and life characteristics of the blue organic EL element 30B were enhanced. In addition, the chromaticity change of each of the red organic EL element 30R and the green organic EL element 30G was also suppressed.

Also, as can be seen from Table 6, even when each of the red light emitting layer 46CR and the green light emitting layer 46CG was made of the phosphorescence luminescent high-molecular material, the provision of the connection layer 46D results in that the luminous efficiency and life characteristics of the blue organic EL element 40D were enhanced. In addition, the chromaticity change of each of the red organic EL element 40R and the green organic EL element 40G was also suppressed. In addition, like Examples 3-2 and 3-3, the suitable low-molecular materials are added to the red light emitting layer 46CR and the green light emitting layer 46CG, respectively, whereby the chromaticity change can be further suppressed and the low voltage promotion becomes possible.

From the foregoing, the connection layer 16D, 26D, 36D, 46D containing therein the low-molecular material is provided between the red light emitting layer 16CR, 26CR, 36C, 46CR and the green light emitting layer 16CG, 26CG, 36CG, 46CG, and the blue light emitting layer 16CB, 26CB, 36CB, 46CB, whereby the luminous efficiency and life characteristics of the blue organic EL element 10B, 20B, 30B, 40B are enhanced. In addition, in the red organic EL element 10R, 20R, 30R, 40R and the green organic EL element 10G, 20G, 30G, 40G in each of which the phosphorescence luminescent materials are used in the red light emitting layer and the green light emitting layer, respectively, the chromaticity change due to the current density dependency is suppressed irrespective of the kinds of phosphorescence luminescent materials.

Although the present disclosure has been described so far based on the first to third embodiments and Examples 1 to 3, the present disclosure is by no means limited to the embodiments, change and Examples described above, and thus various changes can be made.

For example, the materials and the thicknesses, or the deposition methods, the deposition conditions, and the like which have been described in the embodiments, change and Examples described above are by no means limited thereto, other suitable materials and thicknesses may also be used instead, or other suitable deposition methods and deposition conditions may also be utilized instead.

In addition, although in Examples 1 and 2, the low-molecular material (monomer) is used in the blue hole transport layer 16BB, the present disclosure is by no means limited thereto, and thus an oligomer material or a high-molecular material obtained through the polymerization may also be used instead. It is noted that when the low-molecular material is used in the application method such as the spin coating method or the ink-jet method, an adjustment range of the film thickness is limited in some cases because in general, the viscosity of the liquid solution to be applied becomes small. The problem is solved by using the oligomer material or polymer material having an increased molecular weight.

In addition, in the second and third embodiments, and Examples described above, the low-molecular materials are added to the red light emitting layer 16CR and the green light emitting layer 16CG, respectively, thereby enhancing the hole transport characteristics. However, even when the high-molecular material having the structure portion or the substituent bearing the hole transport is used as the high-molecular material composing each of the red light emitting layer 16CR and the green light emitting layer 16CG, the same effects can be obtained.

Moreover, although the embodiments and Examples described above have been described by concretely giving the structures of the organic EL elements 10R, 10G, and 10B, it is unnecessary to include all of the layers, and other suitable layer(s) may also be included. For example, the hole transport layer 16BB of the blue organic EL element 16B may be omitted and the connection layer 16D may be directly provided on the hole injection layer 16AB. As a result, the number of manufacturing processes can be reduced and the cost can also be suppressed. In addition, although in the embodiments and Examples described above, the organic EL display device including the red, green and yellow organic EL elements as the organic EL elements other than the blue organic EL element has been described, a white organic EL element may also be used in addition thereto.

Furthermore, although in the embodiments and the like described above, the description has been given with respect to the case of the active matrix type display device, the present disclosure can also be applied to a positive matrix type display device. Furthermore, the configuration of the pixel drive circuit for the active matrix drive is by no means limited to any of the configurations described in the embodiments described above, and thus a capacitive element or a transistor may also be added as may be necessary. In this case, in addition to the signal line drive circuit 120 and scanning line drive circuit 130 described above, a necessary drive circuit(s) may be added in accordance with the change in the pixel drive circuit.

In addition, although in Examples described above, the hole injection layers 16AR, 16AG, and 16AB, the hole transport layers 16BR, 16BG, and 16BB, and the red light emitting layer 16CR and green light emitting layer 16CG are all formed by utilizing the nozzle coating method of the application methods, the present disclosure is by no means limited thereto, and thus the spin coating method, the ink-jet method or the slit coating method may also be used instead. Moreover, for example, these layers may also be formed by utilizing a discharge system such as a microsyringe for directly drawings a desired pattern either on the pixels or among the pixels, or a plate system typified by a relief printing, flexo printing, offset printing, and gravure printing each using a plate.

The present disclosure contains subject matter related to that disclosed in Japanese Priority Patent Application JP 2011-048353 filed in the Japan Patent Office on Mar. 4, 2011, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. An organic EL display device, which stands for organic electro luminescence display device, comprising:

a lower electrode provided every first organic EL element for a blue color and every second organic EL element for another color on a substrate;

a partition layer in contact with said lower electrode;

a hole injection/transport layer provided every first organic EL element and second organic EL element on said lower electrode, and having at least one of properties of hole injection and hole transport;

a second organic light emitting layer for non-blue colors provided on said hole injection/transport layer for said second organic EL element;

a connection layer made of a low-molecular material and provided over an entire surface of said hole injection/transport layer for said second organic light emitting layer and said first organic EL element, the partition layer extending from said lower electrode to be in contact with said connection layer, wherein a triplet excited state (T1H) of said connection layer is 0.1 eV or more higher than a triplet excited state (T1E) of said second organic light emitting layer;

a first organic light emitting layer for a blue color provided over an entire surface of said connection layer so that the first organic light emitting layer for the blue color is above the second organic light emitting layer for non-blue colors;

an electron injection/transport layer having at least one of the properties of the electron injection and the electron transport and an upper electrode provided over an entire surface of said organic light emitting layer in order.

2. The organic EL display device according to claim 1, wherein said second organic light emitting layer contains therein a phosphorescence luminescent ortho metalated complex or a polyfine complex.

3. The organic EL display device according to claim 2, wherein a central metal of the ortho metalated complex is at least one of iridium (Ir), platinum (Pt) or palladium (Pd).

4. An organic EL display device, which stands for organic electro luminescence display device, comprising:

a lower electrode provided every first organic EL element for a blue color and every second organic EL element for another color on a substrate;

a partition layer in contact with said lower electrode;

a hole injection/transport layer provided every first organic EL element and second organic EL element on said lower electrode, and having at least one of properties of hole injection and hole transport;

a second organic light emitting layer for non-blue colors provided on said hole injection/transport layer for said second organic EL element;

a connection layer made of a low-molecular material and provided over an entire surface of said hole injection/transport layer for said second organic light emitting layer and said first organic EL element, the partition layer extending from said lower electrode to be in contact with said connection layer, wherein said connection layer contains therein a nitrogen-containing heterocyclic compound;

a first organic light emitting layer for a blue color provided over an entire surface of said connection layer so that the first organic light emitting layer for the blue color is above the second organic light emitting layer for non-blue colors;

an electron injection/transport layer having at least one of the properties of the electron injection and the electron transport and an upper electrode provided over an entire surface of said organic light emitting layer in order.

5. The organic EL display device according to claim 4, wherein the nitrogen-containing heterocyclic compound is a compound expressed by the general formula (2):

(2)

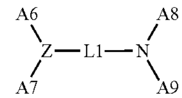

in which L1 is a group into which 2 to 6 bivalent aromatic ring groups are coupled, specifically, a bivalent group into which 2 to 6 aromatic rings are linked, or a derivative thereof, and A6 to 9 are groups into which 1 to 10 aromatic hydrocarbon groups or derivatives thereof are coupled.

6. The organic EL display device according to claim 1, wherein said electron injection/transport layer has a mobility in the range of $1.0\times10^{-6}$ $cm^2/Vs$ to $1.0\times10^{-1}$ $cm^2/Vs$.

7. The organic EL display device according to claim 1, wherein said second organic EL element for another color is at least one of a red organic EL element, a green organic EL element or a yellow organic EL element and the partition layer is between said second organic EL element and said hole injection/transport layer provided every first organic EL element.

8. The organic EL display device according to claim 1, wherein said hole injection/transport layer is provided as a common layer over an entire surface of a lower electrode of said first organic EL element and said second organic EL element, said hole injection layer being divided by said partition layer in a space between said lower electrode of said first organic EL element and said second organic EL element.

9. The organic EL display device according to claim 1, wherein said partition layer blocks light emission such that light emission occurs through said hole injection layer only above said lower electrode of said first organic EL element and said second organic EL element.

10. The organic EL display device according to claim 1, wherein said partition layer has a two layer structure including an upper partition layer and a lower partition layer.

11. The organic EL display device according to claim 10, wherein said upper partition layer is a photosensitive resin and said lower partition layer is an inorganic insulating material.

12. The organic EL display device according to claim 1, wherein said partition layer has a water repellant surface.

13. An organic EL display device, which stands for organic electro luminescence display device, comprising:

a lower electrode provided every first organic EL element for a blue color and every second organic EL element for another color on a substrate;

a partition layer in contact with said lower electrode;

a hole injection/transport layer provided every first organic EL element and second organic EL element on said lower electrode, and having at least one of properties of hole injection and hole transport;

a second organic light emitting layer for non-blue colors provided on said hole injection/transport layer for said second organic EL element;

a connection layer made of a low-molecular material and provided over an entire surface of said hole injection/transport layer for said second organic light emitting layer and said first organic EL element, the partition layer extending from said lower electrode to be in contact with said connection layer, wherein an energy difference between a ground state (S0H) of said connection layer and a ground state (S0I) of said hole injection/transport layer is equal to or smaller than 0.4 eV;

a first organic light emitting layer for a blue color provided over an entire surface of said connection layer so that the first organic light emitting layer for the blue color is above the second organic light emitting layer for non-blue colors;

an electron injection/transport layer having at least one of the properties of the electron injection and the electron transport and an upper electrode provided over an entire surface of said organic light emitting layer in order.

14. The organic EL display device according to claim 4, wherein the nitrogen-containing heterocyclic compound is a compound expressed by the general formula (1):

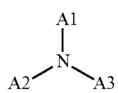

(1)

in which A1 to A3 are aromatic hydrocarbon groups, heterocyclic groups or derivatives thereof.

* * * * *